(12) United States Patent
Kim et al.

(10) Patent No.: US 8,828,561 B2
(45) Date of Patent: *Sep. 9, 2014

(54) COMPOUND FOR ORGANIC PHOTOELECTRIC DEVICE AND ORGANIC PHOTOELECTRIC DEVICE INCLUDING THE SAME

(75) Inventors: Hyung-Sun Kim, Uiwang-si (KR); Eun-Sun Yu, Uiwang-si (KR); Young-Hoon Kim, Uiwang-si (KR); Ja-Hyun Kim, Boryeong (KR); Soo-Hyun Min, Uiwang-si (KR); Ho-Jae Lee, Uiwang-si (KR); Eui-Su Kang, Uiwang-si (KR); Mi-Young Chae, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/555,558

(22) Filed: Jul. 23, 2012

(65) Prior Publication Data

US 2012/0305900 A1    Dec. 6, 2012

Related U.S. Application Data

(63) Continuation-in-part of application No. 13/463,211, filed on May 3, 2012, which is a continuation-in-part of application No. PCT/KR2010/007550, filed on Oct. 29, 2010.

(30) Foreign Application Priority Data

Nov. 3, 2009   (KR) .................... 10-2009-0105576

(51) Int. Cl.
| | | |
|---|---|---|
| *H01L 51/54* | (2006.01) | |
| *H01L 51/00* | (2006.01) | |
| *C09K 11/06* | (2006.01) | |
| *H05B 33/14* | (2006.01) | |
| *H01L 51/50* | (2006.01) | |

(52) U.S. Cl.
CPC .... *H01L 51/0072* (2013.01); *C09K 2211/1007* (2013.01); *H01L 51/5016* (2013.01); *C09K 11/06* (2013.01); *C09K 2211/1059* (2013.01); *C09K 2211/1029* (2013.01); *H05B 33/14* (2013.01); *H01L 51/5056* (2013.01); *H01L 51/5012* (2013.01); *C09K 2211/1048* (2013.01); *C09K 2211/1044* (2013.01); *C09K 2211/1011* (2013.01); *Y10S 428/917* (2013.01)
USPC .......... 428/690; 428/917; 313/504; 313/505; 313/506; 257/40; 257/E51.05; 257/E51.026; 257/E51.032; 546/18; 546/79; 546/81; 546/101; 548/304.1; 548/418; 548/440

(58) Field of Classification Search
USPC .................. 428/690, 917; 313/504, 505, 506; 257/40, E51.05, E51.026, E51.032; 546/18, 79, 81, 101; 548/304.1, 418, 548/440
See application file for complete search history.

(56) References Cited

U.S. PATENT DOCUMENTS

| | | |
|---|---|---|
| 2001/0046612 A1 | 11/2001 | Lee et al. |
| 2002/0045061 A1 | 4/2002 | Hosokawa |
| 2004/0110031 A1 | 6/2004 | Fukuda et al. |
| 2005/0222429 A1 | 10/2005 | Hosokawa |
| 2008/0145665 A1 | 6/2008 | Ye et al. |
| 2008/0145699 A1 | 6/2008 | Yabe |
| 2008/0269461 A1 | 10/2008 | Van Dijken et al. |
| 2009/0096360 A1* | 4/2009 | Tanaka et al. ................ 313/504 |
| 2009/0153034 A1 | 6/2009 | Lin et al. |
| 2009/0302745 A1 | 12/2009 | Otsu et al. |
| 2011/0168990 A1 | 7/2011 | Tanaka et al. |
| 2011/0260138 A1 | 10/2011 | Xia |

| | | | |
|---|---|---|---|
| 2011/0278552 | A1 | 11/2011 | Numata |
| 2011/0278555 | A1 | 11/2011 | Inoue |
| 2012/0235123 | A1 | 9/2012 | Lee |

FOREIGN PATENT DOCUMENTS

| | | | | |
|---|---|---|---|---|
| CN | 102918134 A | 2/2013 | | |
| EP | 1970976 A1 | 9/2008 | | |
| JP | 08-003547 A | 1/1996 | | |
| JP | 11-329737 A | 11/1999 | | |
| JP | 3139321 B2 | 2/2001 | | |
| JP | 2004-178895 A | 6/2004 | | |
| JP | 2006-520409 | 9/2006 | | |
| JP | 2008-135498 | * 6/2008 | ............. | H01L 51/50 |
| JP | 2008-135498 A | 6/2008 | | |
| JP | 2008135498 | 6/2008 | | |
| JP | 2008-294161 A | 12/2008 | | |
| JP | 5018891 B2 | 9/2012 | | |
| KR | 10 2001-0077773 A | 8/2001 | | |
| WO | 03-078541 A1 | 9/2003 | | |
| WO | WO 2006/025186 A1 | 3/2006 | | |
| WO | 2007119816 | 10/2007 | | |
| WO | WO 2007/119816 | 10/2007 | | |
| WO | WO 2007/119816 A1 | 10/2007 | | |
| WO | WO 2008/090912 A1 | 7/2008 | | |
| WO | WO 2008/156105 A1 | 12/2008 | | |
| WO | 2009060779 | 5/2009 | | |
| WO | WO 2009/060779 | 5/2009 | | |
| WO | WO 2009/060779 A1 | 5/2009 | | |
| WO | 2011125680 | 10/2011 | | |
| WO | WO 2011/125680 | 10/2011 | | |

OTHER PUBLICATIONS

O'Brien, et al.; Improved energy transfer in electrophosphorescent devices; Applied Physics Letters; Jan. 18, 1999; pp. 442-444; vol. 74, No. 3; American Institute of Physics; USA.

Baldo, et al.; Very high efficiency green organic light-emitting devices based on electrophosphorescence; Applied Physics Letters; Jul. 5, 1999; pp. 4-6; vol. 75 No. 1; American Institute of Physics; USA.

Tang, et al.; Organic electroluminescent diodes; Applied Physics Letters; Sep. 21, 1987; pp. 913-915; 51 (12); American Institute of Physics; USA.

International Search Report in PCT/KR2010/007550, dated Aug. 1, 2011 (Kim, et al.).

Kwak, J., et al., "Hole transport materials with high glass transition temperatures for highly stable organic light-emitting diodes," *Thin Solid Films*, 2012, vol. 520, Iss. 24, pp. 7157-7163.

Wu, M., et al., "Low Power-Consumption and Long Lifetime OLED with a High Tg n-type Organic Transport Material," *Organic Light-Emitting Materials and Devices VIII*, Proceedings of SPIE (SPIE, Bellingham, WA), Nov. 10, 2004, vol. 5519, pp. 263-269.

Grazulevicius, et al.; "Well-defined [3,3']bicarbazolyl-based electroactive compounds for optoelectronics," Synthetic Metals, 2008, pp. 383-390, Elsevier, USA.

Vaitkeviciene, et al.; "Well-defined [3'3]bicarbazolyl-based electroactive compounds for optoelectronics;" Synthetic Metals 158, 2008, pp. 383-390; Issues 8-9 Elsevier, USA.

Botman, et al.; "Synthesis, Properties and Applications of BICAP: a New Family of Carbazole-Based Disphosphine Ligands;" Adv. Synth. Catal.; 2004, pp. 743-754; 346; Germany.

European Search Report in EP 10828469.6-1555/2497811, dated Aug. 8, 2013 (Kim, et al.).

* cited by examiner

*Primary Examiner* — Gregory Clark

(74) *Attorney, Agent, or Firm* — Lee & Morse, P.C.

(57) ABSTRACT

A compound for an organic photoelectric device, the compound being represented by the following Chemical Formula ("CF") 1:

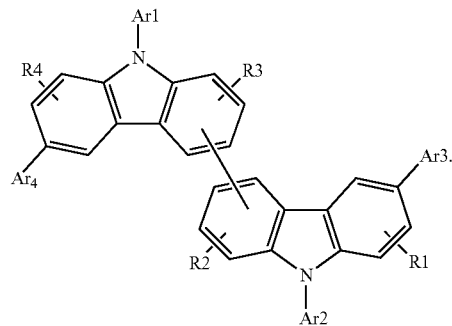

[CF 1]

14 Claims, 2 Drawing Sheets

COMPOUND FOR ORGANIC PHOTOELECTRIC DEVICE AND ORGANIC PHOTOELECTRIC DEVICE INCLUDING THE SAME

CROSS-REFERENCE TO RELATED APPLICATIONS

This application is a continuation-in-part of pending U.S. patent application Ser. No. 13/463,211, entitled "Compound for Organic Photoelectric Device and Organic Photoelectric Device Including the Same", filed on May 3, 2012, which is a continuation-in-part of International Application No. PCT/KR2010/007550, entitled "Compound for Organic Photoelectric Device and Organic Photoelectric Device Including the Same," filed on Oct. 29, 2010, the entire contents of each of which are hereby incorporated by reference.

BACKGROUND

1. Field

Embodiments relate to a compound for organic photoelectric device and an organic photoelectric device including the same.

2. Description of the Related Art

A photoelectric device is, in a broad sense, a device for transforming photo-energy to electrical energy, or conversely, for transforming electrical energy to photo-energy.

An organic photoelectric device may be classified as follows in accordance with its driving principles. A first organic photoelectric device is an electron device driven as follows: excitons are generated in an organic material layer by photons from an external light source, the excitons are separated into electrons and holes, and the electrons and holes are transferred to different electrodes as a current source (voltage source).

A second organic photoelectric device is an electron device driven as follows: a voltage or a current is applied to at least two electrodes to inject holes and/or electrons into an organic material semiconductor positioned at an interface of the electrodes, and the device is driven by the injected electrons and holes.

As examples, the organic photoelectric device includes an organic light emitting diode (OLED), an organic solar cell, an organic photo-conductor drum, an organic transistor, an organic memory device, etc. The organic photoelectric device may use a hole injecting or transporting material, an electron injecting or transporting material, or a light emitting material.

Particularly, the organic light emitting diode (OLED) has recently drawn attention due to an increase in demand for flat panel displays. In general, organic light emission refers to transformation of electrical energy to photo-energy.

The organic light emitting diode transforms electrical energy into light by applying a voltage or current to an organic light emitting material. The organic light emitting diode may have a functional organic material layer interposed between an anode and a cathode. The organic material layer may be formed as a multi-layer including different materials, e.g., a hole injection layer (HIL), a hole transport layer (HTL), an emission layer, an electron transport layer (ETL), and an electron injection layer (EIL), in order to improve efficiency and stability of the organic light emitting diode.

In an organic light emitting diode, when a voltage is applied between an anode and a cathode, holes from the anode and electrons from the cathode are injected to an organic material layer. The generated excitons generate light having certain wavelengths while shifting to a ground state.

An organic light emitting diode may include a low molecular aromatic diamine and aluminum complex as an emission layer-forming material. The organic layer may have a structure in which a thin film (hole transport layer (HTL)) of a diamine derivative and a thin film of tris(8-hydroxy-quinolate)aluminum ($Alq_3$) are laminated.

A phosphorescent light emitting material may be used for a light emitting material of an organic light emitting diode in addition to a fluorescent light emitting material. The phosphorescent material may emit light by transitioning electrons from a ground state to an excited state, non-radiative transitioning of a singlet exciton to a triplet exciton through intersystem crossing, and transitioning the triplet exciton to a ground state to emit light.

In an organic light emitting diode, an organic material layer may include a light emitting material and a charge transport material, e.g., a hole injection material, a hole transport material, an electron transport material, an electron injection material, etc.

The light emitting material may be classified as blue, green, and red light emitting materials according to emitted colors, and yellow and orange light emitting materials to emit colors approaching natural colors.

SUMMARY

Embodiments are directed to a compound for an organic photoelectric device, the compound being represented by the following Chemical Formula ("CF") 1:

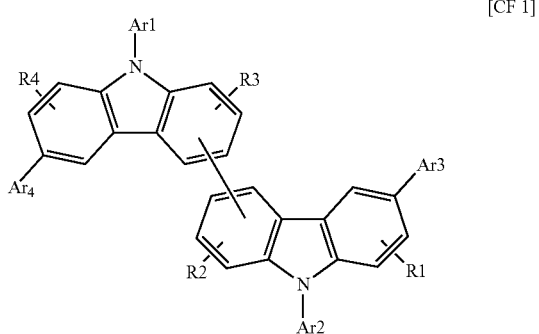

[CF 1]

wherein, in CF 1,

Ar1 and Ar2 may each be independently selected from the group of a substituted or unsubstituted C6 to C30 aryl group and a substituted or unsubstituted C2 to C30 heteroaryl group, Ar3 and Ar4 may each be independently selected from the group of hydrogen, a substituted or unsubstituted C6 to C30 aryl group, and a substituted or unsubstituted C2 to C30 heteroaryl group, and R1 to R4 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

The compound represented by CF 1 may be represented by the following CF 3:

[CF 3]

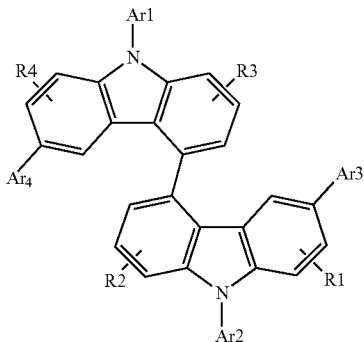

wherein, in CF 3,

Ar1 and Ar2 may each be independently selected from the group of a substituted or unsubstituted C6 to C30 aryl group and a substituted or unsubstituted C2 to C30 heteroaryl group, Ar3 and Ar4 may each be independently selected from the group of hydrogen, a substituted or unsubstituted C6 to C30 aryl group, and a substituted or unsubstituted C2 to C30 heteroaryl group, and R1 to R4 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

The compound represented by CF 3 may be represented by the following CF 5:

[CF 5]

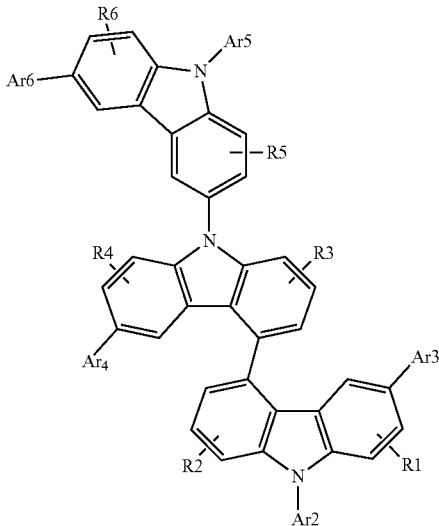

wherein, in CF 5,

Ar2 and Ar5 may each be independently selected from the group of a substituted or unsubstituted C6 to C30 aryl group and a substituted or unsubstituted C2 to C30 heteroaryl group, Ar3, Ar4 and Ar6 may each be independently selected from the group of hydrogen, a substituted or unsubstituted C6 to C30 aryl group, and a substituted or unsubstituted C2 to C30 heteroaryl group, and R1 to R6 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

Ar5 may be a C6 to C12 aryl group, and Ar2 may be a C10 to C20 fused polycyclic group.

Ar5 may be a C6 to C12 aryl group, and Ar2 may be selected from the group of a C6 to C30 substituted or unsubstituted an arylamine group, C6 to C30 substituted or unsubstituted aminoaryl group, a substituted or unsubstituted carbazole group, a substituted or unsubstituted pyridine group, a substituted or unsubstituted pyrimidine group, and a substituted or unsubstituted triazine group.

The compound represented by CF 1 may be represented by the following CF 2:

[CF 2]

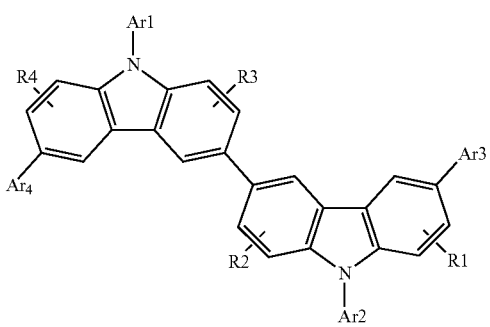

wherein, in CF 2,

Ar1 and Ar2 may each be independently selected from the group of a substituted or unsubstituted C6 to C30 aryl group and a substituted or unsubstituted C2 to C30 heteroaryl group, Ar3 and Ar4 may each be independently selected from the group of hydrogen, a substituted or unsubstituted C6 to C30 aryl group, and a substituted or unsubstituted C2 to C30 heteroaryl group, and R1 to R4 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

The compound represented by CF 2 may be represented by the following CF 4:

[CF 4]

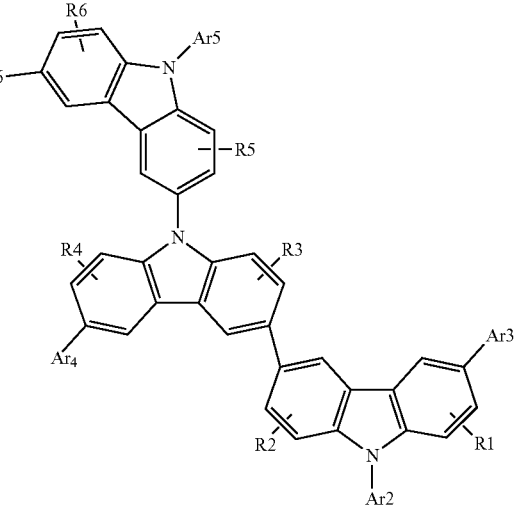

wherein, in CF 4,

Ar2 and Ar5 may each be independently selected from the group of a substituted or unsubstituted C6 to C30 aryl group and a substituted or unsubstituted C2 to C30 heteroaryl group, Ar3, Ar4 and Ar6 may each be independently selected from the group of hydrogen, a substituted or unsubstituted C6 to C30 aryl group, and a substituted or unsubstituted C2 to C30 heteroaryl group, and R1 to R6 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

Ar5 may be a C6 to C12 aryl group, and Ar2 may be a C10 to C20 fused polycyclic group.

Ar5 may be a C6 to C12 aryl group, and Ar2 may be selected from the group of a C6 to C30 substituted or unsubstituted an arylamine group, C6 to C30 substituted or unsubstituted aminoaryl group, a substituted or unsubstituted carbazole group, a substituted or unsubstituted pyridine group, a substituted or unsubstituted pyrimidine group, and a substituted or unsubstituted triazine group.

Embodiments are also directed to a compound for an organic photoelectric device, the compound being represented by the following Chemical Formula ("CF") Z-1:

[CF Z-1]

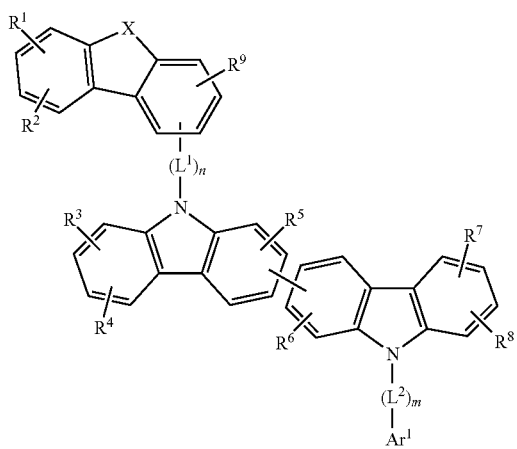

wherein, in CF Z-1,

X may be selected from the group of —O—, —S—, —SO—, —S(O)$_2$—, and —CR'R"—,

R$^1$ to R$^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarylene group, Ar$^1$ may be a substituted or unsubstituted C6 to C30 aryl group, n may be an integer of 0 to 3, and m may be an integer of 0 to 3.

The compound represented by CF Z-1 may be represented by the following CF Z-2:

[CF Z-2]

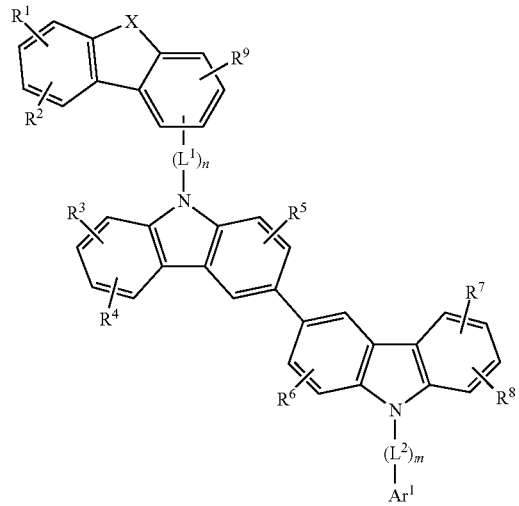

wherein, in CF Z-2,

X may be selected from the group of —O—, —S—, —SO—, —S(O)$_2$—, and —CR'R"—,

R$^1$ to R$^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarylene group, Ar$^1$ may be a substituted or unsubstituted C6 to C30 aryl group, n may be an integer of 0 to 3, and m may be an integer of 0 to 3.

The compound represented by CF Z-1 may be represented by the following CF Z-3:

[CF Z-3]

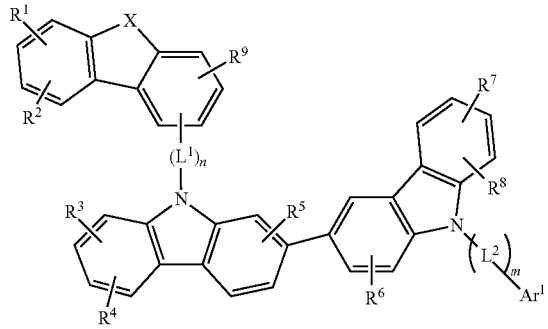

wherein, in CF Z-3,

X may be selected from the group of —O—, —S—, —SO—, —S(O)$_2$—, and —CR'R"—, $R^1$ to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

The compound represented by CF Z-1 may be represented by the following CF Z-4:

[CF Z-4]

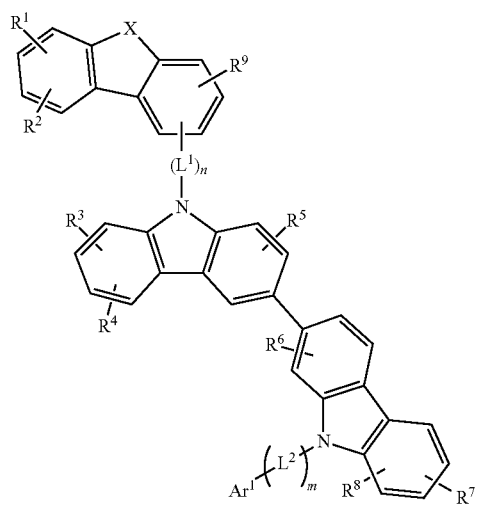

wherein, in CF Z-4,

X may be selected from the group of —O—, —S—, —SO—, —S(O)$_2$—, and —CR'R"—, $R^1$ to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

The compound represented by CF Z-1 may be represented by the following CF Z-5:

[CF Z-5]

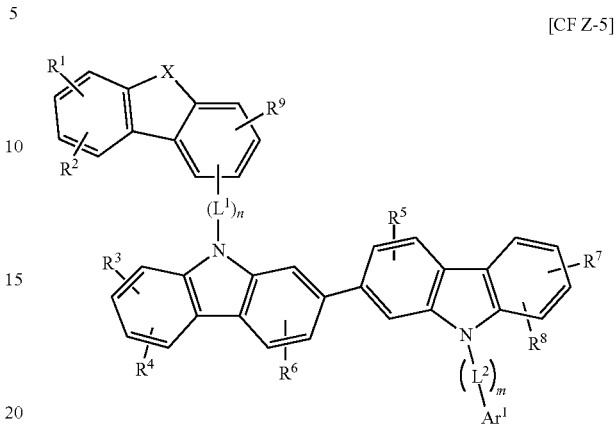

wherein, in CF Z-5,

X may be selected from the group of —O—, —S—, —SO—, —S(O)$_2$—, and —CR'R"—, $R^1$ to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

The compound represented by CF Z-1 may be represented by one or more of the following CF Z-6 to CF Z-39, and the compound represented by CF 1 may also be represented by one or more of the following CF Z-6 to CF Z-39:

[CF Z-6]

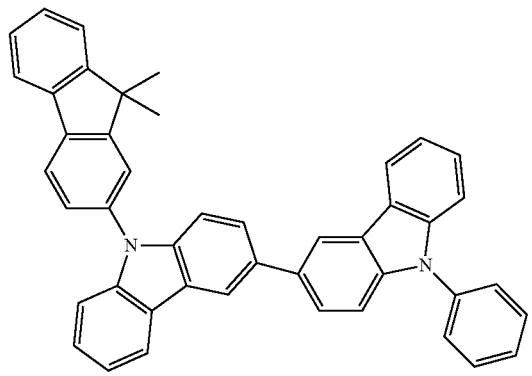

[CF Z-7]
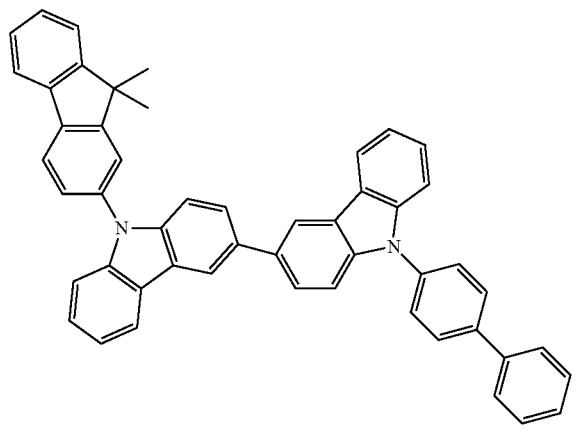
[CF Z-8]
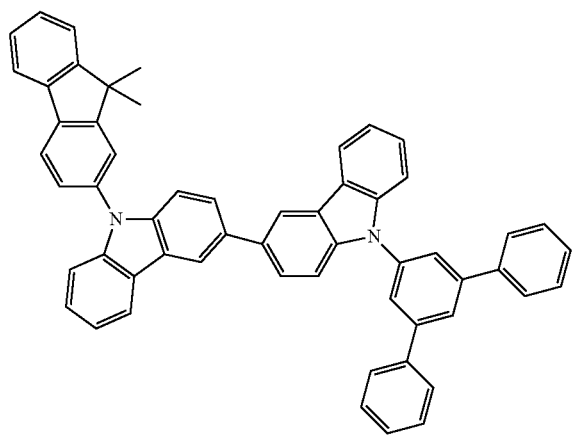
[CF Z-9]
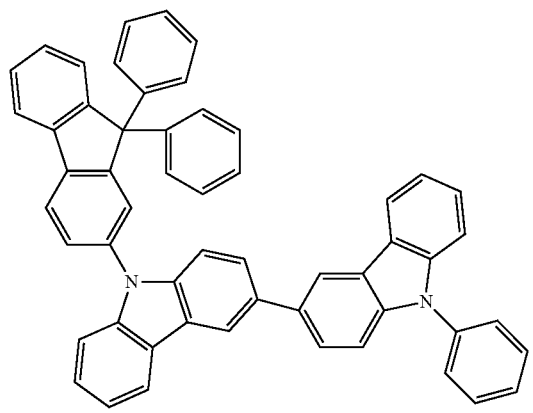
[CF Z-10]
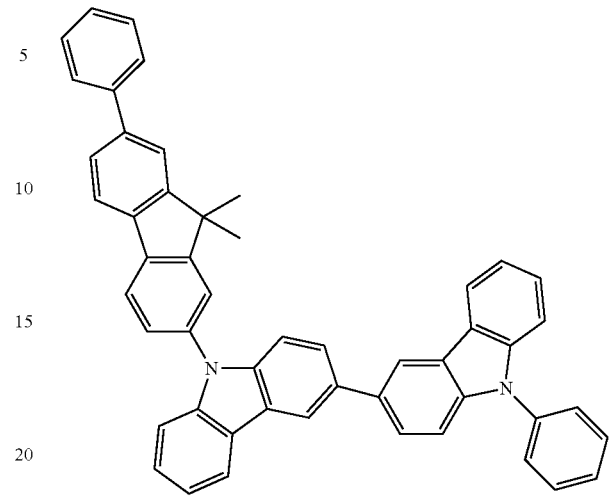
[CF Z-11]
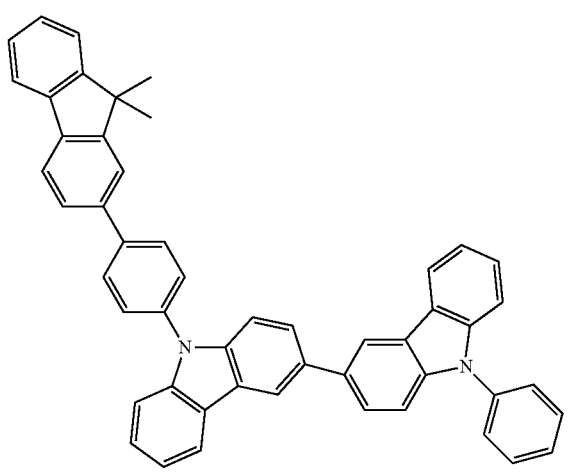
[CF Z-12]
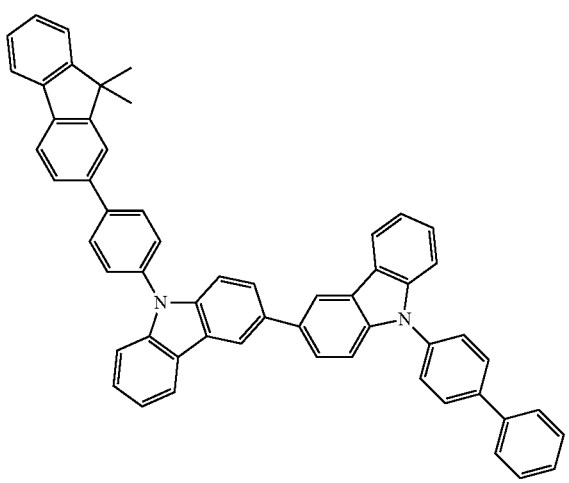

[CF Z-13]
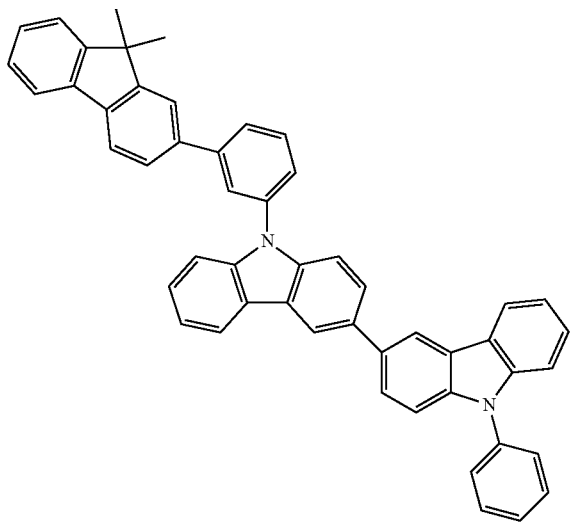
[CF Z-14]
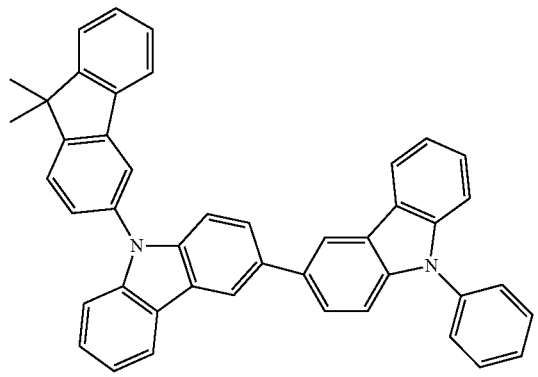
[CF Z-15]
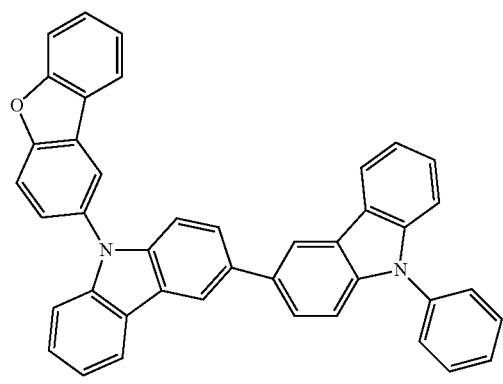
[CF Z-16]
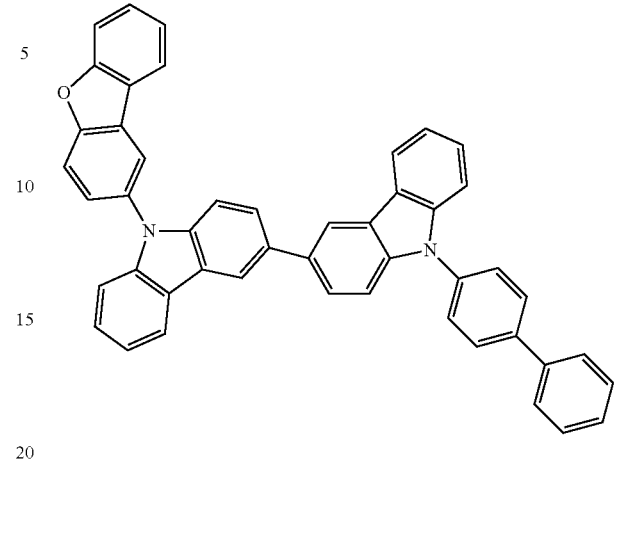
[CF Z-17]
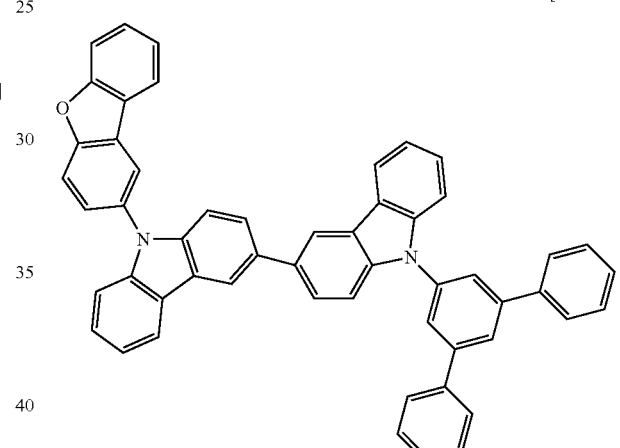
[CF Z-18]
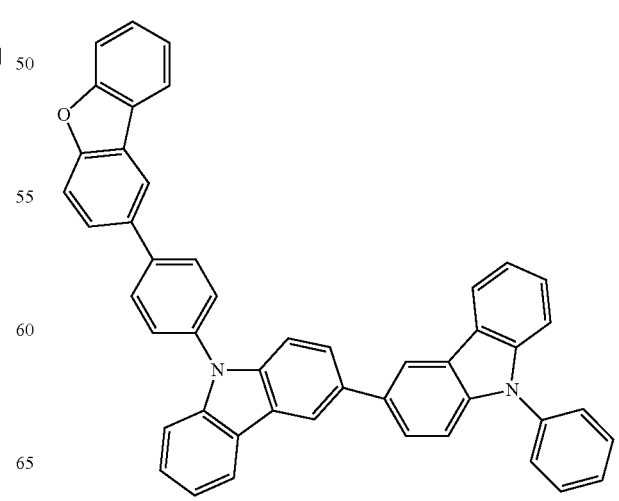

[CF Z-19]
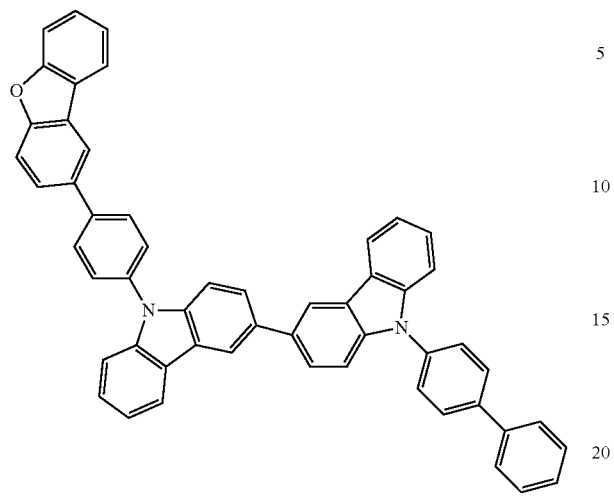
[CF Z-20]
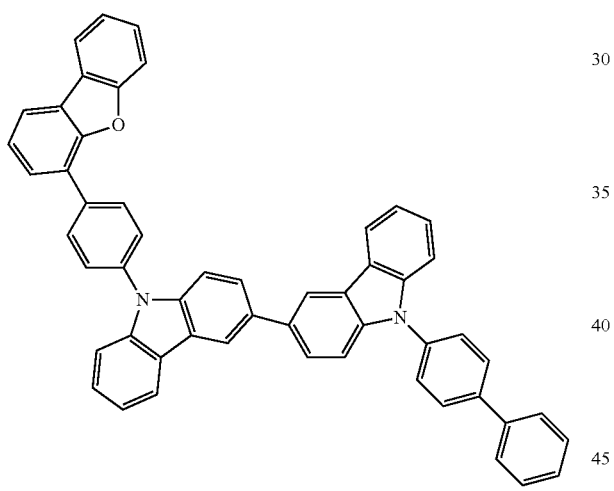
[CF Z-21]
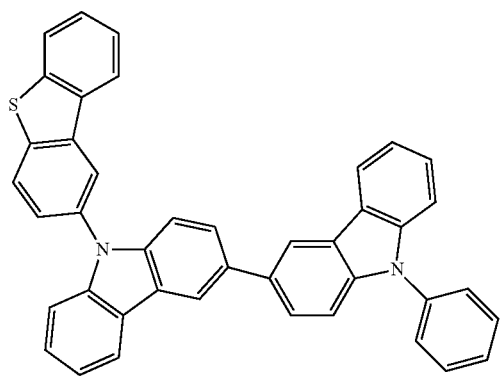
[CF Z-22]
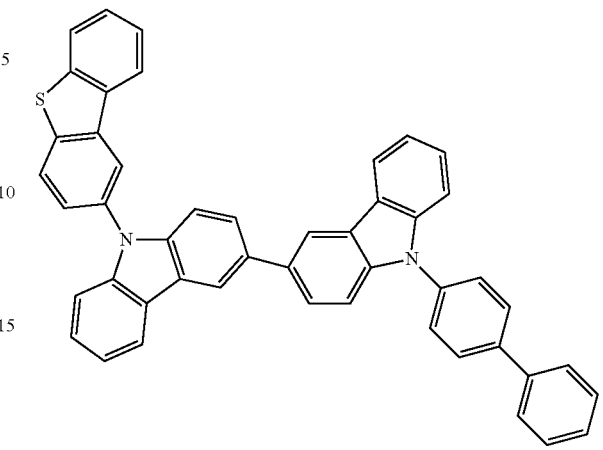
[CF Z-23]
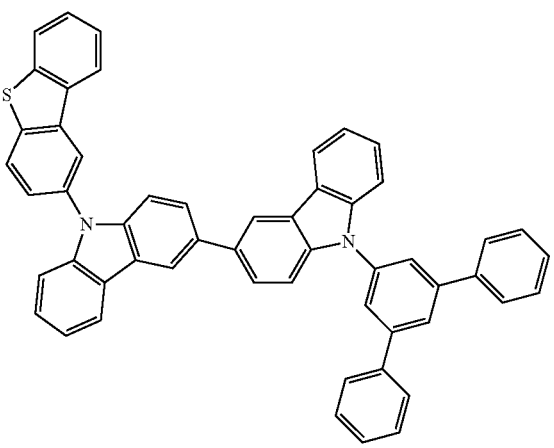
[CF Z-24]
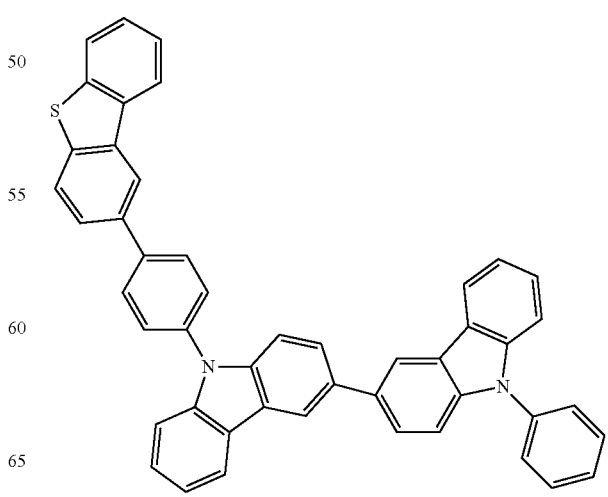

[CF Z-25]
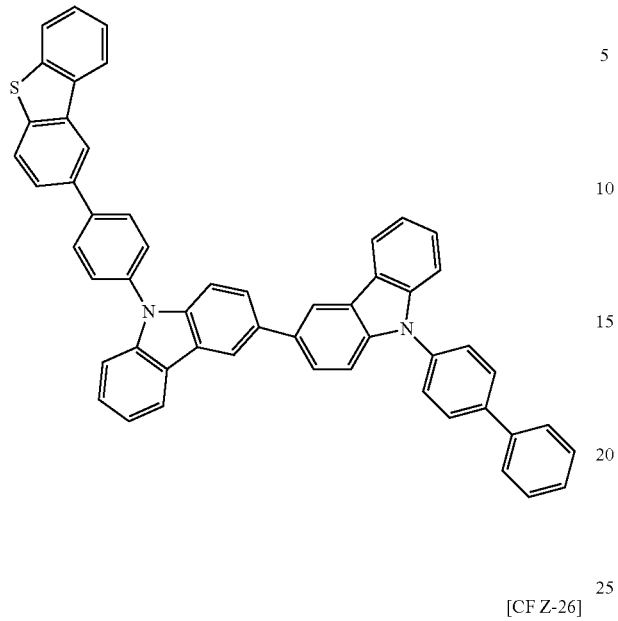
[CF Z-26]
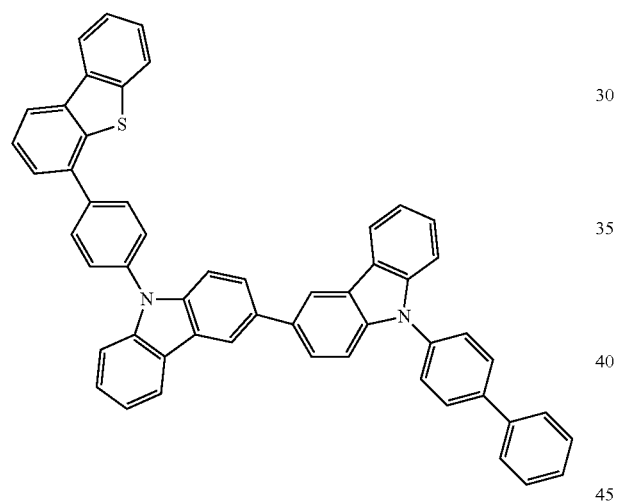
[CF Z-27]
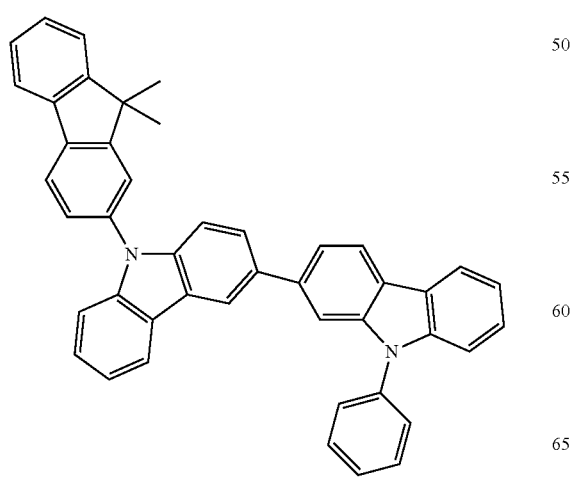
[CF Z-28]
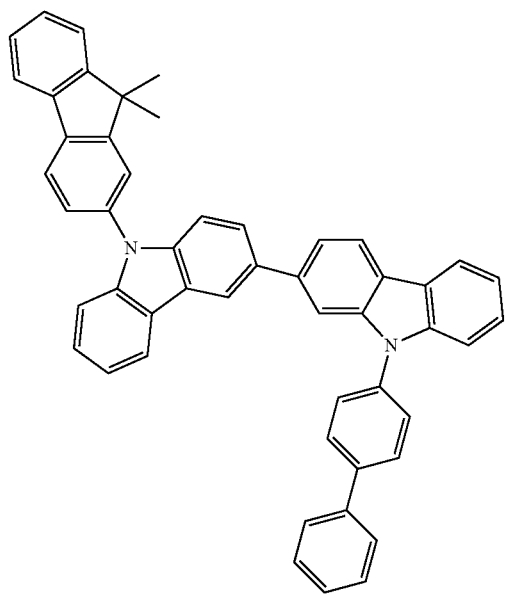
[CF Z-29]
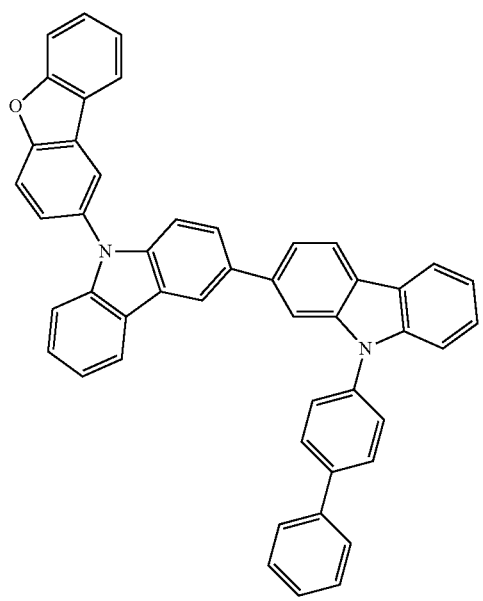

[CF Z-30]
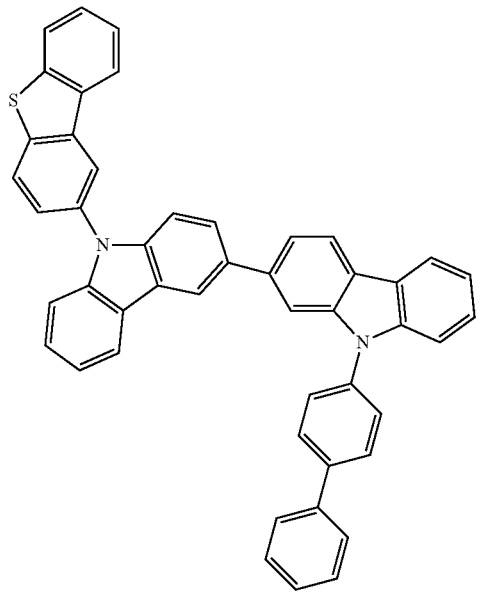
[CF Z-31]
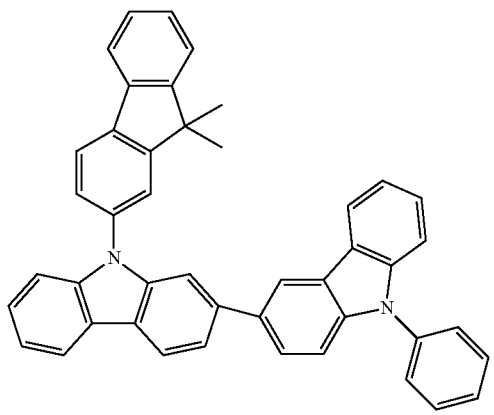
[CF Z-32]
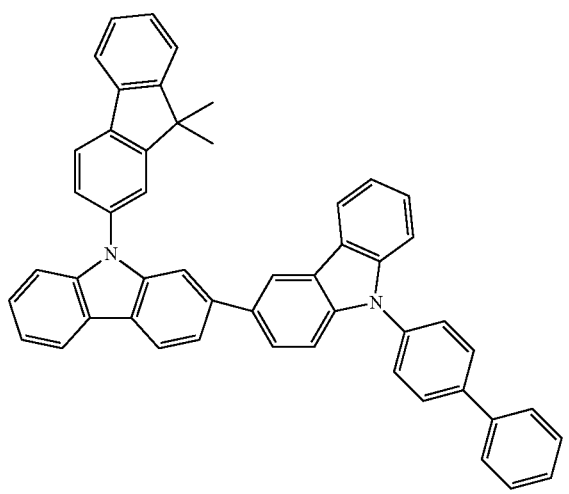
[CF Z-33]
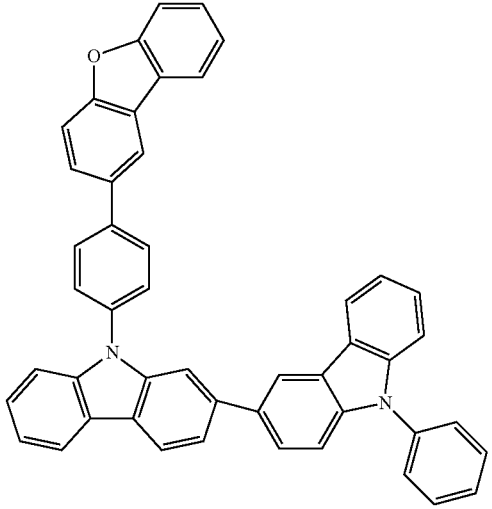
[CF Z-34]
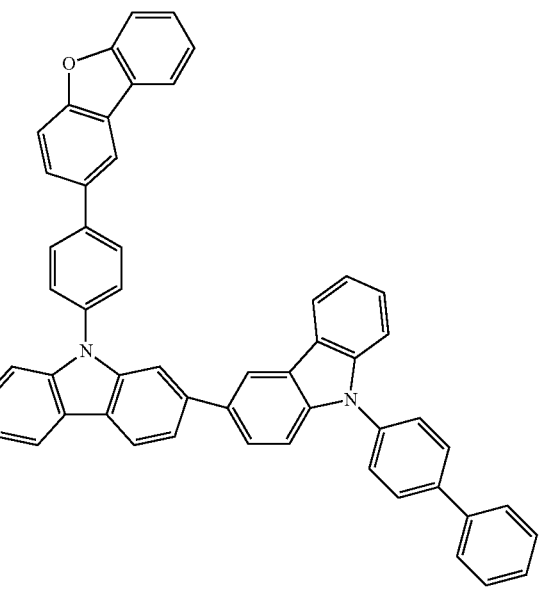
[CF Z-35]
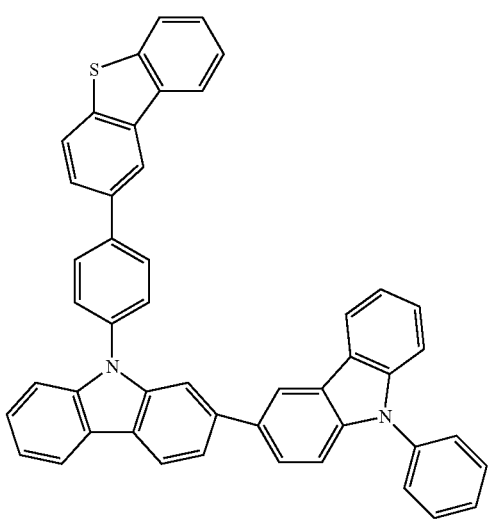

[CF Z-36]
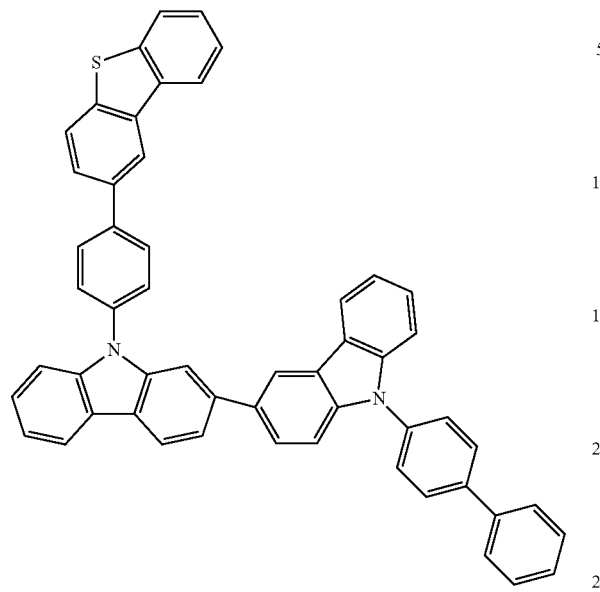
[CF Z-38]
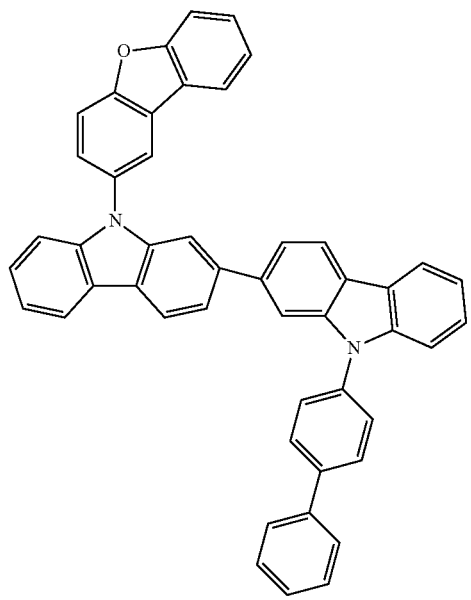
[CF Z-37]
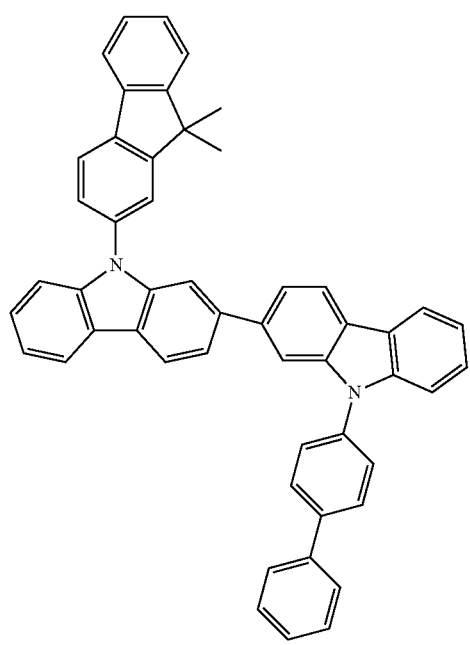
[CF Z-39]
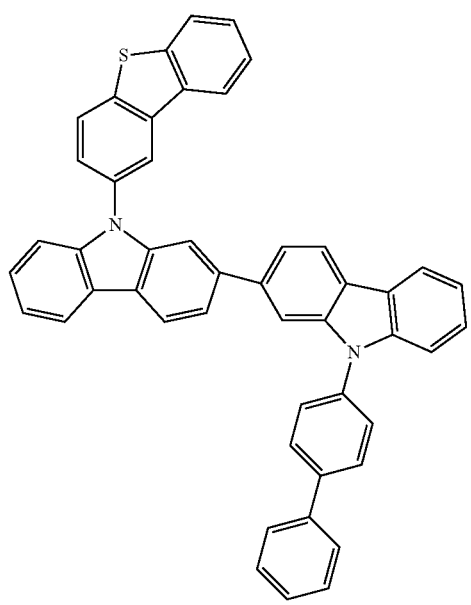

The compound represented by CF 1 may be represented by one or more of the following CF 6 to 37:
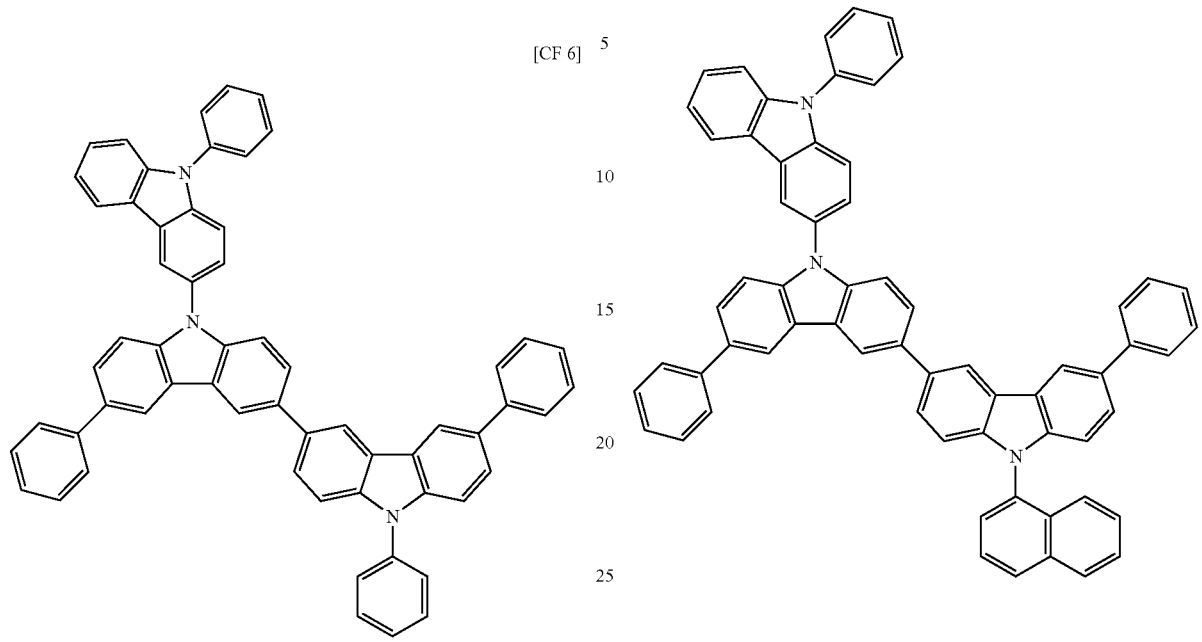
[CF 6]
[CF 8]
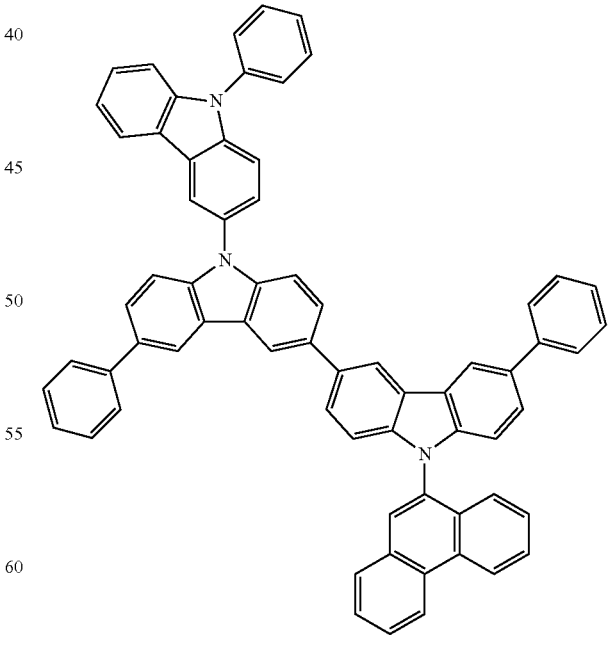
[CF 7]
[CF 9]

[CF 10]
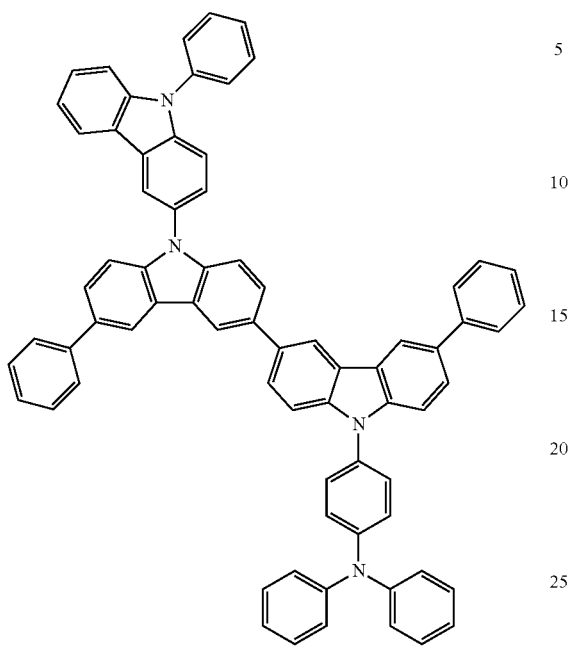
[CF 12]
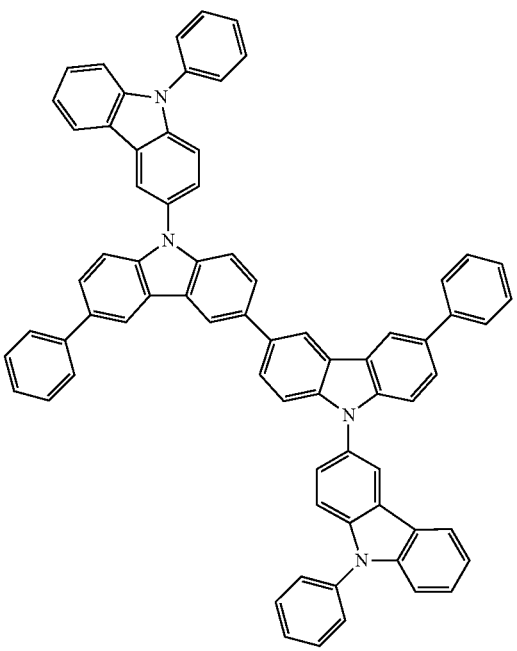
[CF 11]
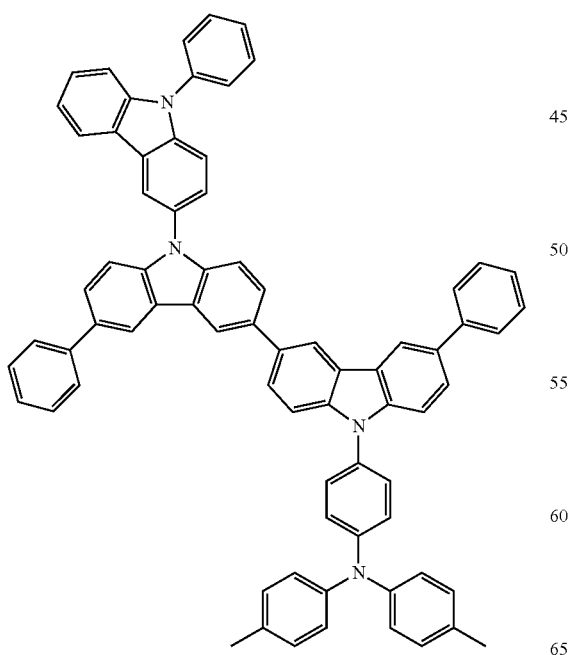
[CF 13]

[CF 14]
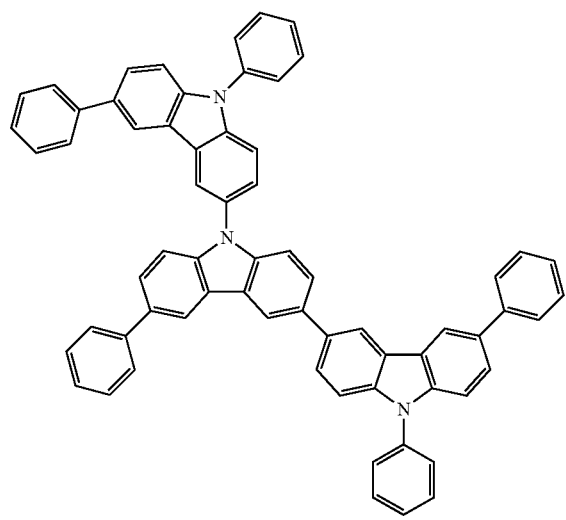
[CF 16]
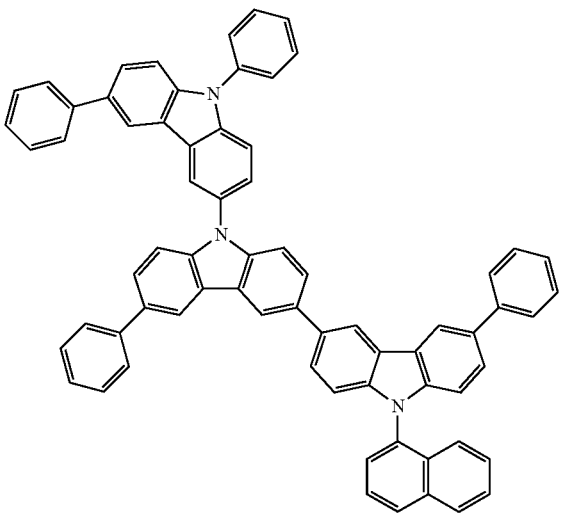
[CF 15]
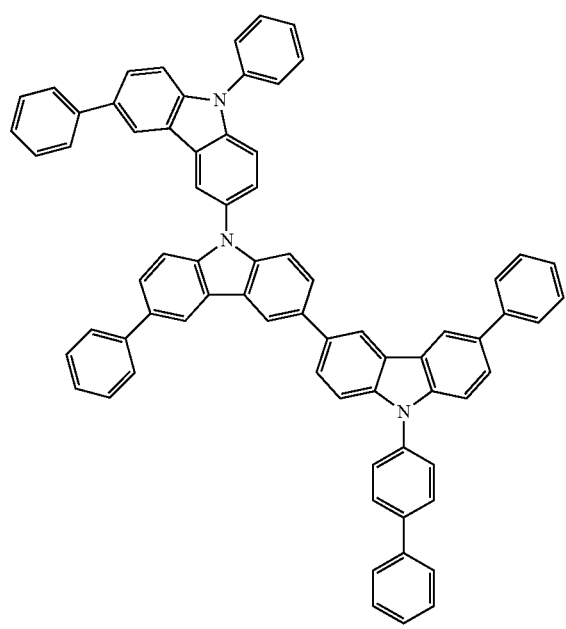
[CF 17]
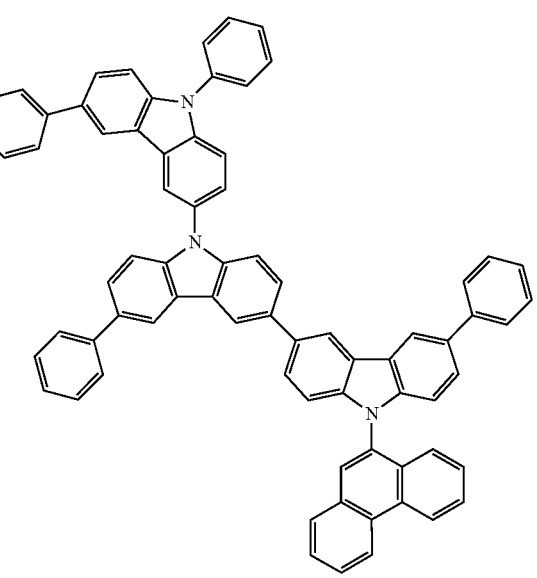

[CF 18]
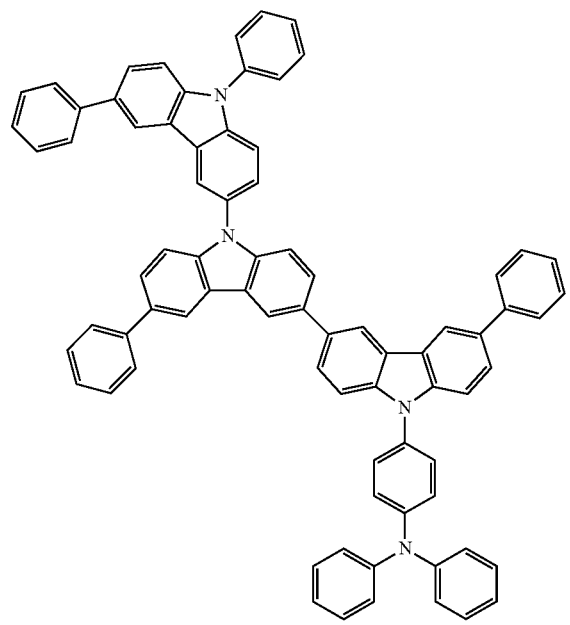
[CF 20]
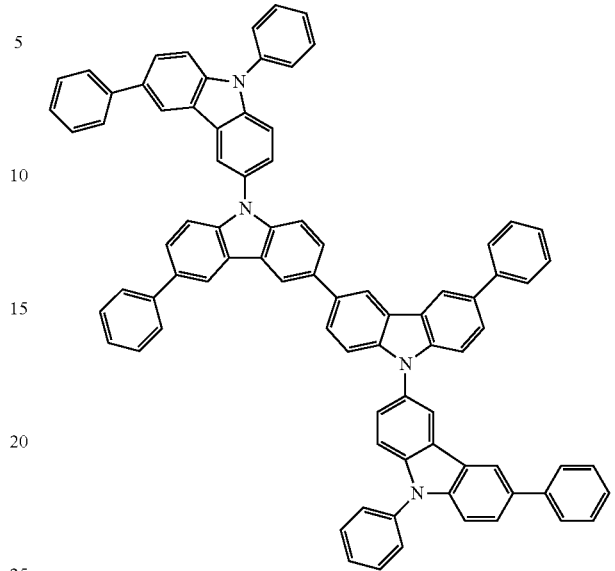
[CF 19]
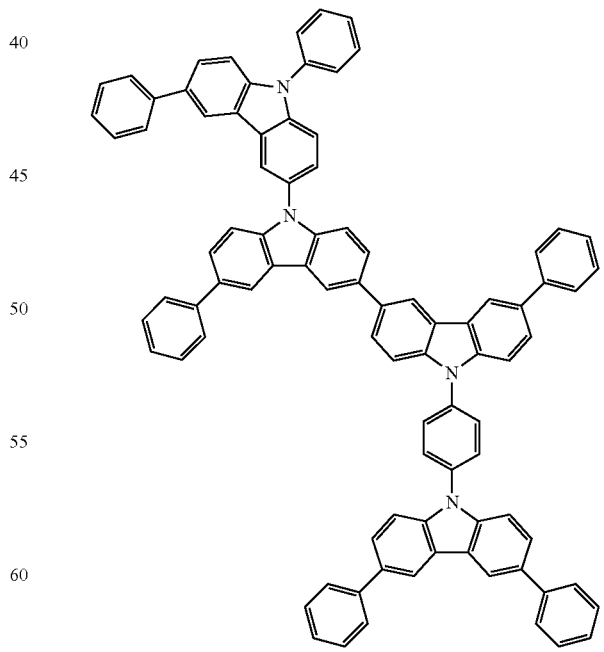
[CF 21]

[CF 22]
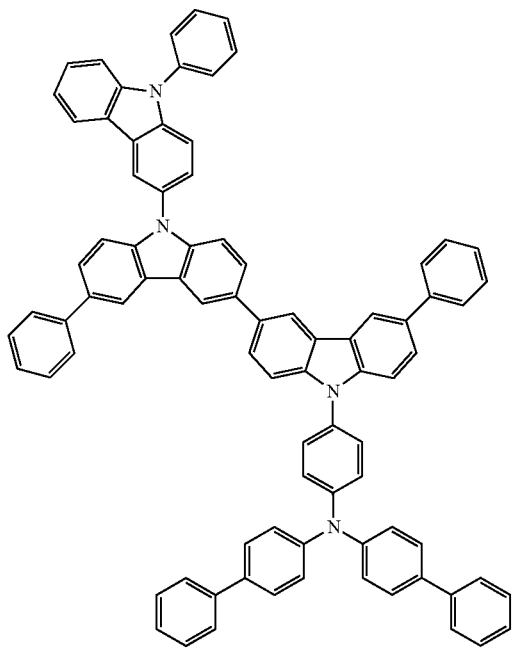
[CF 24]
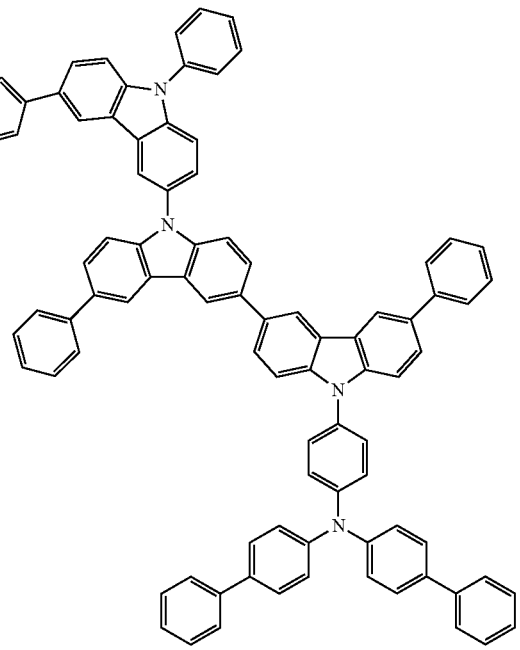
[CF 23]
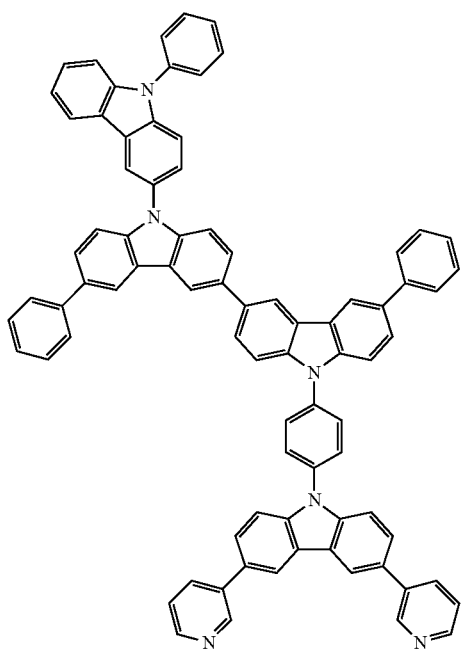
[CF 25]
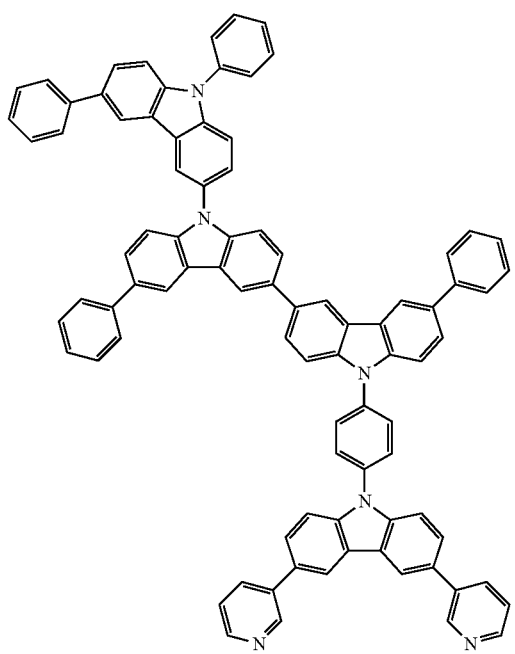

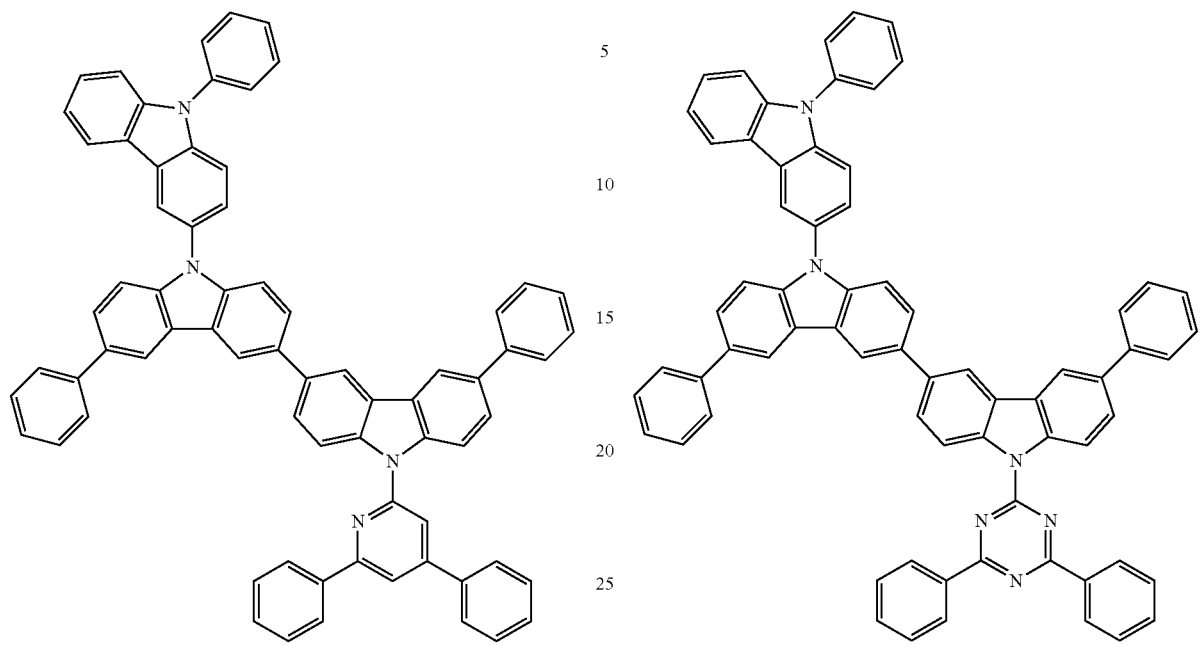
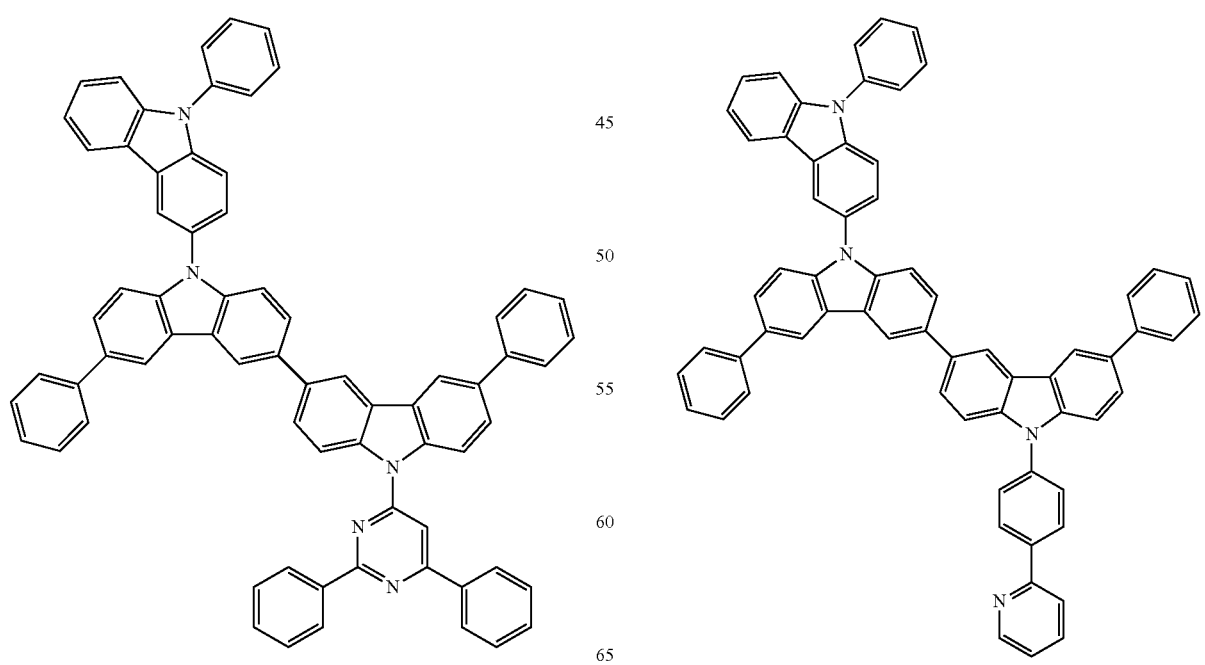

[CF 30]
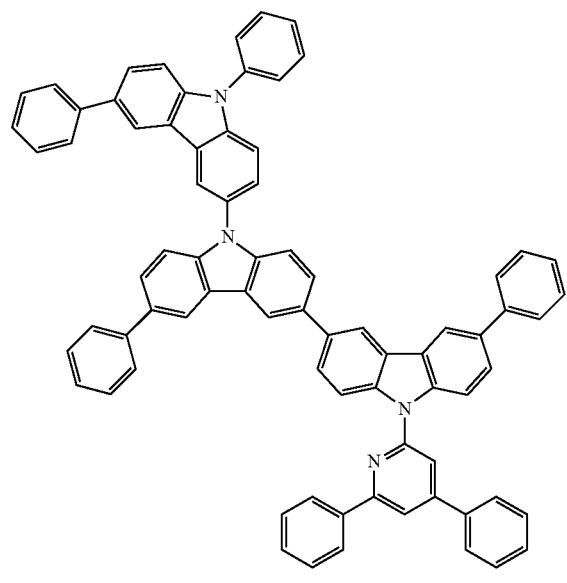
[CF 32]
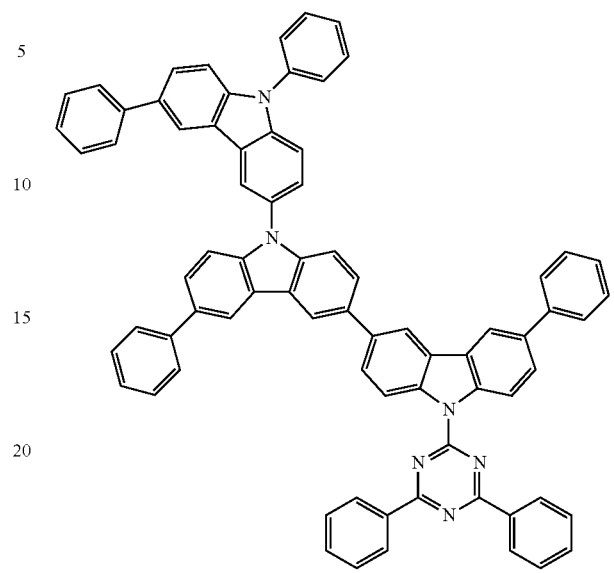
[CF 31]
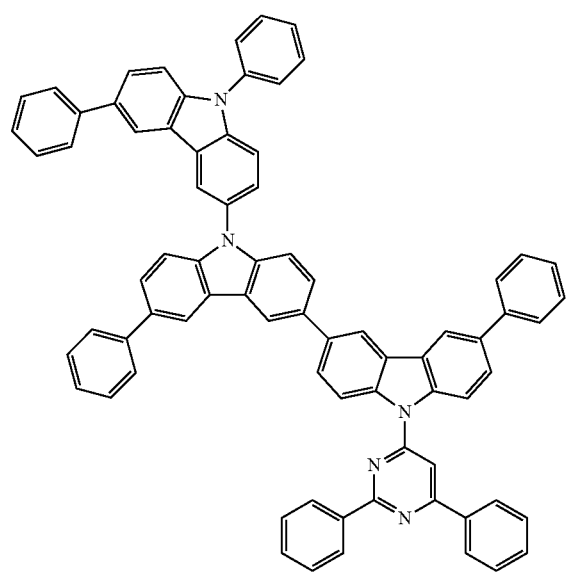
[CF 33]
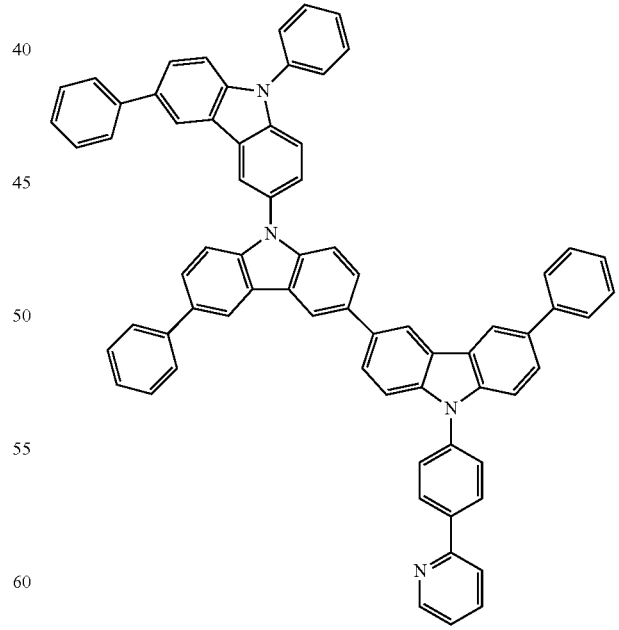

[CF 34]
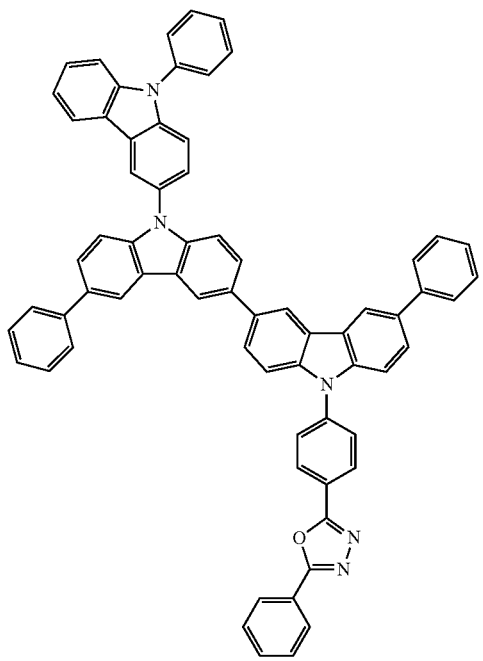
[CF 36]
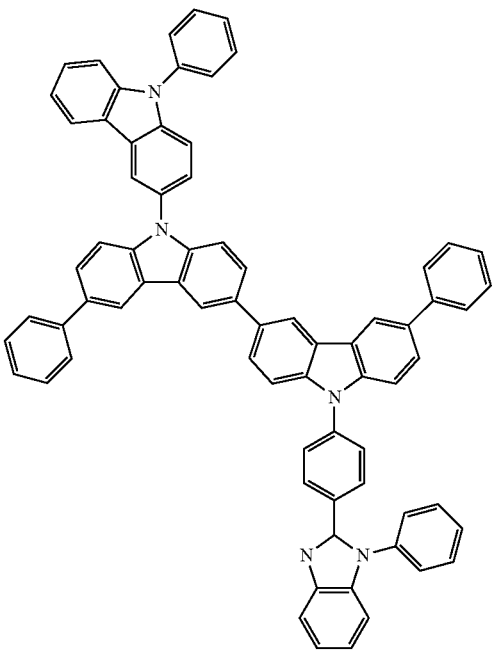
[CF 35]
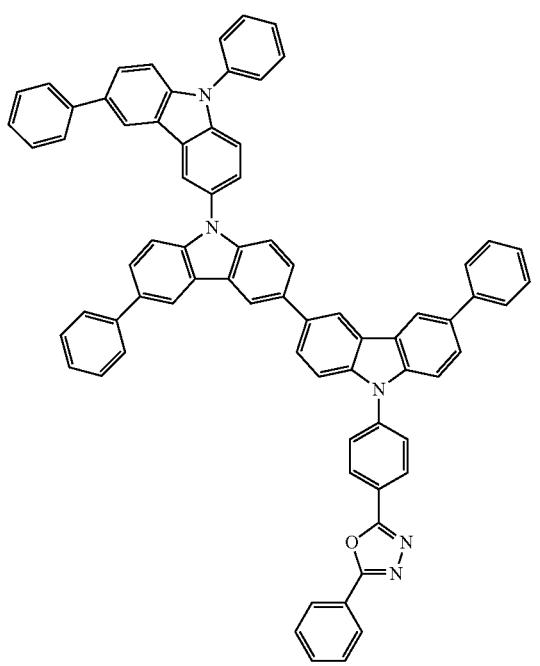
[CF 37]
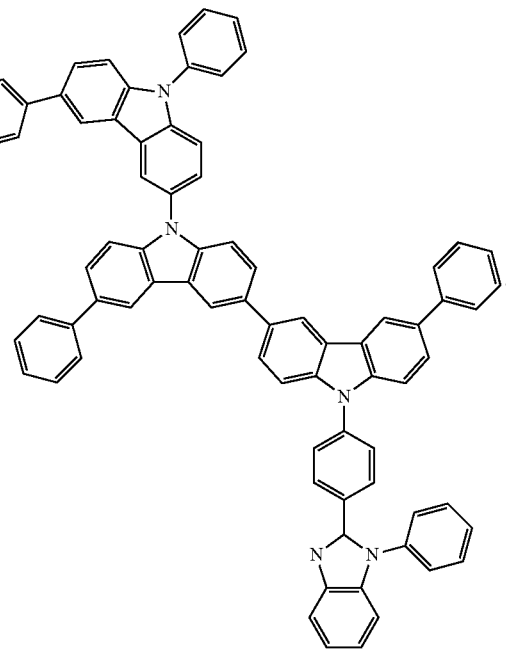

The compound represented by CF 1 may be represented by one or more of the following CF 38 and 42 to 72.
[CF 38]
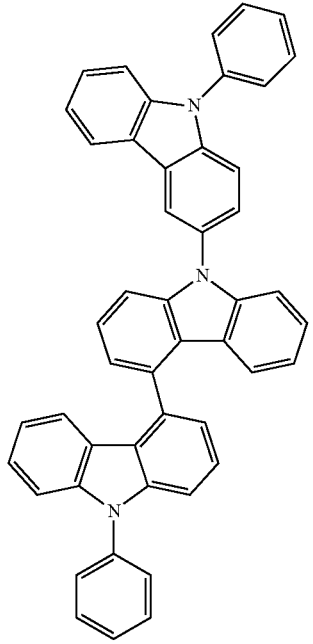
[CF 42]
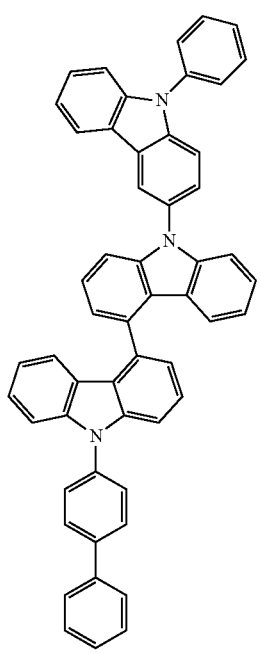
[CF 43]
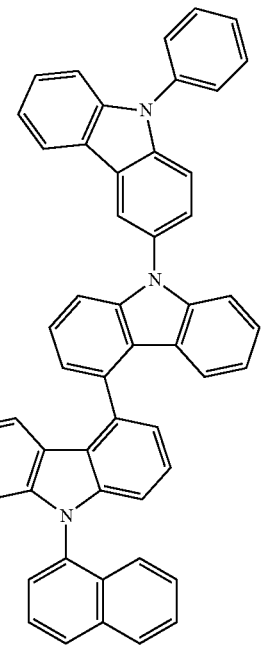
[CF 44]
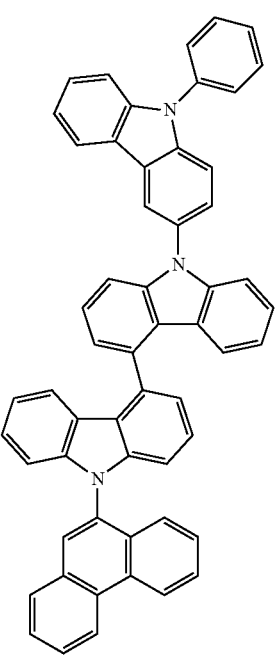

[CF 45]
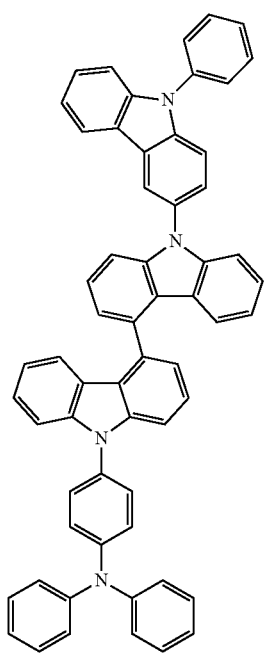
[CF 46]
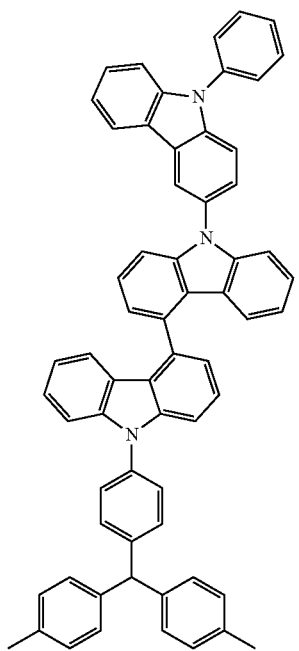
[CF 47]
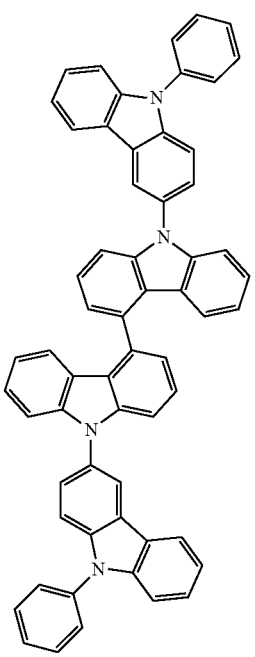
[CF 48]
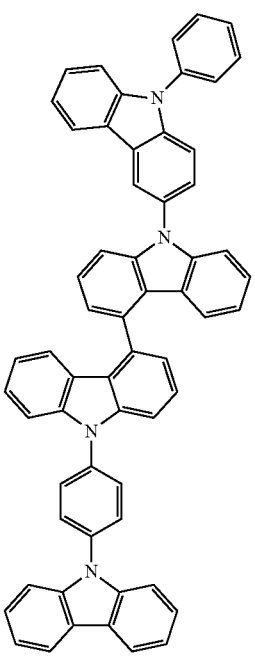

[CF 49]
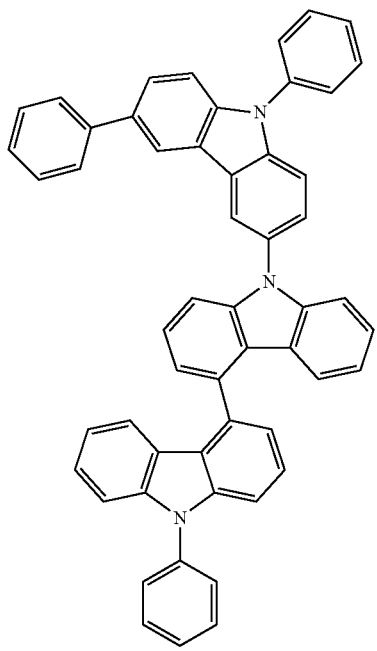
[CF 50]
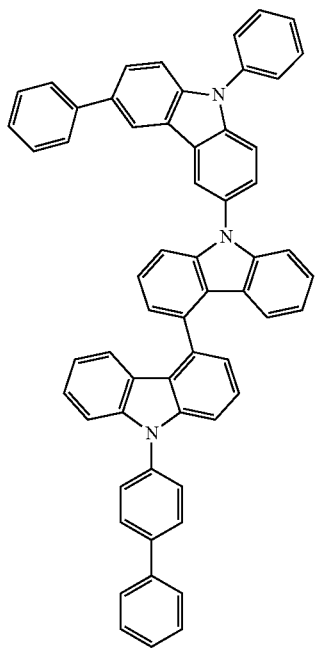
[CF 51]
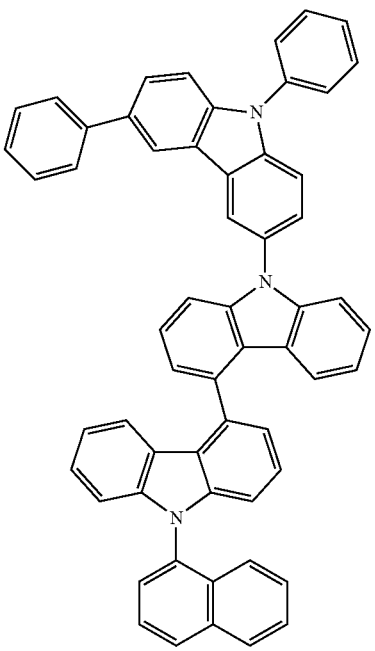
[CF 52]
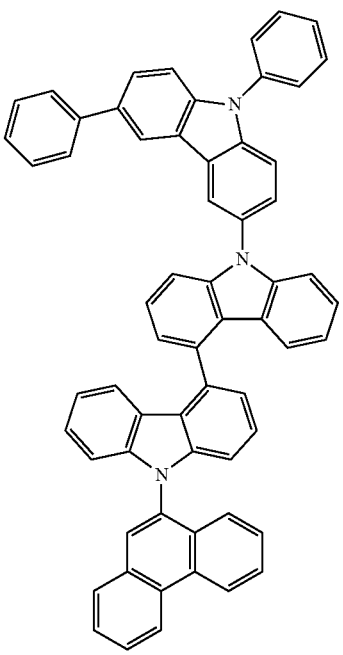

[CF 53]
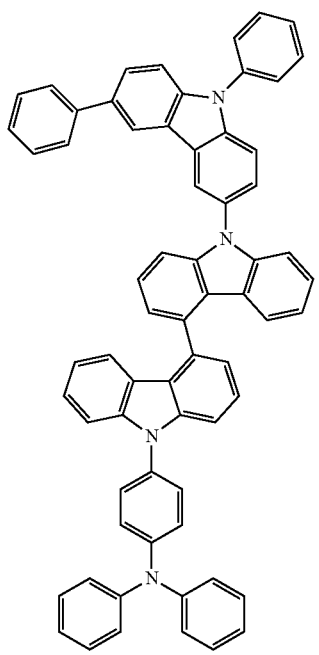
[CF 54]
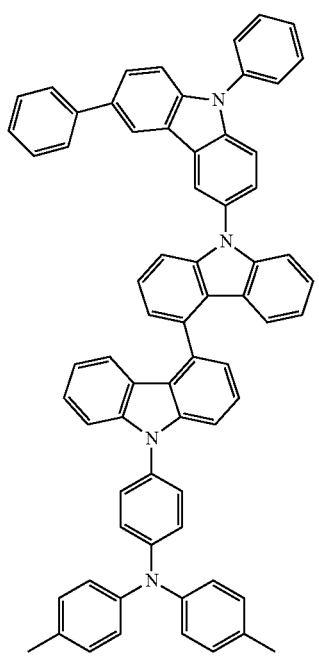
[CF 55]
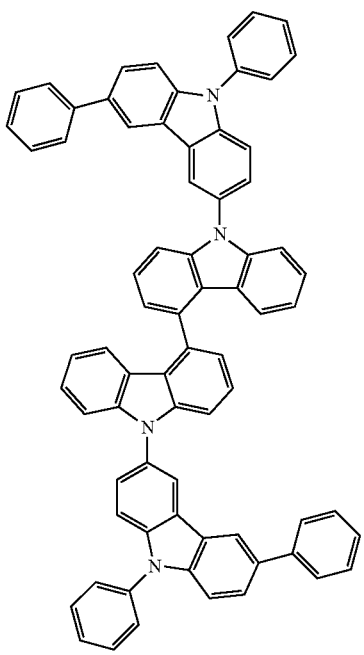
[CF 56]
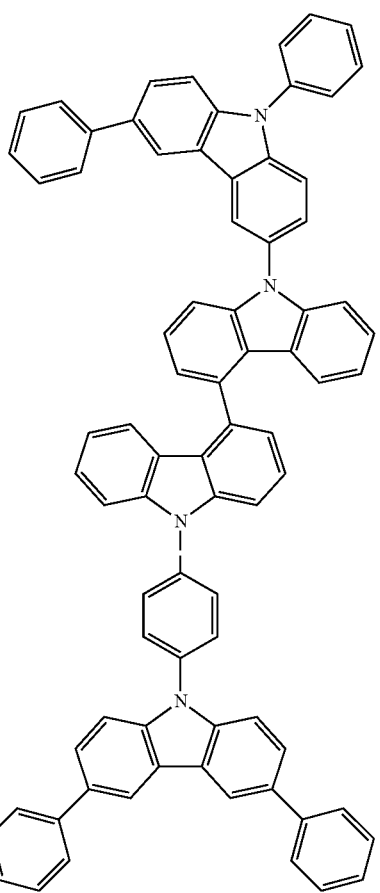

[CF 57]
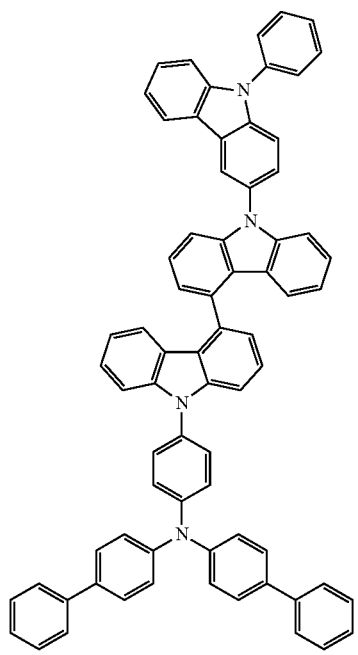
[CF 59]
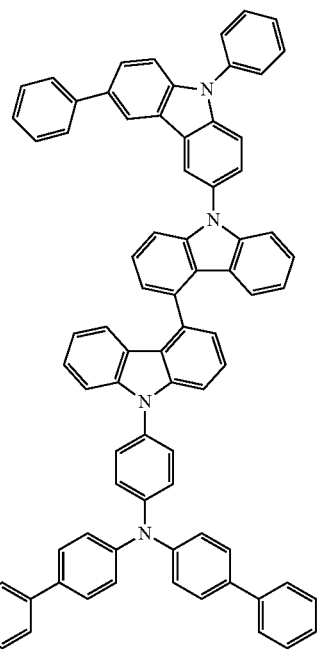
[CF 58]
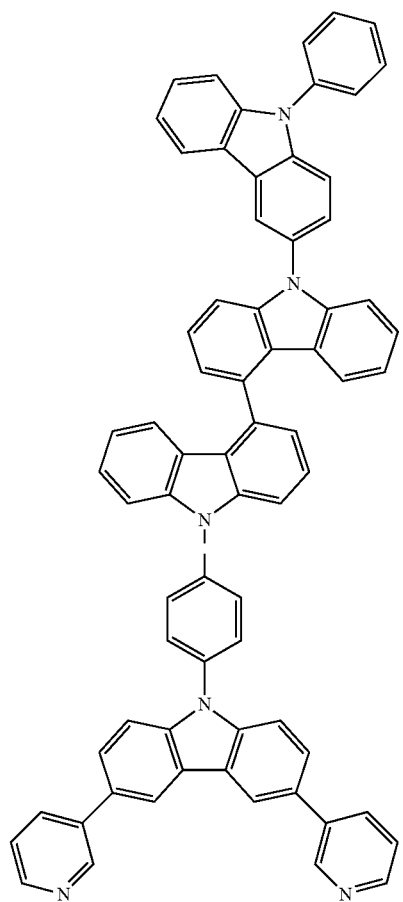
[CF 60]
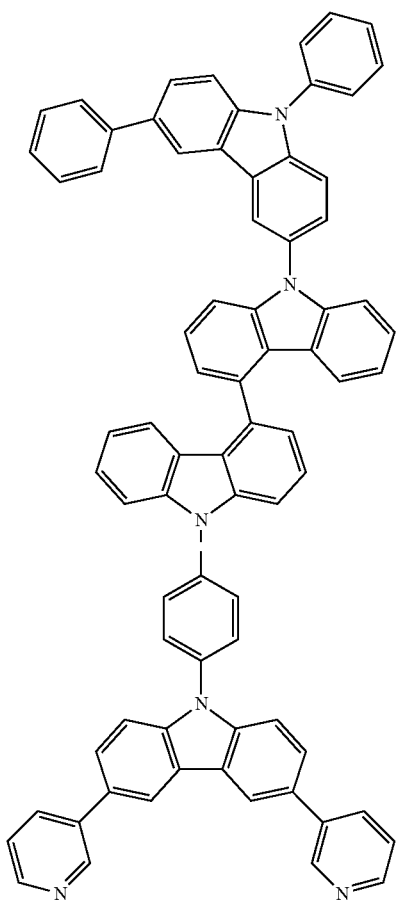

[CF 61]
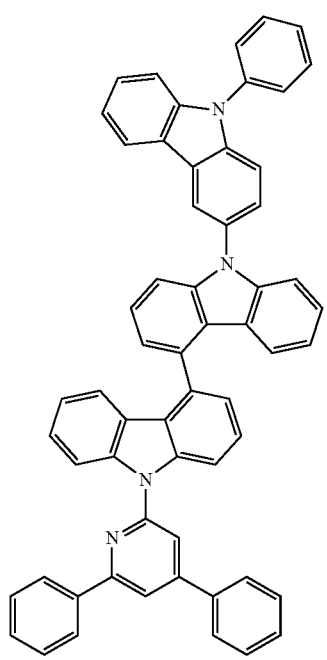
[CF 62]
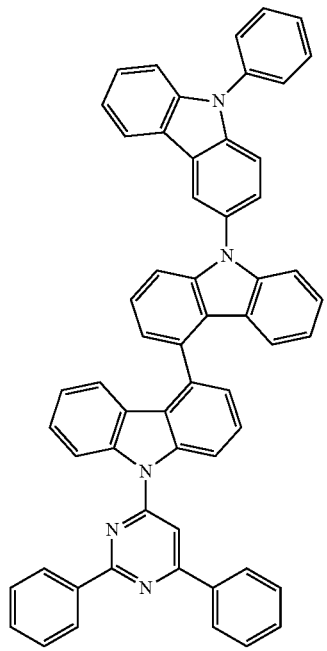
[CF 63]
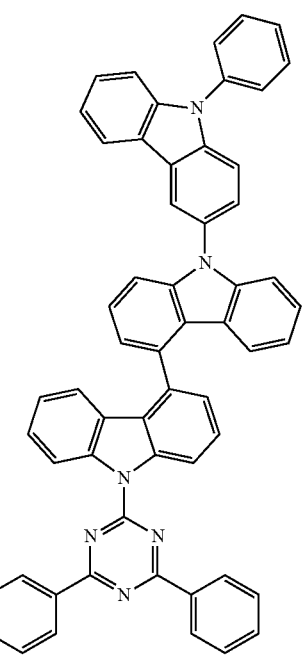
[CF 64]
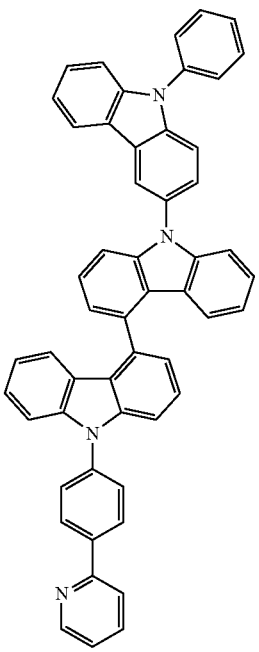

[CF 65]
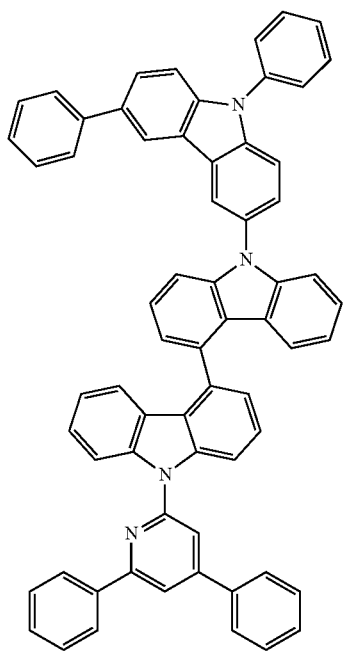
[CF 67]
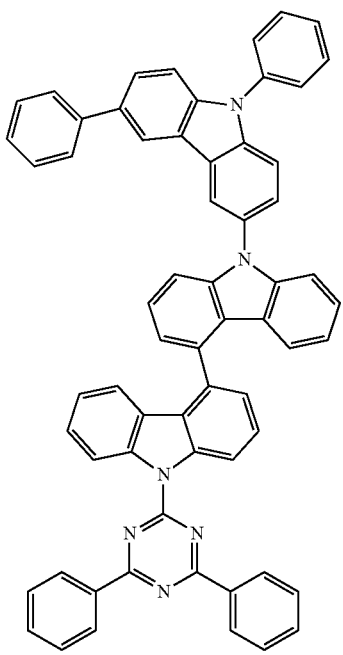
[CF 66]
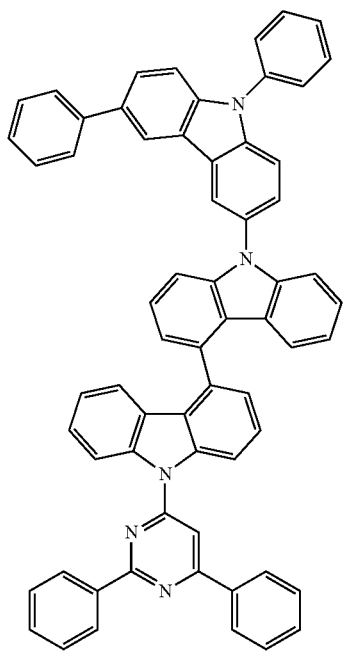
[CF 68]
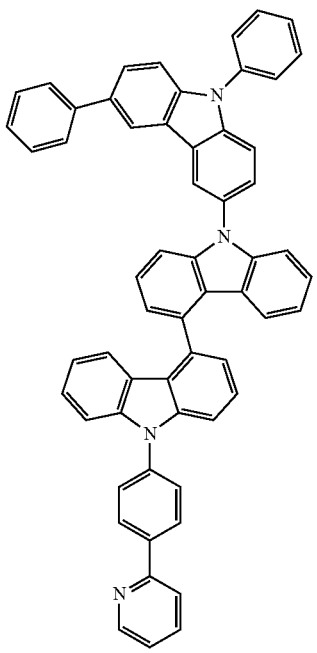

[CF 69]
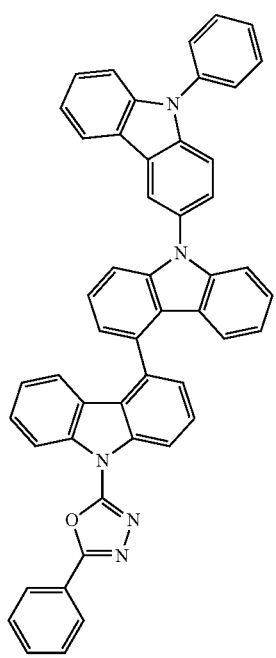
[CF 70]
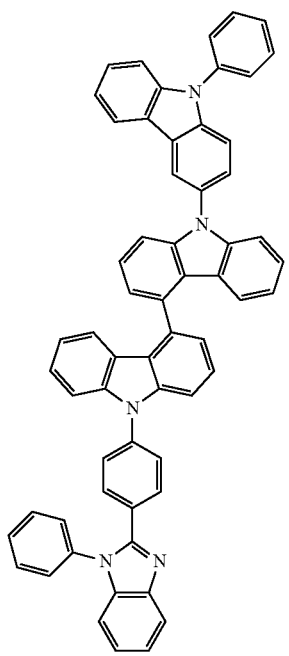
[CF 71]
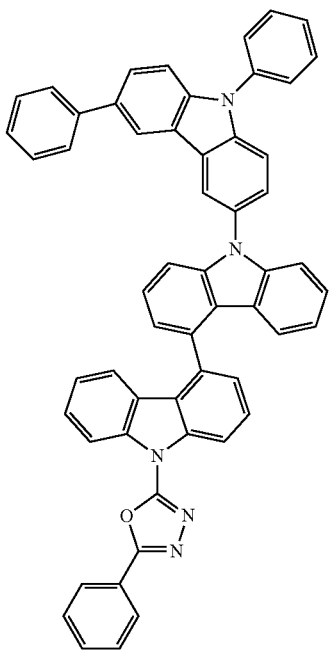
[CF 72]
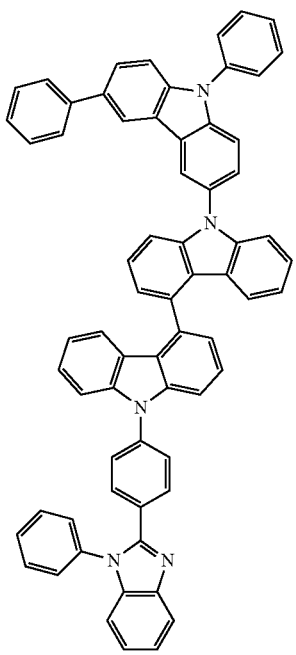

The compound represented by CF 1 may be represented by one or more of the following CF 73 to 83.
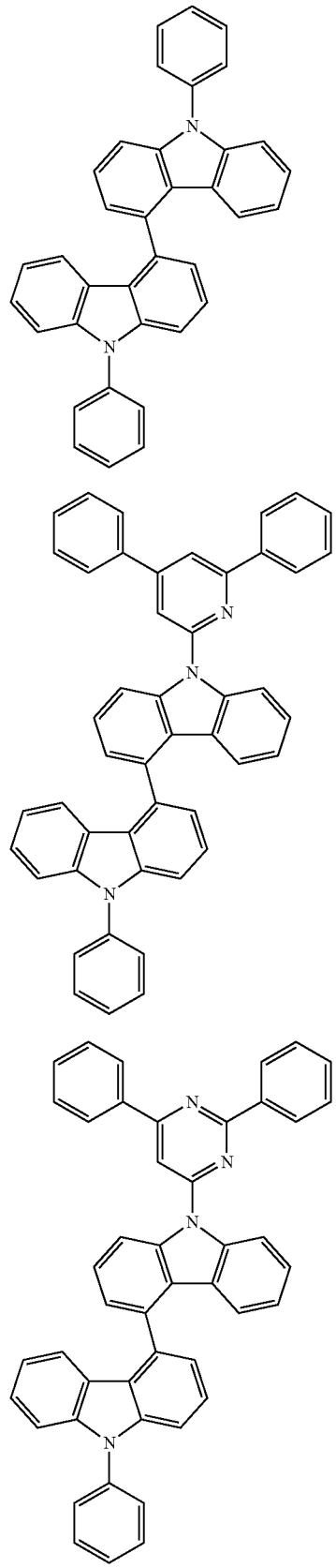
[CF 73]
[CF 74]
[CF 75]
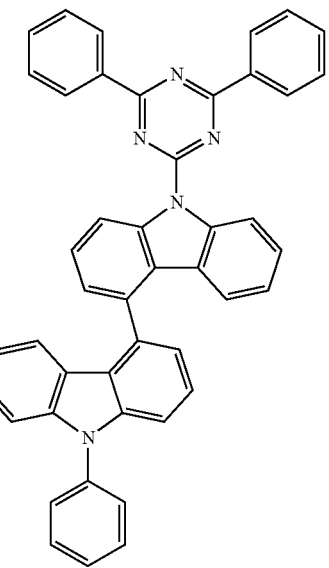
[CF 76]
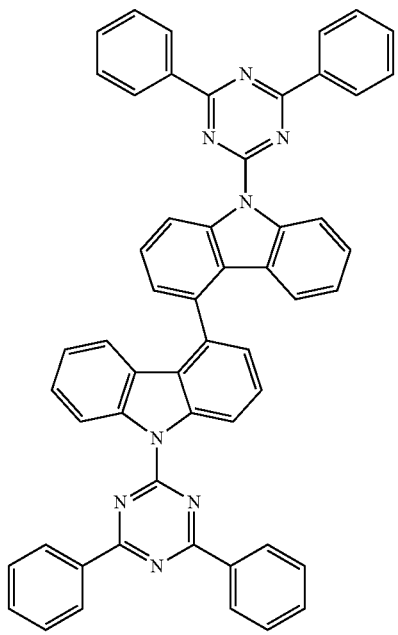
[CF 77]

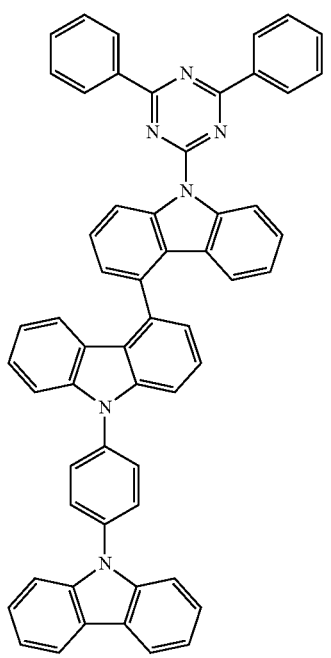
[CF 78]
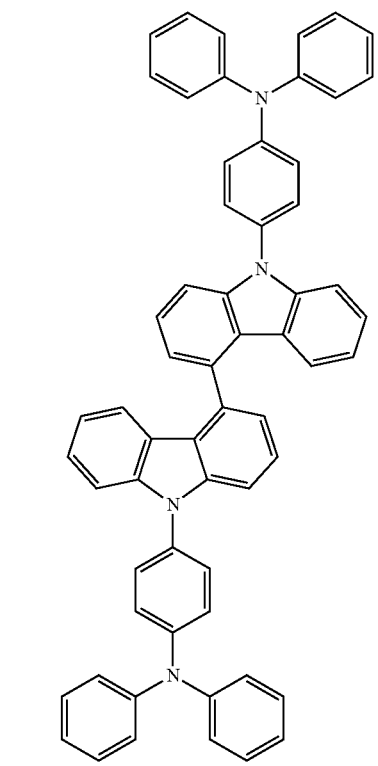
[CF 80]
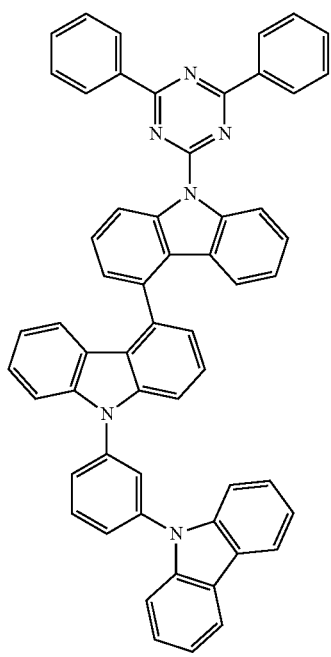
[CF 79]
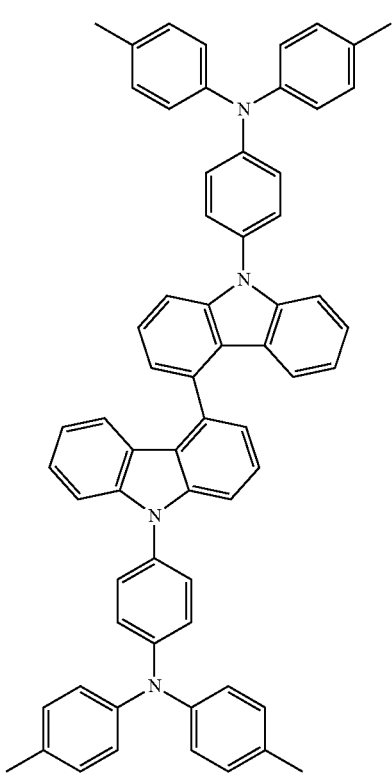
[CF 81]

[CF 82]
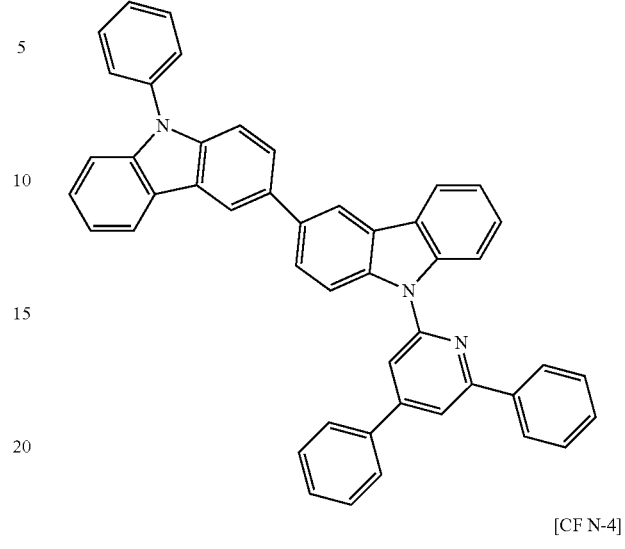
[CF N-3]
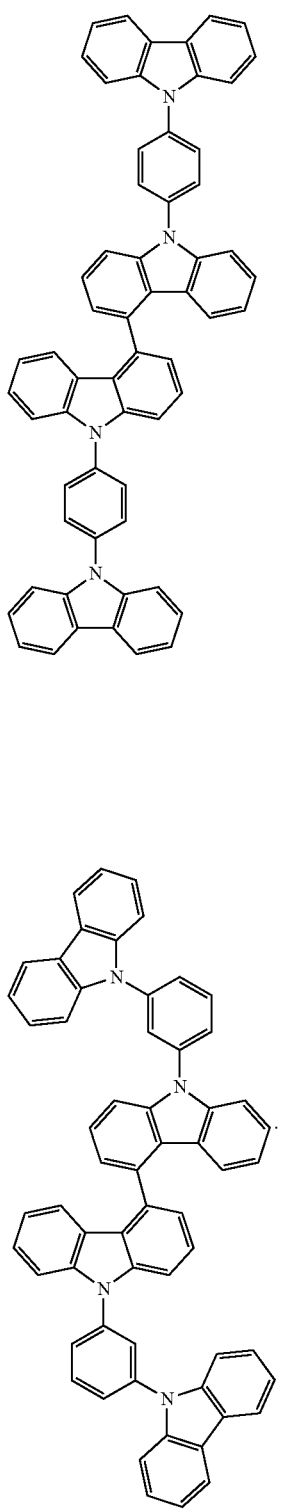
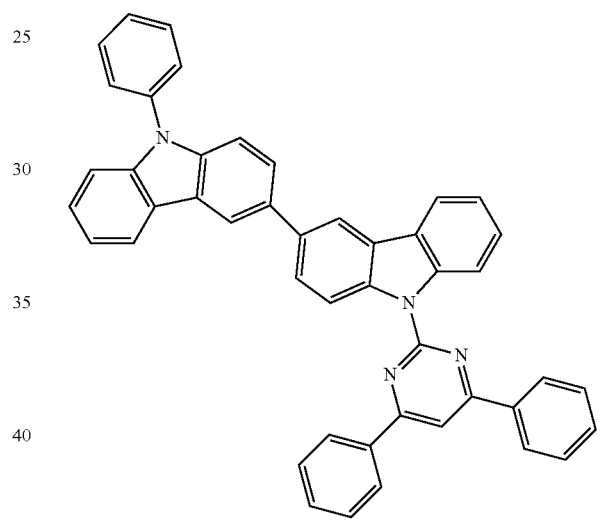
[CF N-4]
[CF 83]
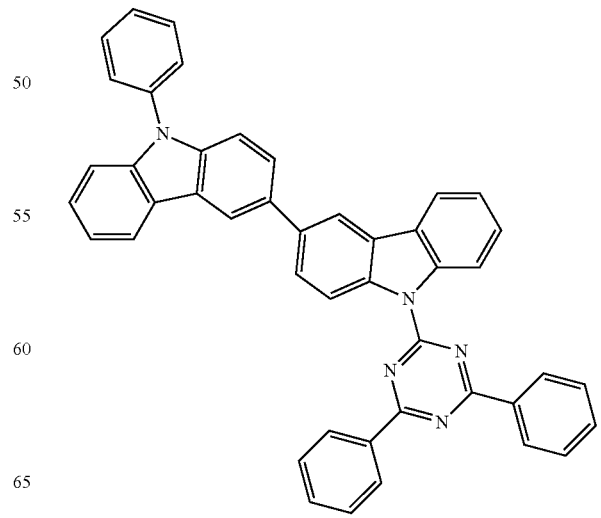
[CF N-5]
The compound represented by CF 1 may be represented by one or more of the following CF N-3 to N-54, A-2 to A-26, B-3 to B-22, and C-1 to C-18:

[CF N-6]
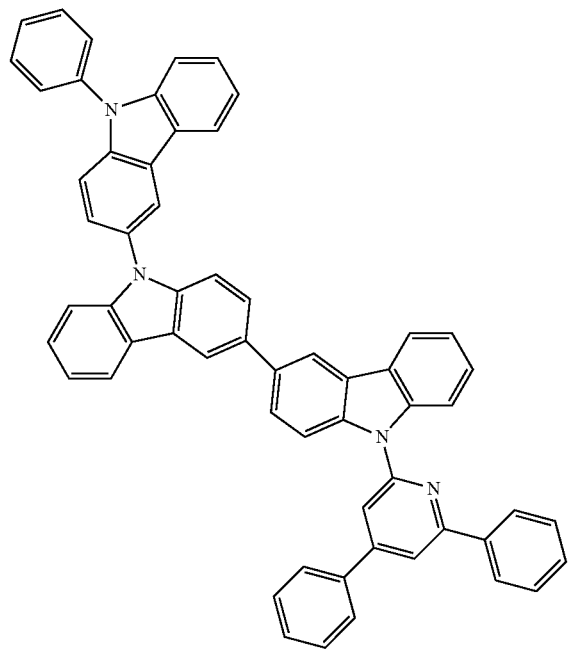
[CF N-8]
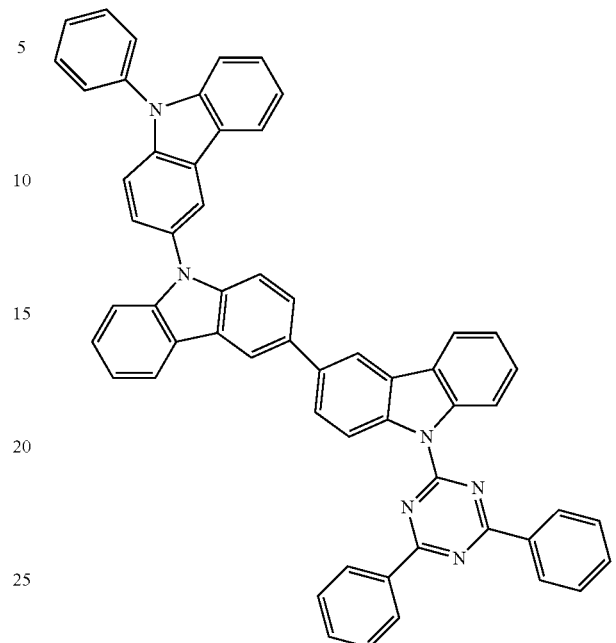
[CF N-7]
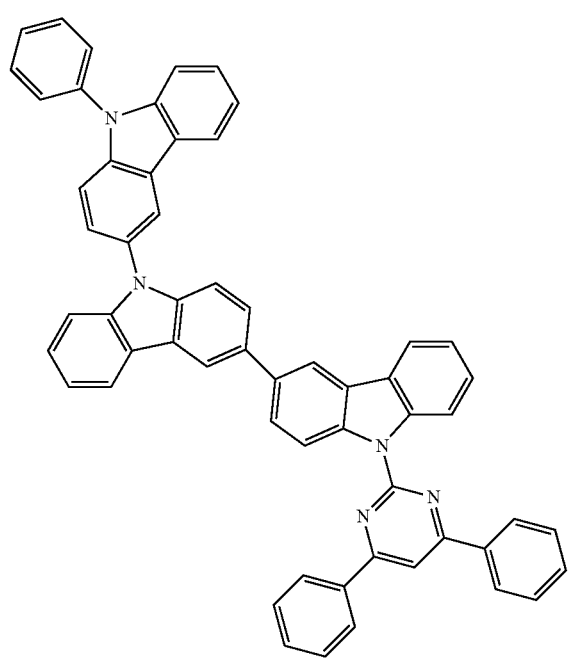
[CF N-9]
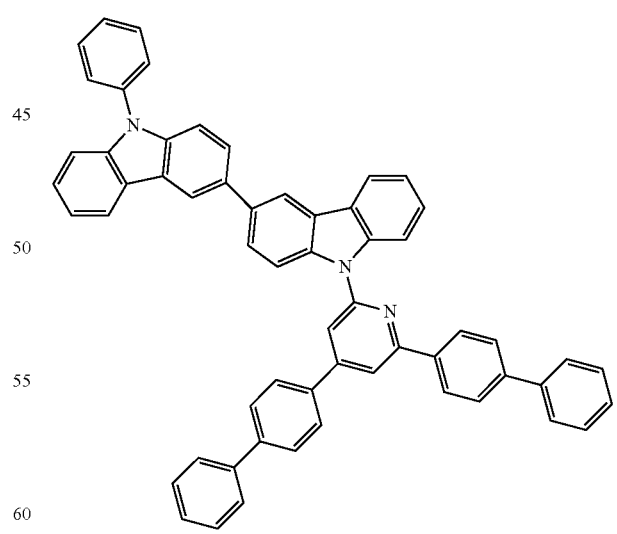

[CF N-10]
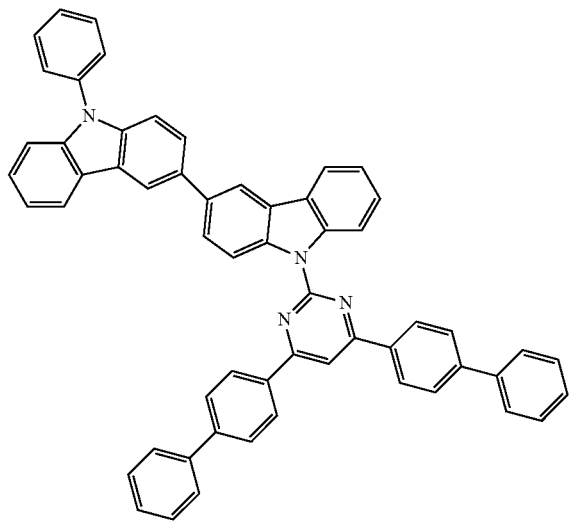
[CF N-11]
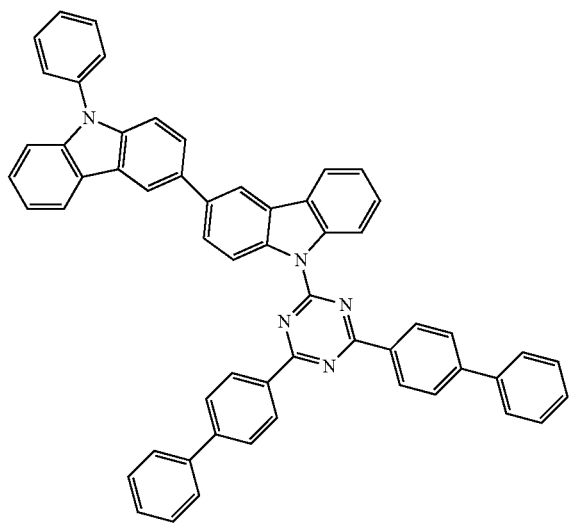
[CF N-12]
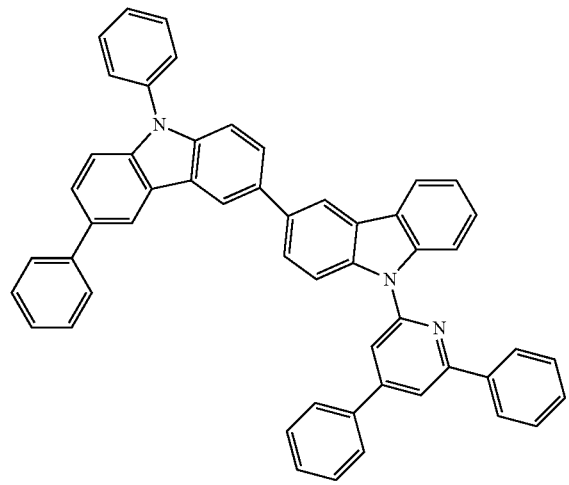
[CF N-13]
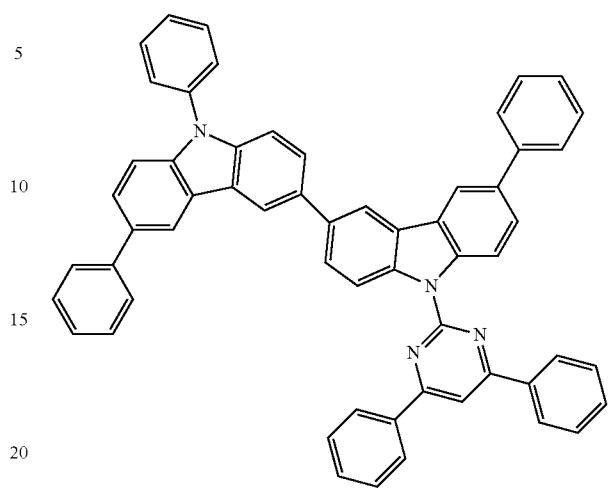
[CF N-14]
[CF N-15]
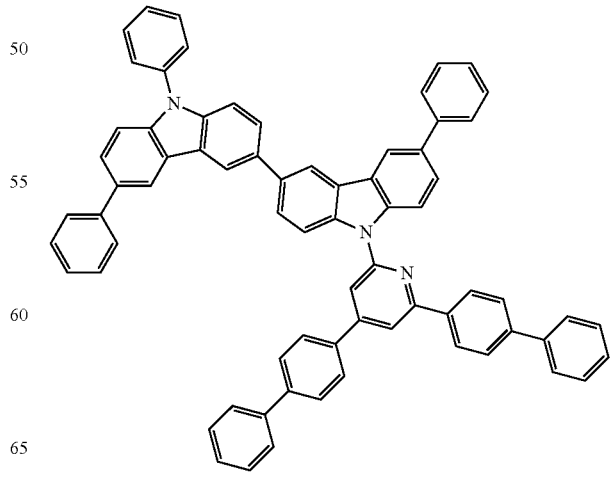

[CF N-16]
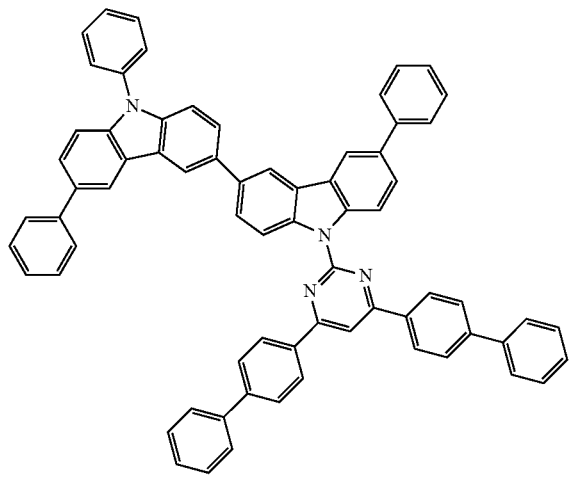
[CF N-17]
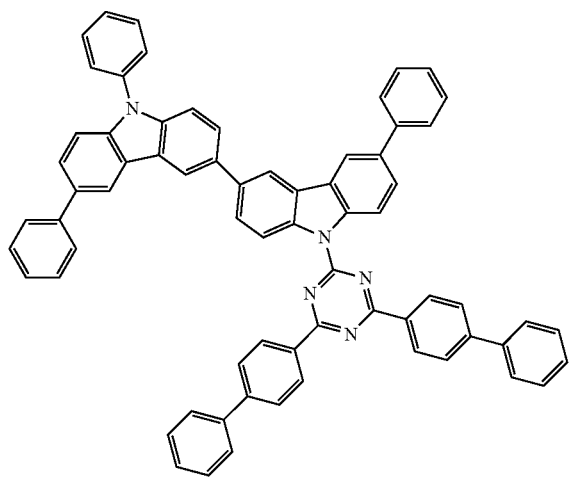
[CF N-18]
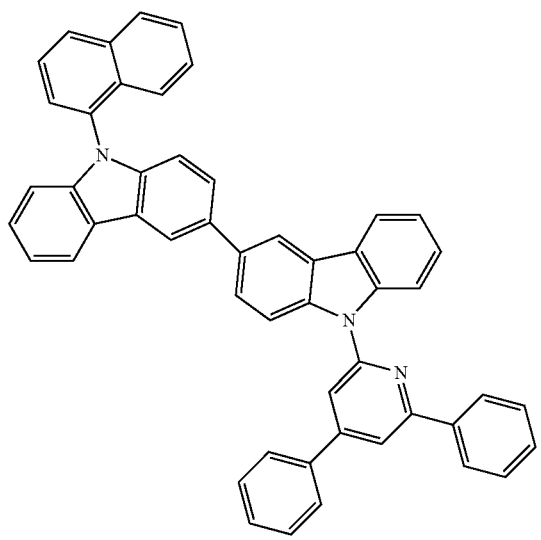
[CF N-19]
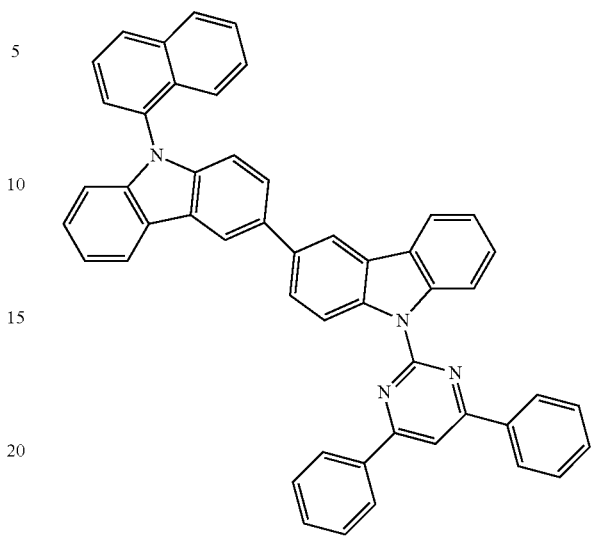
[CF N-20]
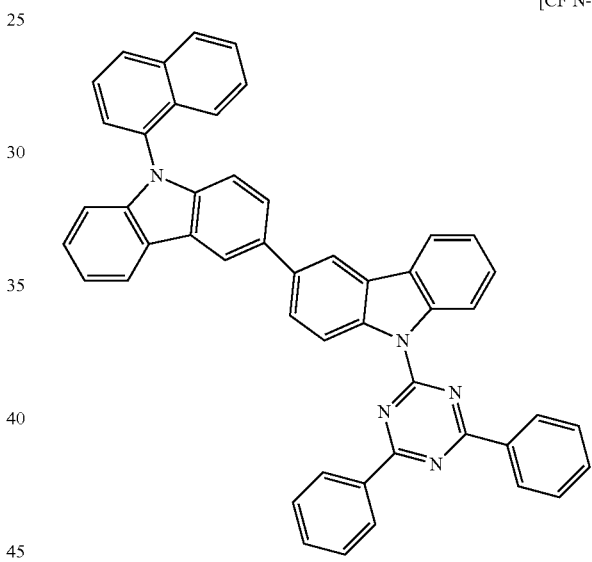
[CF N-21]
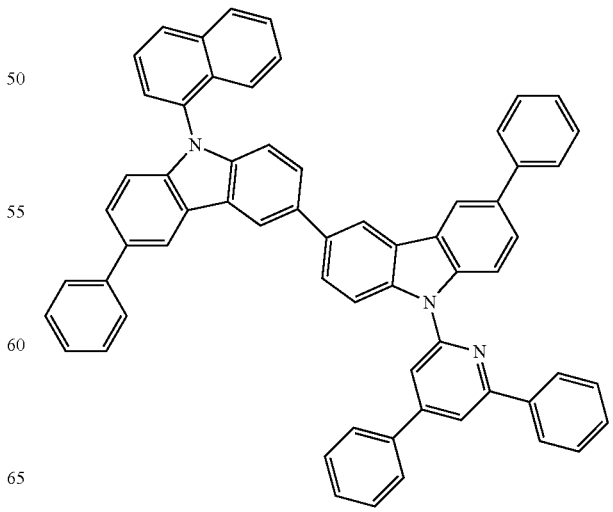

[CF N-22]
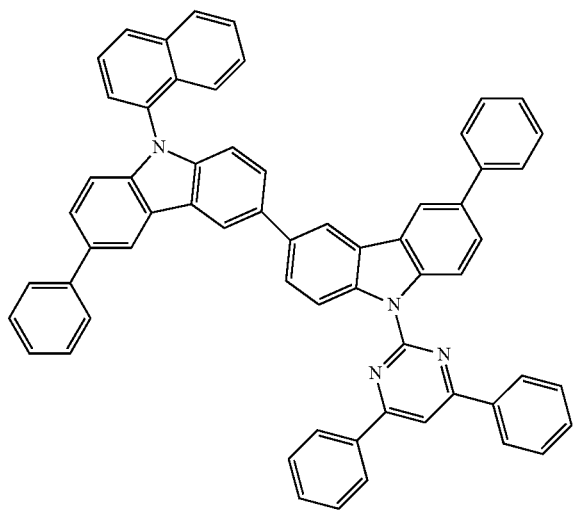
[CF N-23]
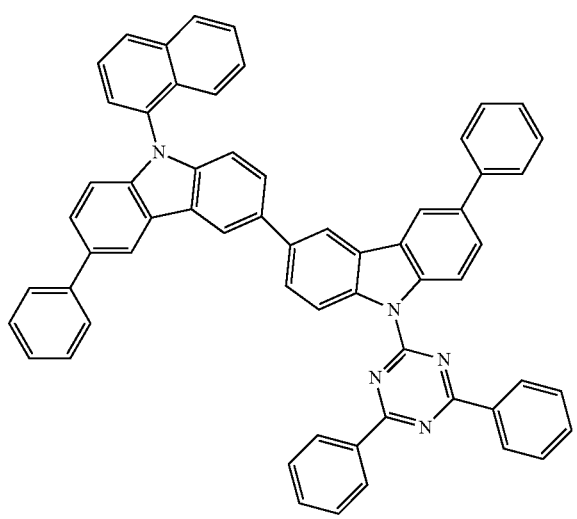
[CF N-24]
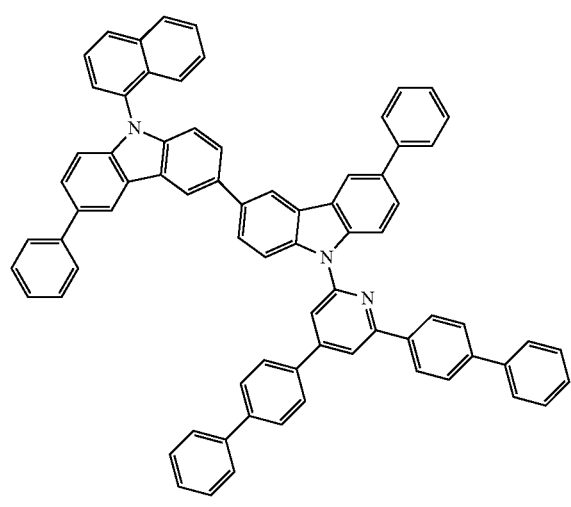
[CF N-25]
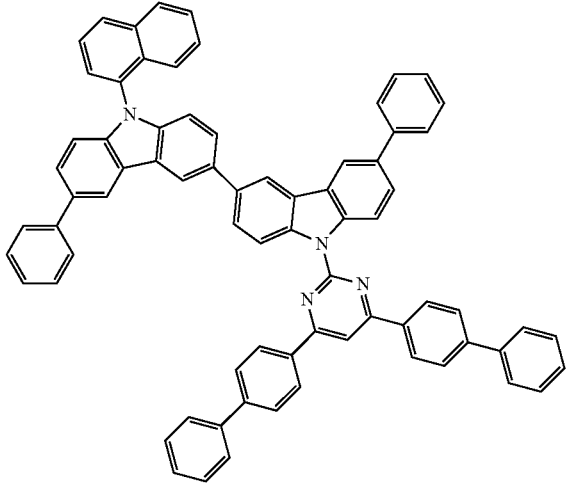
[CF N-26]
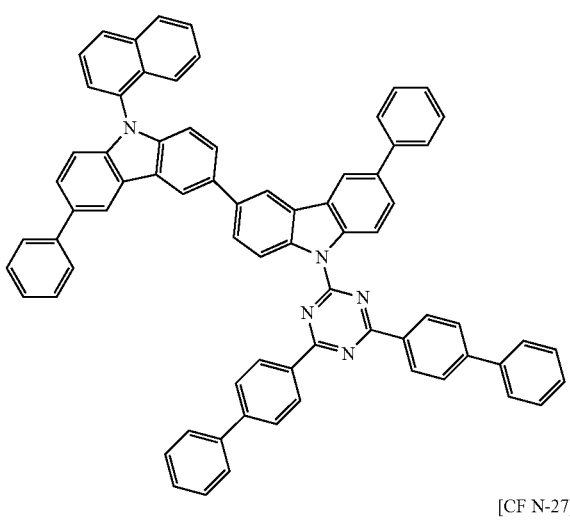
[CF N-27]
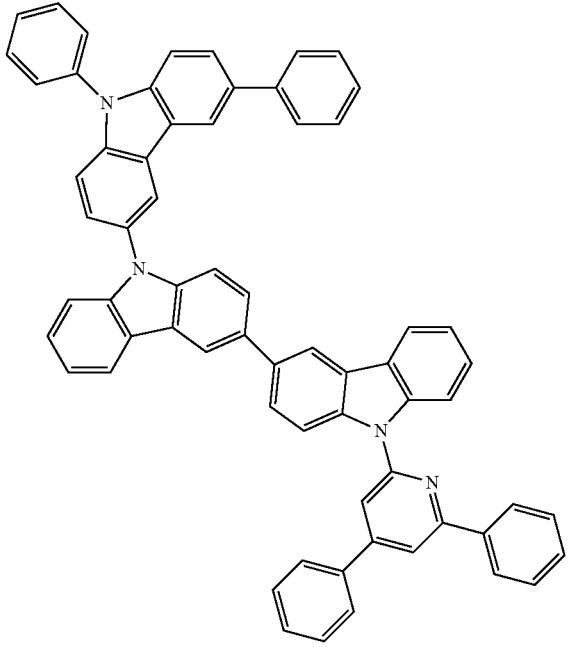

[CF N-28]
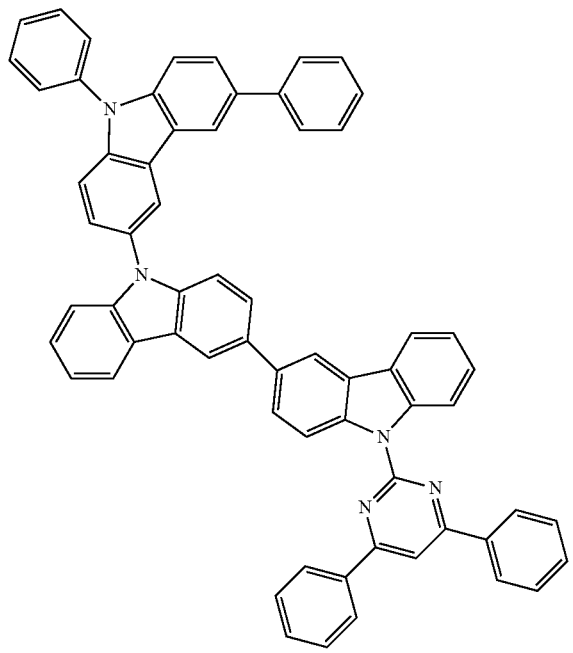
[CF N-30]
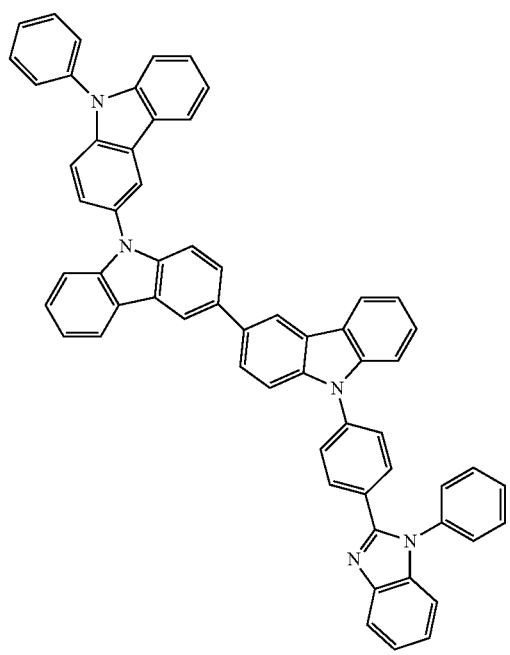
[CF N-29]
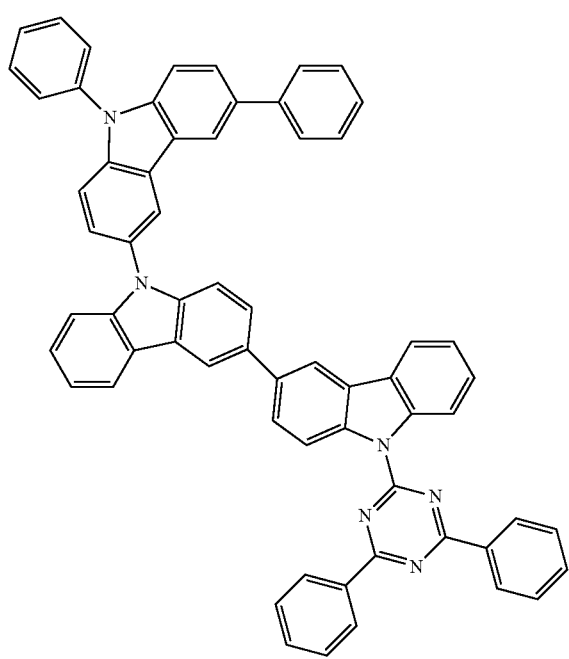
[CF N-31]
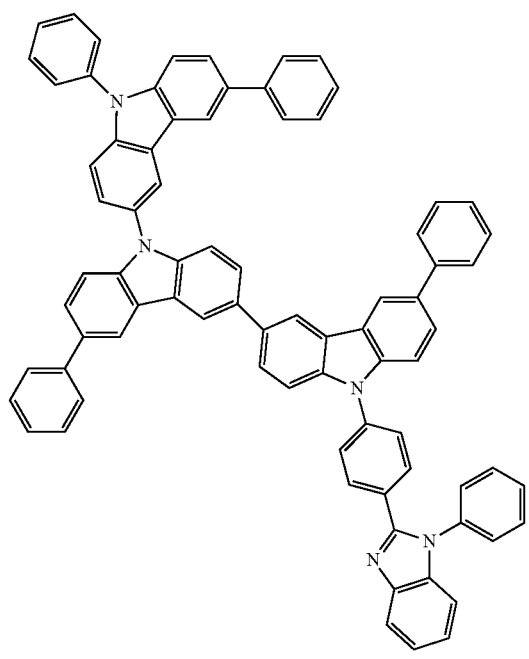

[CF N-32]
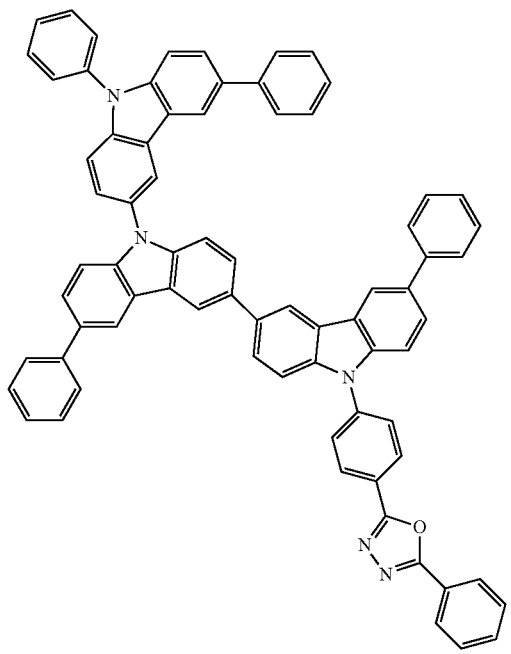
[CF N-34]
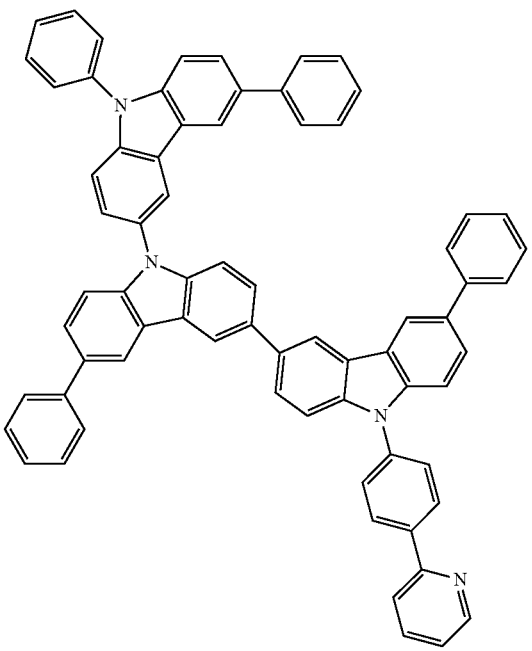
[CF N-33]
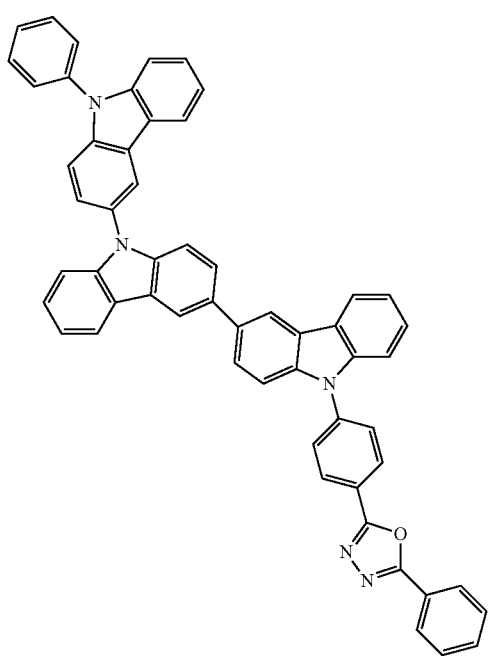
[CF N-35]
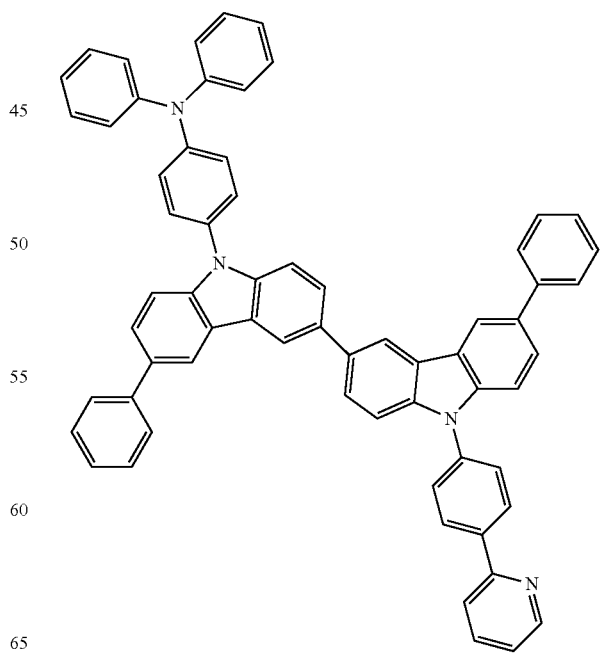

[CF N-36]
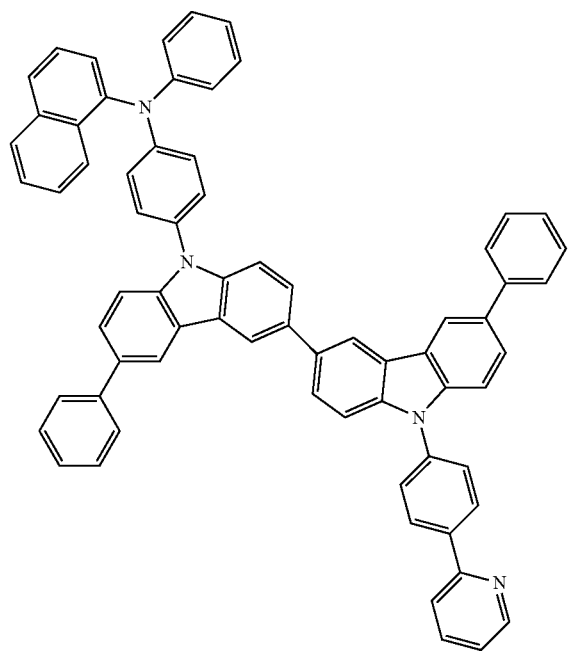
[CF N-38]
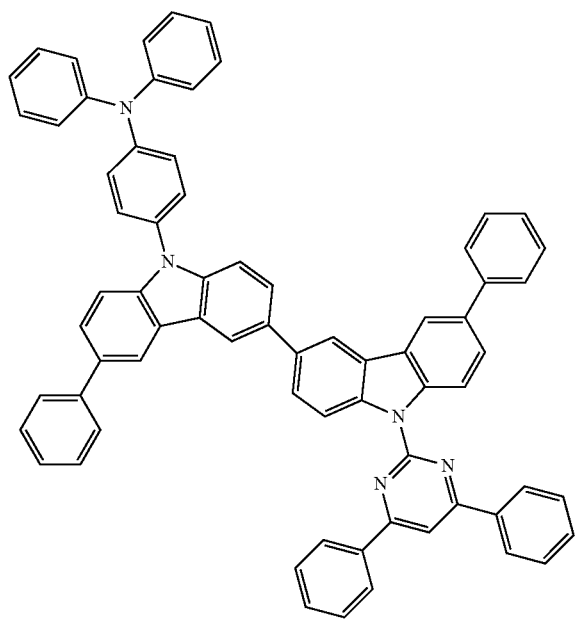
[CF N-37]
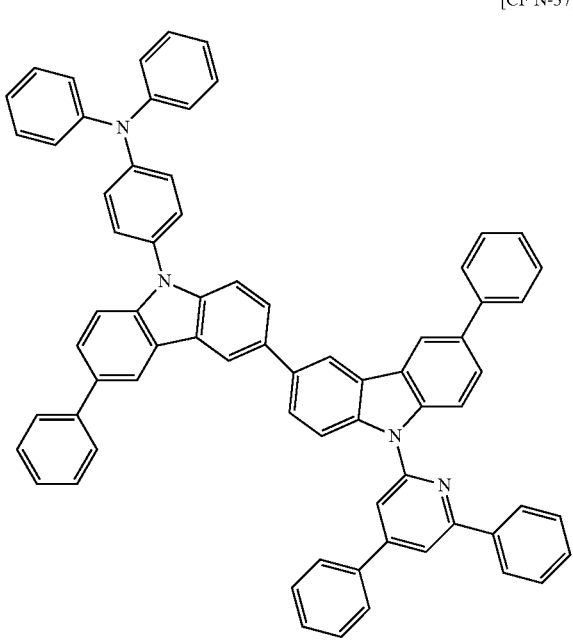
[CF N-39]
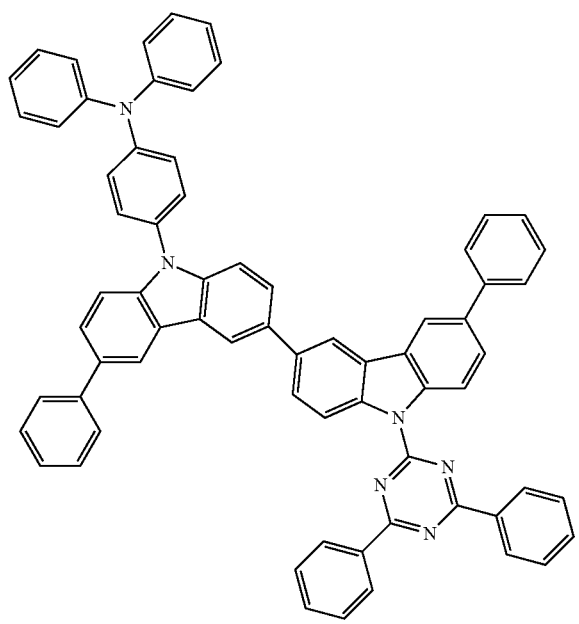

[CF N-40]
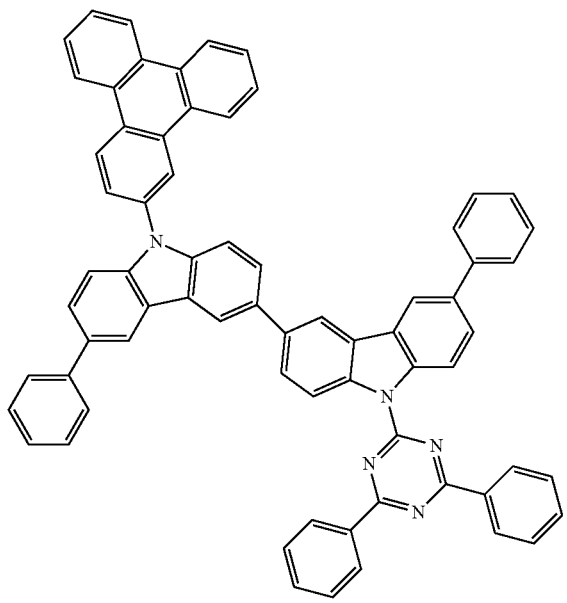
[CF N-42]
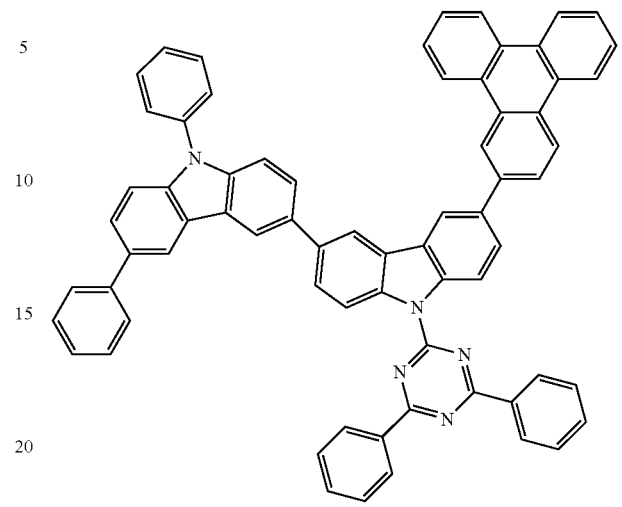
[CF N-43]
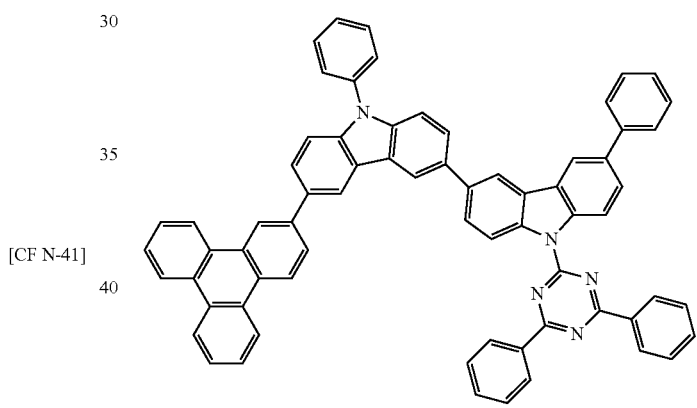
[CF N-41]
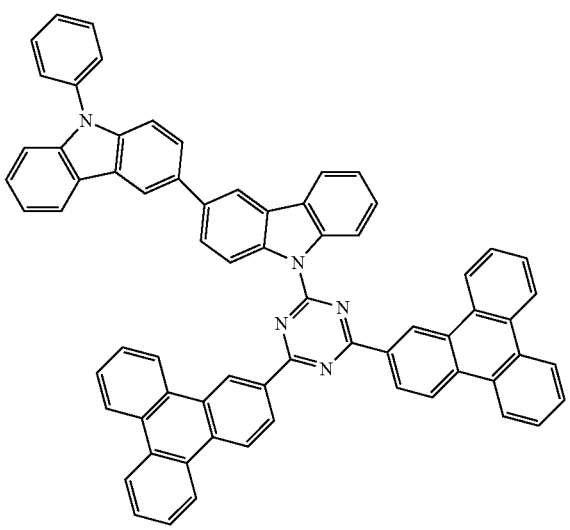
[CF N-44]
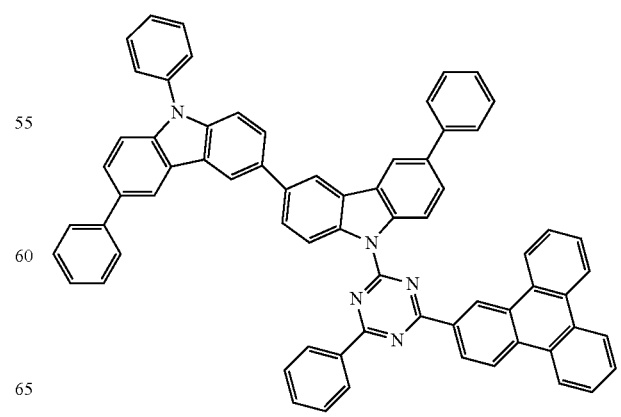

[CF N-45]
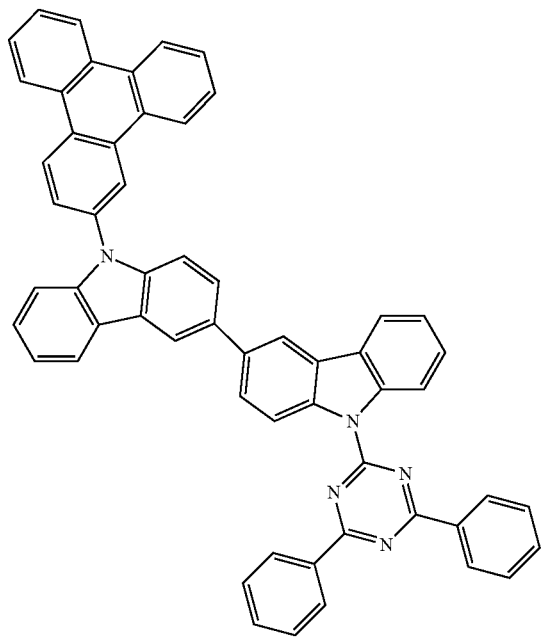
[CF N-46]
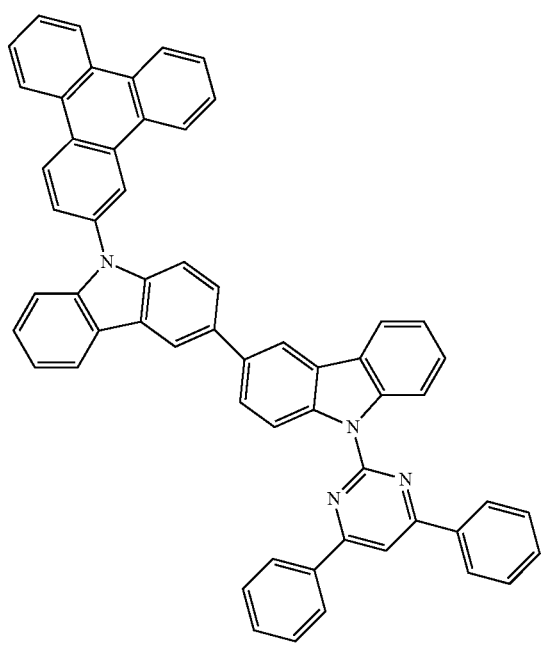
[CF N-47]
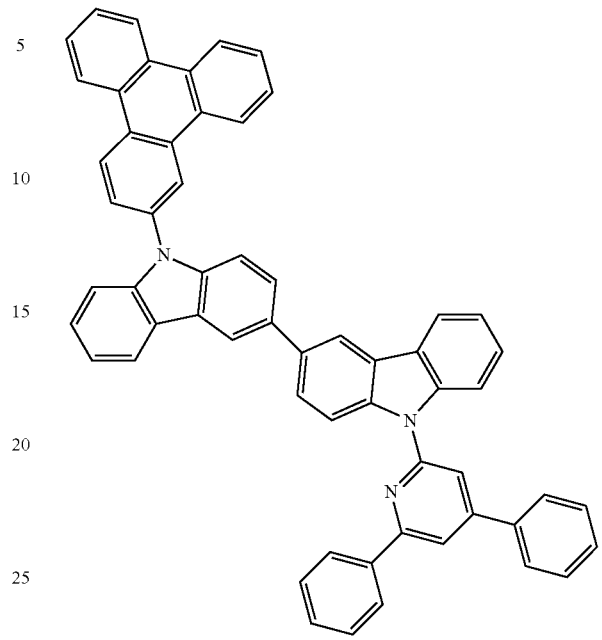
[CF N-48]
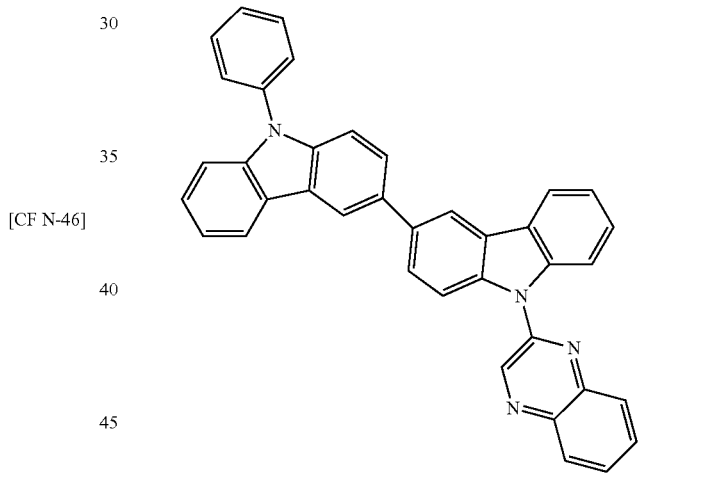
[CF N-49]
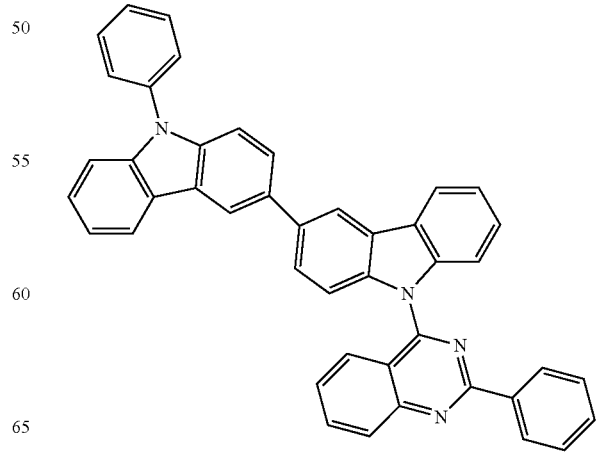

[CF N-50]
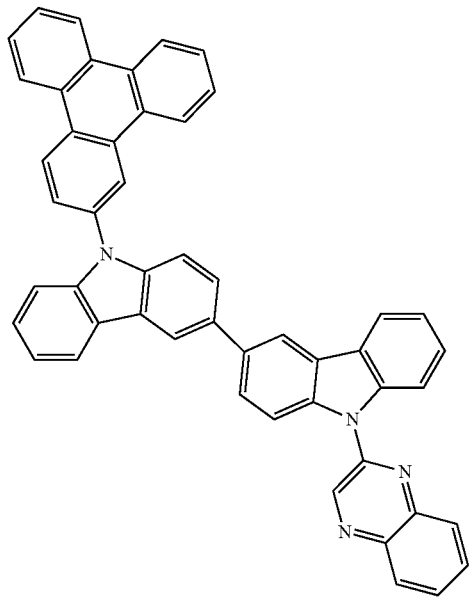
[CF N-52]
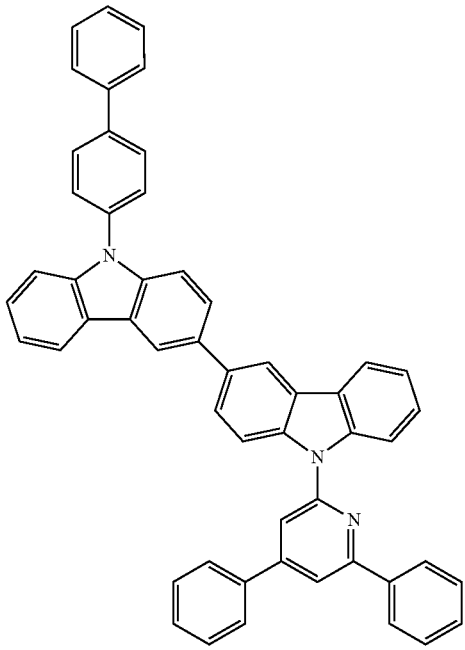
[CF N-51]
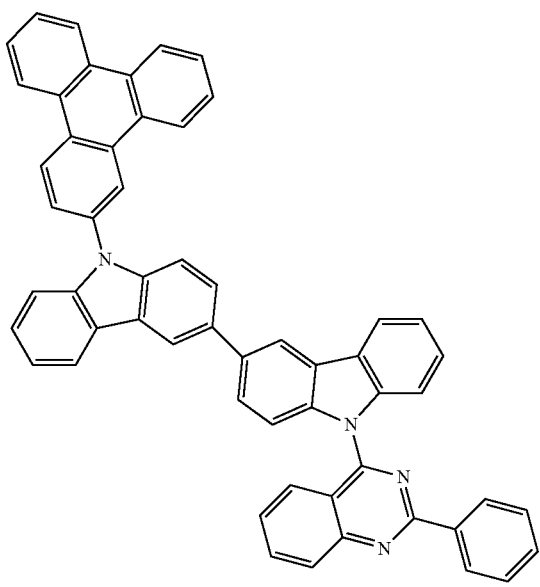
[CF N-53]
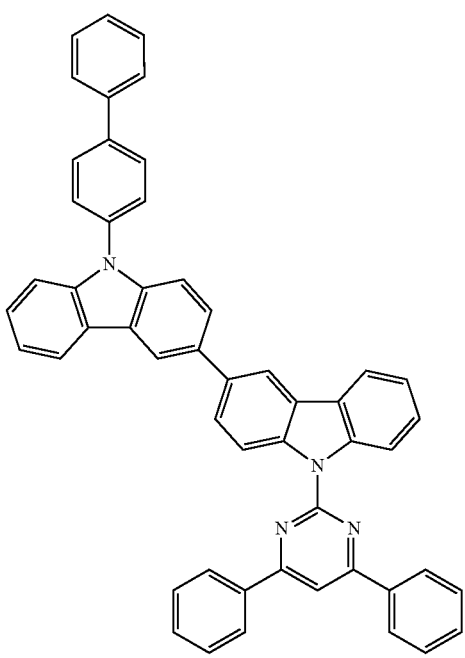

[CF N-54]
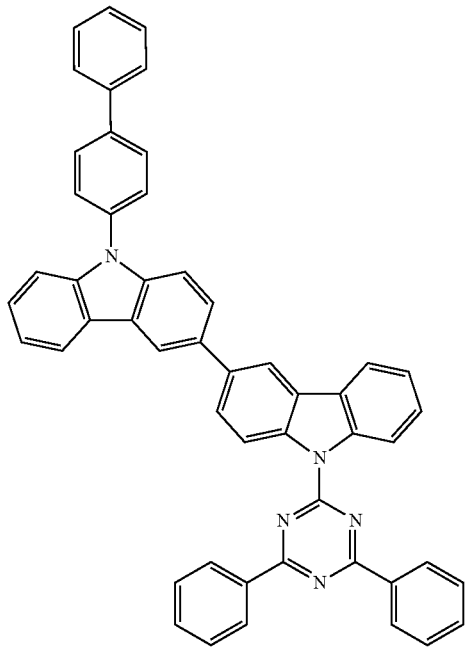
[CF A-2]
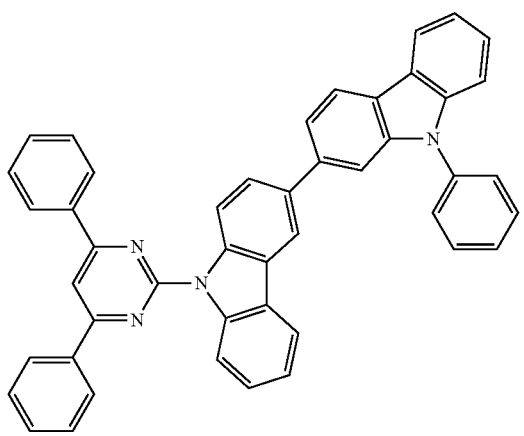
[CF A-3]
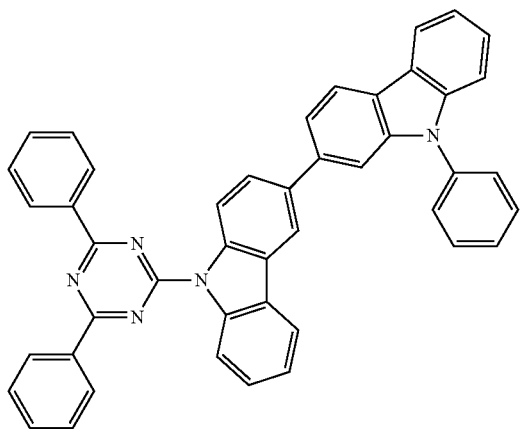
[CF A-4]
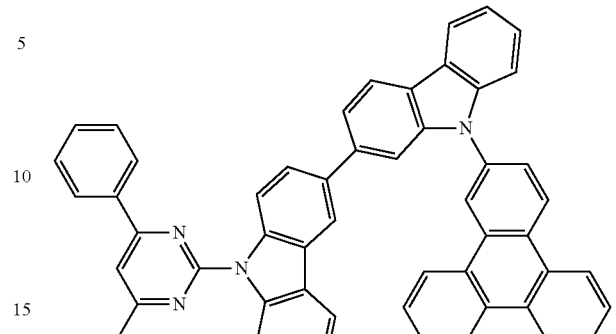
[CF A-5]
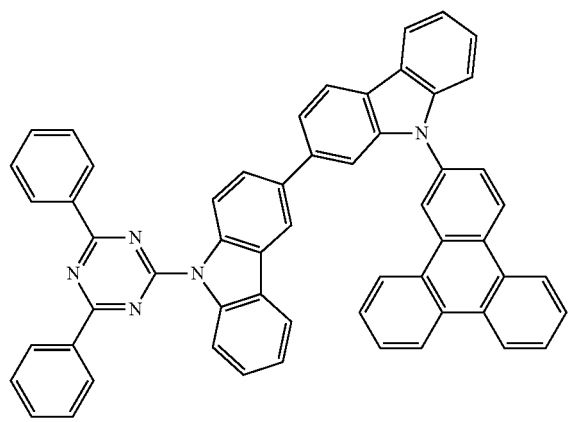
[CF A-6]
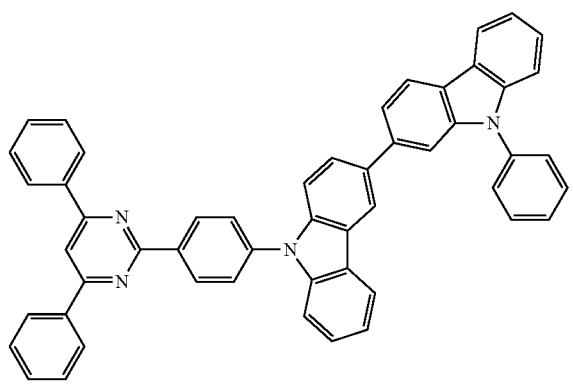

[CF A-7]
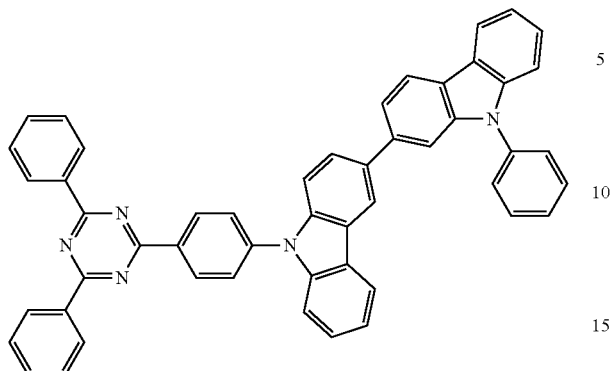
[CF A-8]
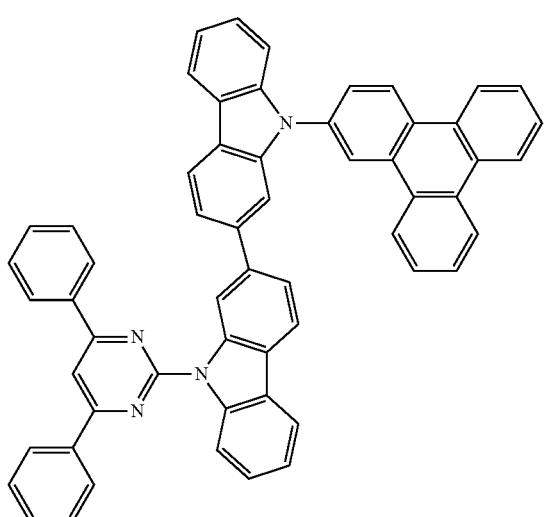
[CF A-9]
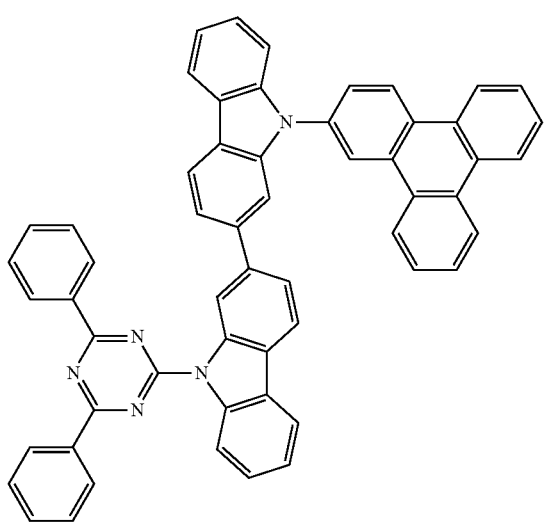
[CF A-10]
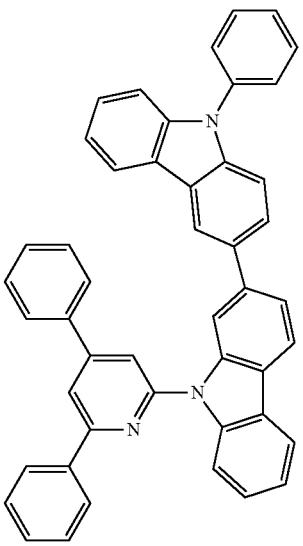
[CF A-11]
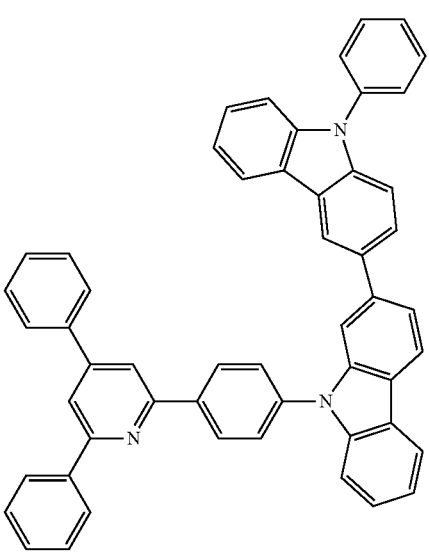
[CF A-12]

[CF A-13]
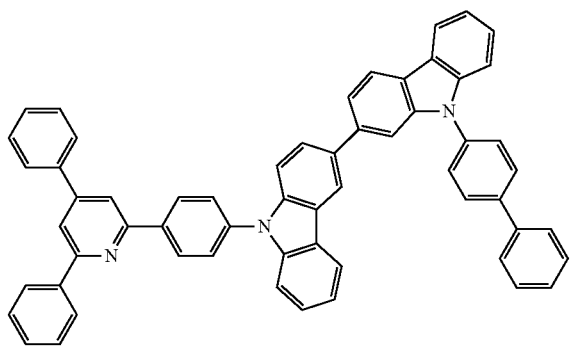
[CF A-16]
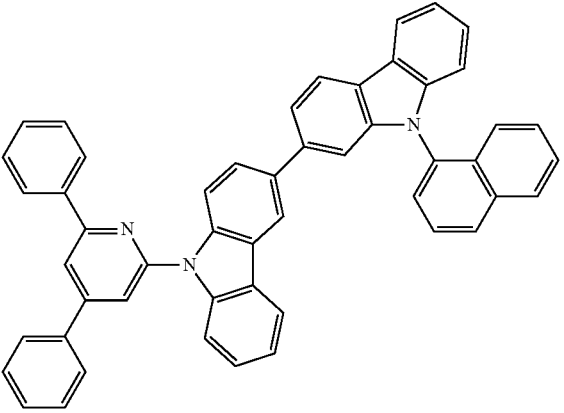
[CF A-14]
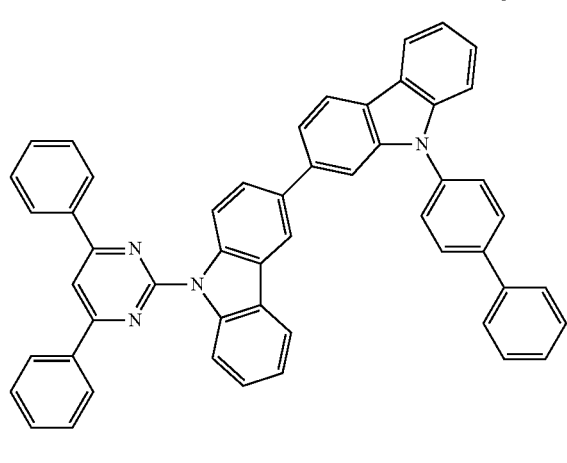
[CF A-17]
[CF A-15]
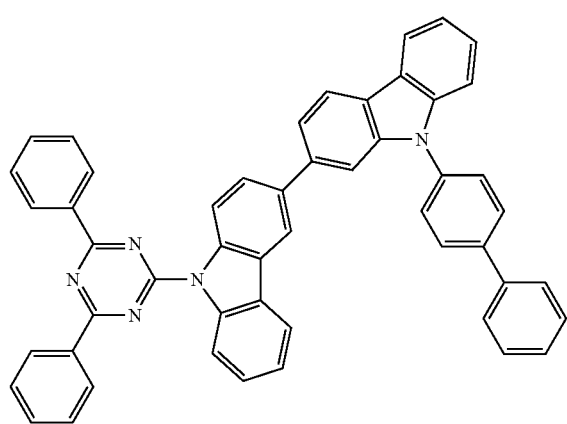
[CF A-18]
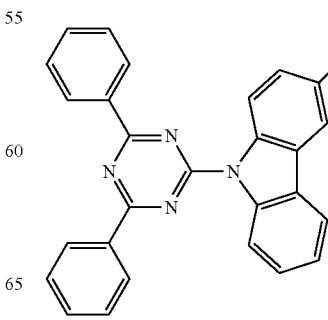

[CF A-19]
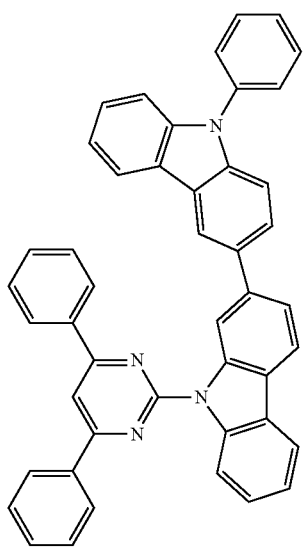
[CF A-21]
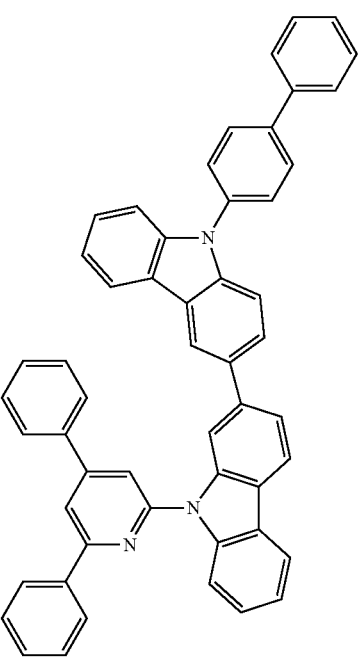
[CF A-20]
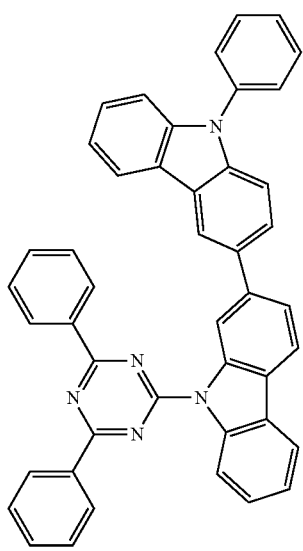
[CF A-22]
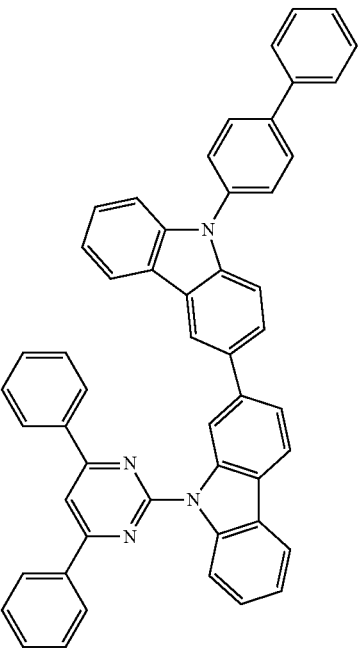

[CF A-23]
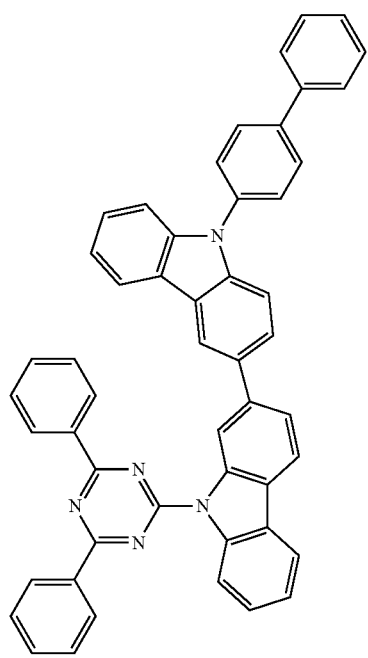
[CF A-24]
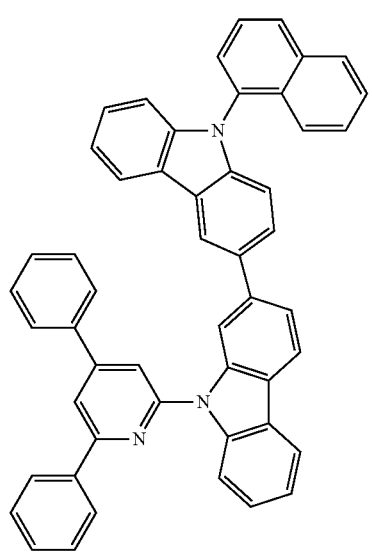
[CF A-25]
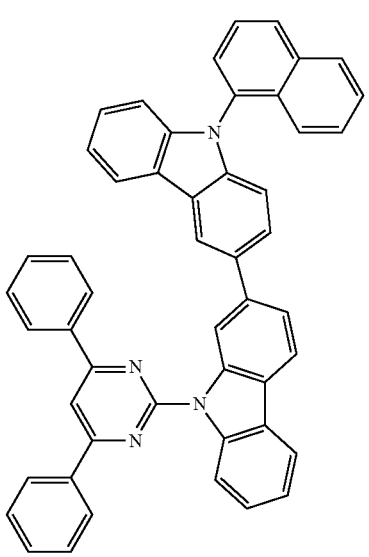
[CF A-26]
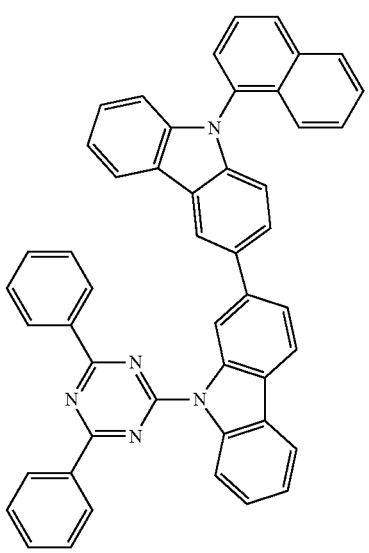
[CF B-3]
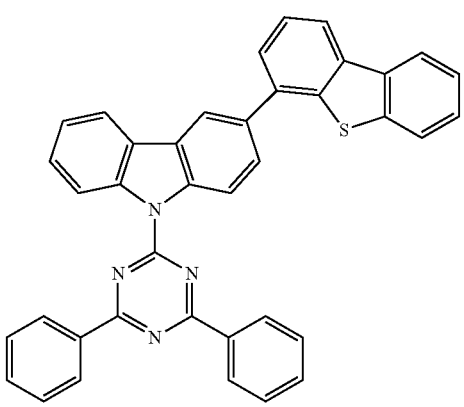

[CF B-4]
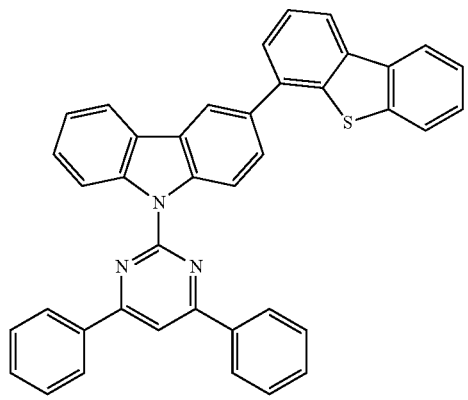
[CF B-5]
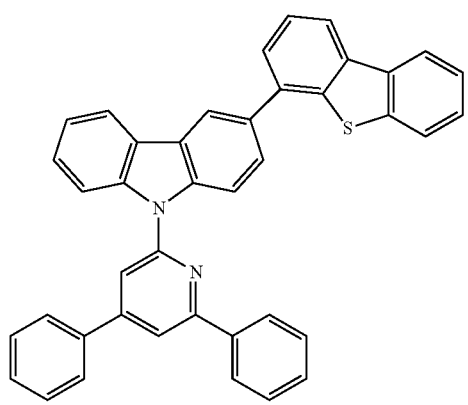
[CF B-6]
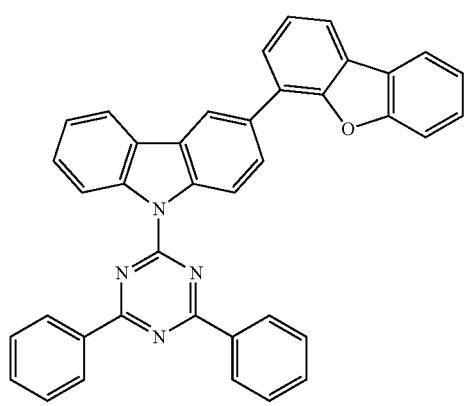
[CF B-7]
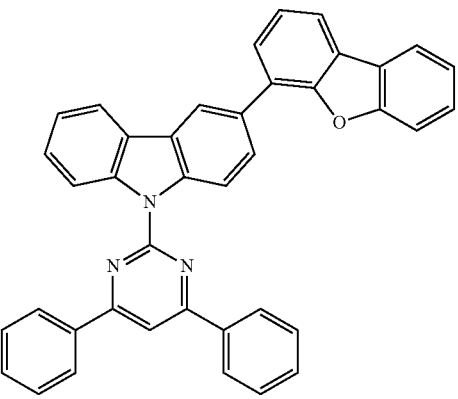
[CF B-8]
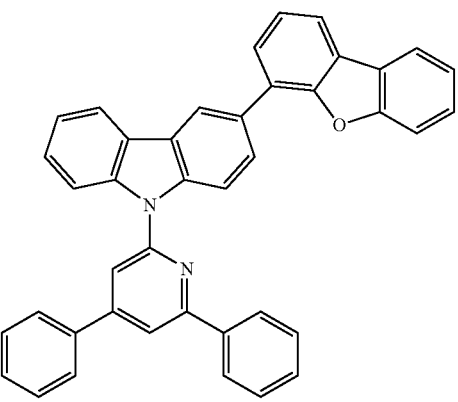
[CF B-9]
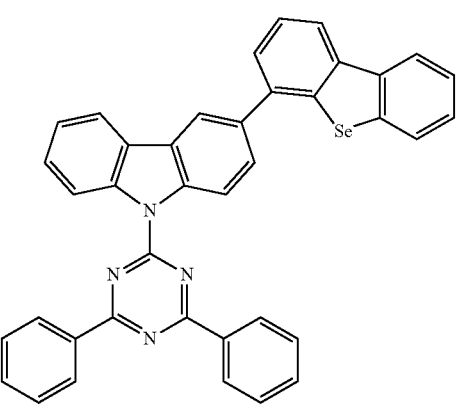

[CF B-10]
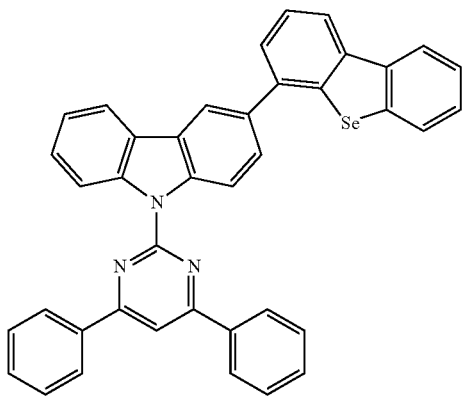
[CF B-13]
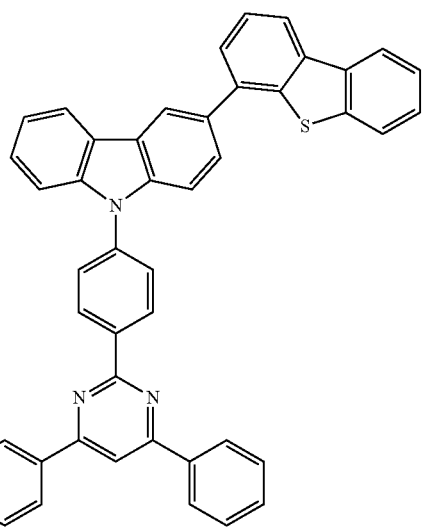
[CF B-11]
[CF B-14]
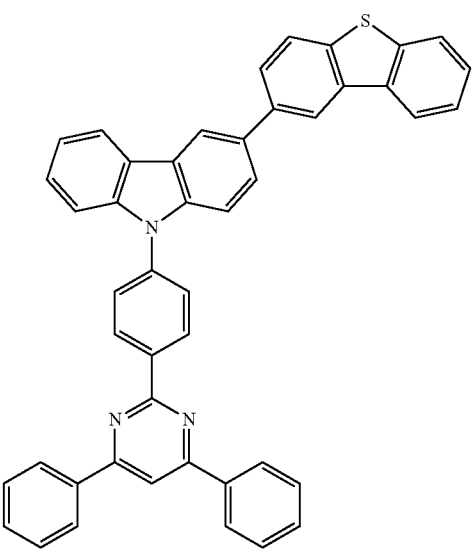
[CF B-12]
[CF B-15]
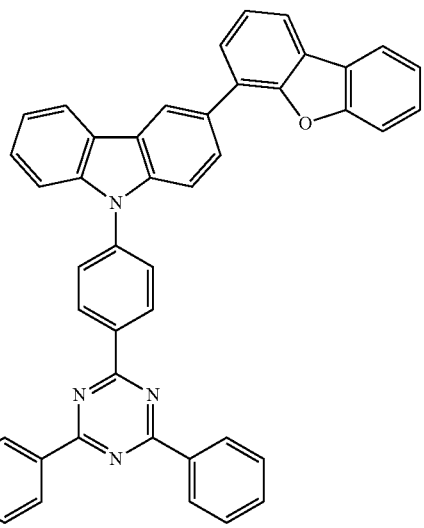

[CF B-16]
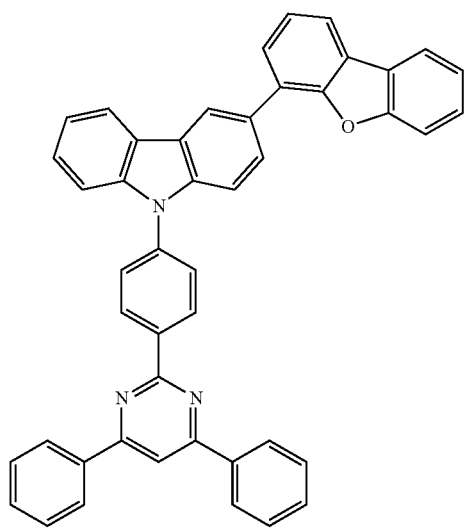
[CF B-17]
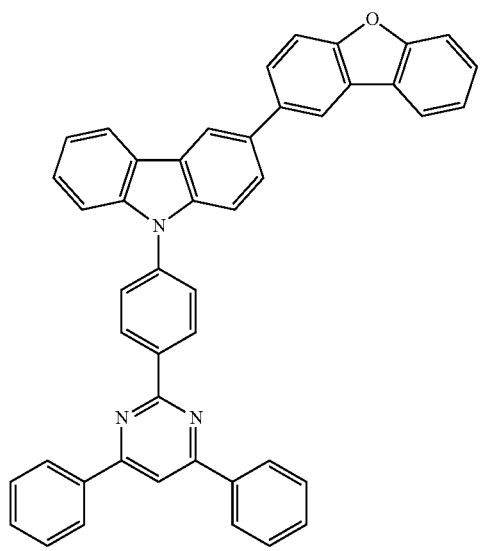
[CF B-18]
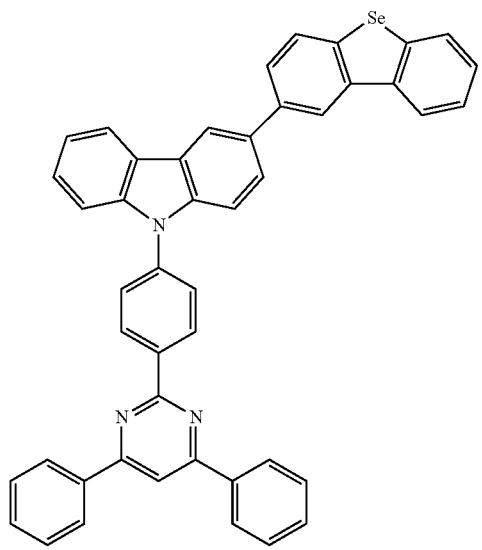
[CF B-19]
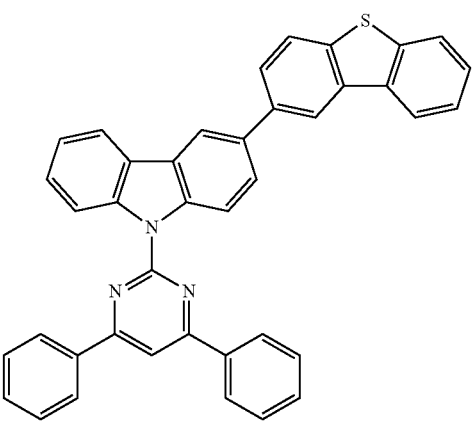
[CF B-20]
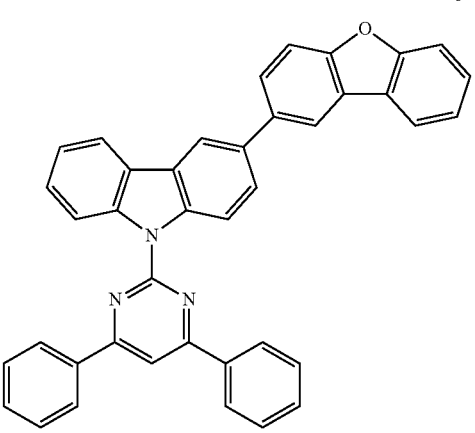
[CF B-21]
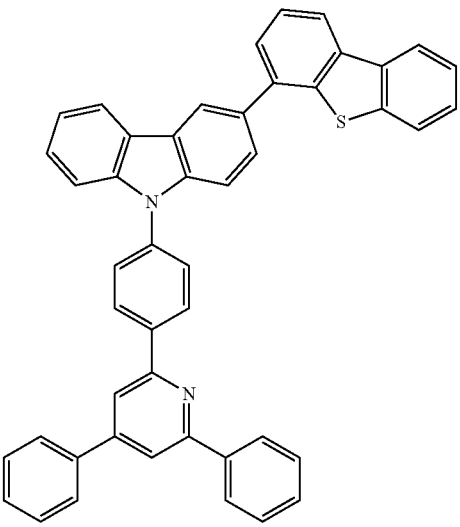

[CF B-22]
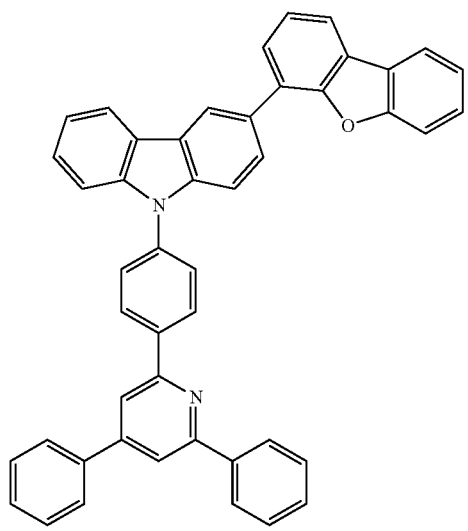
[CF C-1]
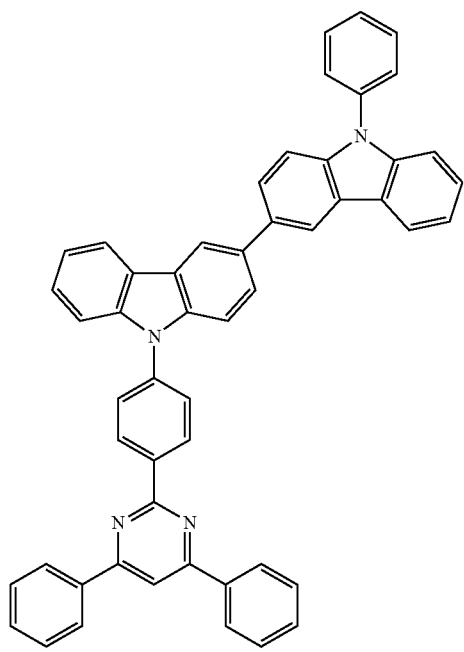
[CF C-2]
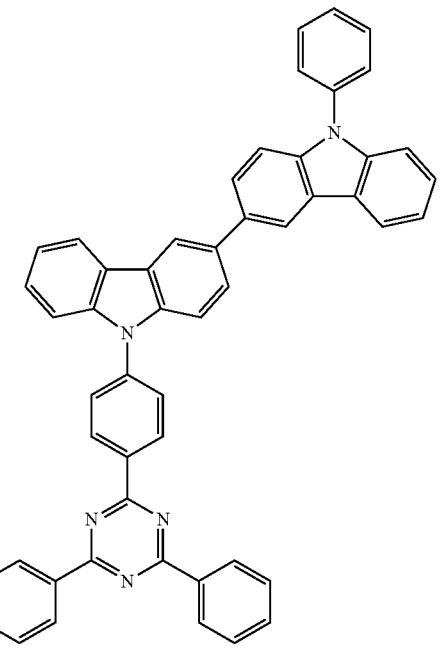
[CF C-3]
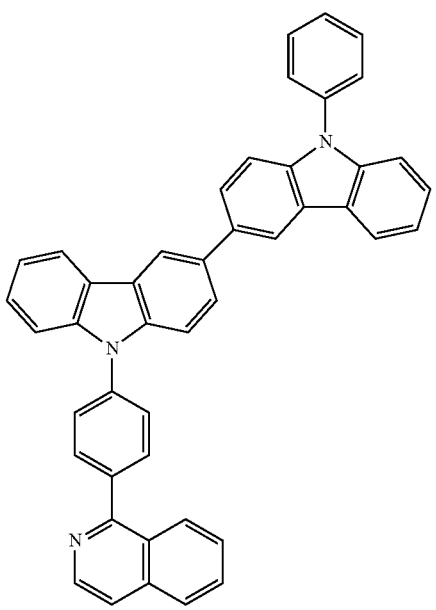

[CF C-4]
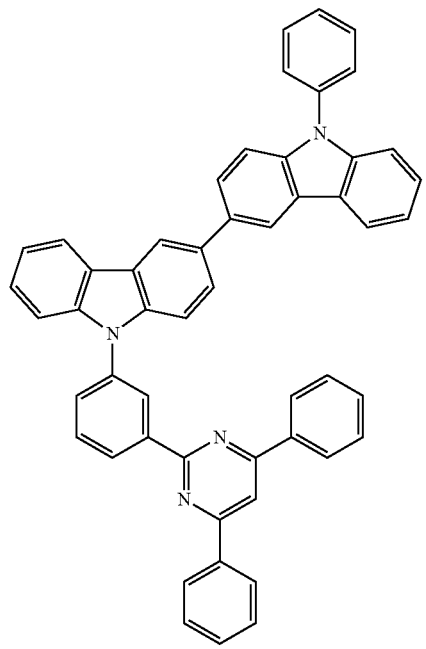
[CF C-5]
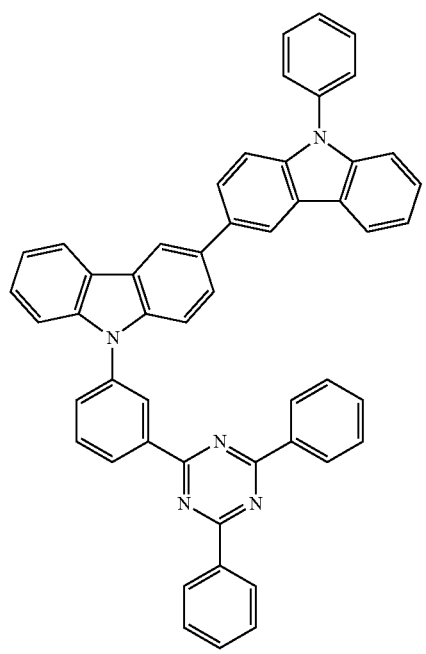
[CF C-6]
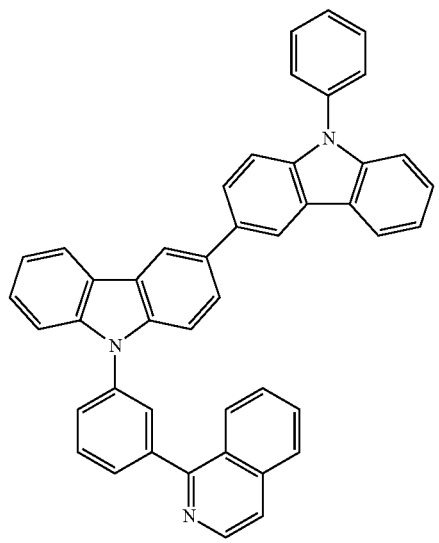
[CF C-7]
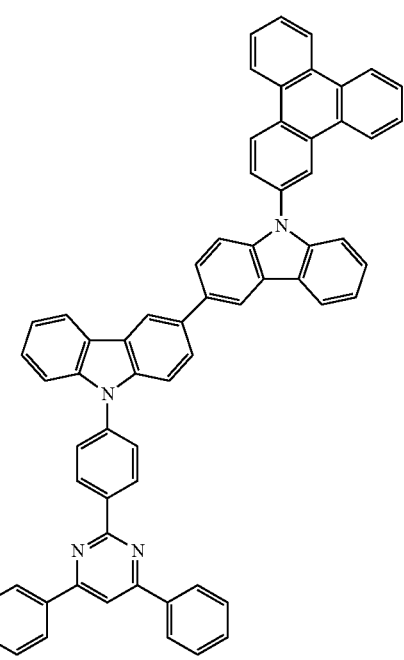

[CF C-8]
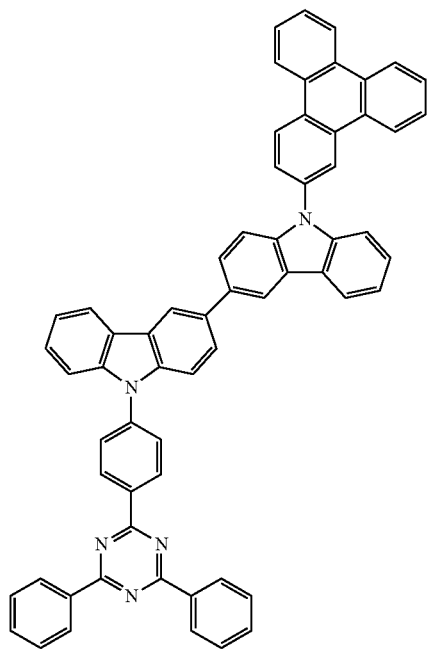
[CF C-10]
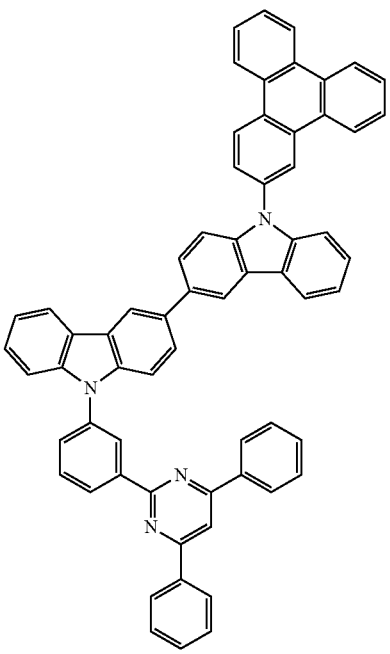
[CF C-9]
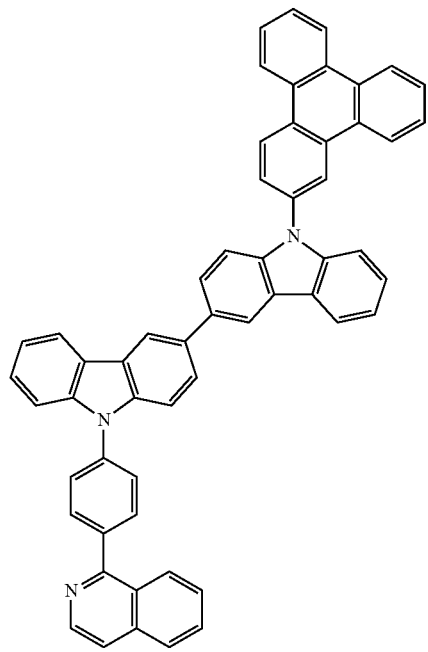
[CF C-11]

101
-continued
[CF C-12]
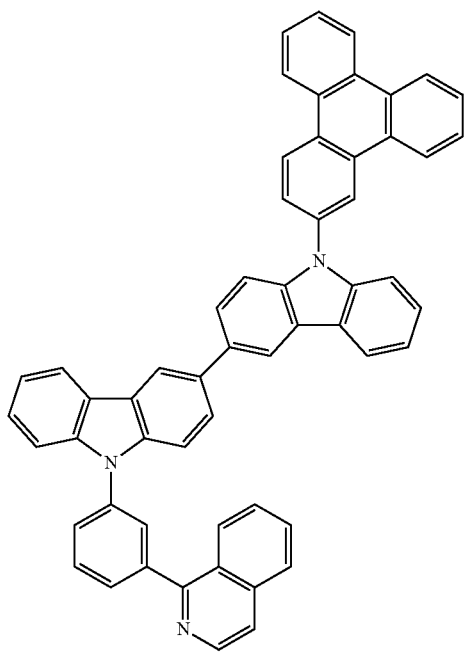
102
-continued
[CF C-14]
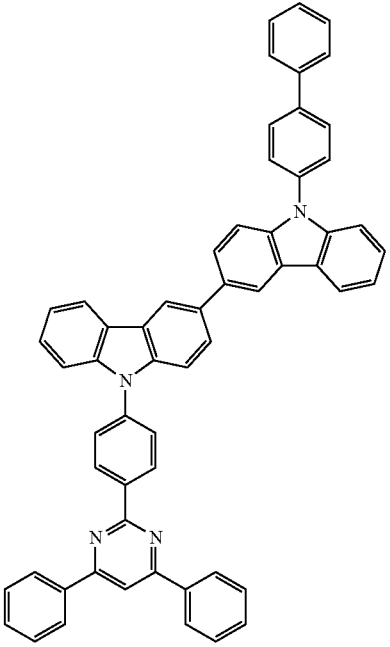
[CF C-13]
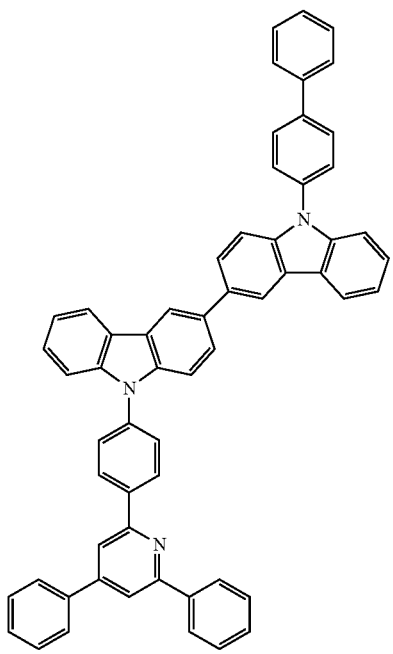
[CF C-15]
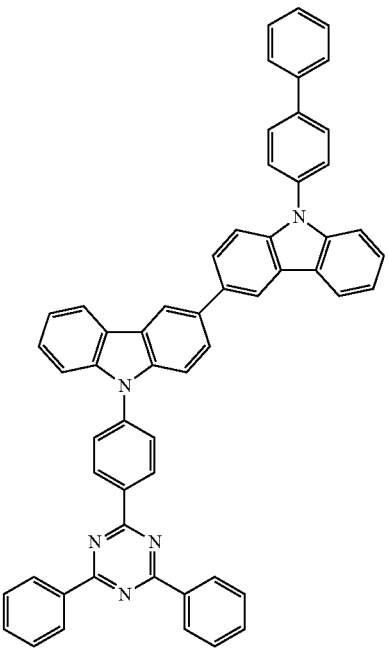

[CF C-16]

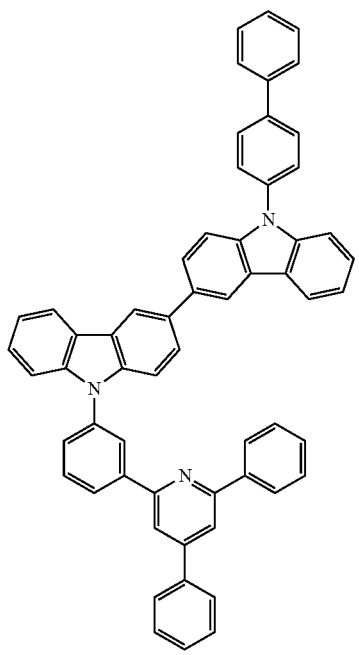

[CF C-18]

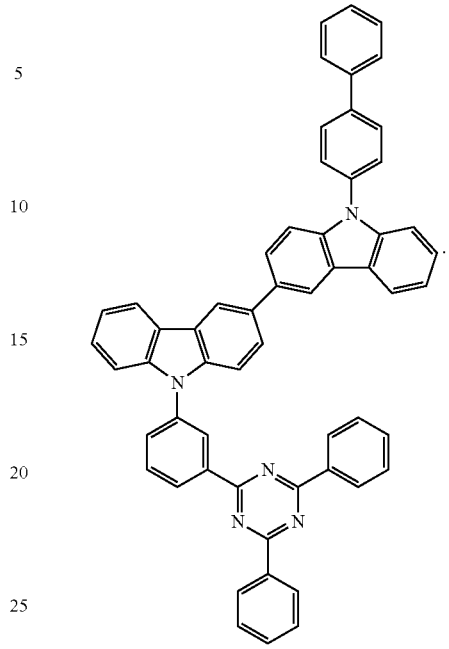

[CF C-17]

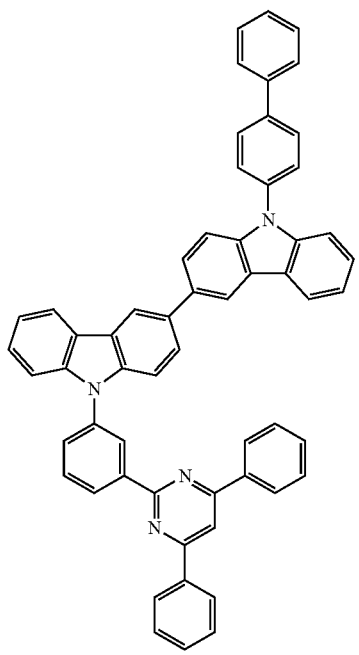

Embodiments are also directed to an organic photoelectric device, including an anode, a cathode, and at least one organic thin layer, the at least one organic thin layer being disposed between the anode and cathode, and including a compound according to an embodiment.

The organic thin layer may be selected from the group of an emission layer, a hole transport layer (HTL), a hole injection layer (HIL), an electron transport layer (ETL), an electron injection layer (EIL), a hole blocking layer, and a combination thereof.

The compound may be included in an electron transport layer (ETL) or an electron injection layer (EIL).

The compound may be included in a hole transport layer (HTL) or a hole injection layer (HIL).

The compound may be included in an emission layer.

The compound may be used as a phosphorescent or fluorescent host material in an emission layer.

The compound may be used as a fluorescent blue dopant material in an emission layer.

Embodiments are also directed to a display device including an organic photoelectric device according to an embodiment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
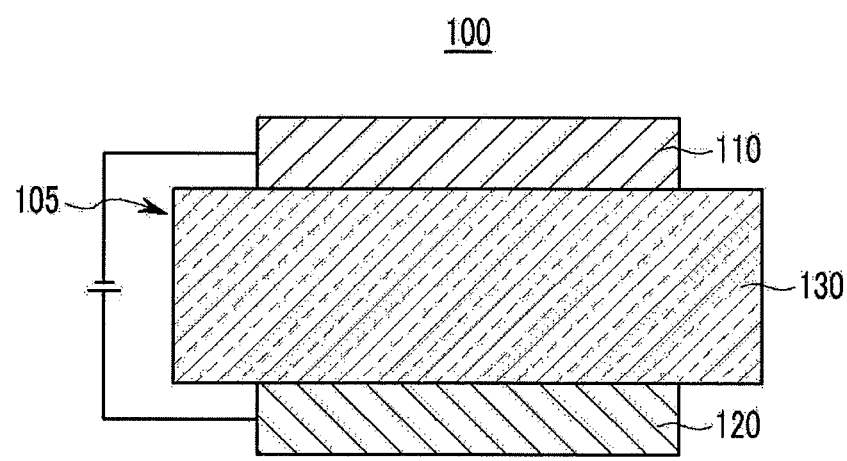
FIGS. 1 to 5 illustrate cross-sectional views showing organic light emitting diodes including compounds according to various embodiments.

Korean Patent Application No. 10-2009-0105576, filed on Nov. 3, 2009, in the Korean Intellectual Property Office, and entitled: "Compound for Organic Photoelectric Device and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

| <Description of Reference Numerals Indicating Primary Elements in the Drawings> | |
|---|---|
| 100: organic photoelectric device | 110: cathode |
| 120: anode | 105: organic thin layer |
| 130: emission layer | 140: hole transport layer (HTL) |
| 150: electron transport layer (ETL) | 160: electron injection layer (EIL) |
| 170: hole injection layer (HIL) | |
| 230: emission layer + electron transport layer (ETL) | |

As used herein, when a specific definition is not otherwise provided, the term "hetero" refers to one including 1 to 3 of N, O, S, or P, and remaining carbons in one ring.

As used herein, when a definition is not otherwise provided, the term "combination thereof" refers to at least two substituents bound to each other by a linker, or at least two substituents condensed to each other.

As used herein, when a definition is not otherwise provided, the term "alkyl" refers to an aliphatic hydrocarbon group. The alkyl may be a saturated alkyl group that does not include any alkene or alkyne. The alkyl may be branched, linear, or cyclic.

As used herein, when a definition is not otherwise provided, the term "alkene" refers to a group in which at least two carbon atoms are bound in at least one carbon-carbon double bond, and the term "alkyne" refers to a group in which at least two carbon atoms are bound in at least one carbon-carbon triple bond.

The alkyl group may have 1 to 20 carbon atoms. The alkyl group may be a medium-sized alkyl having 1 to 10 carbon atoms. The alkyl group may be a lower alkyl having 1 to 6 carbon atoms.

For example, a C1-C4 alkyl may have 1 to 4 carbon atoms and may be selected from the group of methyl, ethyl, propyl, iso-propyl, n-butyl, iso-butyl, sec-butyl, and t-butyl.

Examples of an alkyl group may be selected from the group of methyl, ethyl, propyl, isopropyl, butyl, isobutyl, t-butyl, pentyl, hexyl, ethenyl, propenyl, butenyl, cyclopropyl, cyclobutyl, cyclopentyl, cyclohexyl, or the like, which may be individually and independently substituted.

The term "aryl" refers to an aryl group including a carbocyclic aryl (e.g., phenyl) having at least one ring having a covalent pi electron system. The term also refers to monocyclic or fused polycyclic (i.e., rings sharing adjacent pairs of carbon atoms) groups. In addition, this term also refers to a spiro compound having a contact point of one carbon.

As used herein, when specific definition is not otherwise provided, the term "substituted" refers to one substituted with at least one selected from the group of a C1 to C30 alkyl group, a C1 to C10 alkylsilyl group, a C3 to C30 cycloalkyl group, a C6 to C30 aryl group, a C2 to C30 heteroaryl group, a C1 to C10 alkoxy group, a fluoro group, a C1 to C10 trifluoroalkyl group such as a trifluoromethyl group, and the like, a C12 to C30 carbazole group, a C6 to C30 arylamine group, a C6 to C30 substituted or unsubstituted aminoaryl group, or a cyano group.

A compound according to an embodiment for an organic photoelectric device is represented by the following Chemical Formula ("CF") 1.

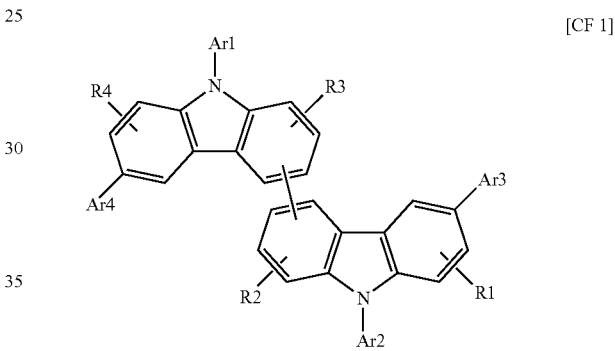

[CF 1]

In CF 1, Ar1 and Ar2 may each be independently selected from the group of a substituted or unsubstituted C6 to C30 aryl group and a substituted or unsubstituted C2 to C30 heteroaryl group.

In CF 1, Ar3 and Ar4 may each be independently selected from the group of hydrogen, a substituted or unsubstituted C6 to C30 aryl group, and a substituted or unsubstituted C2 to C30 heteroaryl group.

In CF 1, a π-conjugation length of Ar1 to Ar4 may be adjusted to enlarge a triplet energy bandgap, and thereby the compound may be usefully applied to the emission layer of an organic photoelectric device as a phosphorescent host.

In CF 1, R1 to R4 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

In the above-described structure, improved thermal stability and/or oxidation resistance may be provided, and the life-span characteristic of an organic photoelectric device may be improved.

According to an embodiment, two carbazole groups may be bound to each other at the 3 position or 4 position of each carbazole group, as shown in the following CF 2 or 3.

[CF 2]

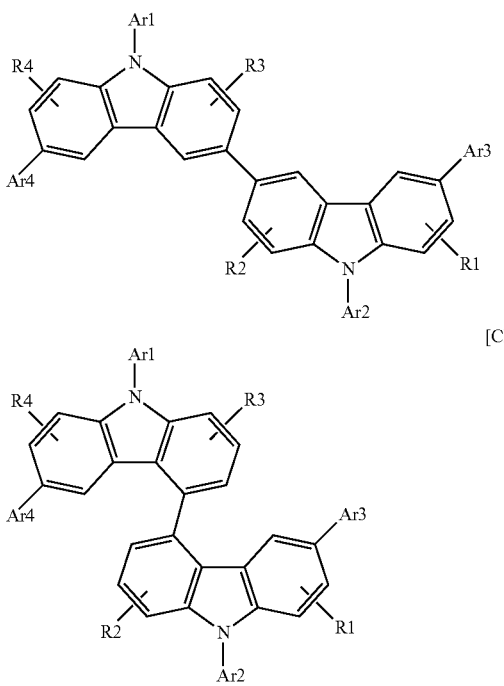

[CF 3]

As shown in CF 2, the two carbazole groups are bound to each other at the 3 position. The compound may be synthesized easily and may provide improved oxidation stability by substituting hydrogen at the 3 position of the carbazole group.

As shown in CF 3, the two carbazole groups are bound to each other at the 4 position. The two carbazole groups may not occupy the same plane, and thus crystallization may be suppressed and solubility may be improved. In addition, the π-conjugation length may become very short, and thus triplet bandgap may become high.

The Ar1 to Ar4 and R1 to R4 are the same as described above.

In the structure of the core, Ar1 may be another carbazole. Examples thereof are represented by the following CF 4 and 5.

[CF 4]

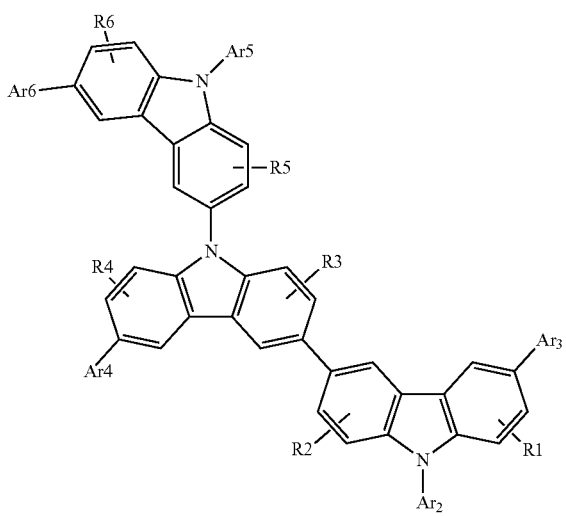

[CF 5]

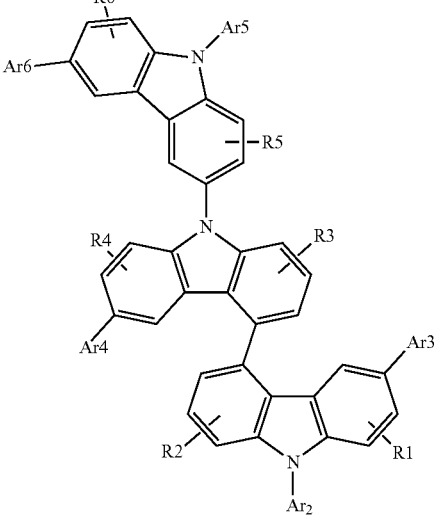

In CF 4 and 5, Ar2 and Ar5 may each be independently selected from the group of a substituted or unsubstituted C6 to C30 aryl group and a substituted or unsubstituted C2 to C30 heteroaryl group, and Ar3, Ar4 and Ar6 may each be independently selected from the group of hydrogen, a substituted or unsubstituted C6 to C30 aryl group, and a substituted or unsubstituted C2 to C30 heteroaryl group.

A triplet energy bandgap may be enlarged due to adjustment of π-conjugation length of Ar2 to Ar6, and thereby the compound may be applied to an emission layer of an organic photoelectric device as a phosphorescent host. Also, due to an increase of carbazole, hole injection and transport properties may be improved.

R1 to R6 may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group.

In the above-described structures, improved thermal stability and/or oxidation resistance may be provided, and the life-span characteristic of an organic photoelectric device may be improved.

In the above CF 4 and 5, Ar5 may be a C6 to C12 aryl group, and Ar2 may be a C10 to C20 fused polycyclic group. When the substituent is a fused polycyclic group, thermal stability, electron transporting, and injection properties may increase.

In an implementation, Ar5 may be a C6 to C12 aryl group, and Ar2 may be selected from the group of a C6 to C30 substituted or unsubstituted arylamine group, a C6 to C30 substituted or unsubstituted aminoaryl group, a substituted or unsubstituted carbazole group, a substituted or unsubstituted pyridine group, a substituted or unsubstituted pyrimidine group, and a substituted or unsubstituted triazine group.

When the substituents are an arylamine group, aminoaryl group, or carbazole group that increases hole transport properties, hole injection and transport properties of the compound may be improved. When the substituents are a pyrimidine group or a triazine group that increase electron transport properties, electron injection and transporting properties of the compound may be improved.

Numbers of the substituents may control electron transporting properties of the compound. The compound may have a bulky structure due to adjustment of the substituents, and thereby crystallinity may be decreased. The decreased crystallinity of the compound may lengthen the life-span of a device.

A compound according to an embodiment for an organic photoelectric device is represented by the following CF Z-1.

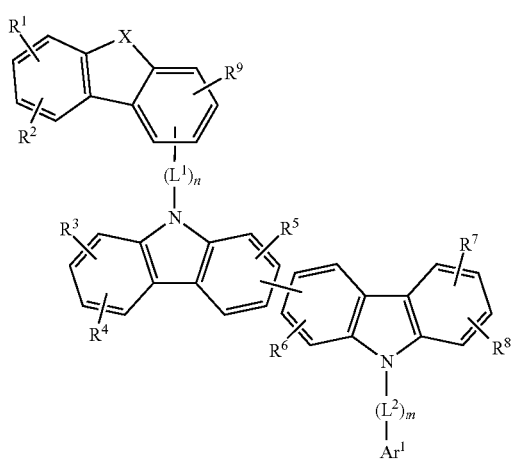

[CF Z-1]

wherein, in CF Z-1, X may be selected from the group of —O—, —S—, —SO—, —S(O)$_2$—, and —CR'R"—, $R^1$ to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

In the above-described structure, hole injection and transport properties may be improved.

A compound according to an embodiment for an organic photoelectric device is represented by the following CF Z-2.

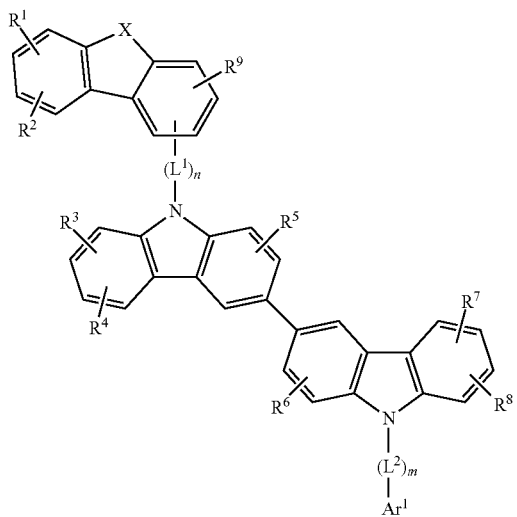

[CF Z-2]

wherein, in CF Z-2, X may be selected from the group of —O—, —S—, —SO—, —S(O)$_2$—, and —CR'R"—, $R^1$ to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

In the above-described structure, improved thermal stability and/or oxidation resistance may be provided, and the life-span characteristic of an organic photoelectric device may be improved.

A compound according to an embodiment for an organic photoelectric device is represented by the following CF Z-3.

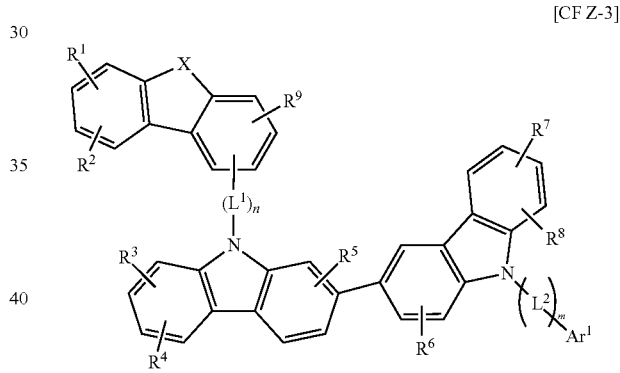

[CF Z-3]

wherein, in CF Z-3, X may be selected from the group of —O—, —S—, —SO—, —S(O)$_2$—, and —CR'R"—, R' to $R^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, $L^1$ and $L^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, $Ar^1$ may be a substituted or unsubstituted C6 to C30 aryl group, n may be an integer of 0 to 3, and m may be an integer of 0 to 3.

In the above-described structure, hole injection and transport properties may be improved.

A compound according to an embodiment for an organic photoelectric device is represented by the following CF Z-4.

[CF Z-4]

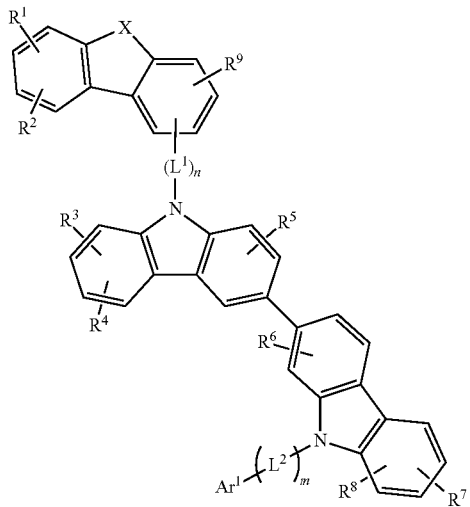

wherein, in CF Z-4, X may be selected from the group of —O—, —S—, —SO—, —S(O)$_2$—, and —CR'R"—, R' to R$^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, Ar$^1$ may be a substituted or unsubstituted C6 to C30 aryl group, n may be an integer of 0 to 3, and m may be an integer of 0 to 3.

In the above-described structure, hole injection and transport properties may be improved.

A compound according to an embodiment for an organic photoelectric device is represented by the following CF Z-5.

[CF Z-5]

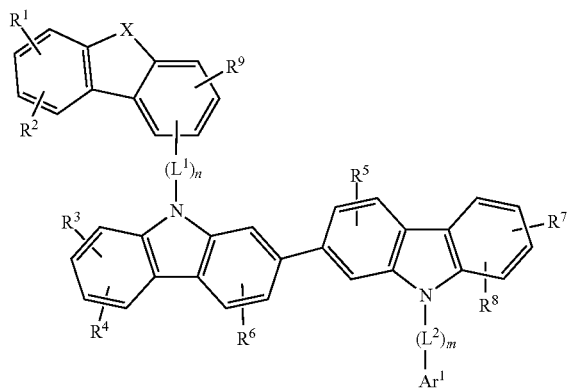

wherein, in CF Z-5, X may be selected from the group of —O—, —S—, —SO—, —S(O)$_2$—, and —CR'R"—, R$^1$ to R$^9$, R', and R" may each be independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ may each be independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, Ar$^1$ may be a substituted or unsubstituted C6 to C30 aryl group, n may be an integer of 0 to 3, and m may be an integer of 0 to 3.

In the above-described structure, hole injection and transport properties may be improved.

According to embodiments, a compound for an organic photoelectric device may be represented by, e.g., the following CF Z-6 to CF Z-39:

[CF Z-6]

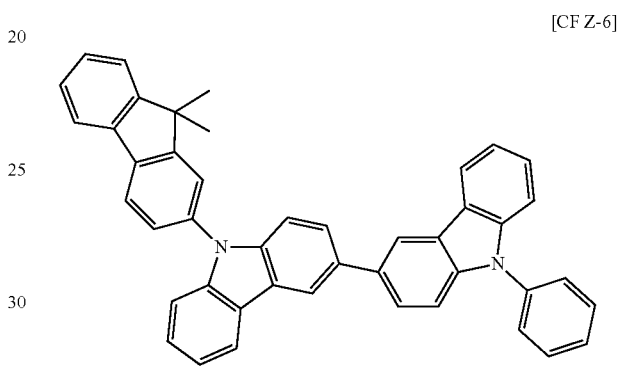

[CF Z-7]

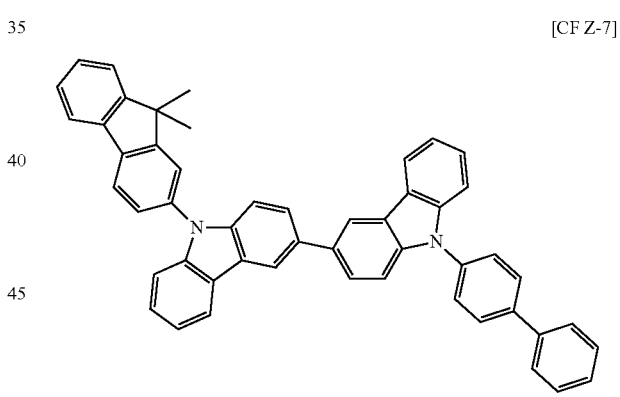

[CF Z-8]

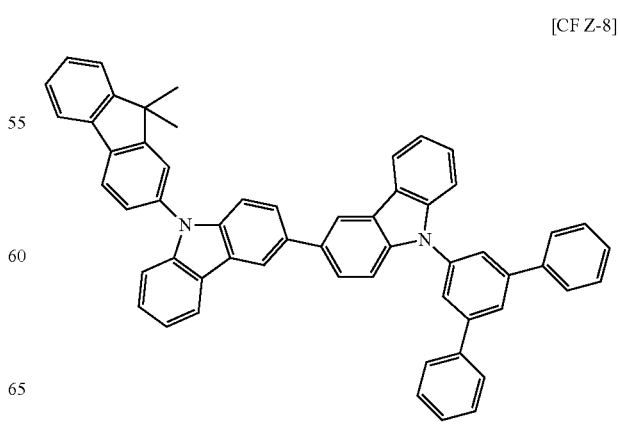

[CF Z-9]
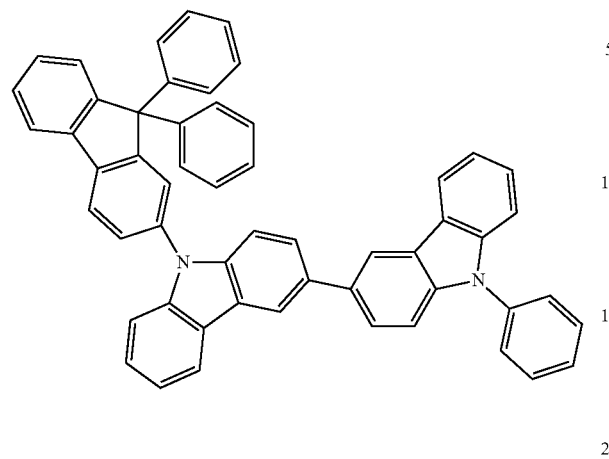
[CF Z-10]
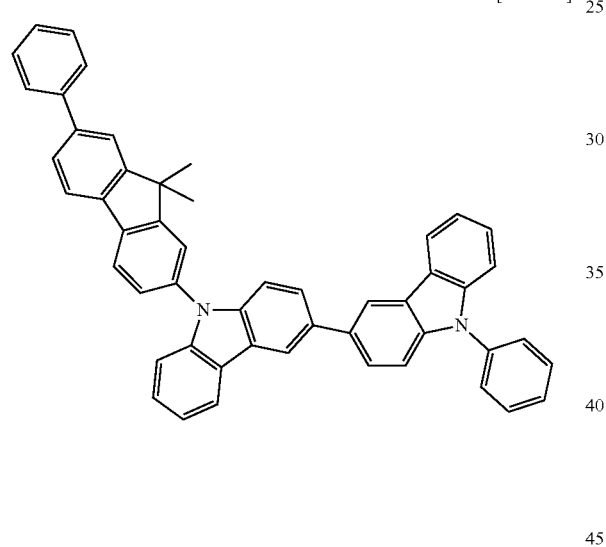
[CF Z-11]
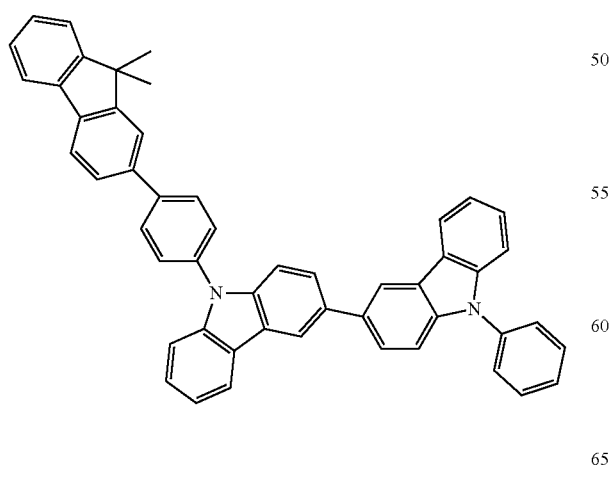
[CF Z-12]
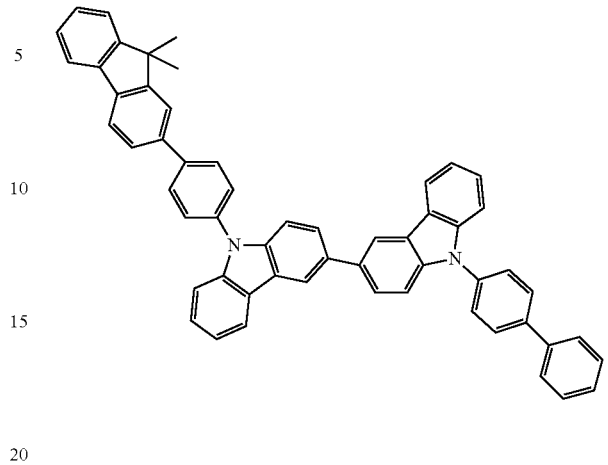
[CF Z-13]
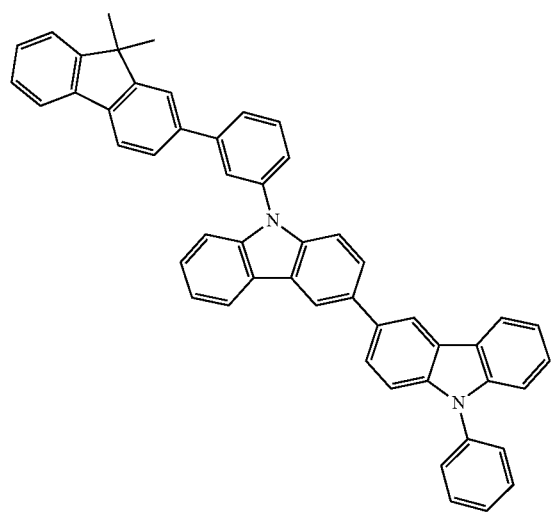
[CF Z-14]
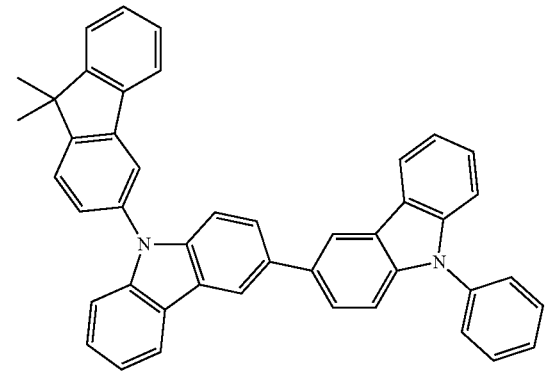

[CF Z-15]
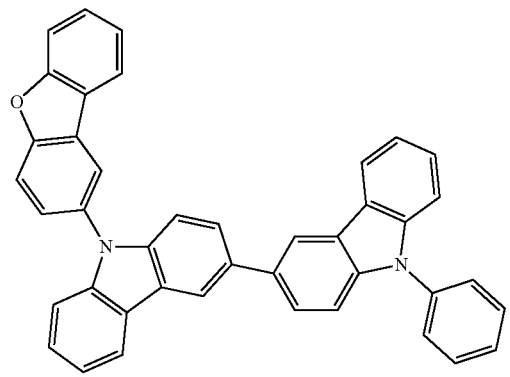
[CF Z-18]
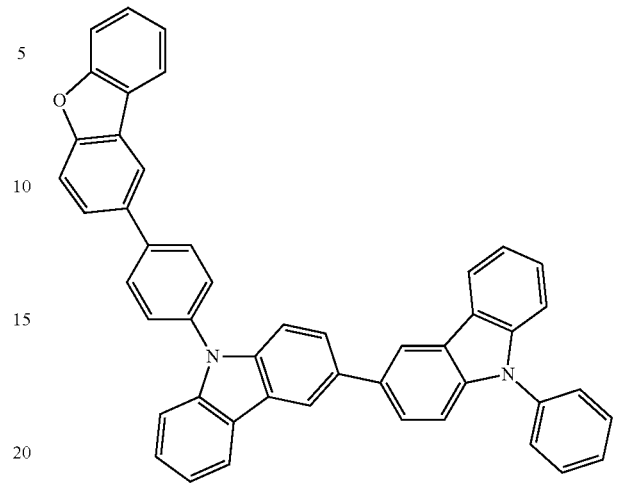
[CF Z-16]
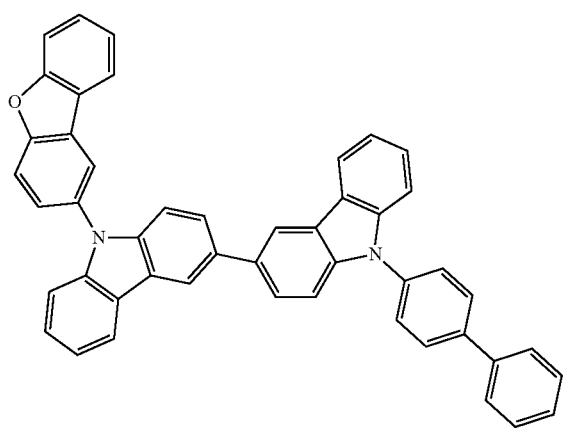
[CF Z-19]
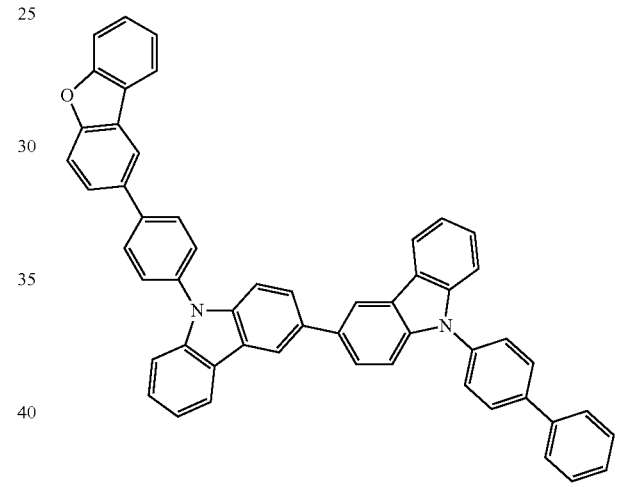
[CF Z-17]
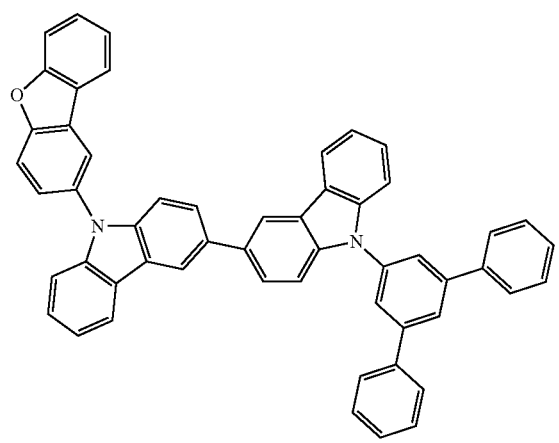
[CF Z-20]
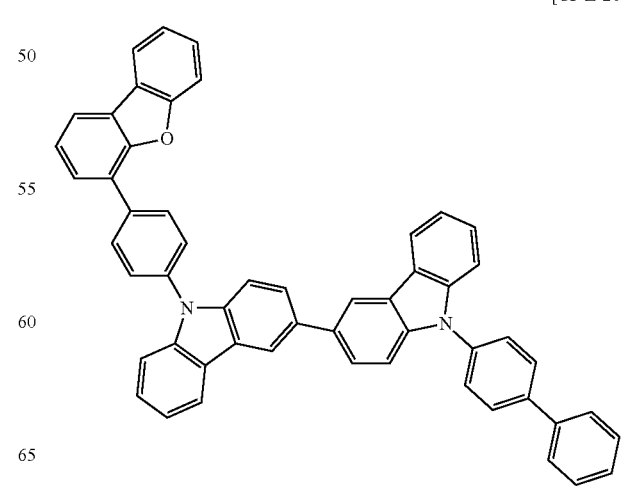

[CF Z-21]
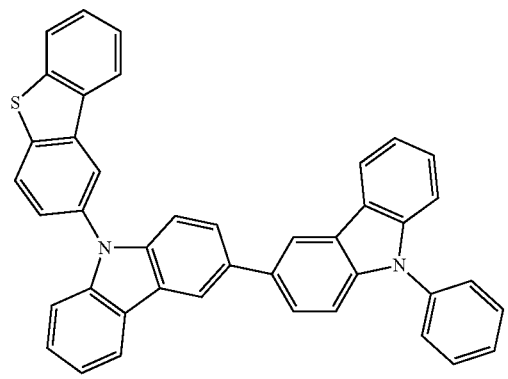
[CF Z-24]
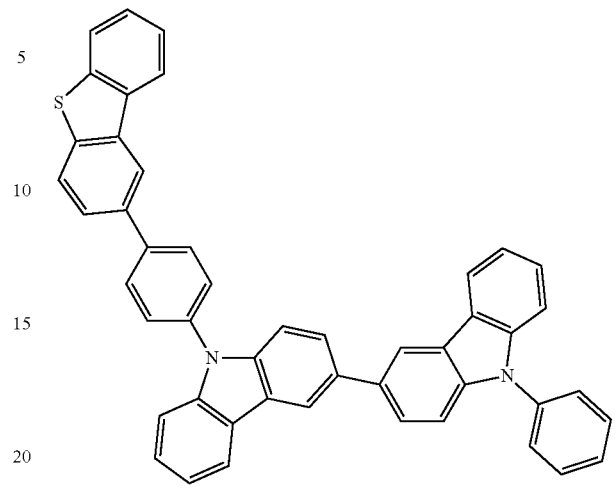
[CF Z-22]
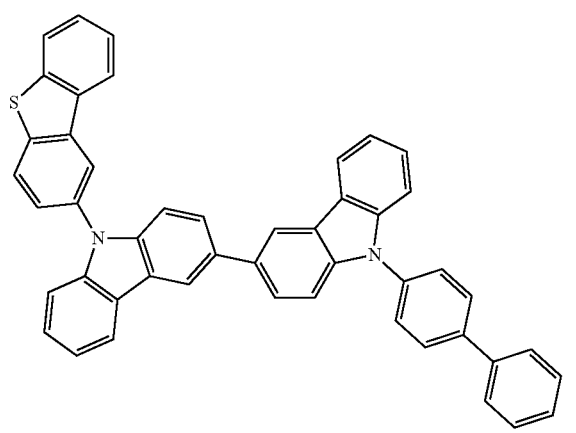
[CF Z-25]
[CF Z-23]
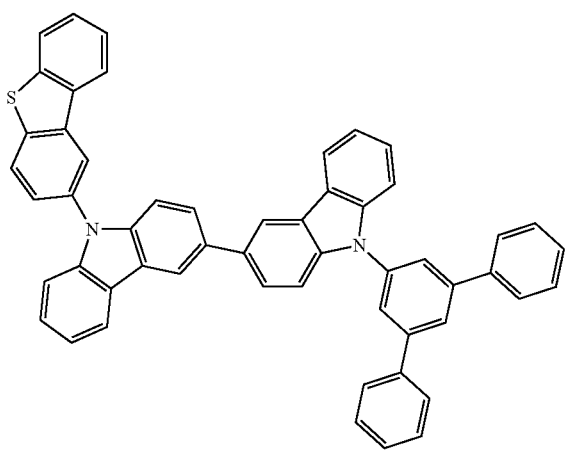
[CF Z-26]
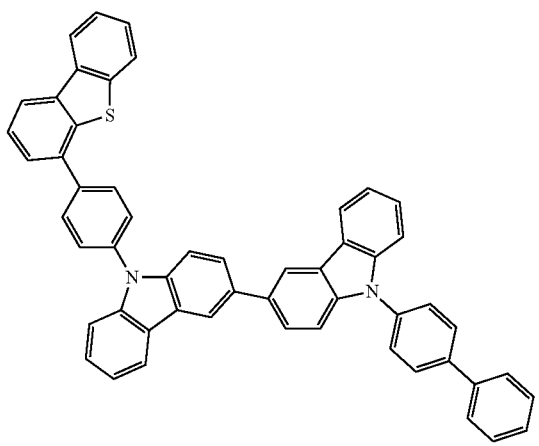

[CF Z-27]
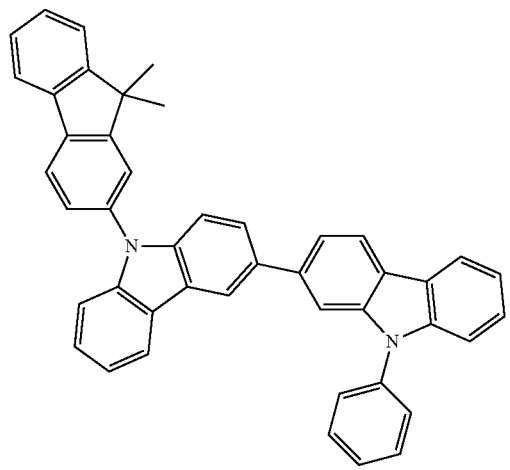
[CF Z-29]
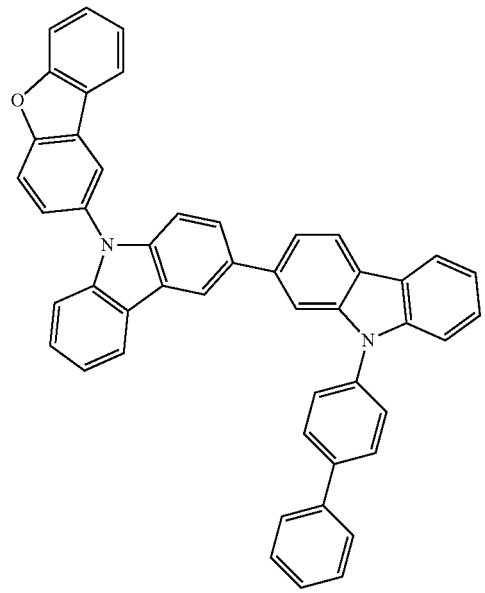
[CF Z-28]
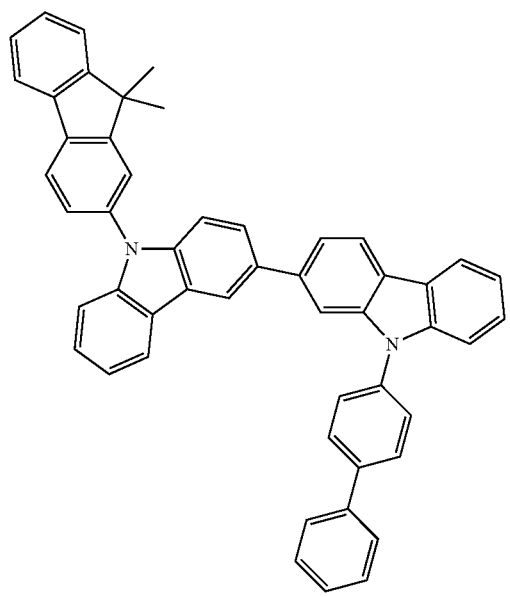
[CF Z-30]
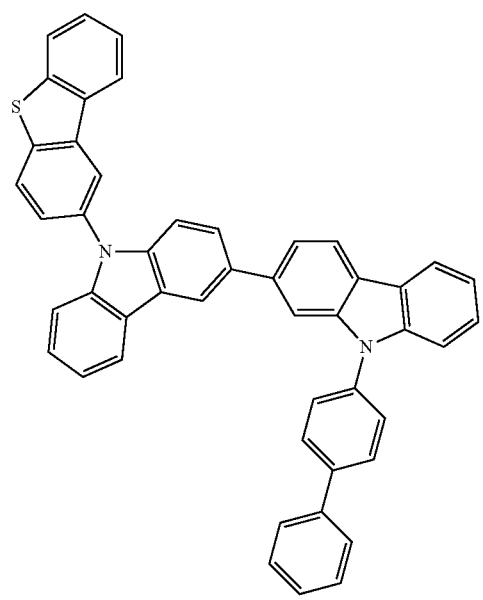
[CF Z-31]
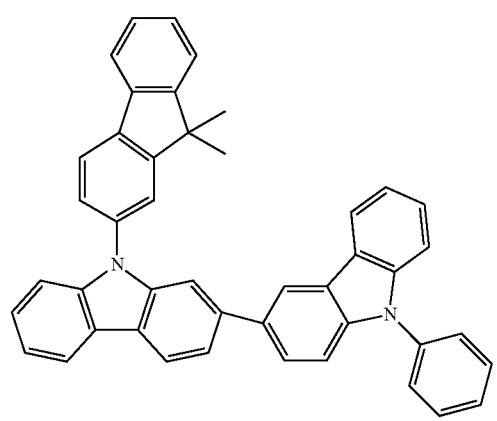

[CF Z-32]
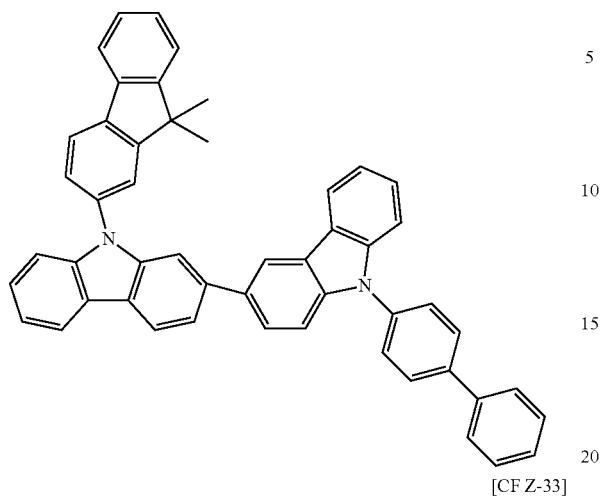
[CF Z-33]
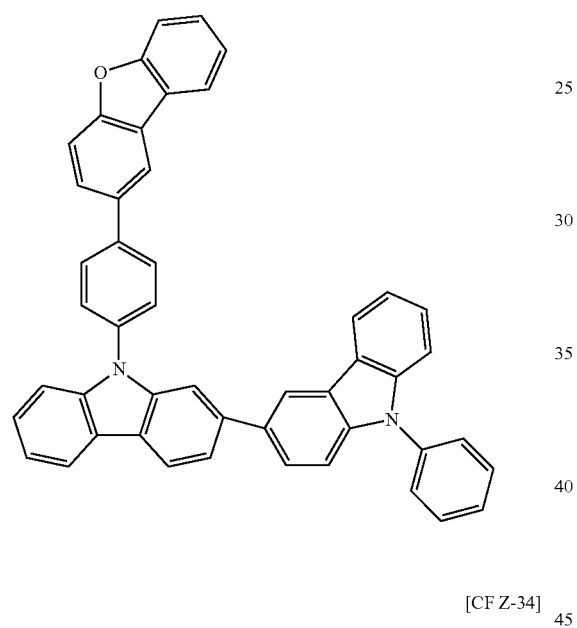
[CF Z-34]
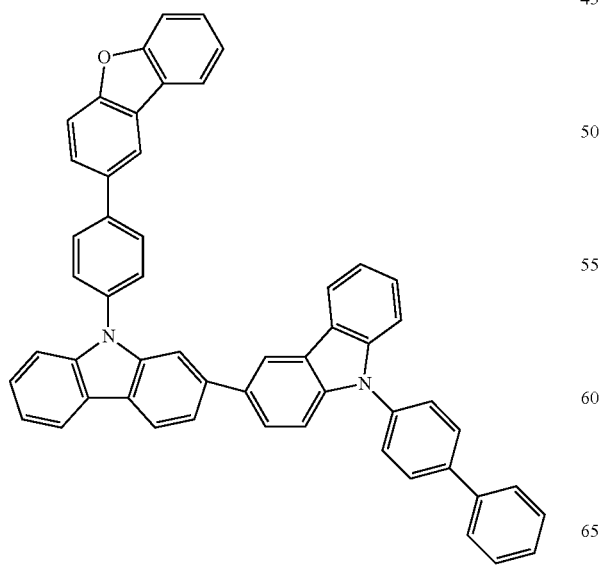
[CF Z-35]
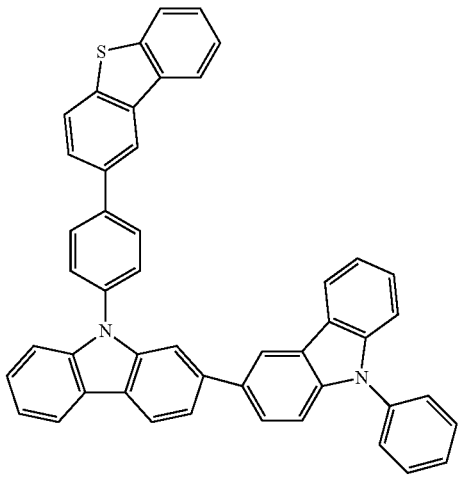
[CF Z-36]
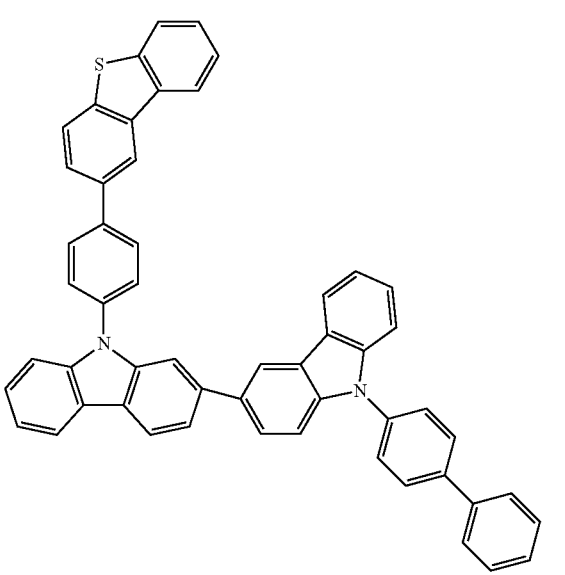
[CF Z-37]
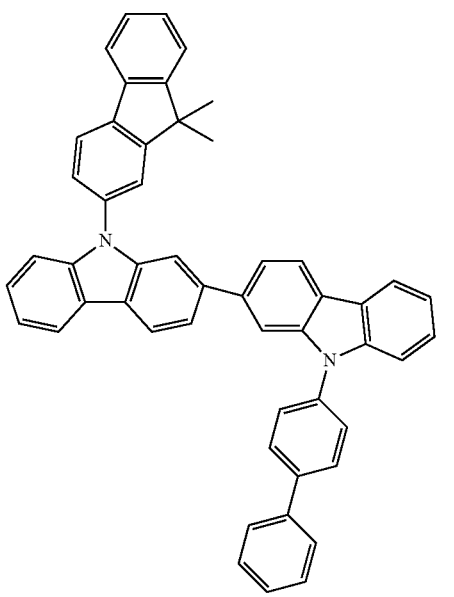

[CF Z-38]
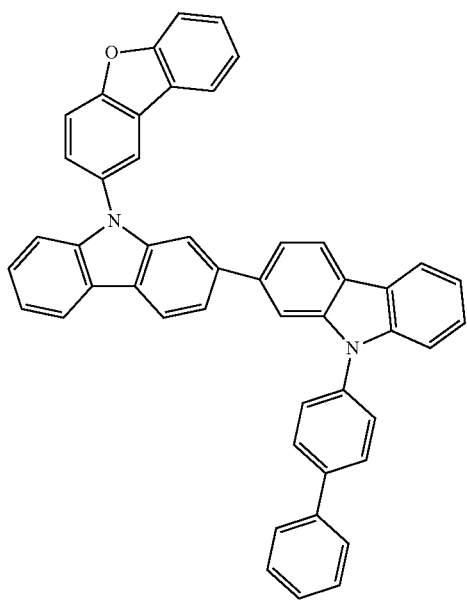
[CF 6]
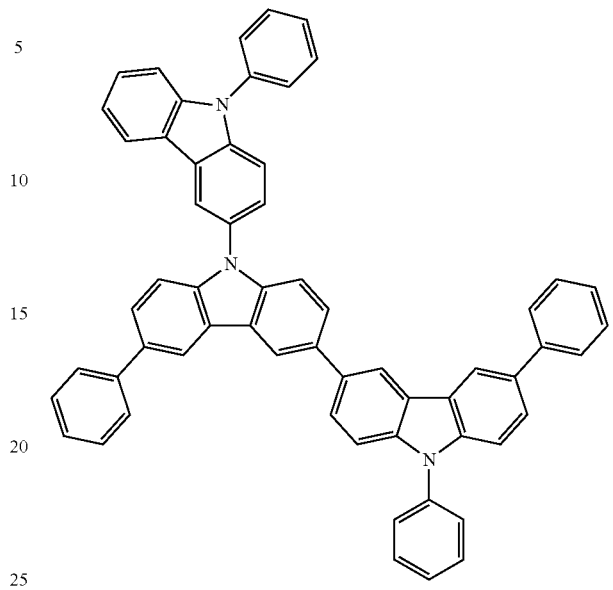
[CF Z-39]
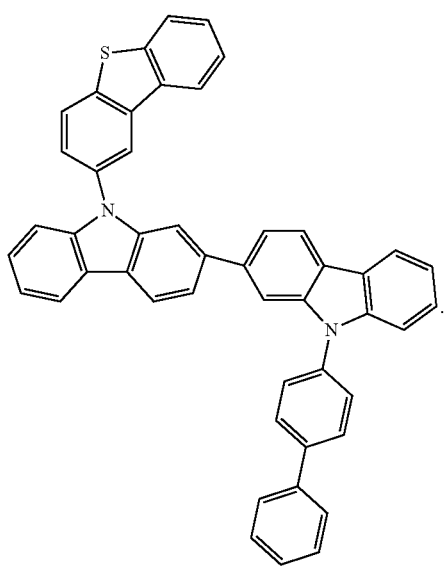
[CF 7]
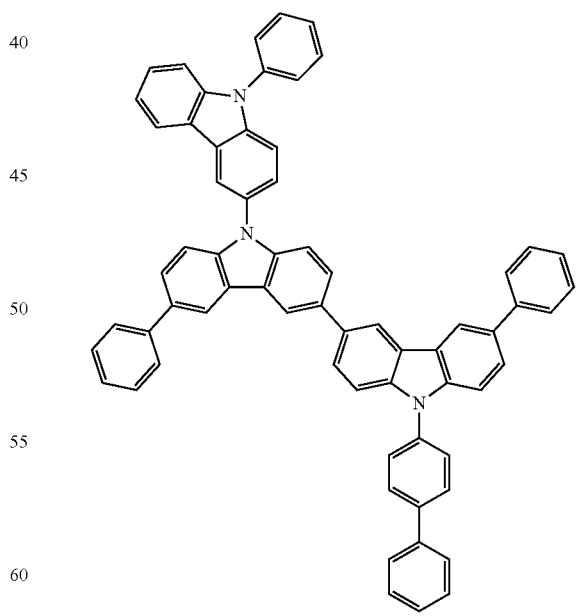
According to embodiments, the compound represented by CF Z-1 may be represented by one or more of CF Z-6 to CF Z-39, and the compound represented by CF 1 may also be represented by one or more of CF Z-6 to CF Z-39.
According to embodiments, the compound for an organic photoelectric device may be represented by, e.g., the following CF 6 to 38 and 42 to 83.

[CF 8]
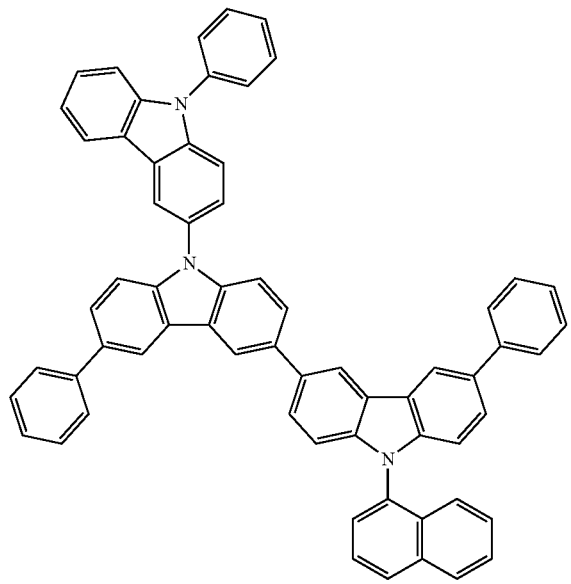
[CF 9]
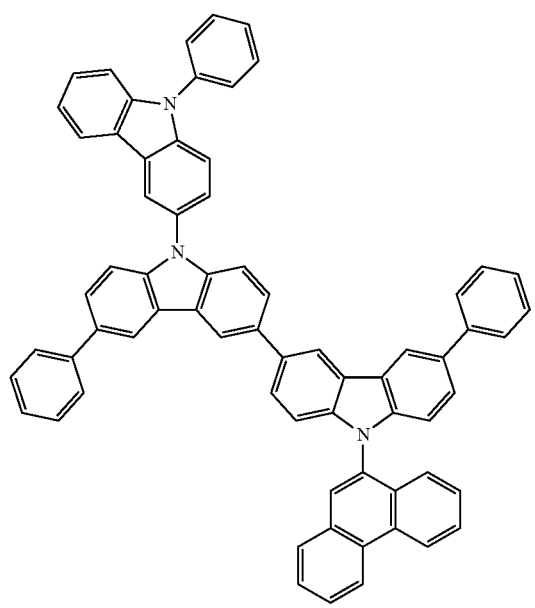
[CF 10]
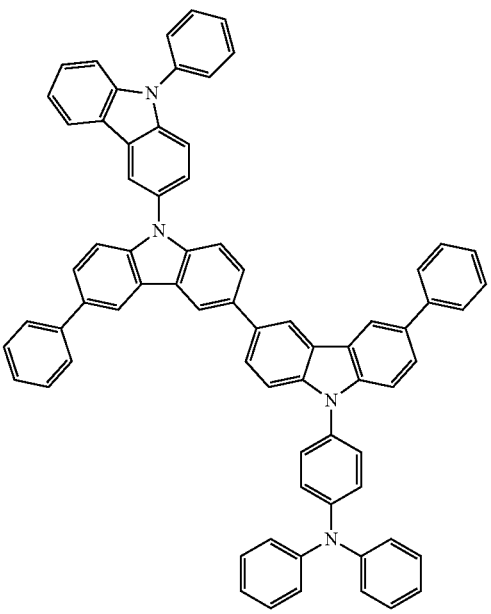
[CF 11]
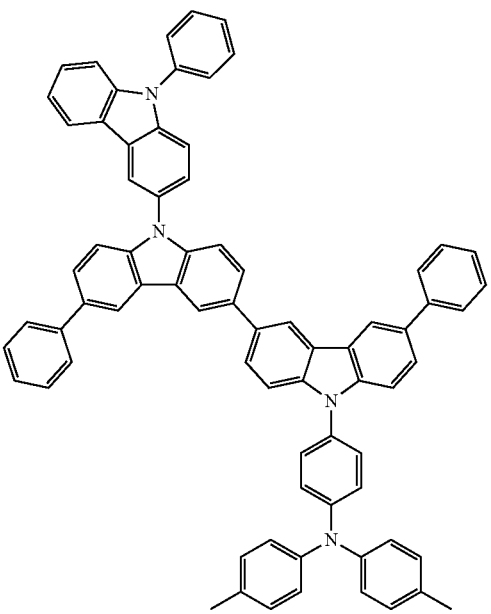

[CF 12]
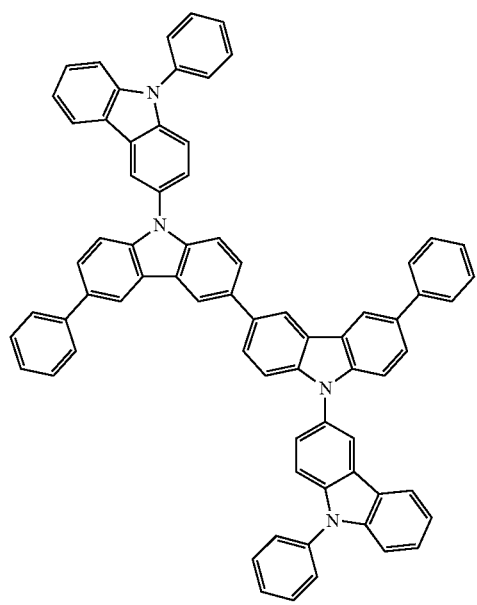
[CF 14]
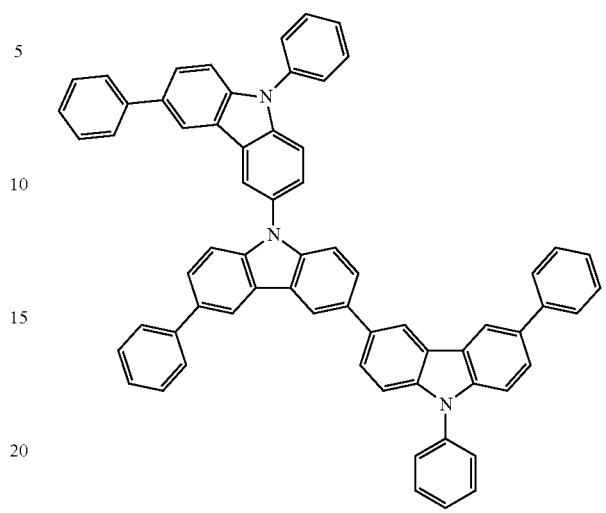
[CF 13]
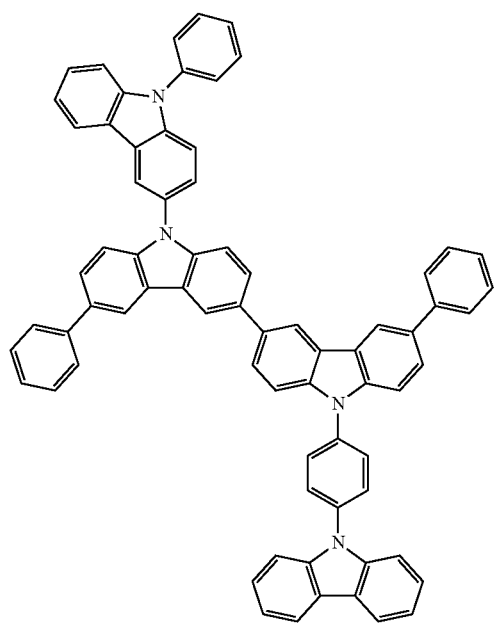
[CF 15]
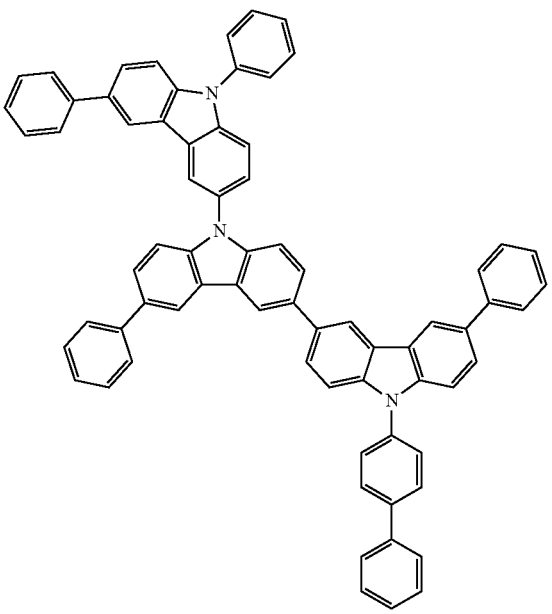

[CF 16]
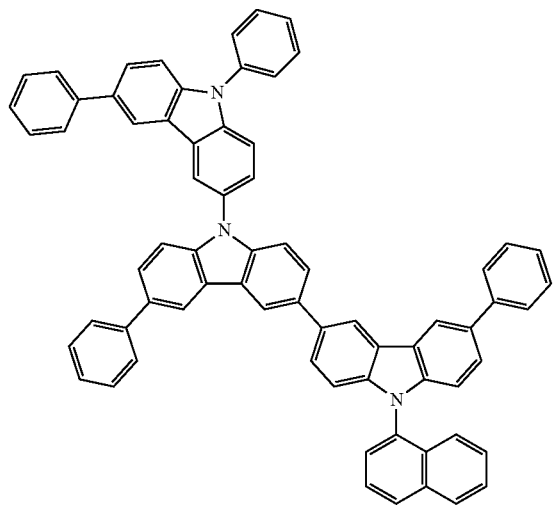
[CF 17]
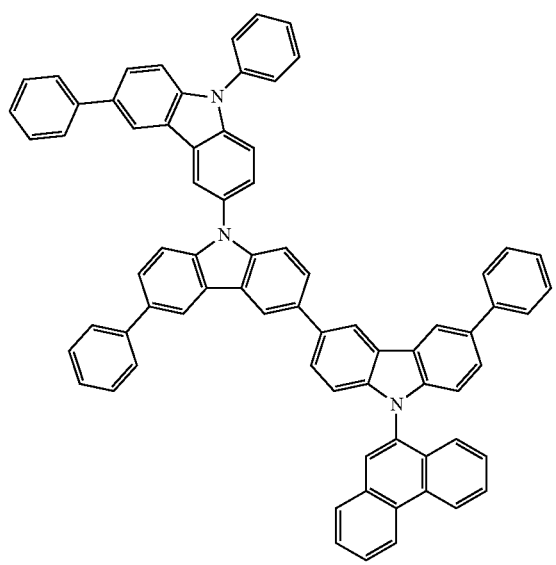
[CF 18]
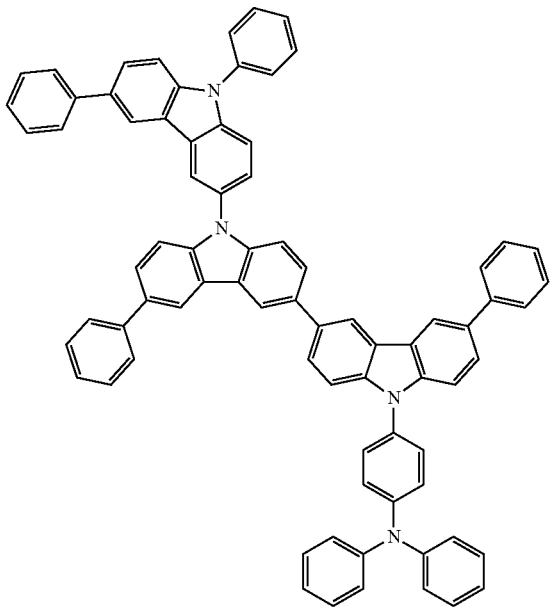
[CF 19]
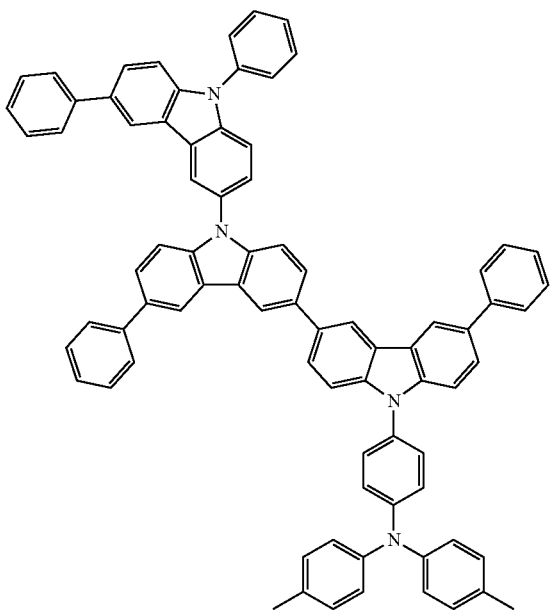

[CF 20]
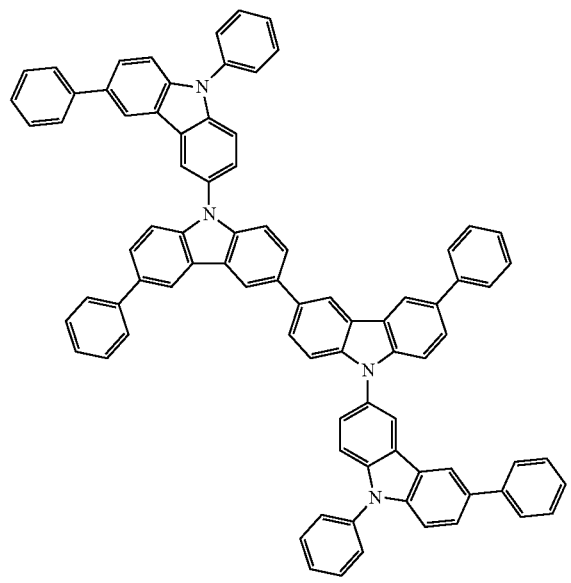
[CF 21]
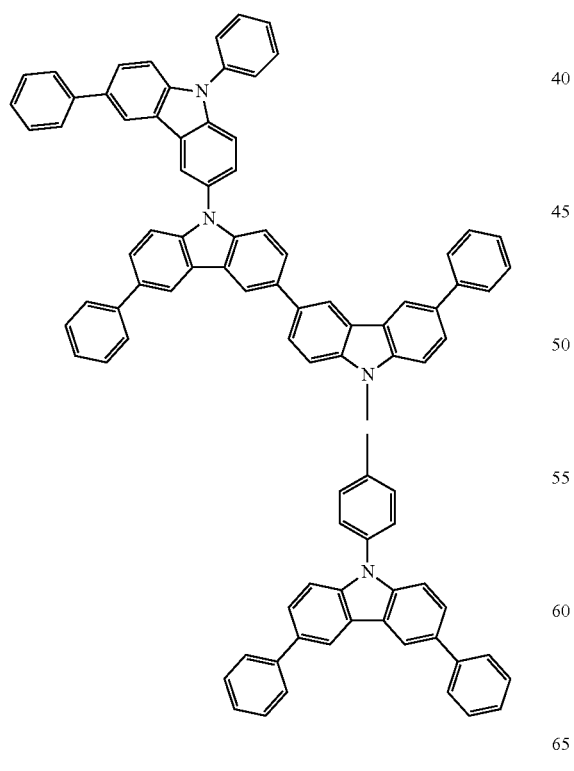
[CF 22]
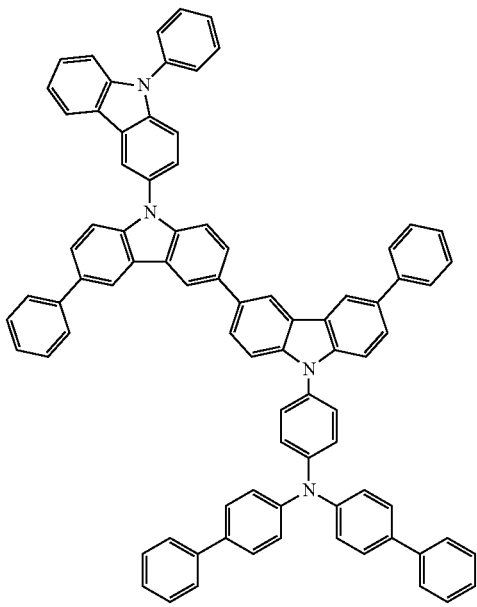
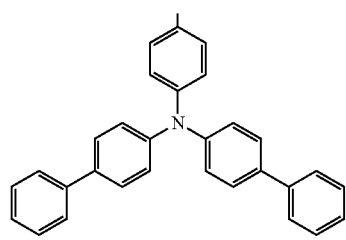
[CF 23]
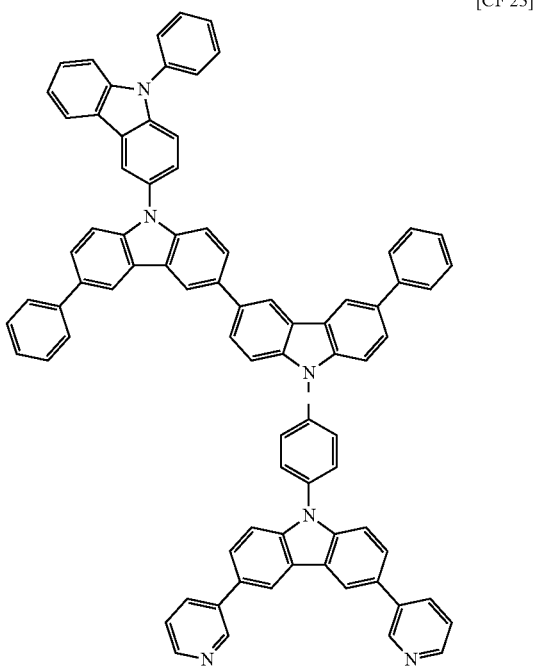

[CF 24]
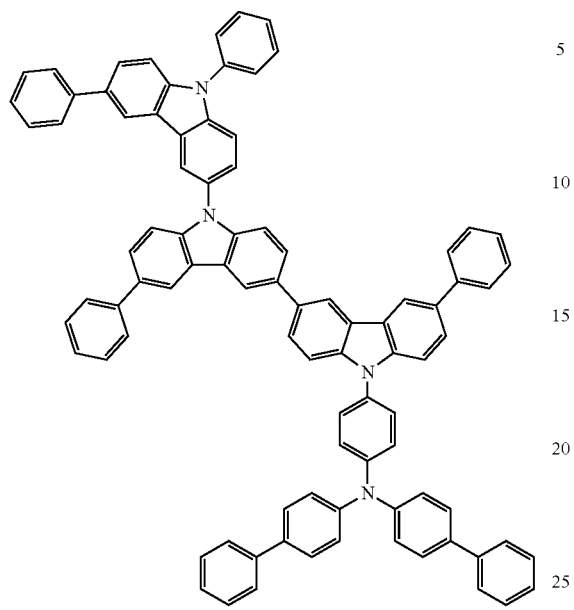
[CF 26]
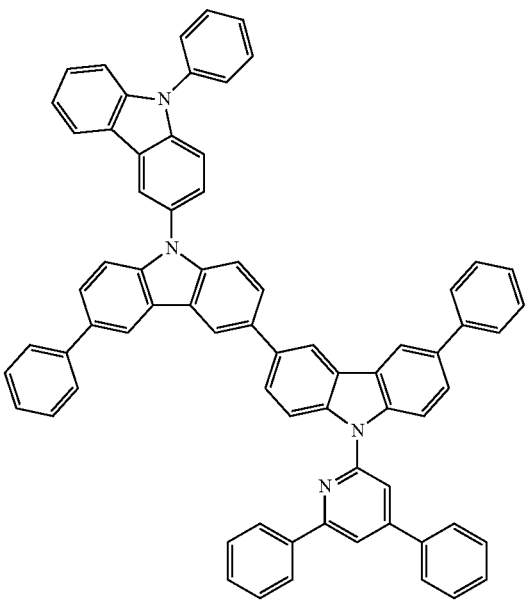 [SMILES: c1ccc(-c2cc(-c3ccccc3)nc(-n3c4ccc(-c5ccccc5)cc4c4cc(-c5ccc6c(c5)c5cc(-c7ccccc7)ccc5n6-c5ccc6c(c5)c5ccccc5n6-c5ccccc5)ccc43)c2)cc1]
[CF 25]
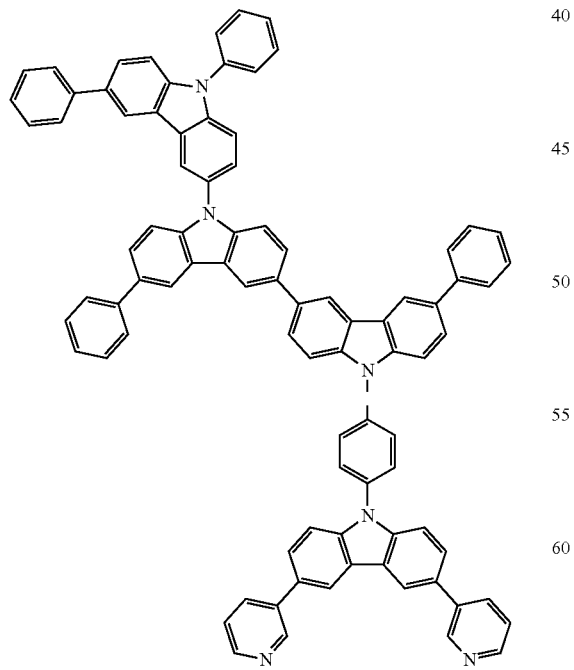
[CF 27]
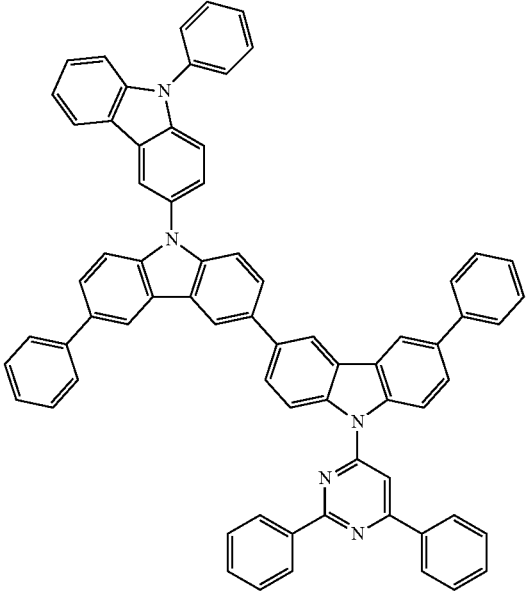

[CF 28]
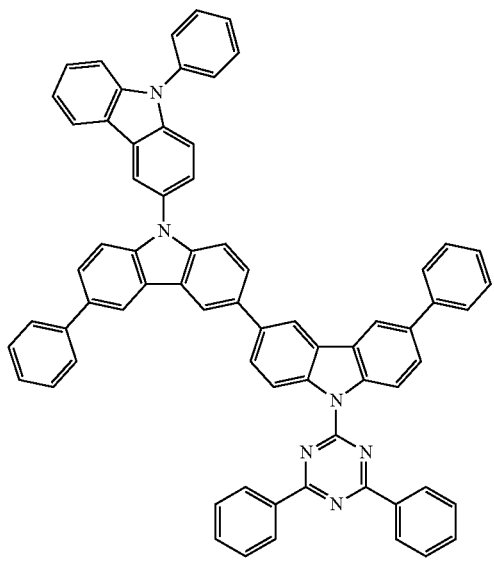
[CF 29]
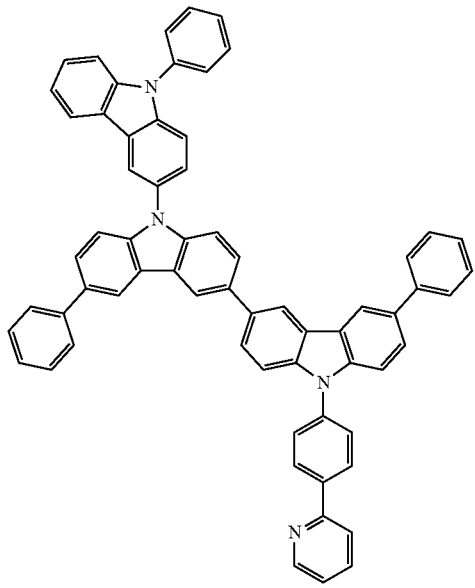
[CF 30]
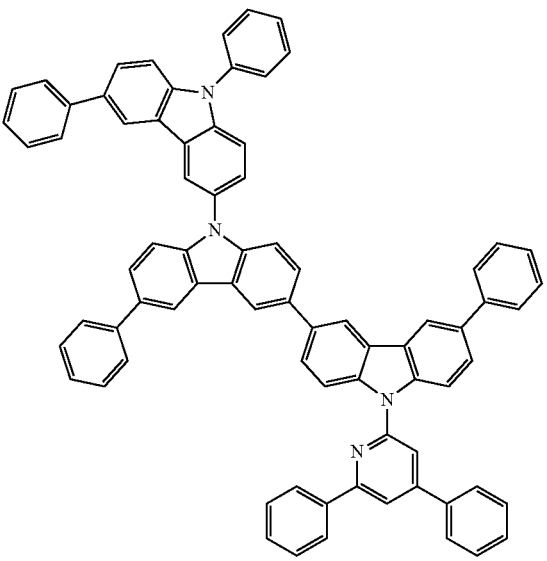
[CF 31]
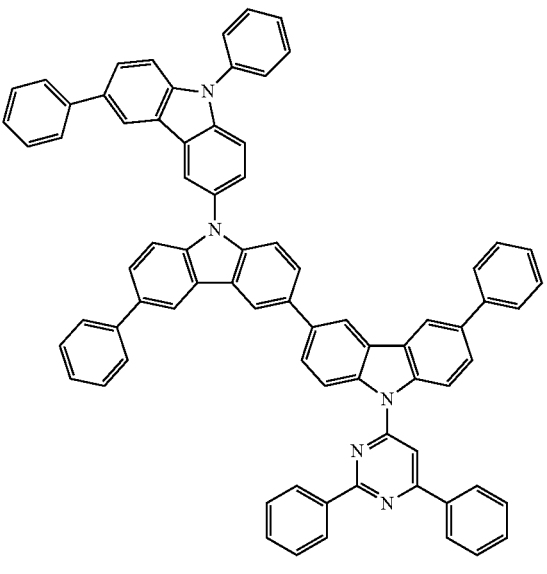

137
-continued
[CF 32]
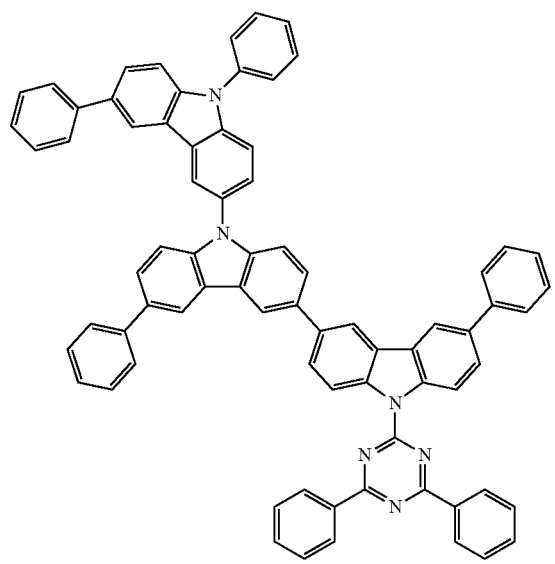
[CF 33]
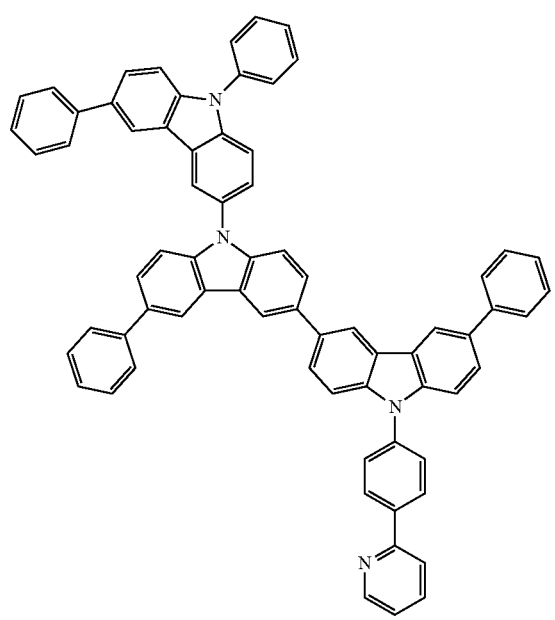
138
-continued
[CF 34]
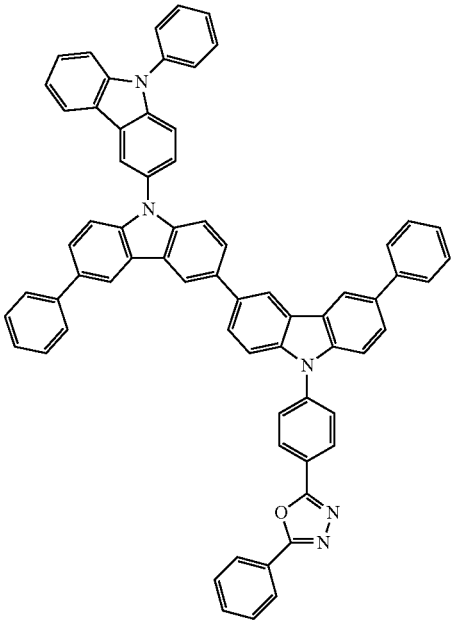
[CF 35]
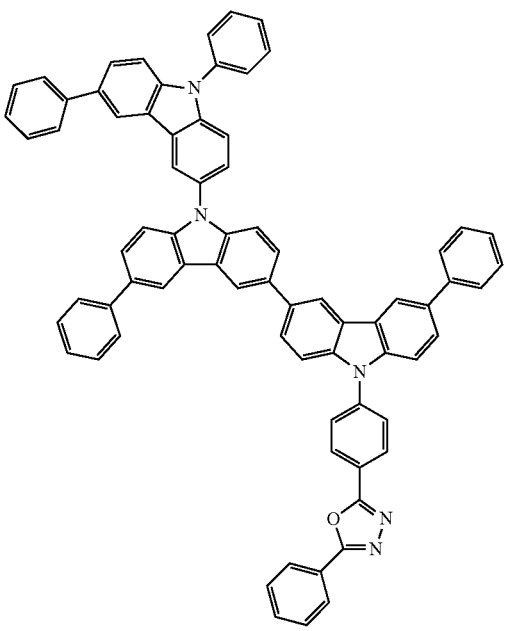

[CF 36]
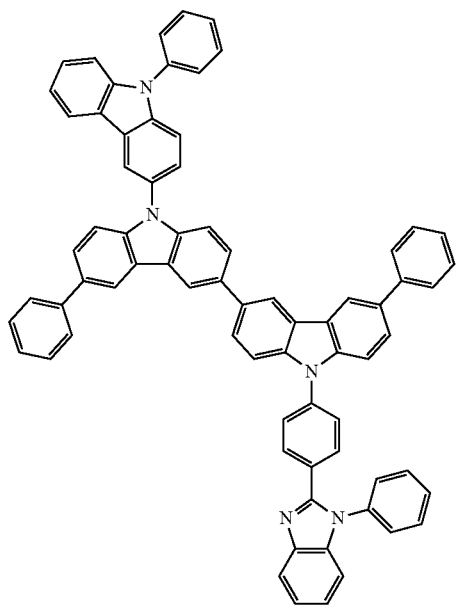
[CF 38]
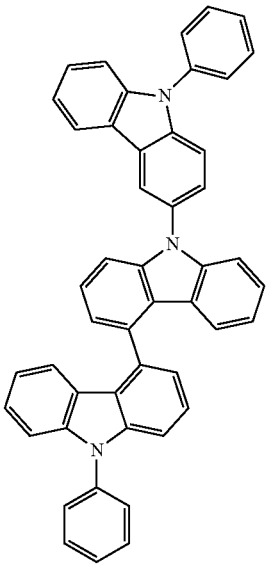
[CF 37]
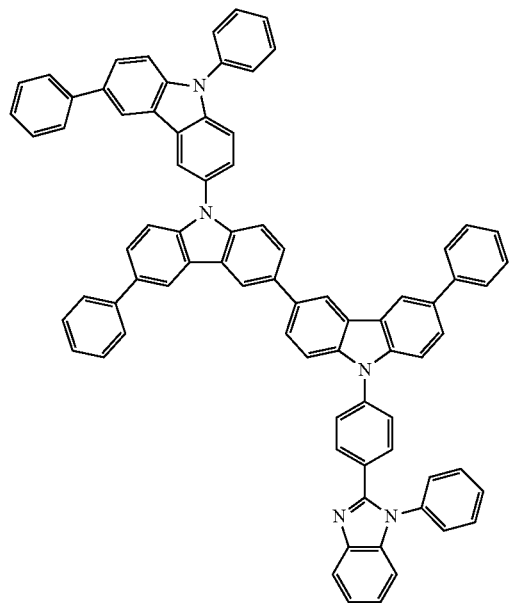
[CF 42]
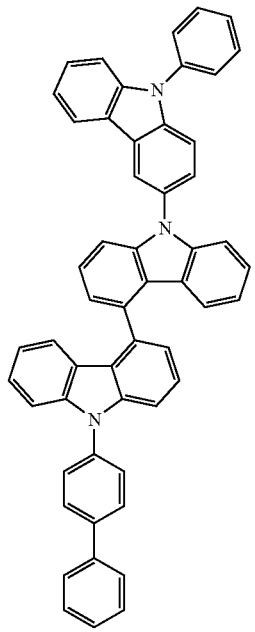

[CF 43]
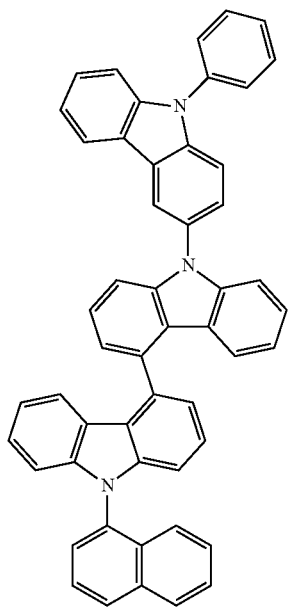
[CF 44]
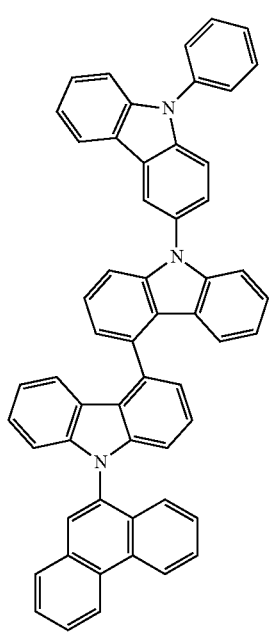
[CF 45]
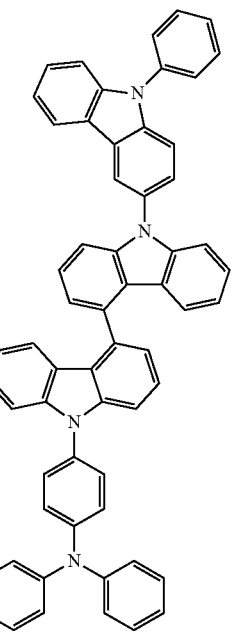
[CF 46]
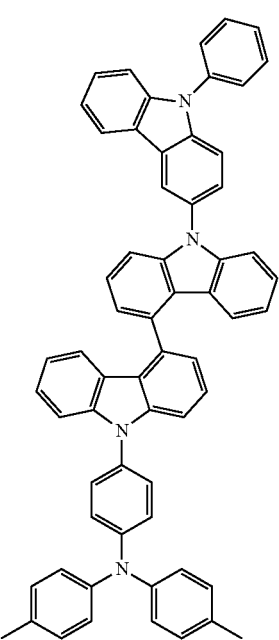

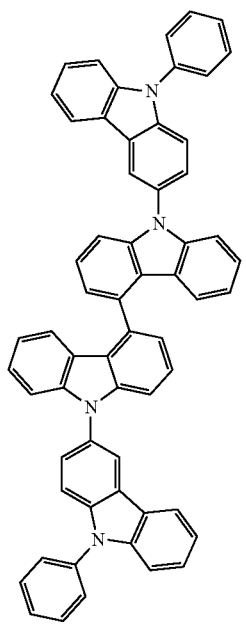
[CF 47]
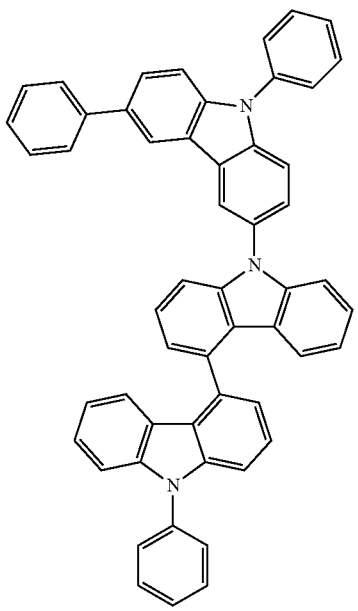
[CF 49]
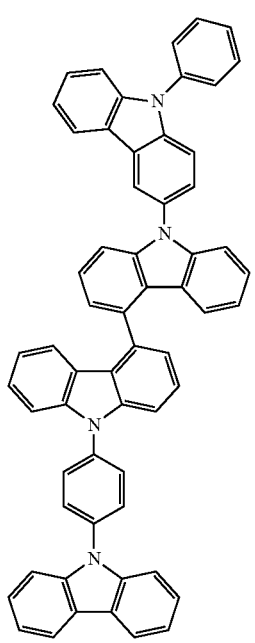
[CF 48]

[CF 51]
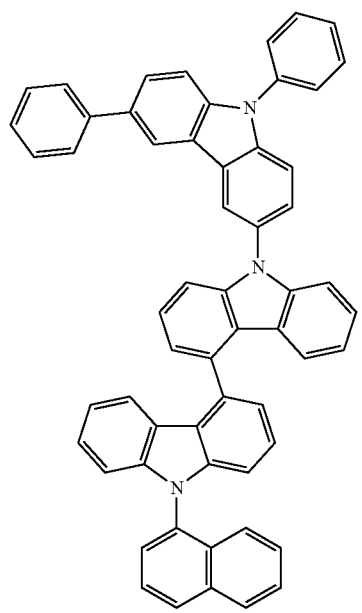
[CF 52]
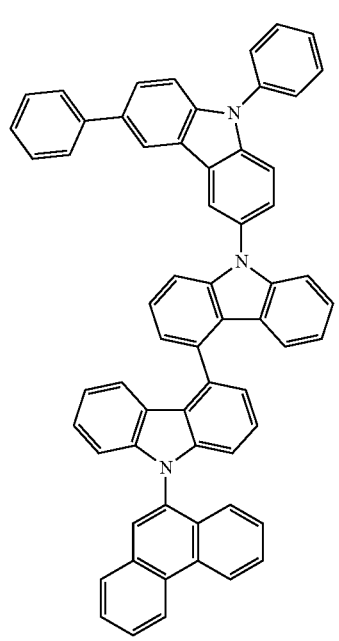
[CF 53]
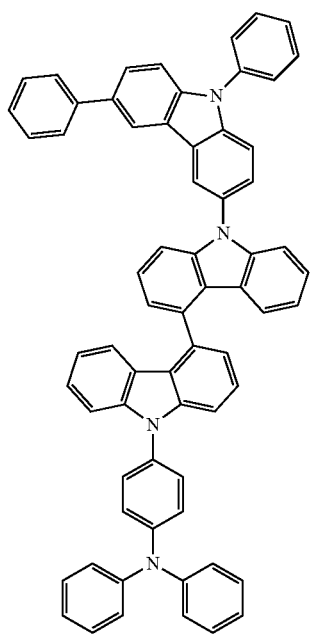
[CF 54]
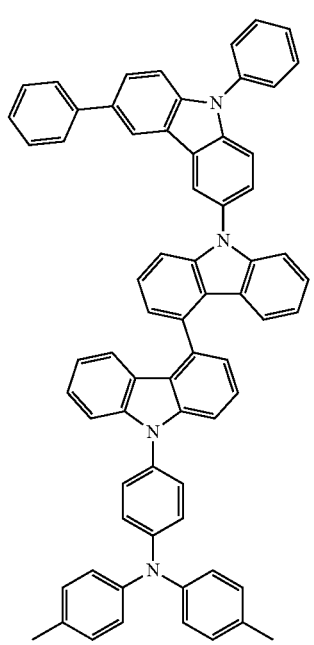

[CF 55]
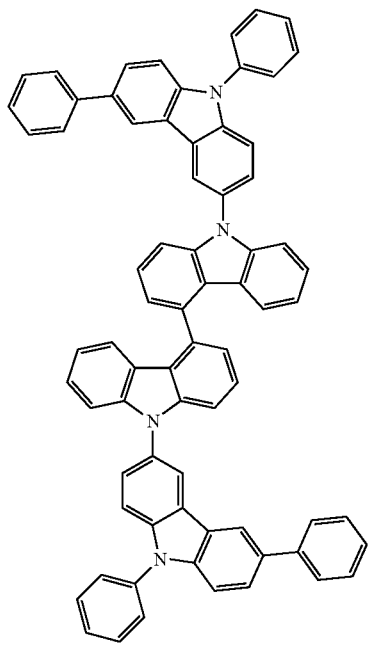
[CF 56]
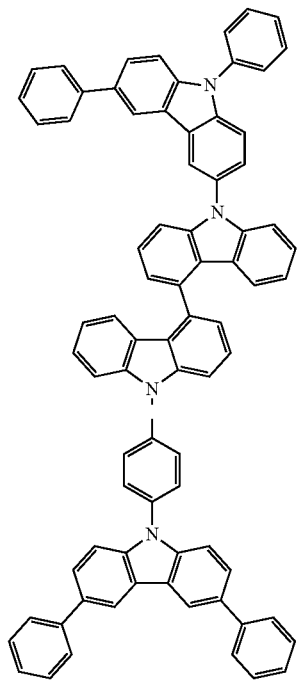
[CF 57]
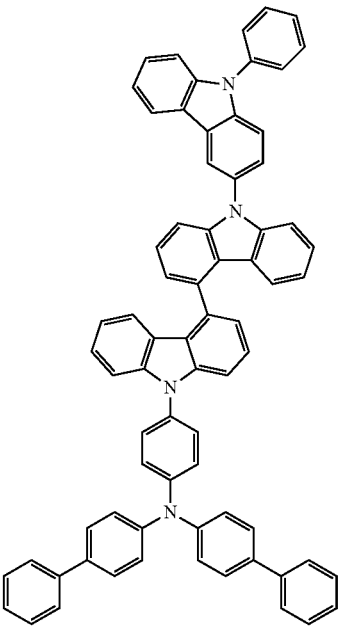
[CF 58]

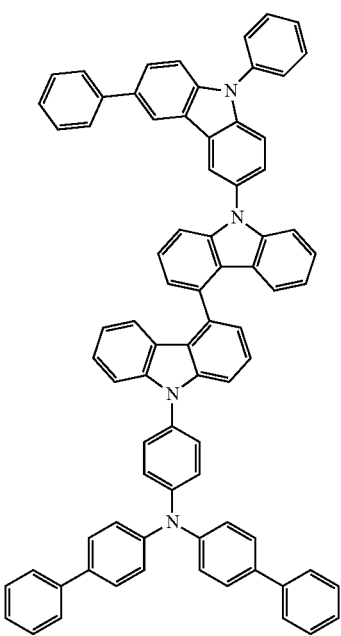
[CF 59]
[CF 60]
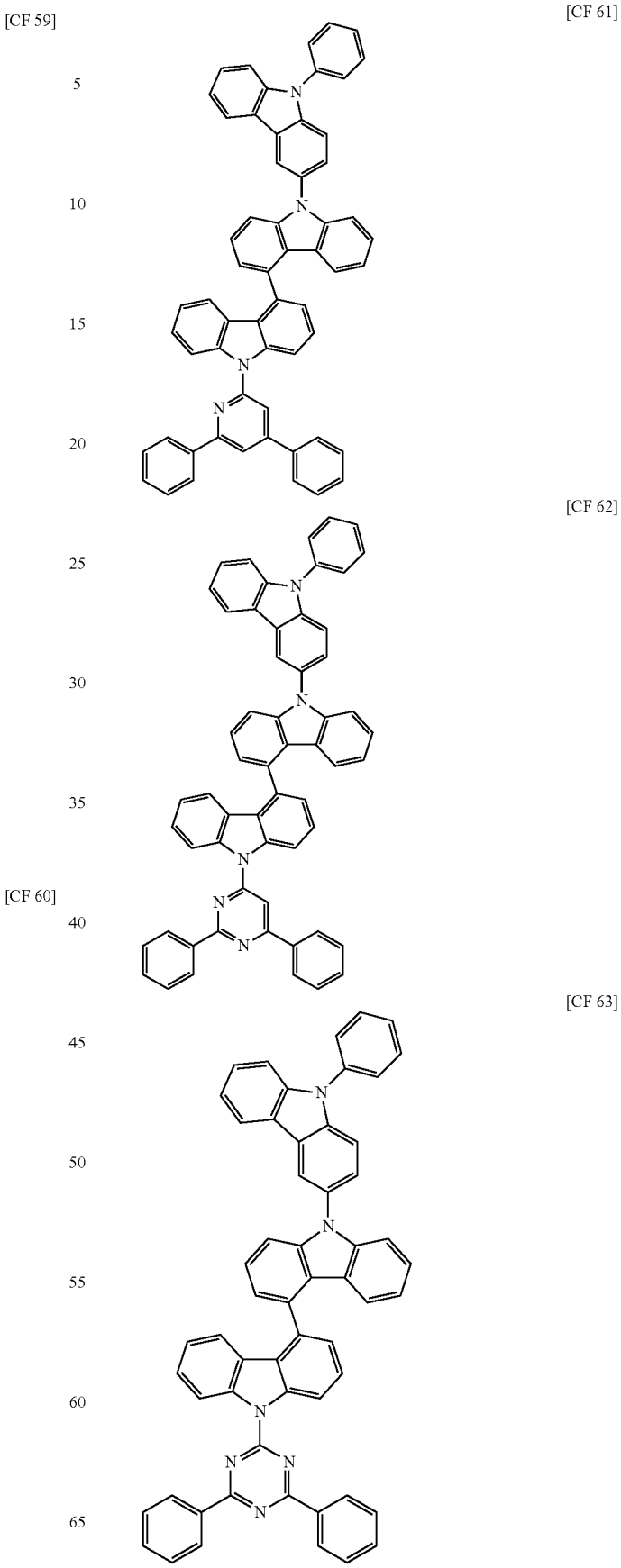
[CF 61]
[CF 62]
[CF 63]

[CF 64]
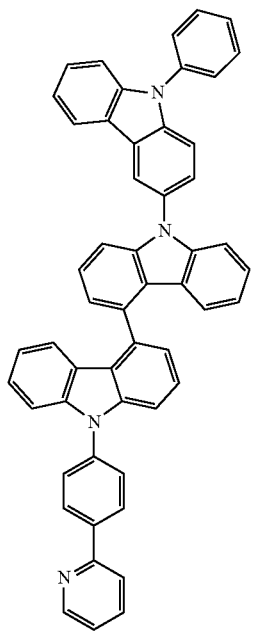
[CF 66]
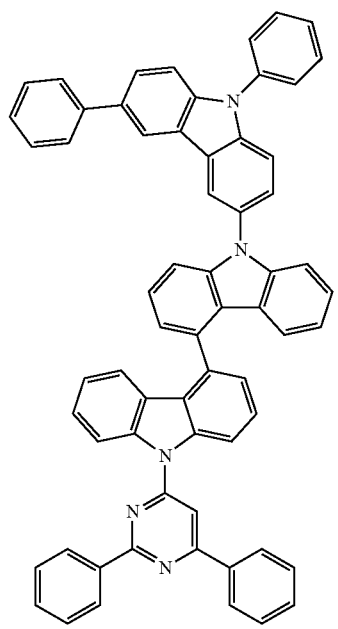
[CF 65]
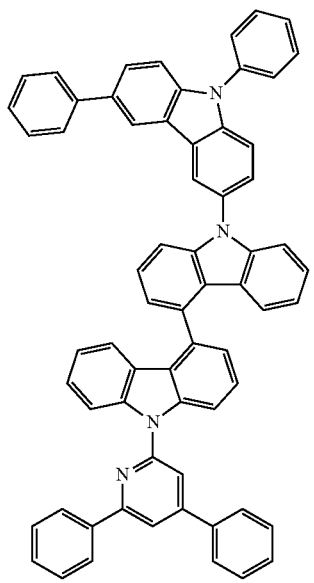
[CF 67]
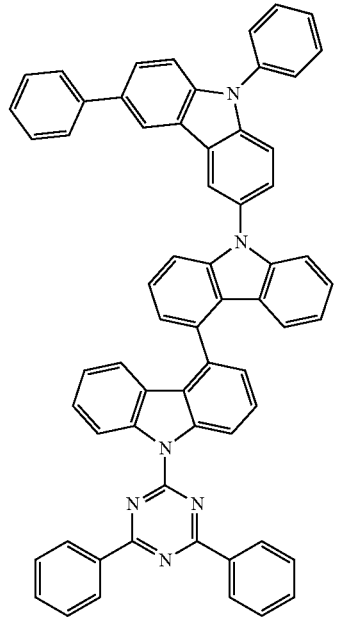

[CF 68]
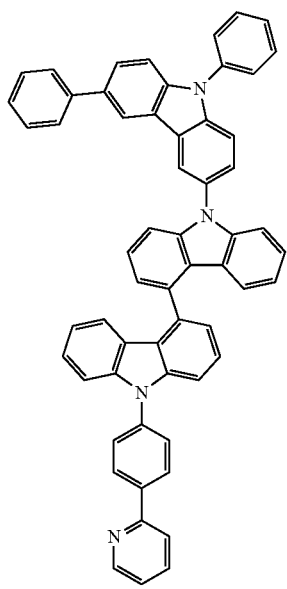
[CF 69]
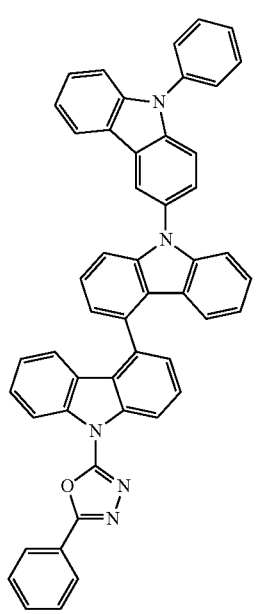
[CF 70]
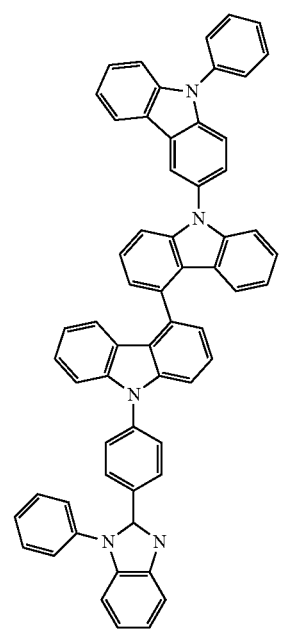
[CF 71]
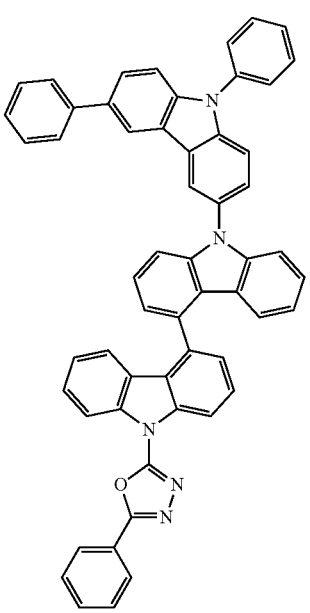

[CF 72]
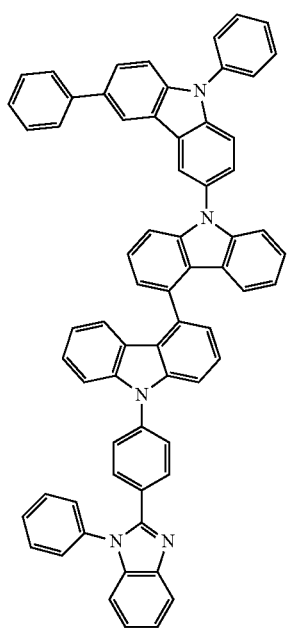
[CF 73]
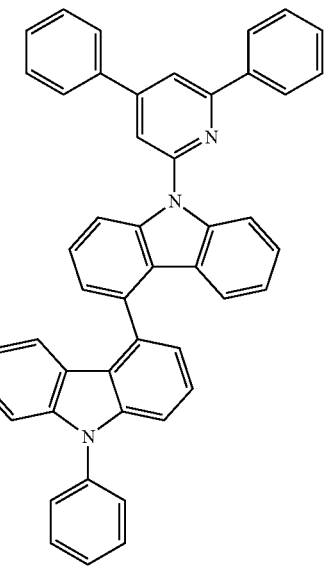
[CF 74]
[CF 75]

[CF 76]
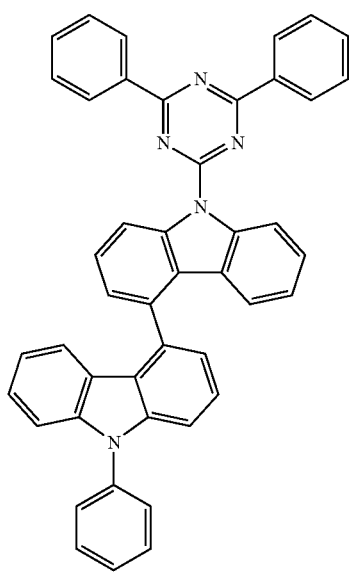
[CF 77]
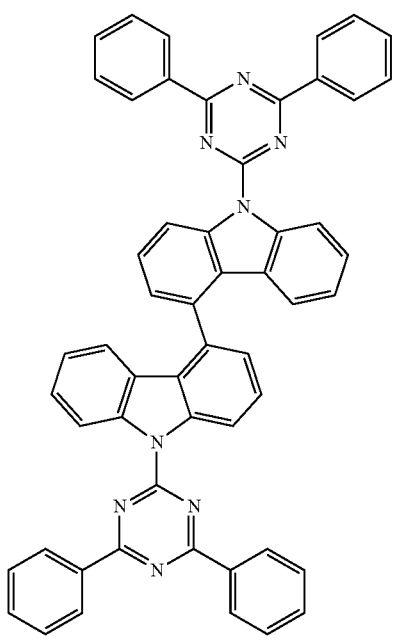
[CF 78]
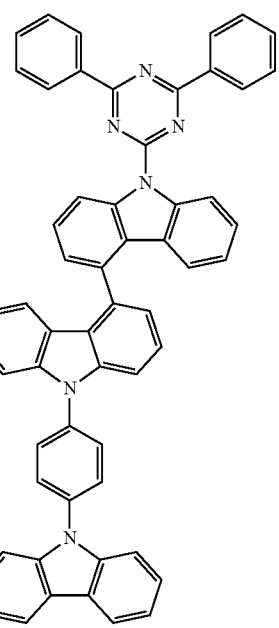
[CF 79]
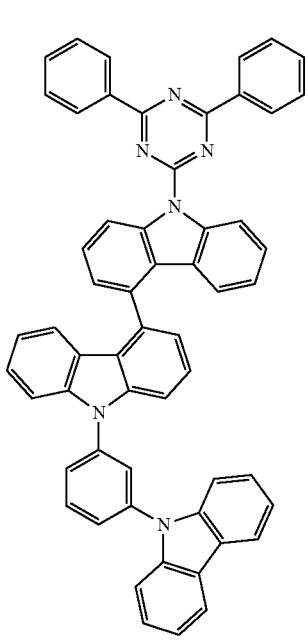

[CF 80]
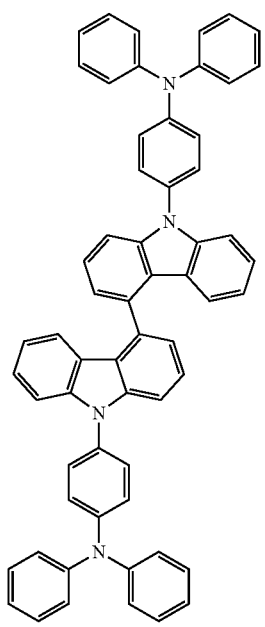
[CF 82]
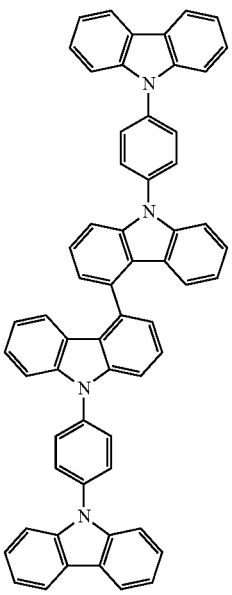
[CF 81]
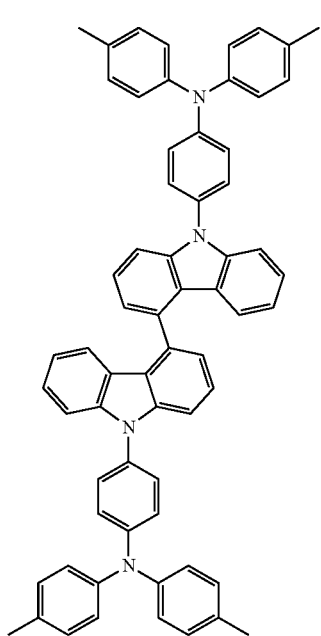
[CF 83]
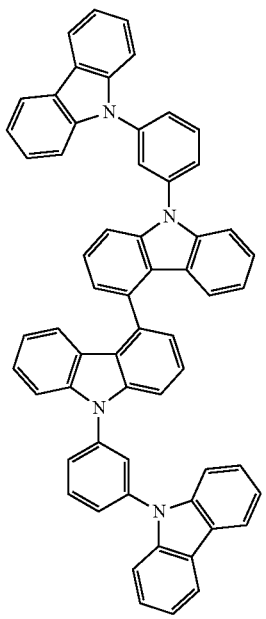
According to embodiments, the compound for an organic photoelectric device may be represented by, e.g., the following CF N-3 to N-54.

[CF N-3]
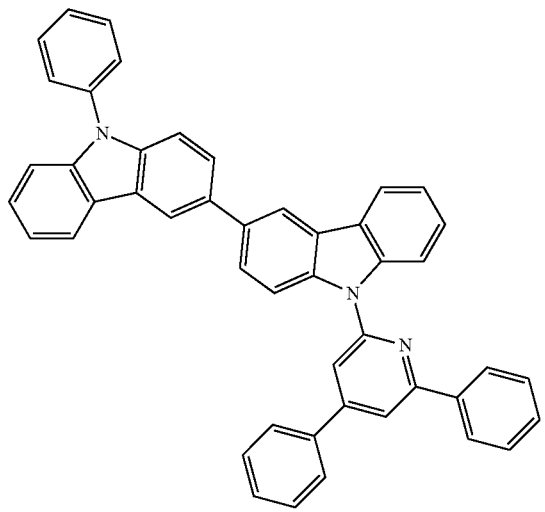
[CF N-4]
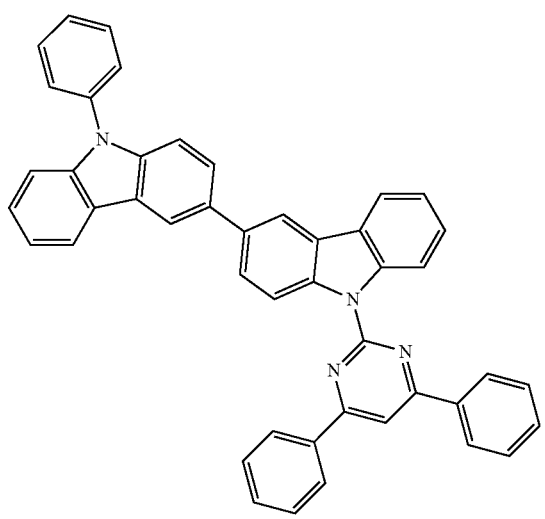
[CF N-5]
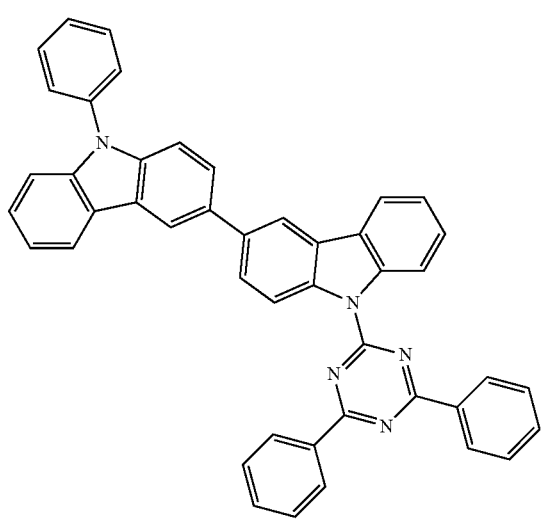
[CF N-6]
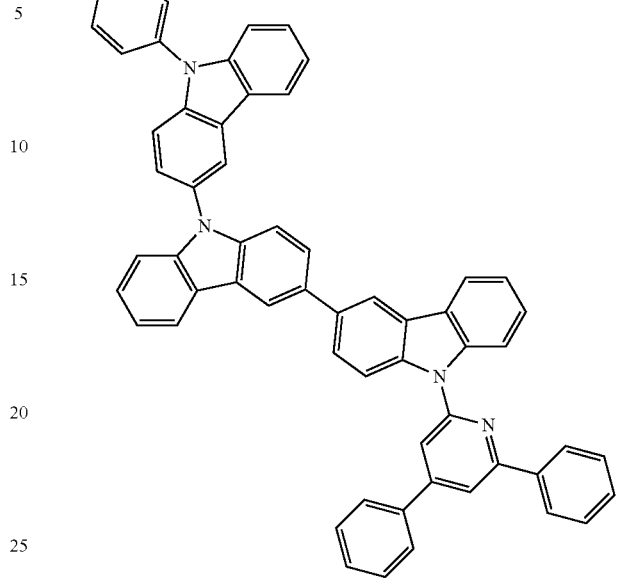
[CF N-7]
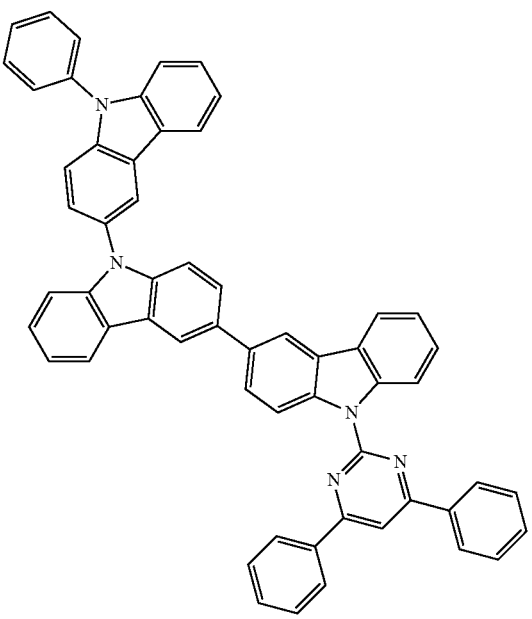

[CF N-8]
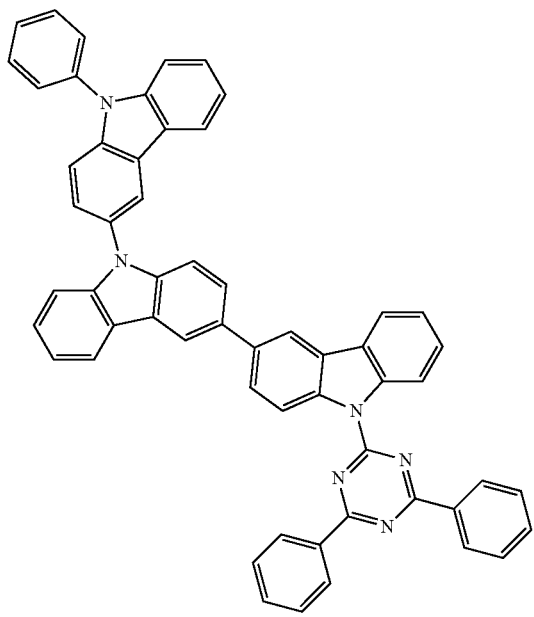
[CF N-9]
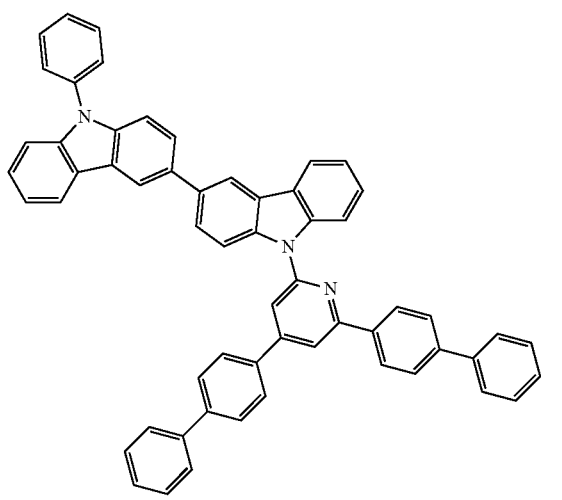
[CF N-10]
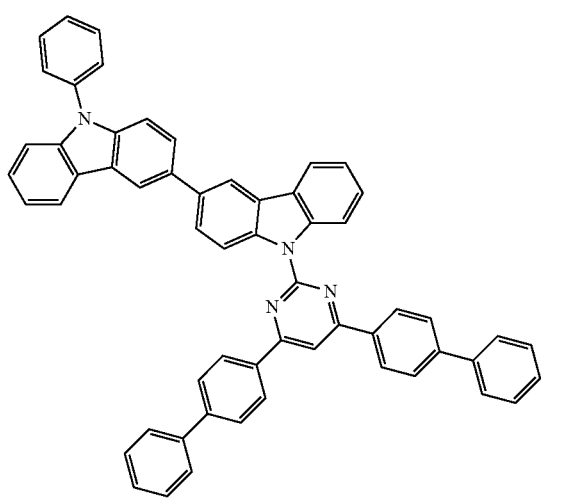
[CF N-11]
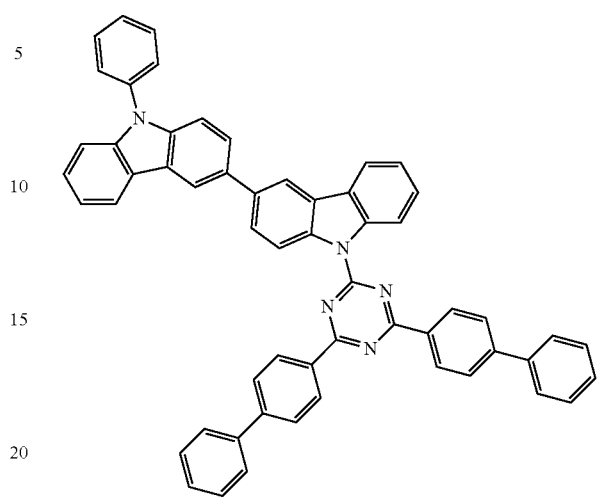
[CF N-12]
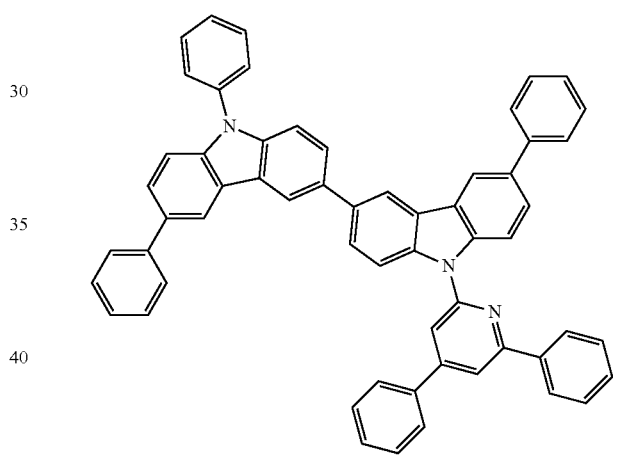
[CF N-13]
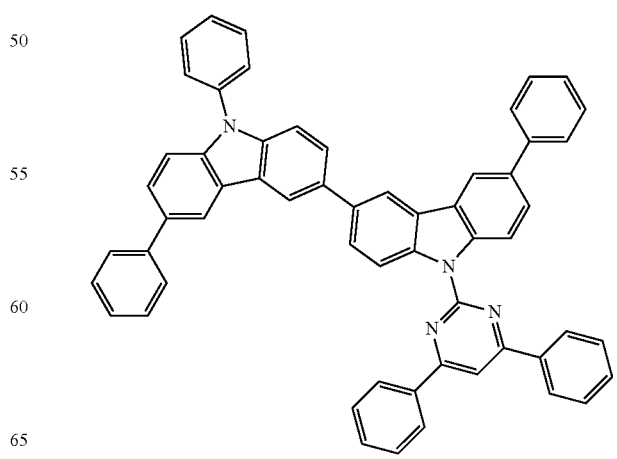

[CF N-14]
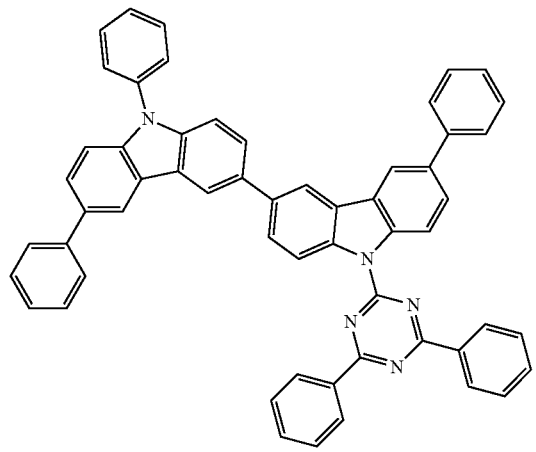
[CF N-15]
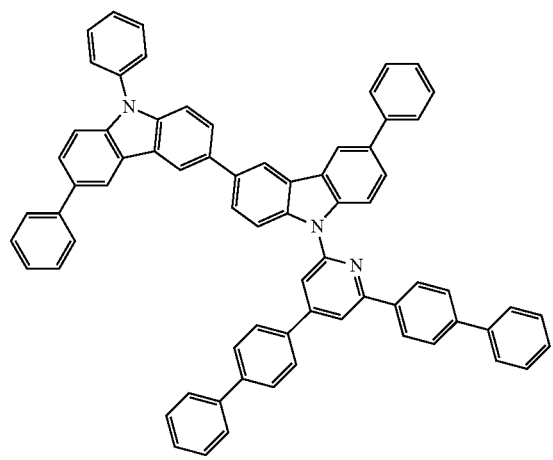
[CF N-16]
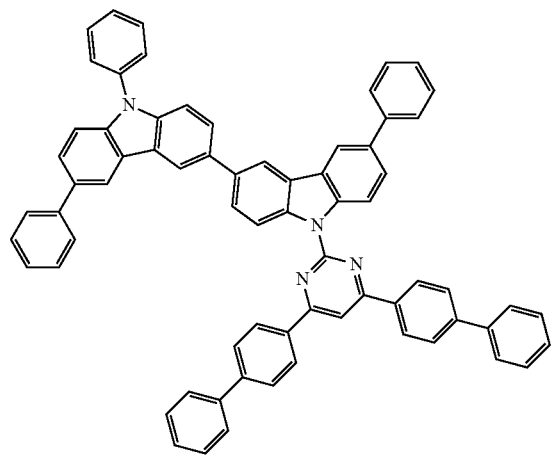
[CF N-17]
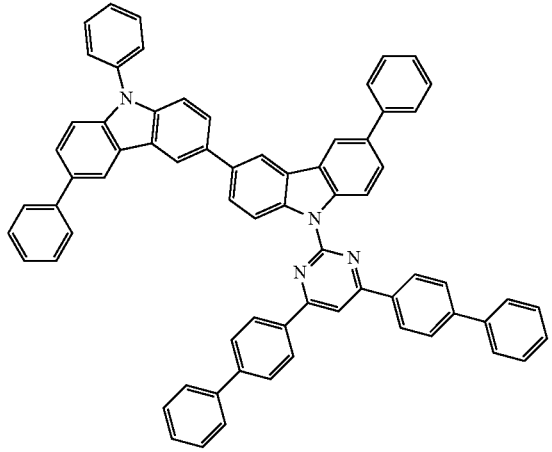
[CF N-18]
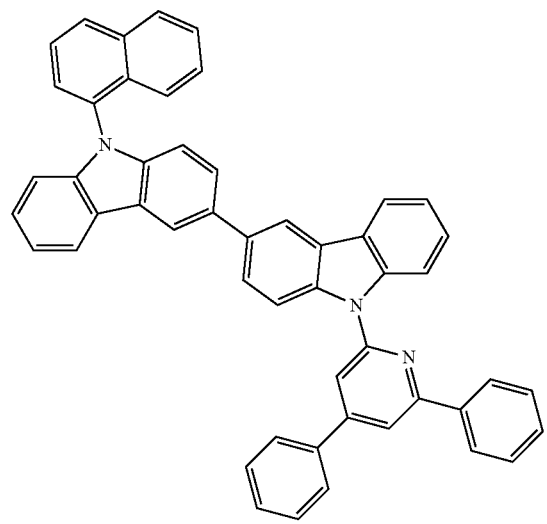
[CF N-19]
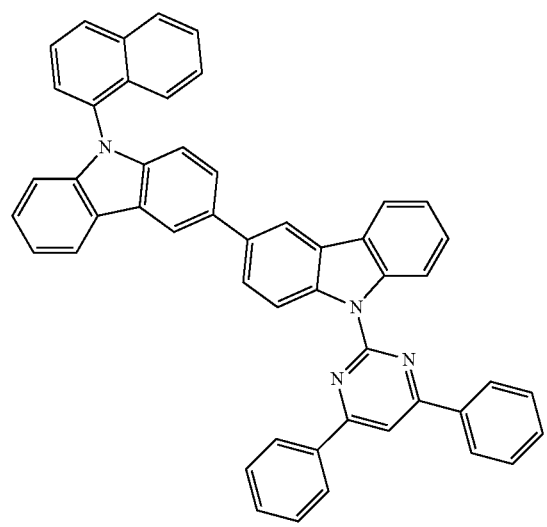

[CF N-20]
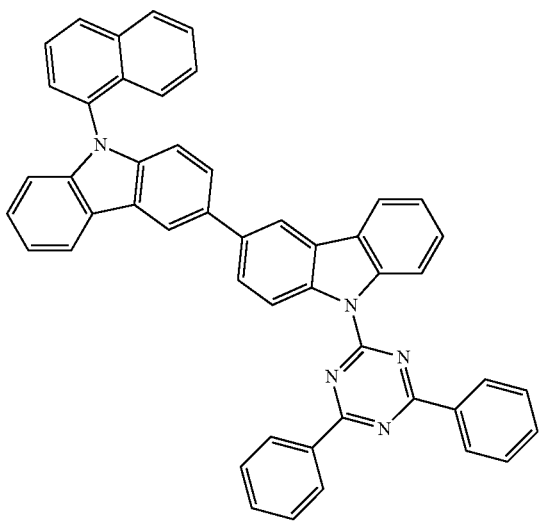
[CF N-21]
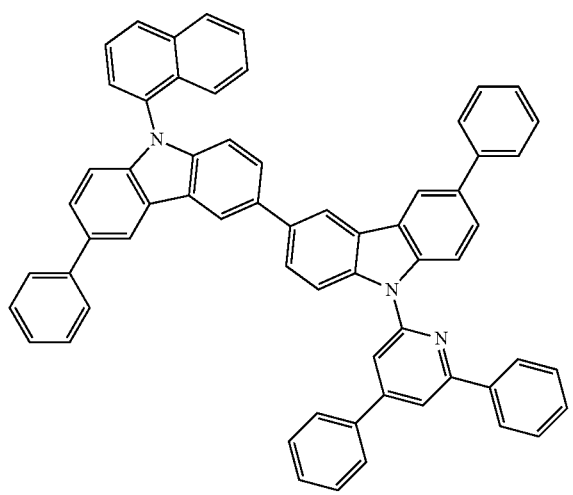
[CF N-22]
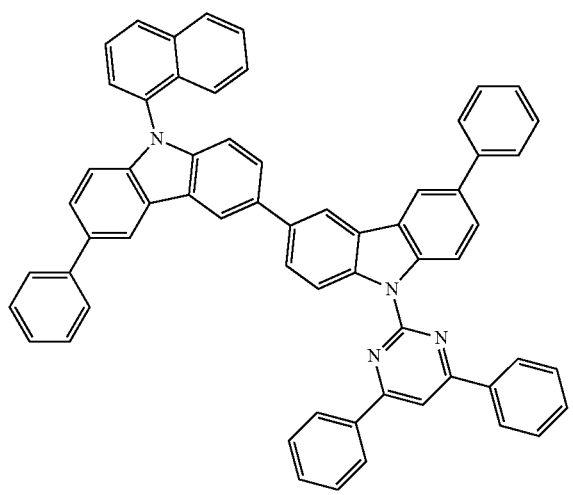
[CF N-23]
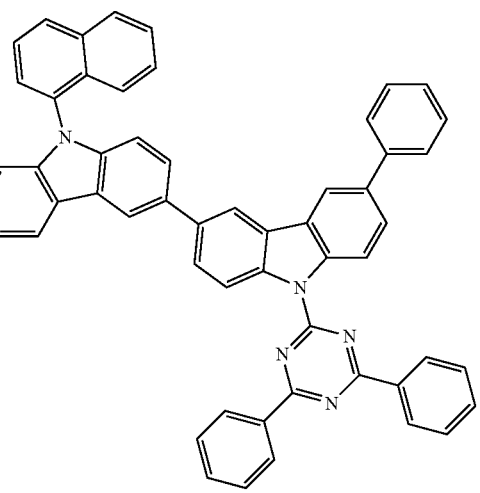
[CF N-24]
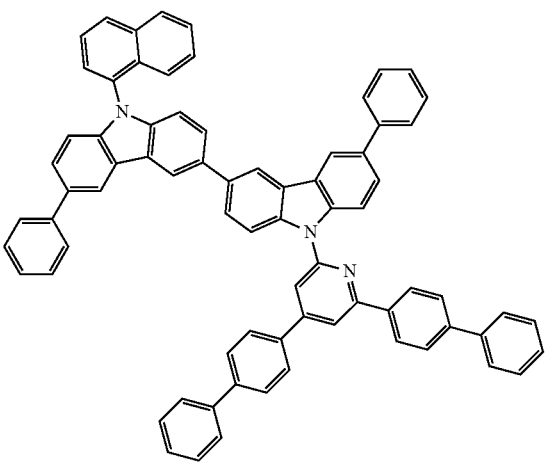
[CF N-25]
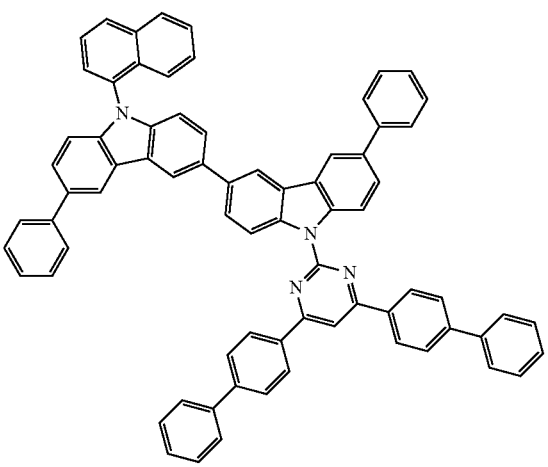

[CF N-26]
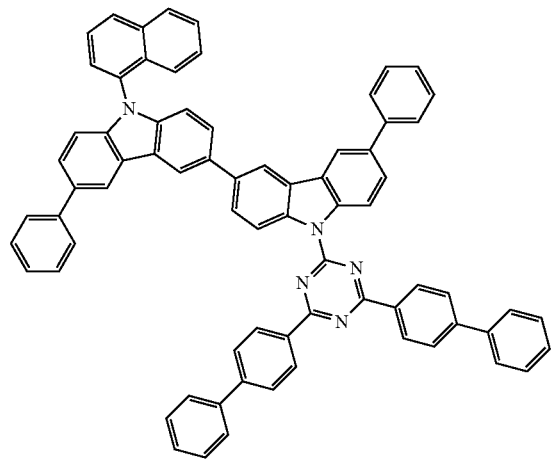
[CF N-27]
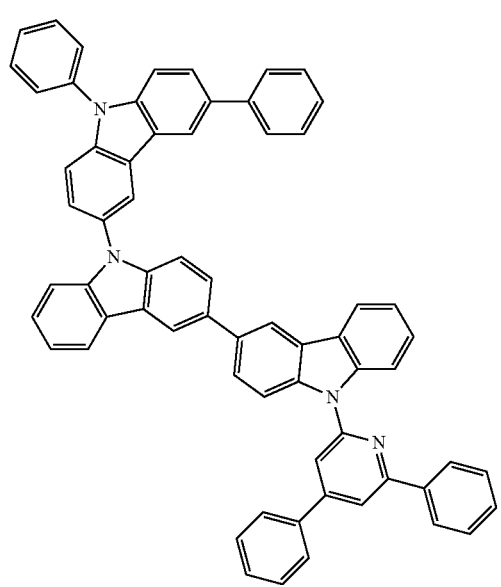
[CF N-28]
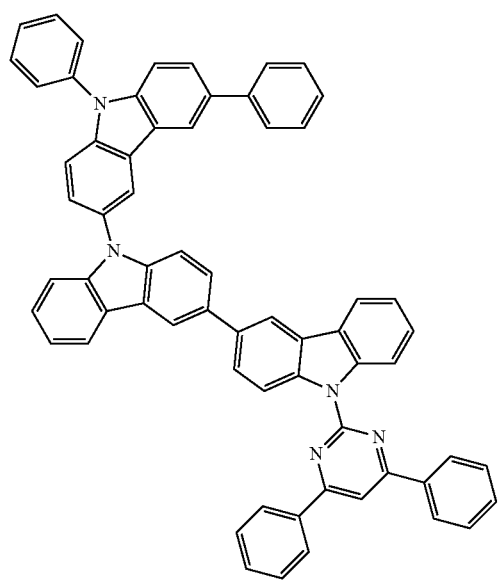
[CF N-29]
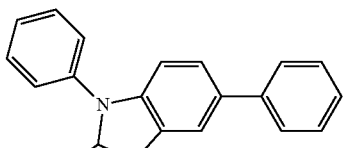
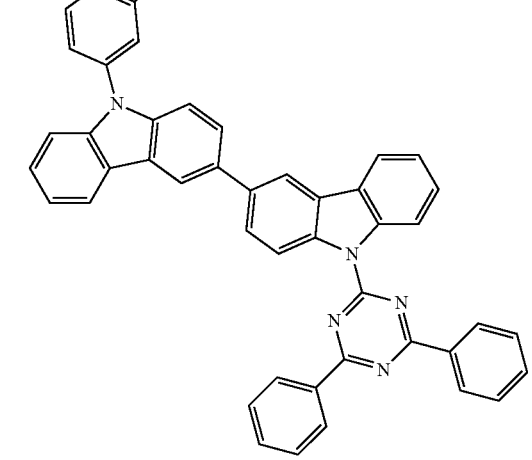
[CF N-30]
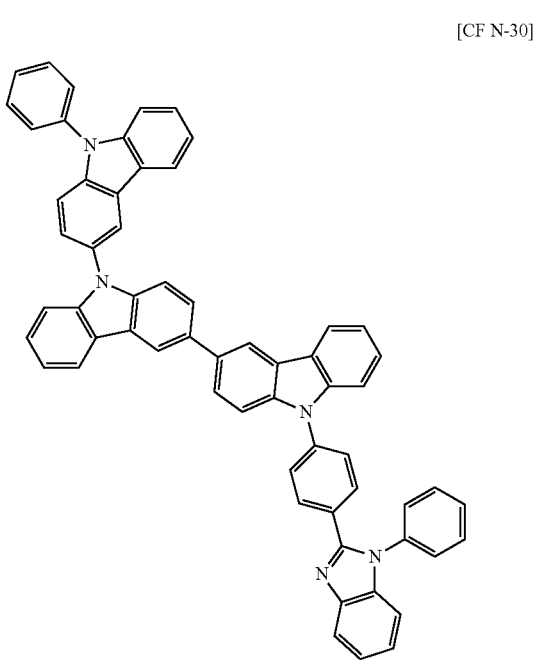

[CF N-31]
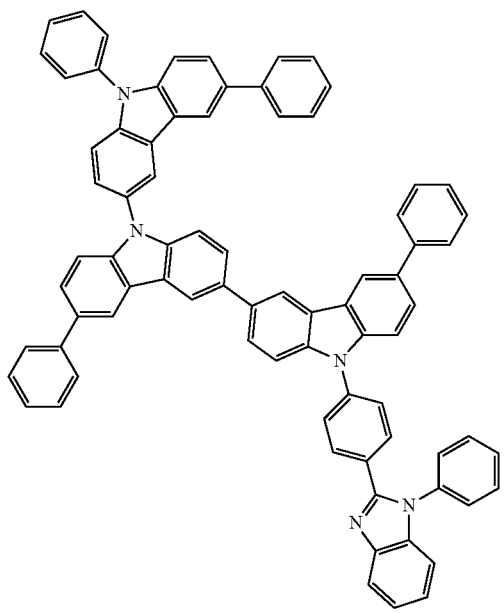
[CF N-33]
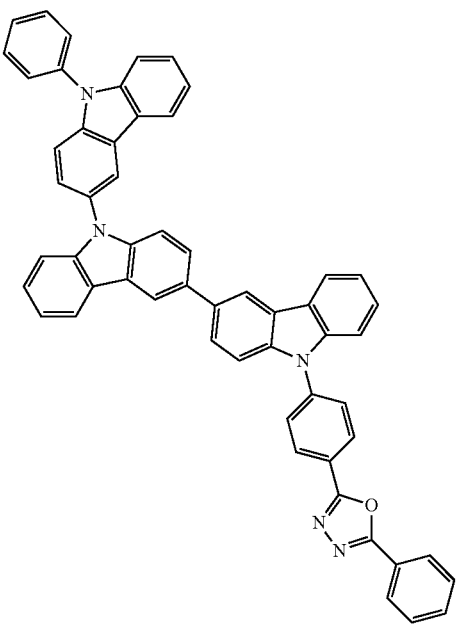
[CF N-32]
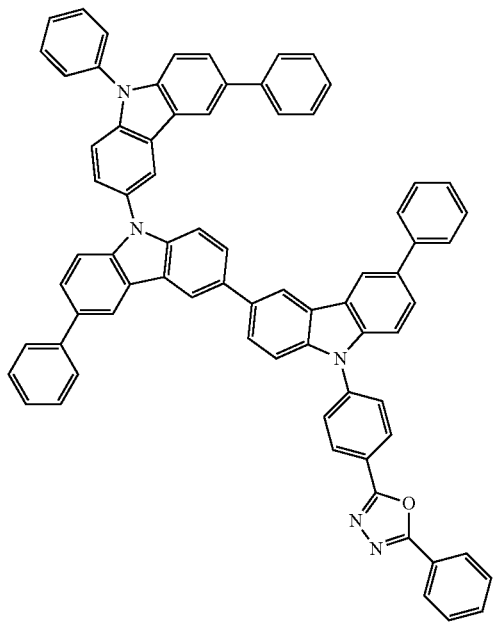
[CF N-34]
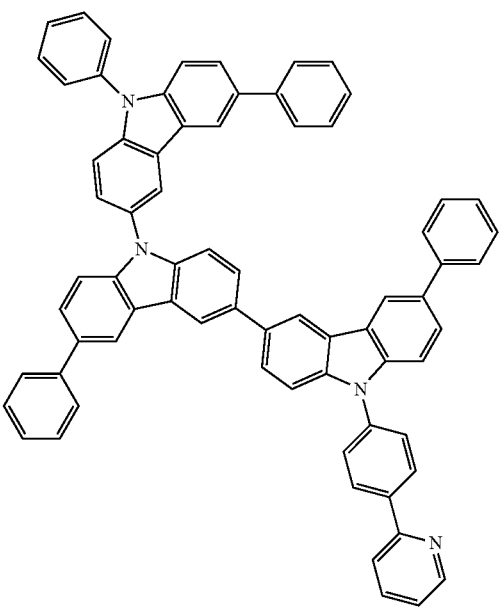

[CF N-35]
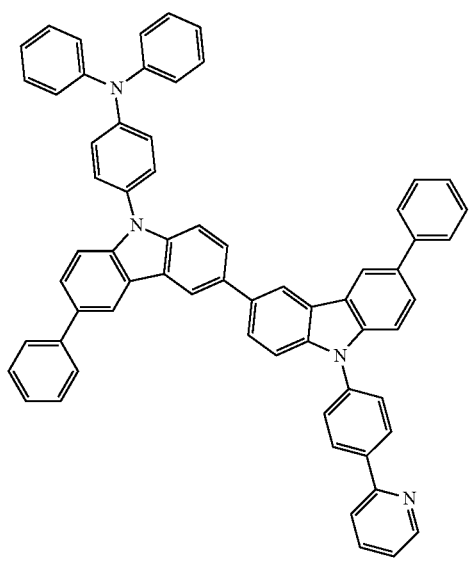
[CF N-37]
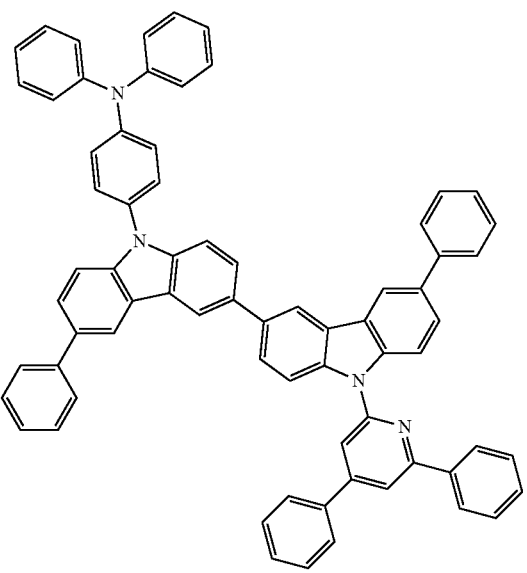
[CF N-36]
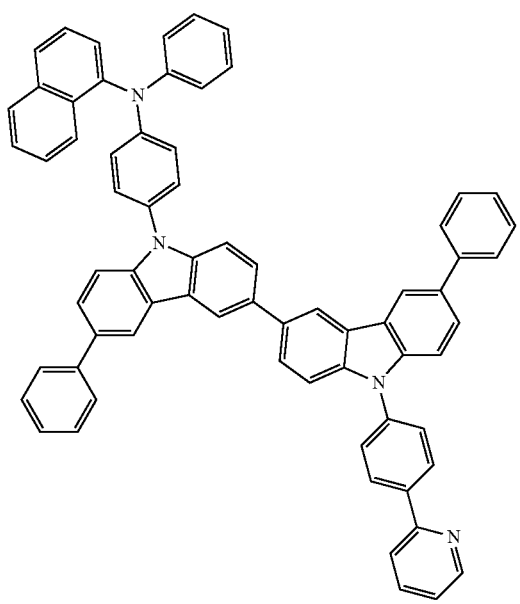
[CF N-38]
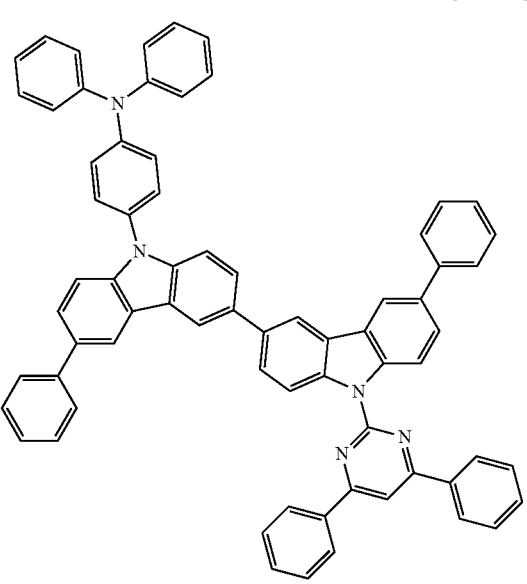

[CF N-39]
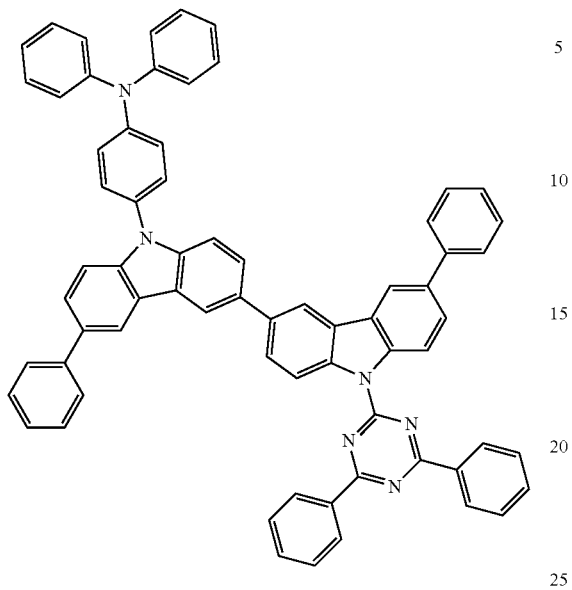
[CF N-41]
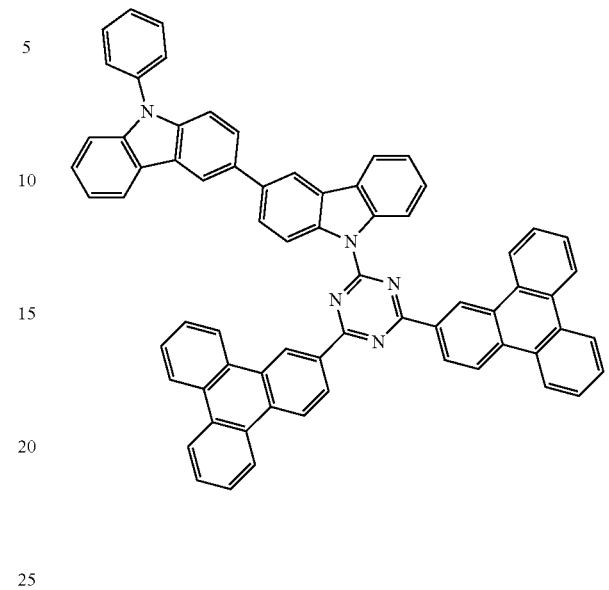
[CF N-40]
[CF N-42]
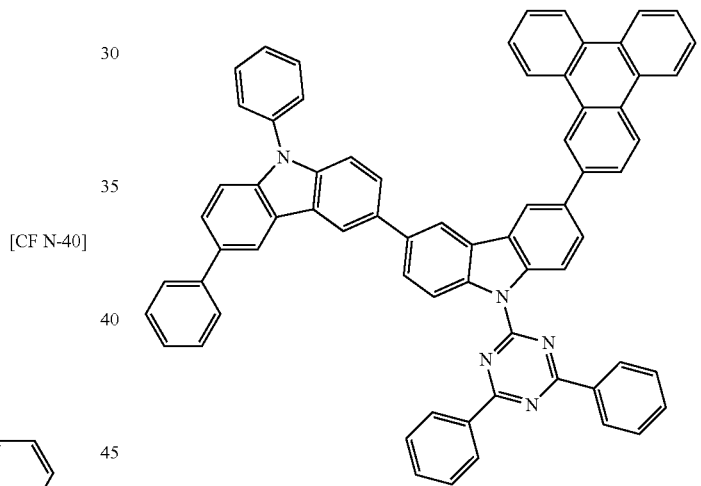
[CF N-43]
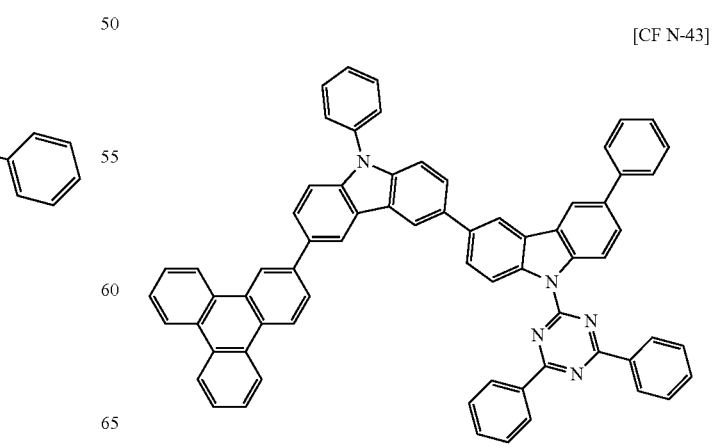

-continued
[CF N-44]
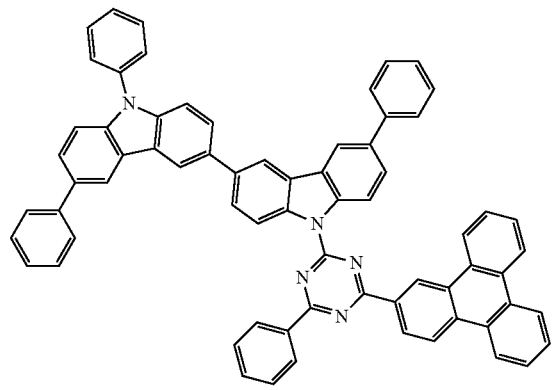
[CF N-45]
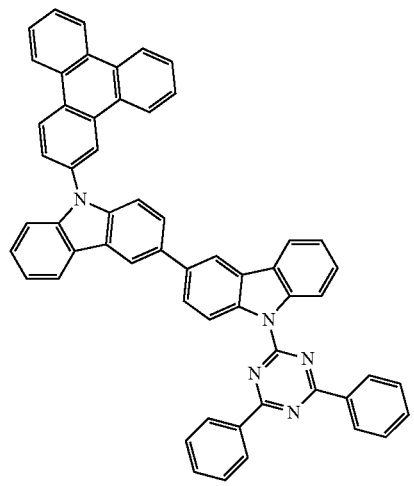
[CF N-46]
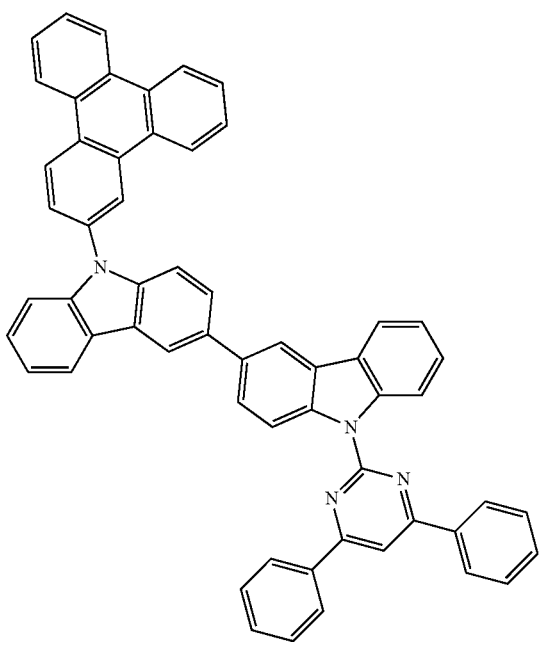
-continued
[CF N-47]
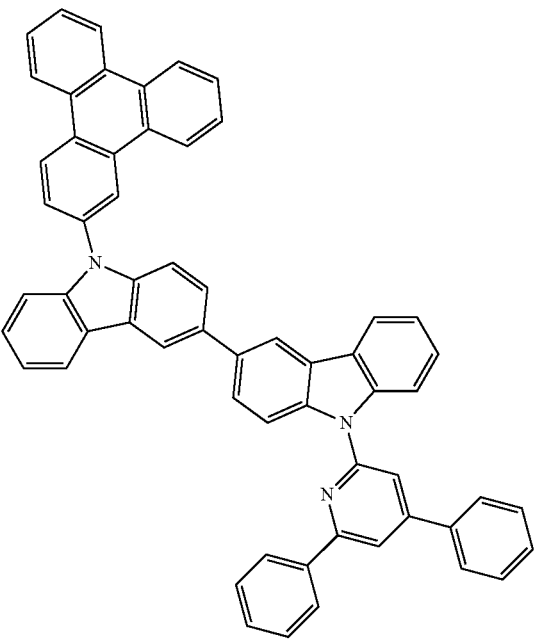
[CF N-48]
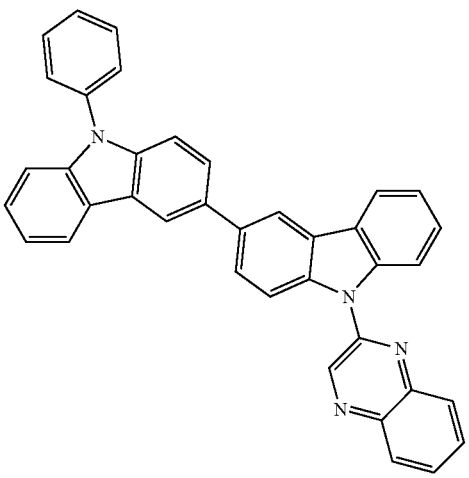
[CF N-49]
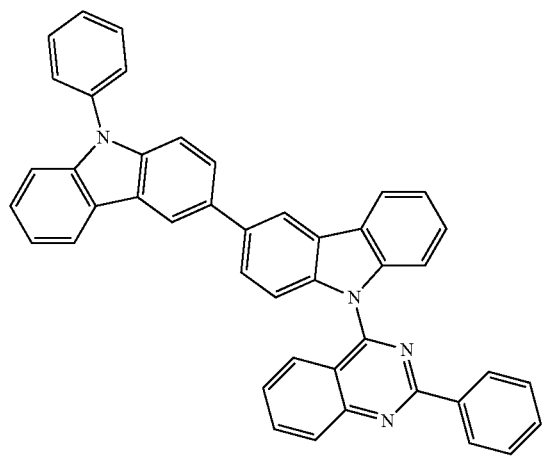

[CF N-50]
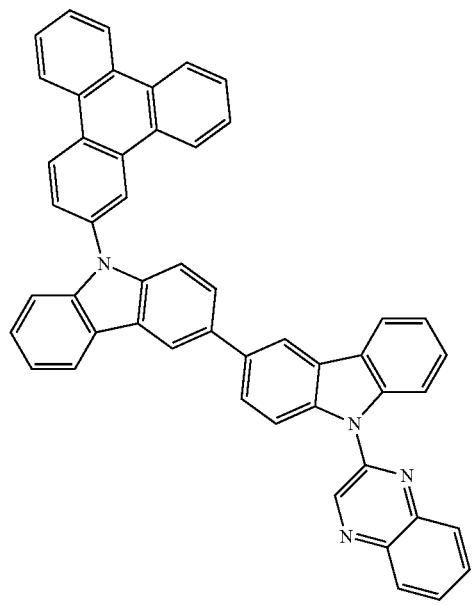
[CF N-51]
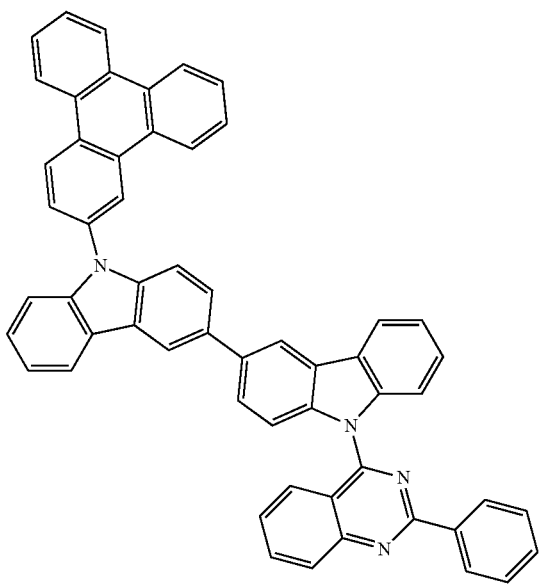
[CF N-52]
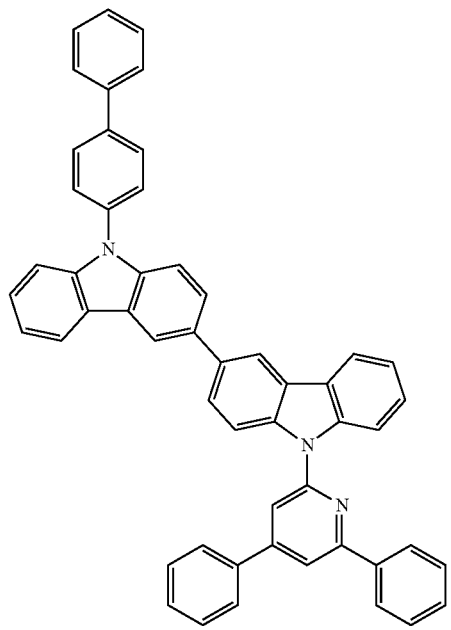
[CF N-53]
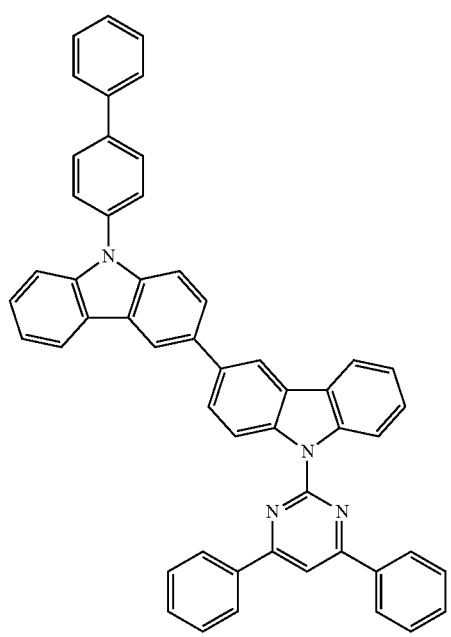

[CF N-54]
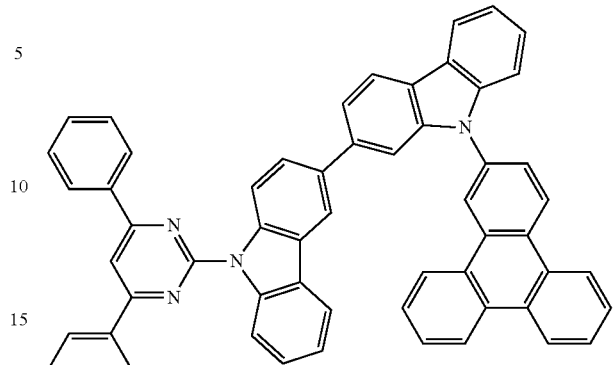
[CF A-4]
According to embodiments, the compound for an organic photoelectric device may be represented by, e.g., the following CF A-2 to A-26.
[CF A-2]
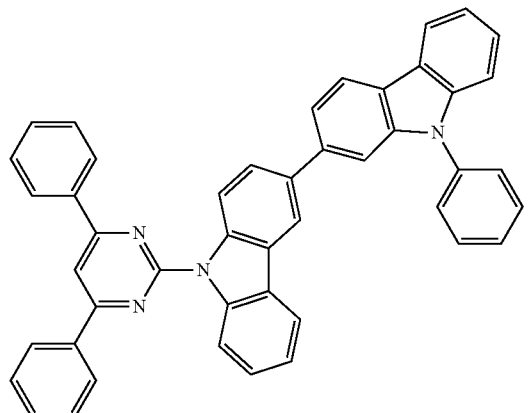
[CF A-5]
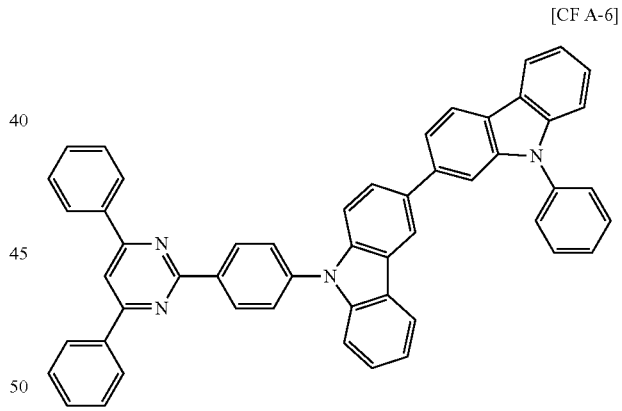
[CF A-6]
[CF A-3]
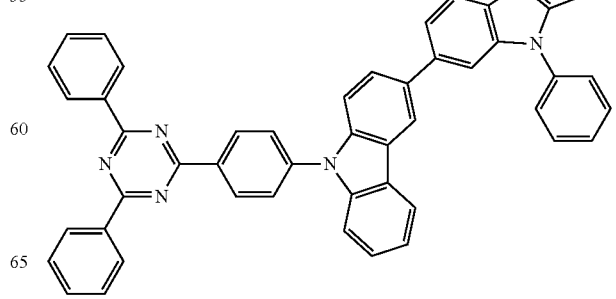
[CF A-7]

[CF A-8]
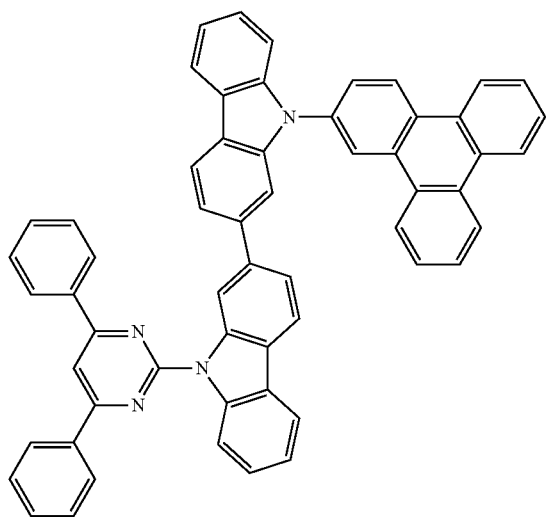
[CF A-9]
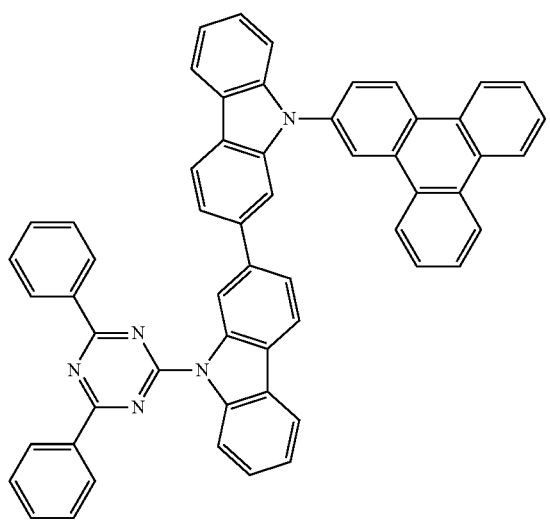
[CF A-10]
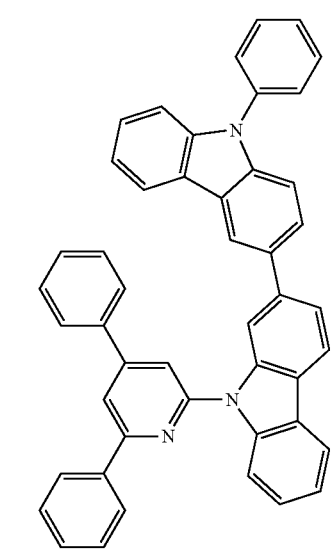
[CF A-11]
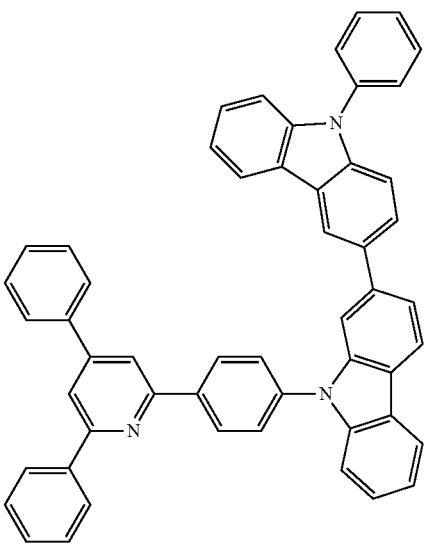
[CF A-12]
[CF A-13]
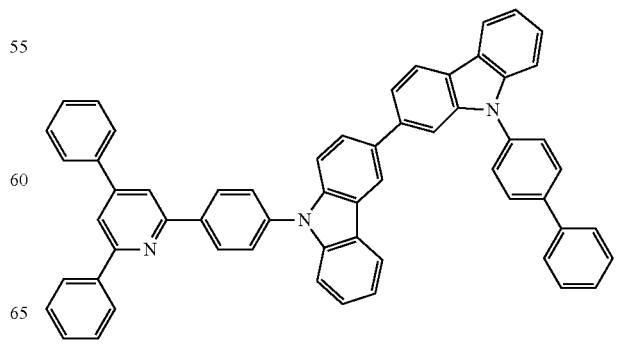

[CF A-14]
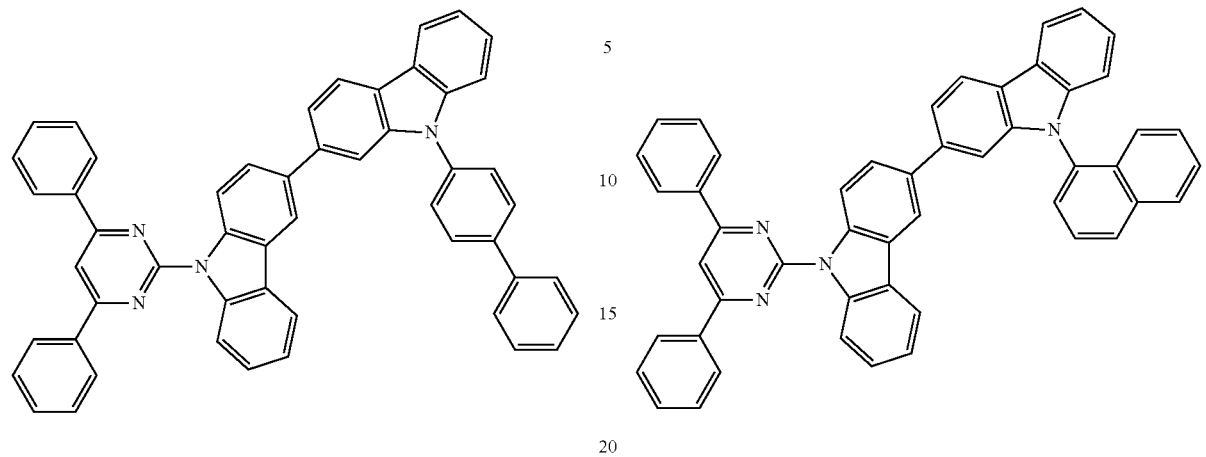
[CF A-15]
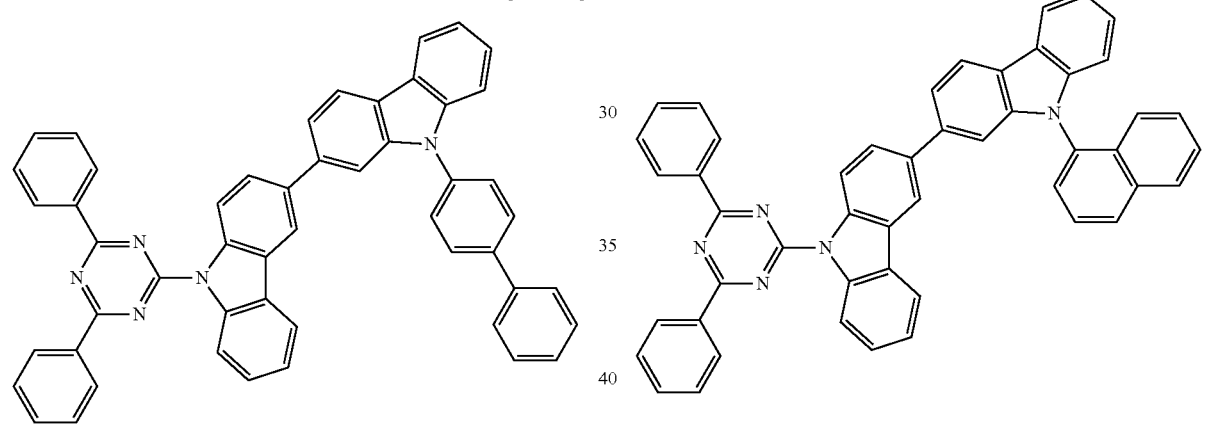
[CF A-16]
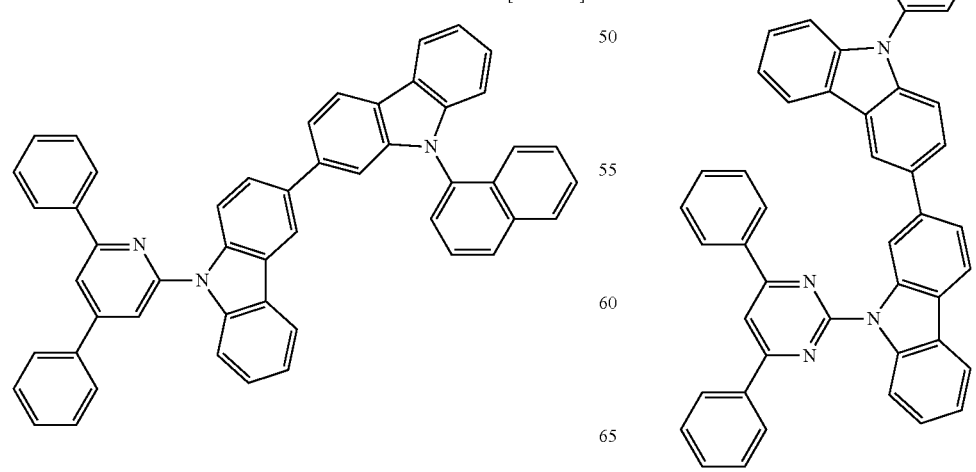
[CF A-17]
[CF A-18]
[CF A-19]
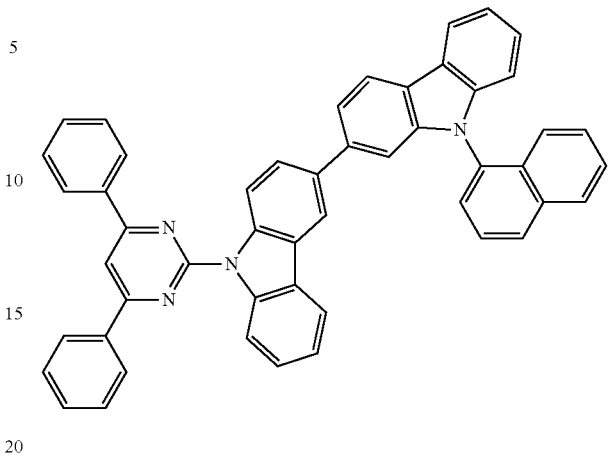

[CF A-20]
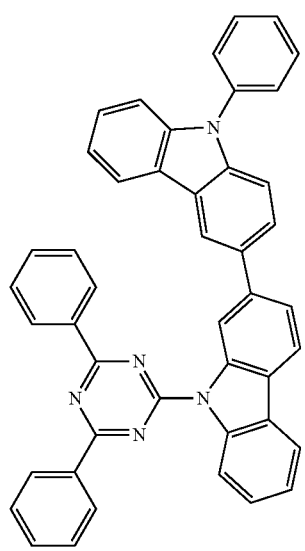
[CF A-22]
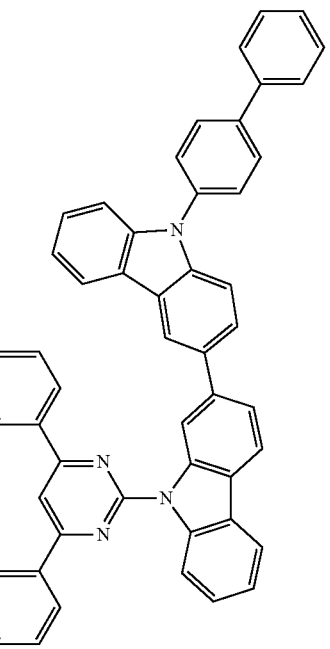
[CF A-21]
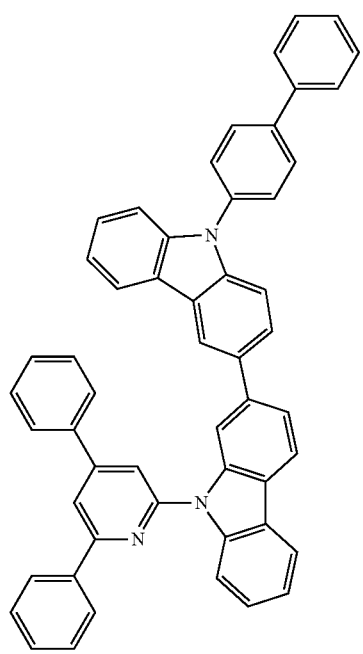
[CF A-23]
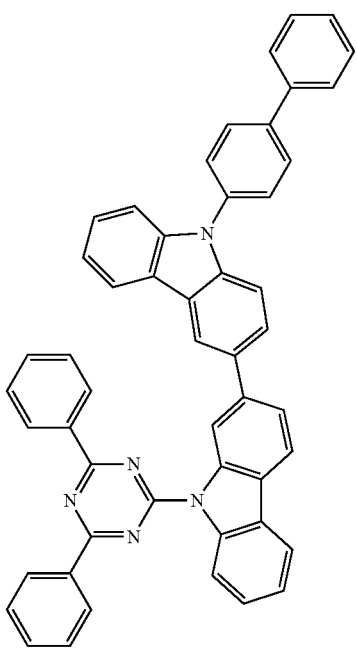

[CF A-24]
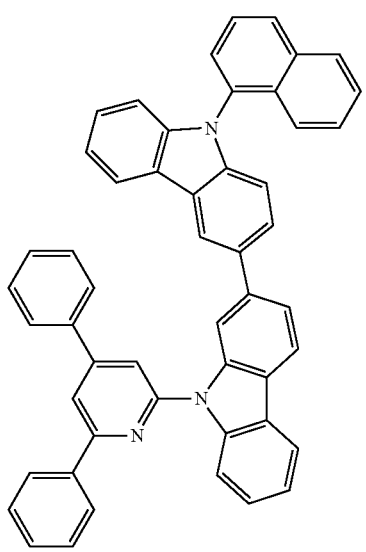
[CF A-25]
[CF A-26]
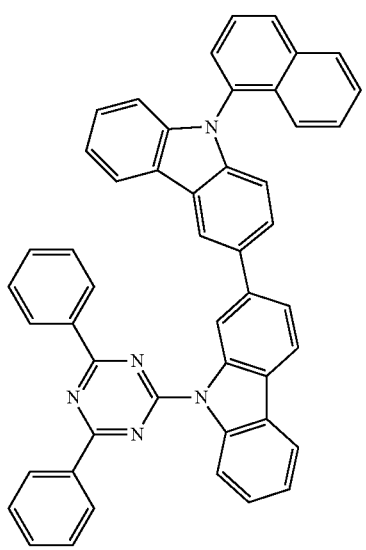
According to embodiments, the compound for an organic photoelectric device may be represented by, e.g., the following CF B-3 to B-22.
[CF B-3]
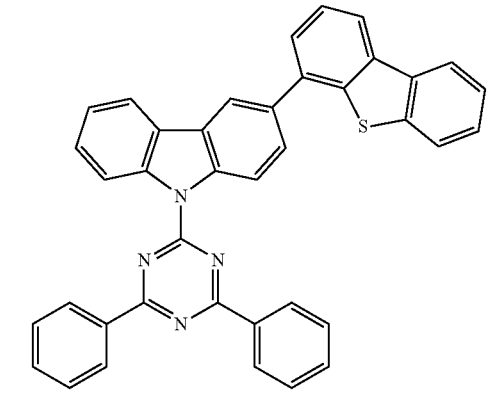
[CF B-4]
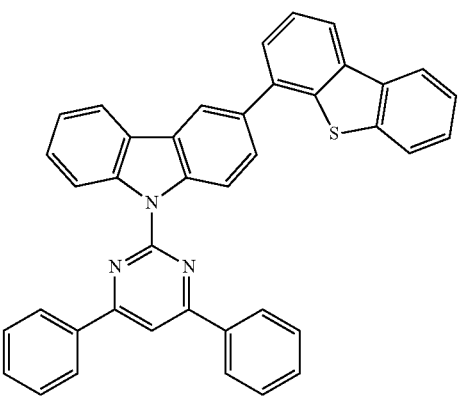
[CF B-5]
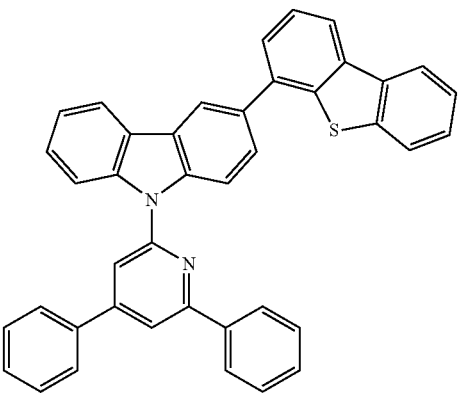

[CF B-6]
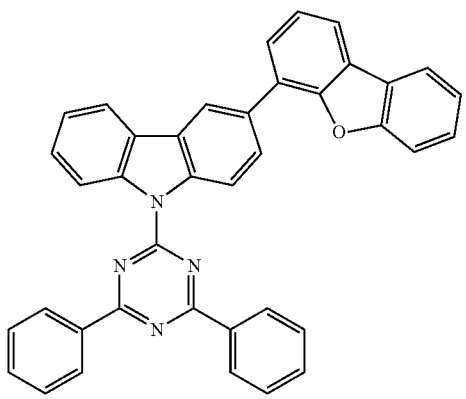
[CF B-9]
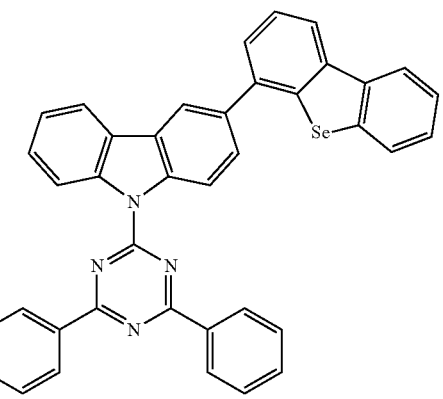
[CF B-7]
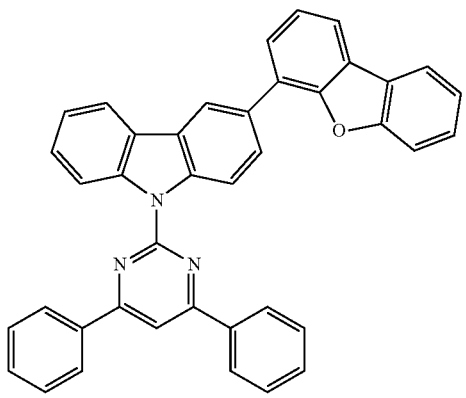
[CF B-10]
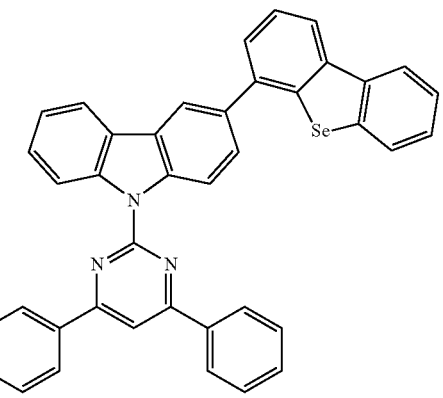
[CF B-8]
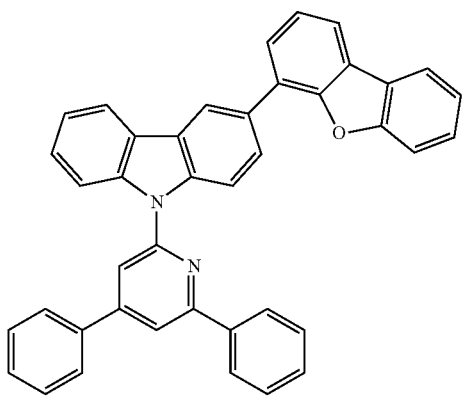
[CF B-11]
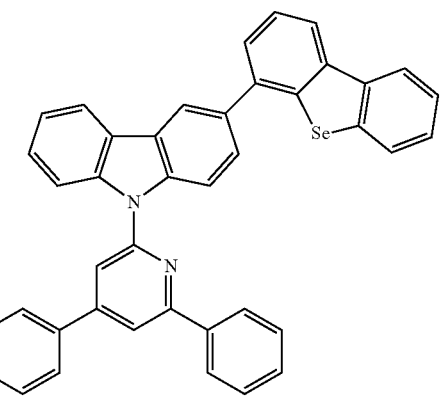

[CF B-12]
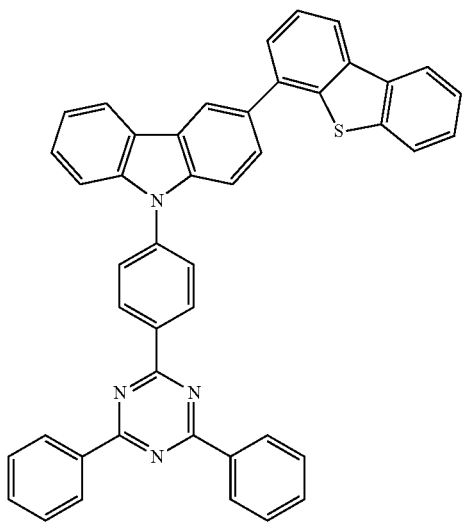
[CF B-13]
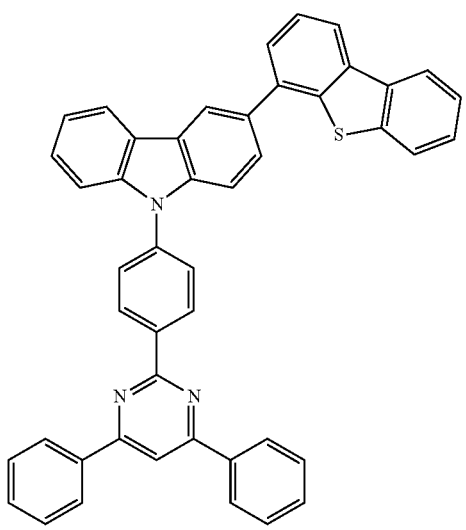
[CF B-14]
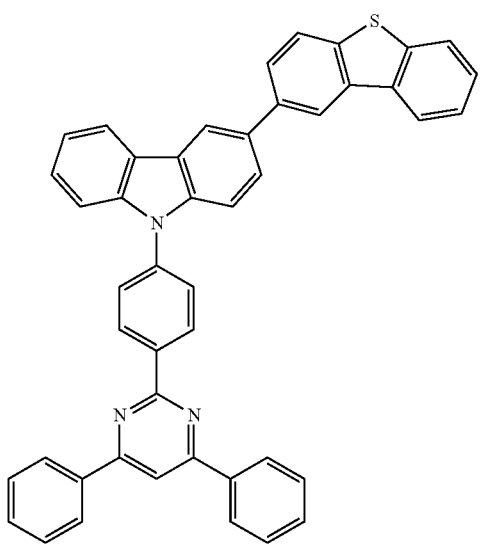
[CF B-15]
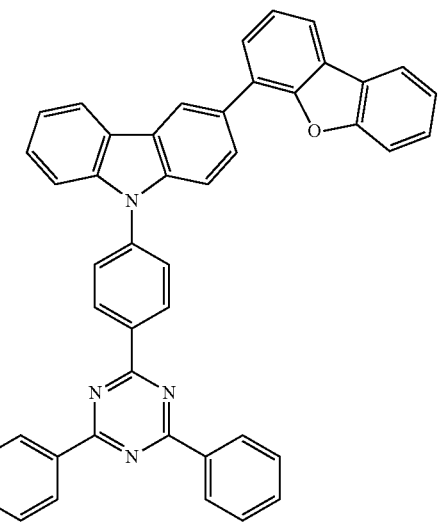
[CF B-16]
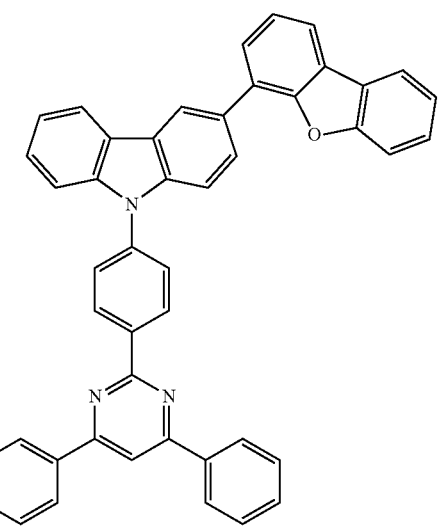
[CF B-17]
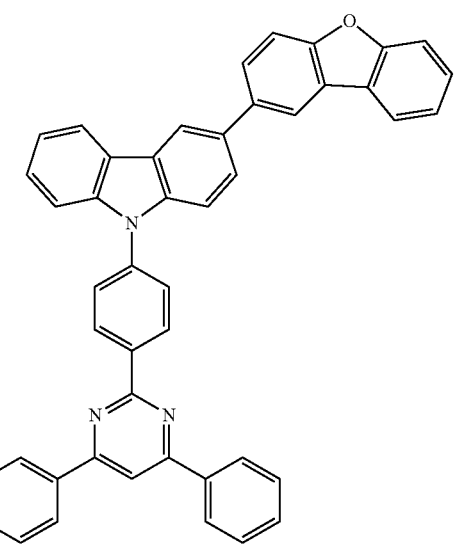

[CF B-18]
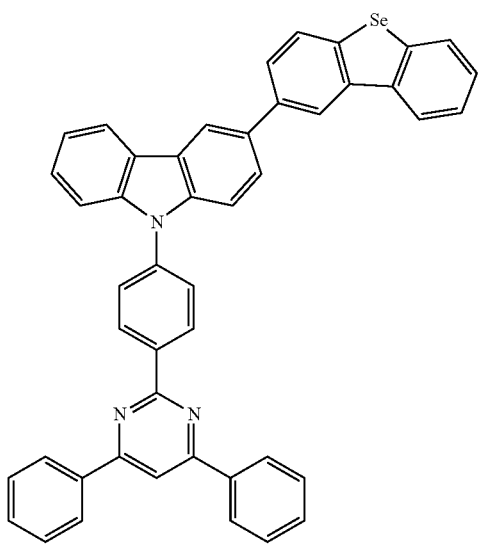
[CF B-19]
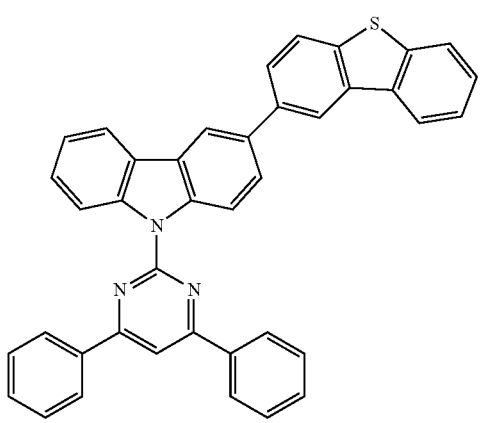
[CF B-20]
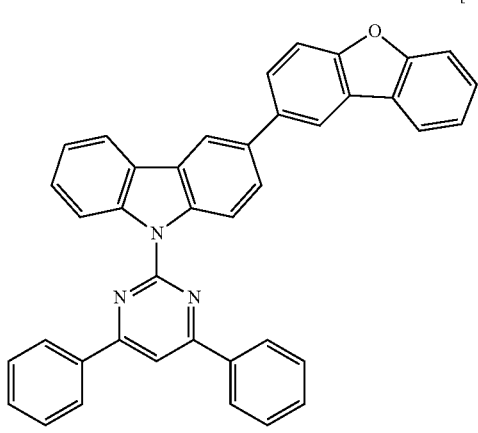
[CF B-21]
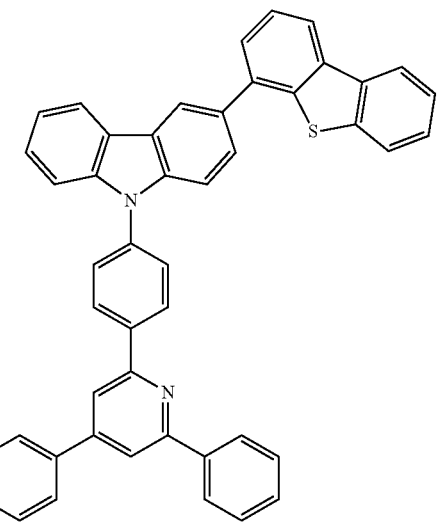
[CF B-22]
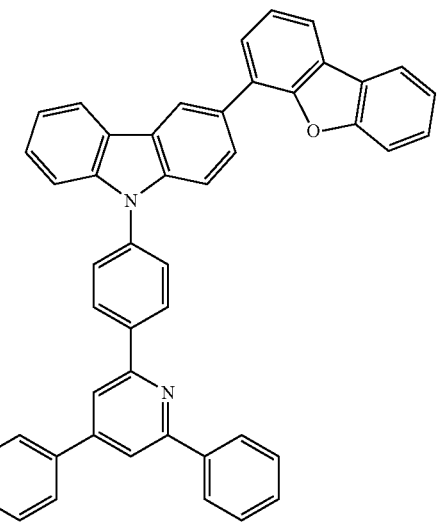
According to embodiments, the compound for an organic photoelectric device may be represented by, e.g., the following CF C-1 to C-18.

[CF C-1]
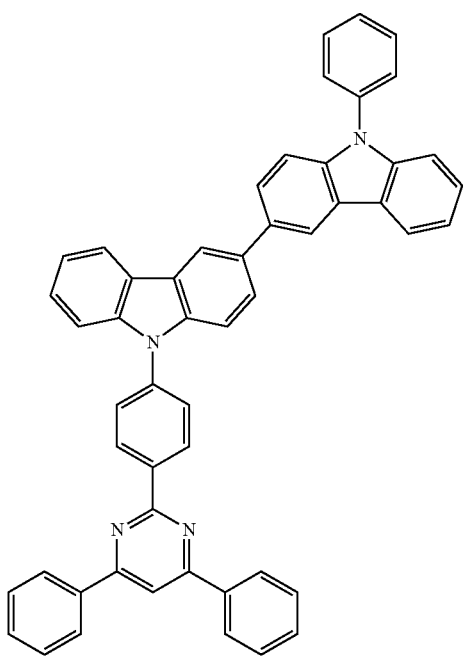
[CF C-2]
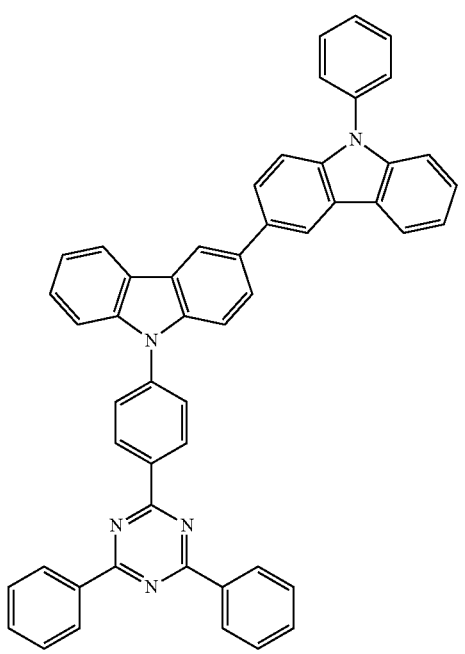
[CF C-3]
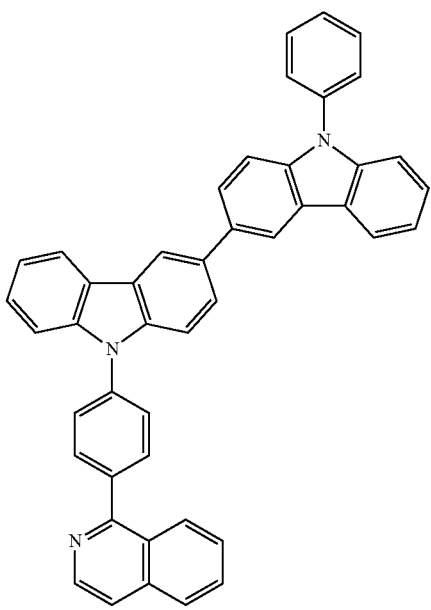
[CF C-4]
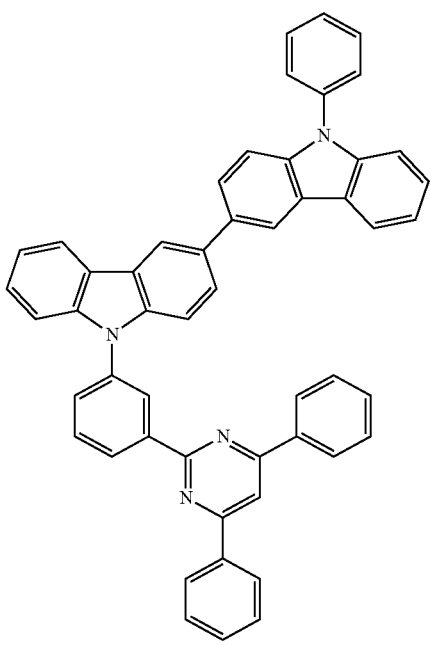

[CF C-5]
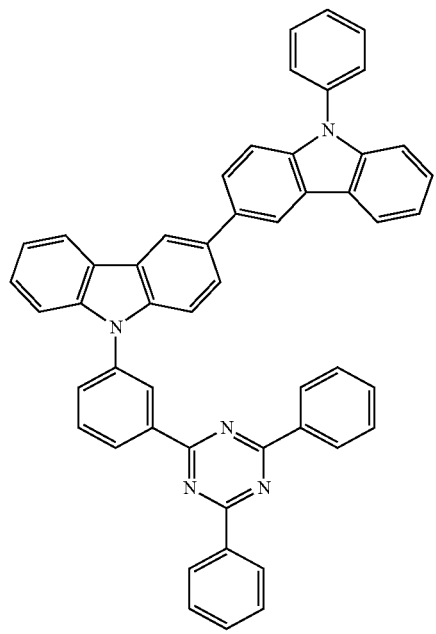
[CF C-7]
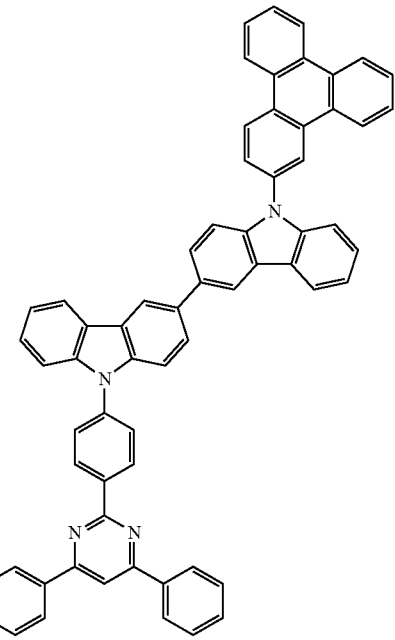
[CF C-6]
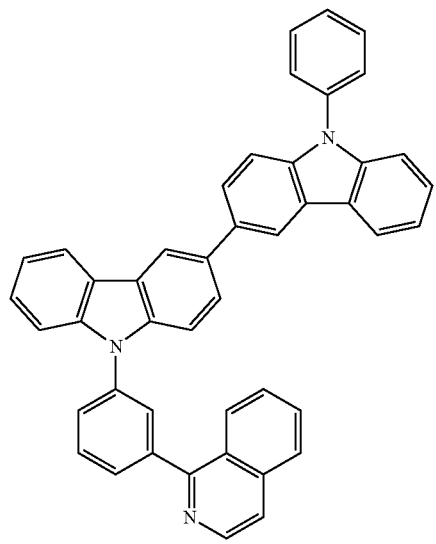
[CF C-8]
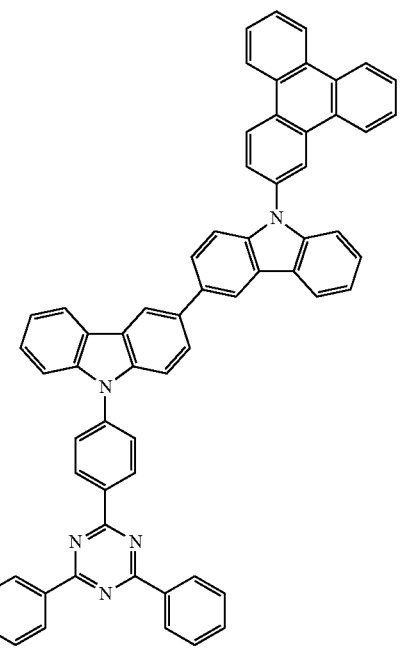

-continued
[CF C-9]
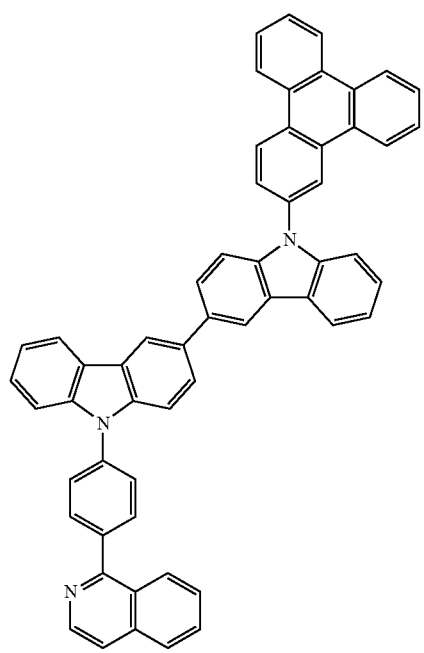
[CF C-11]
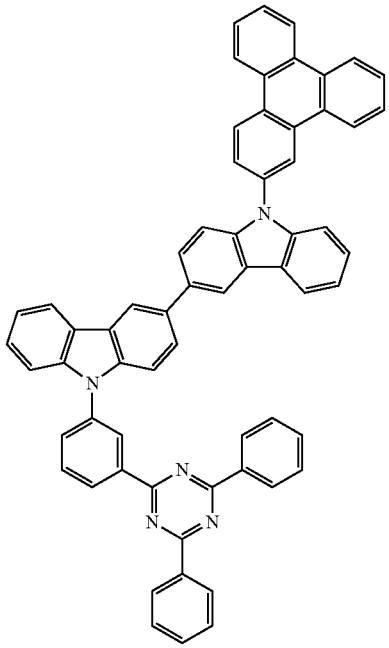
[CF C-10]
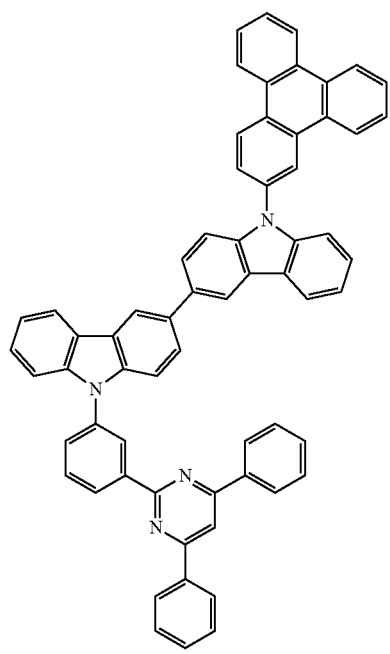
[CF C-12]
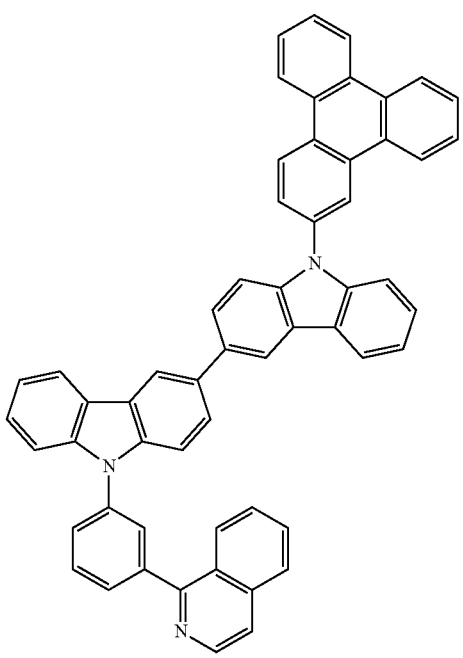

[CF C-13]
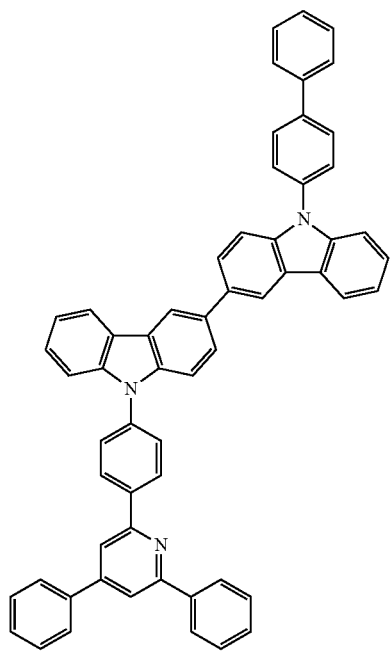
[CF C-15]
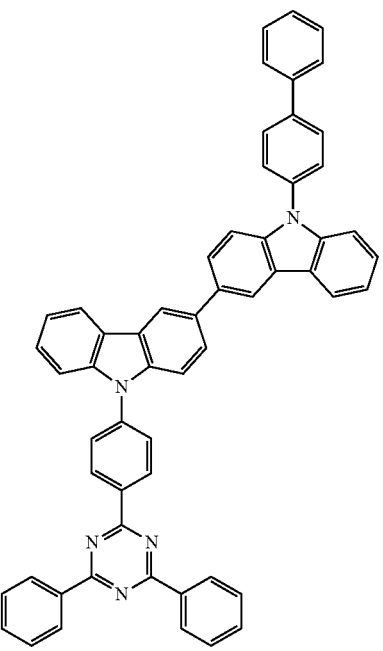
[CF C-14]
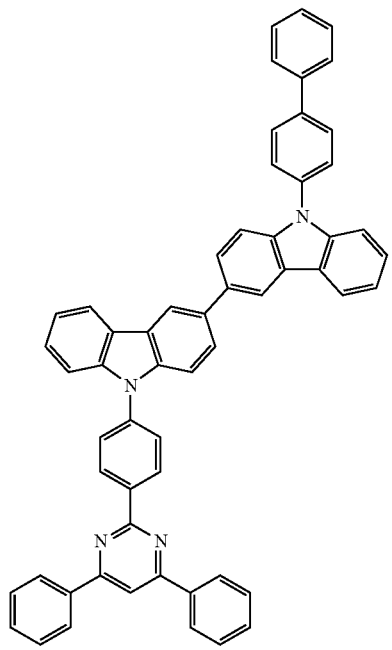
[CF C-16]
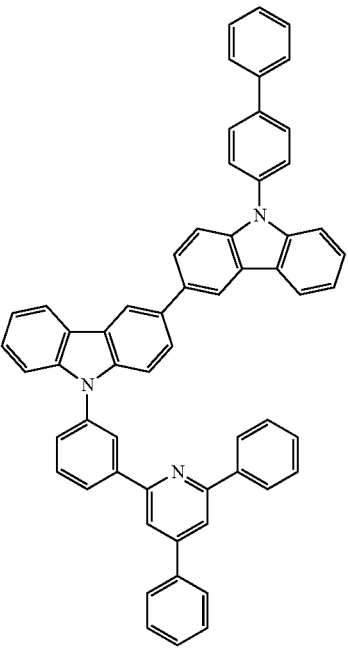

-continued

[CF C-17]

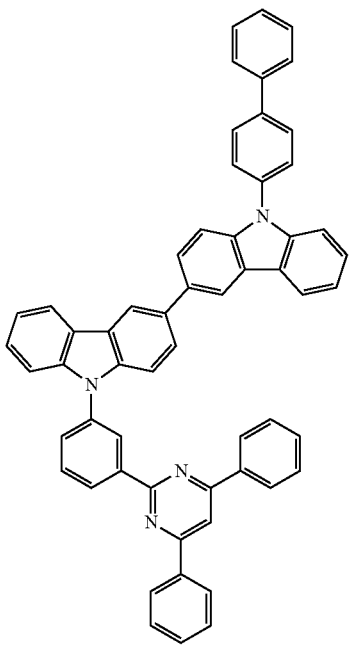

[CF C-18]

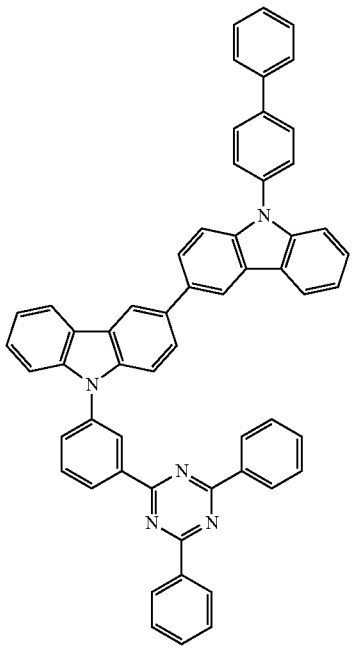

The compound for an organic photoelectric device according to an embodiment may have a glass transition temperature of higher than or equal to 110° C., and/or a thermal decomposition temperature of higher than or equal to 400° C., so as to improve thermal stability. Thereby, it may be possible to produce an organic photoelectric device having a high efficiency.

The compound according to an embodiment may have an appropriate HOMO energy level, and hole injection may be realized smoothly, and holes and electrons may be transported well.

The compound according to an embodiment for an organic photoelectric device may play a role for emitting light or injecting and/or transporting electrons, and it may act as a light emitting host together with a suitable dopant. The compound may be applied as, e.g., a phosphorescent or fluorescent host material, a blue light emitting dopant material, or an electron transport material.

The compound for an organic photoelectric device according to an embodiment is used for an organic thin layer. Thus, it may improve the life-span characteristic, efficiency characteristics, electrochemical stability, and thermal stability of an organic photoelectric device, and may decrease the driving voltage.

According to another embodiment, an organic photoelectric device may be provided that includes the compound for an organic photoelectric device. Examples of the organic photoelectric device may include an organic light emitting diode, an organic solar cell, an organic transistor, an organic photosensitive drum, an organic memory device, or the like. For example, the compound for an organic photoelectric device according to an embodiment may be included in an electrode or an electrode buffer layer in the organic solar cell to improve the quantum efficiency, or it may be used as an electrode material for a gate, a source-drain electrode, or the like in the organic transistor.

Hereinafter, a detailed description relating to the organic photoelectric device will be provided.

According to an embodiment, the organic photoelectric device includes an anode, a cathode, and at least one organic thin layer interposed between the anode and the cathode. The at least one organic thin layer may provide an organic photoelectric device including the compound for an organic photoelectric device according to an embodiment.

The organic thin layer that may include the compound for an organic photoelectric device may include a layer selected from the group of an emission layer, a hole transport layer (HTL), a hole injection layer (HIL), an electron transport layer (ETL), an electron injection layer (EIL), a hole blocking film, and a combination thereof. Particularly, the electron transport layer (ETL) or the electron injection layer (EIL) may include the compound for an organic photoelectric device according to an embodiment. In addition, when the compound for an organic photoelectric device is included in the emission layer, the compound for an organic photoelectric device may be included as a phosphorescent or fluorescent host, and particularly, as a fluorescent blue dopant material.

FIGS. 1 to 5 illustrate cross-sectional views showing an organic photoelectric device including the compound for an organic photoelectric device according to an embodiment.

Referring to FIGS. 1 to 5, organic photoelectric devices 100, 200, 300, 400, and 500 according to an embodiment may include at least one organic thin layer 105 interposed between an anode 120 and a cathode 110.

The anode 120 may include an anode material laving a large work function to help hole injection into an organic thin layer. The anode material may include: a metal such as nickel, platinum, vanadium, chromium, copper, zinc, and gold, or alloys thereof; a metal oxide such as zinc oxide, indium oxide, indium tin oxide (ITO), and indium zinc oxide (IA)); a combined metal and oxide such as ZnO:Al or SnO$_2$:Sb; or a conductive polymer such as poly(3-methylthiophene), poly [3,4-(ethylene-1,2-dioxy)thiophene] (PEDT), polypyrrole, polyaniline, etc. It is preferable to include a transparent electrode including indium tin oxide (ITO) as an anode.

The cathode 110 may include a cathode material having a small work function to help electron injection into an organic thin layer. The cathode material may include: a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO₂/Al, LiF/Ca, LiF/Al, BaF₂/Ca, etc. It is preferable to include a metal electrode including aluminum as a cathode.

In the example embodiment shown in FIG. 1, the organic photoelectric device 100 includes an organic thin layer 105 including only an emission layer 130.

Figure 2:
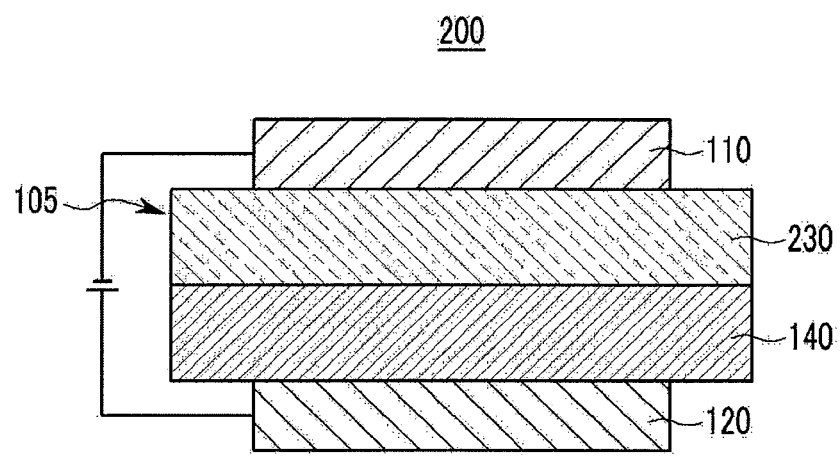

In the example embodiment shown in FIG. 2, a double-layered organic photoelectric device 200 includes an organic thin layer 105 including an emission layer 230 including an electron transport layer (ETL), and a hole transport layer (HTL) 140. The emission layer 230 also functions as an electron transport layer (ETL), and the hole transport layer (HTL) 140 layer has an excellent binding property with a transparent electrode such as ITO or an excellent hole transporting property.

Figure 3:
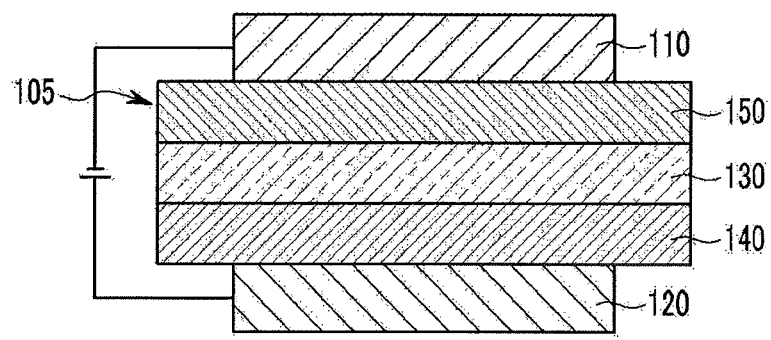

In the example embodiment shown in FIG. 3, a three-layered organic photoelectric device 300 includes an organic thin layer 105 including an electron transport layer (ETL) 150, an emission layer 130, and a hole transport layer (HTL) 140. The emission layer 130 is independently installed, and layers having an excellent electron transporting property or an excellent hole transporting property are separately stacked.

Figure 4:
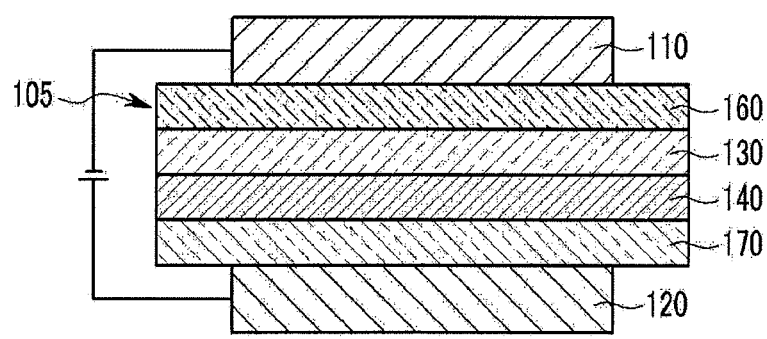

In the example embodiment shown in FIG. 4, a four-layered organic photoelectric device 400 includes an organic thin layer 105 including an electron injection layer (EIL) 160, an emission layer 130, a hole transport layer (HTL) 140, and a hole injection layer (HIL) 170 for binding with the cathode of ITO.

Figure 5:
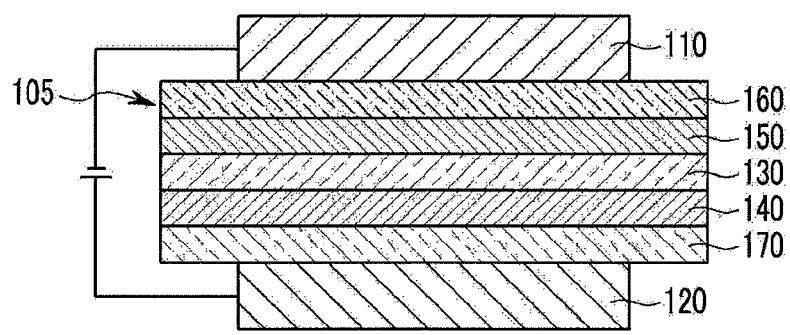

In the example embodiment shown in FIG. 5, a five layered organic photoelectric device 500 includes an organic thin layer 105 including an electron transport layer (ETL) 150, an emission layer 130, a hole transport layer (HTL) 140, and a hole injection layer (HIL) 170, and further includes an electron injection layer (EIL) 160 to achieve a low voltage.

In FIG. 1 to FIG. 5, the organic thin layer 105 including at least one selected from the group of an electron transport layer (ETL) 150, an electron injection layer (EIL) 160, an emission layer 130 and 230, a hole transport layer (HTL) 140, a hole injection layer (HIL) 170, and combinations thereof includes a compound for an organic photoelectric device according to an embodiment. The material for the organic photoelectric device may be used for an electron transport layer (ETL) 150 including the electron transport layer (ETL) 150 or electron injection layer (EIL) 160. When it is used for the electron transport layer (ETL), it may be possible to provide an organic photoelectric device having a simpler structure because it may not require an additional hole blocking layer (not shown).

When the compound for an organic photoelectric device is included in the emission layer 130 and 230, the material for the organic photoelectric device may be included as a phosphorescent or fluorescent host or a fluorescent blue dopant.

The organic photoelectric device may be fabricated by, e.g.: forming an anode on a substrate, forming an organic thin layer in accordance with a dry coating method such as evaporation, sputtering, plasma plating, and ion plating or a wet coating method such as spin coating, dipping, and flow coating, and providing a cathode thereon.

Another embodiment provides a display device including the organic photoelectric device according to an embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

(Preparation of Compound for Organic Photoelectric Device)

EXAMPLE 1

Synthesis of Compound Represented by CF 12

As an example of a compound for an organic photoelectric device according to an embodiment, the compound represented by CF 12 was synthesized as in Reaction Scheme 1.

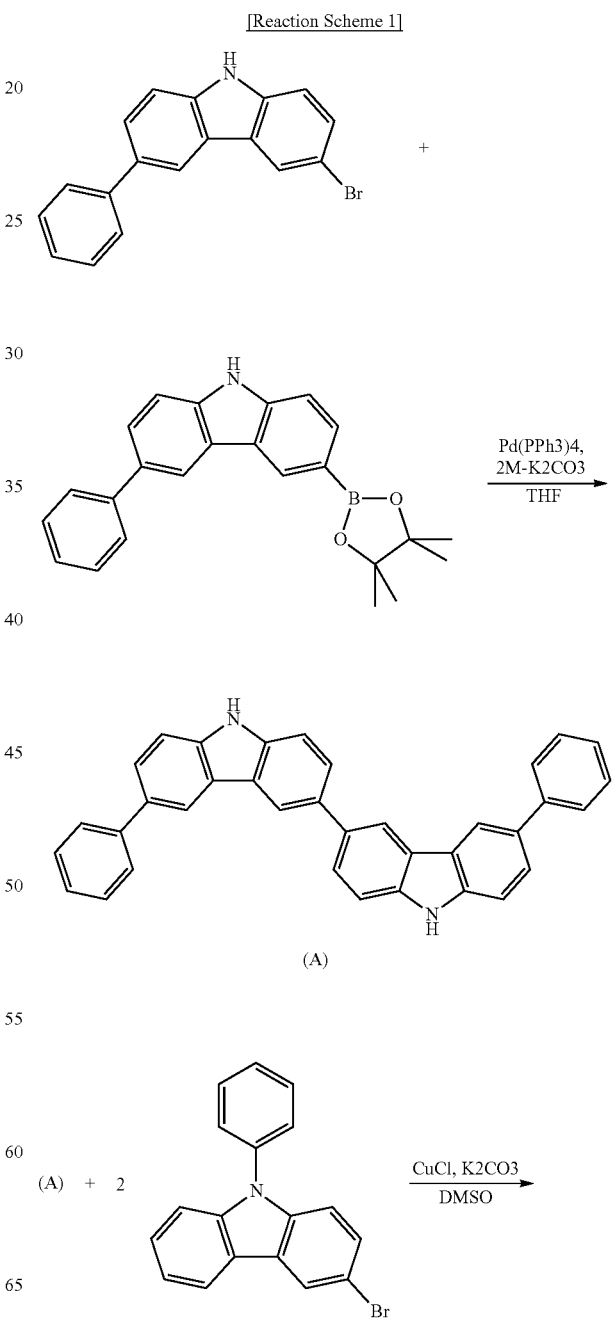

209
-continued

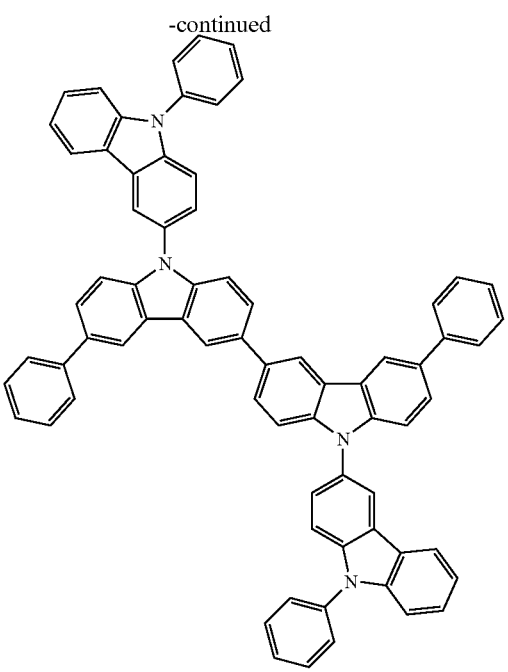

210
EXAMPLE 2

Synthesis of Compound Represented by CF 26

As an example of a compound for an organic photoelectric device according to an embodiment, the compound represented by CF 26 was synthesized as in Reaction Scheme 2.

[Reaction Scheme 2]

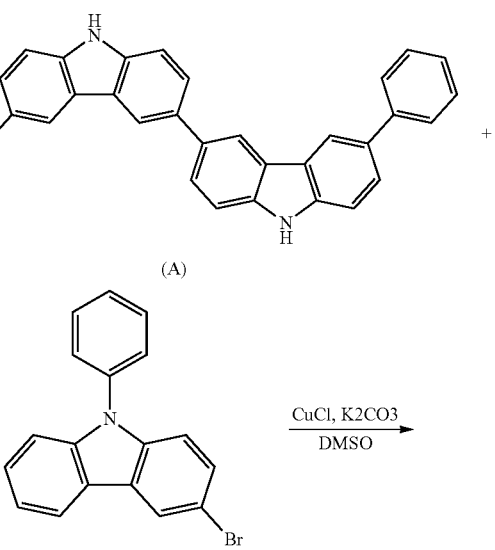

(A)

Step 1: Synthesis of Compound (A)

5 g (15.5 mmol) of 3-bromo-6-phenyl carbazole, 6.3 g (17.1 mmol) of 3-phenyl-6-carbazole boronic acid pinacol ester, and 100 mL of tetrahydrofuran were mixed with palladium-tetrakis(triphenylphosphine) and a 2M aqueous potassium carbonate solution in a 250 mL round-bottomed flask with an agitator under a nitrogen atmosphere. The mixture was heated and refluxed for 12 hours under a nitrogen flow. After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated. The resulting solution was filtered and recrystallized using dichloromethane and hexane, obtaining a compound A of 4.5 g (yield: 60%)

Step 2: Synthesis of CF 12

2 g (4.13 mmol) of the intermediate product represented by the compound A, 3.8 g (10.3 mmol) of 3-bromo-N-phenyl carbazole, and 0.2 g (2.1 mmol) of copper chloride, 3.4 g (24.8 mmol) of potassium carbonate, 0.37 g (2.1 mmol) of 1,10-phenanthroline, and 80 mL of dimethylsulfoxide were put in a 100 mL round flask and heated at 180° C. for 24 hours under a nitrogen flow. Next, an organic solvent was removed from the reactant under reduced pressure distillation, and 3 g of a compound 12 (yield: 77%) was obtained through column chromatography.

The compound represented by CF 12 was element-analyzed. The result is provided as follows.

calcd. $C_{72}H_{46}N_4$: C, 89.41; H, 4.79; N, 5.79. found: C, 89.52; H, 4.99; N, 5.62.

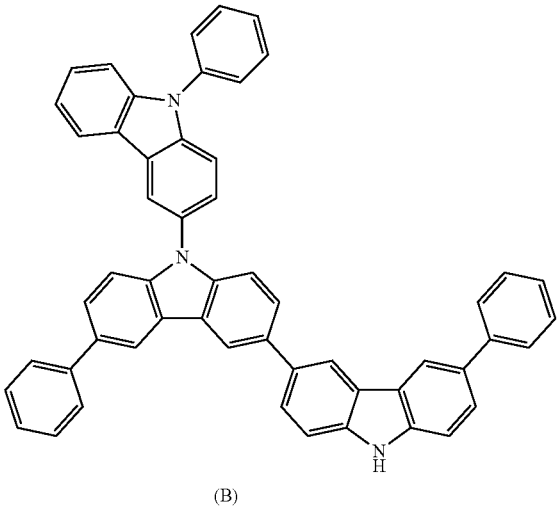

(B)

(B) + 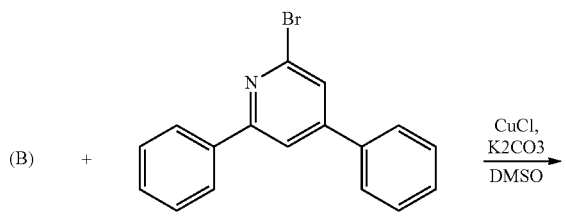

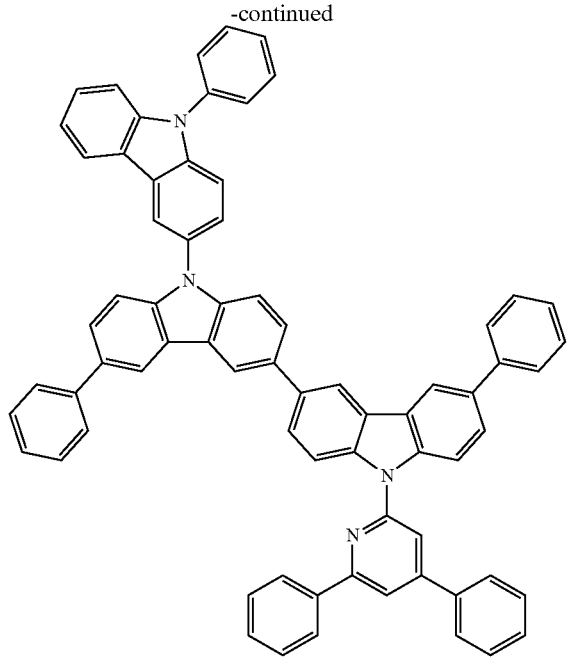

Step 1: Synthesis of Compound (B)

2 g (4.13 mmol) of the intermediate product represented by the compound A, 2.3 g (6.2 mmol) of 3-bromo-N-phenyl carbazole, and 0.2 g (2.1 mmol) of copper chloride, 1.7 g (12.4 mmol) of potassium carbonate, 0.37 g (2.1 mmol) of 1,10-phenanthroline, and 80 mL of dimethylsulfoxide were mixed in a 100 mL round flask and heated at 180° C. for 24 hours under a nitrogen flow. Then, an organic solvent therein was removed under reduced pressure distillation, and 2 g of a compound B (yield: 67%) was obtained through column chromatography.

Step 2: Synthesis of CF 26

2 g (2.76 mmol) of the intermediate product represented by the compound B, 1.3 g (4.1 mmol) of 1-bromo-3,5-diphenylpyridine and 0.14 g (1.4 mmol) of copper chloride, 1.14 g (8.3 mmol) of potassium carbonate, 0.25 g (1.4 mmol) of 1,10-phenanthroline, and 80 mL of dimethylsulfoxide were put in a 100 mL round flask and heated at 180° C. for 24 hours under a nitrogen flow. Then, an organic solvent therein was removed under reduced pressure distillation, and 2.1 g of a compound 26 (yield: 80%) was obtained through column chromatography.

The compound represented by CF 26 was element-analyzed. The result is provided as follows.

calcd. $C_{71}H_{46}N_4$: C, 89.28; H, 4.85; N, 5.87. found: C, 89.74; H, 4.91; N, 5.77.

EXAMPLE 3

Synthesis of Compound Represented by CF 10

As an example of a compound for an organic photoelectric device according to an embodiment, the compound represented by CF 10 was synthesized as in Reaction Scheme 3.

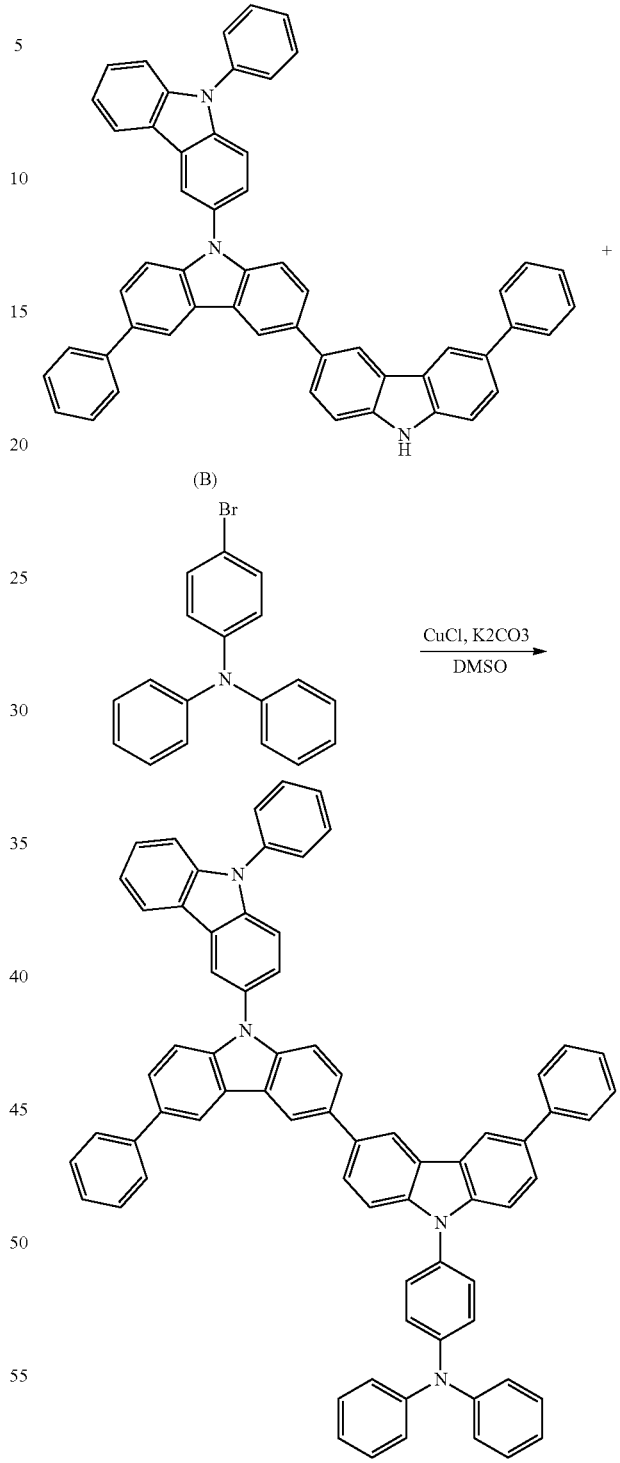

2 g (2.76 mmol) of the intermediate product represented by the compound B, 1.3 g (4.1 mmol) of N-(4-bromophenyl)diphenylamine and 0.14 g (1.4 mmol) of copper chloride, 1.14 g (8.3 mmol) of potassium carbonate, 0.25 g (1.4 mmol) of 1,10-phenanthroline, and 80 mL of dimethylsulfoxide were put in a 100 mL round flask and heated at 180° C. for 24 hours under a nitrogen flow. Then, an organic solvent therein was removed under reduced pressure distillation, and 2 g of a compound 8 (yield: 75%) was obtained through column chromatography.

The compound represented by CF 10 was element-analyzed. The result is provided as follows.

calcd. $C_{72}H_{48}N_4$: C, 89.23; H, 4.99; N, 5.78. found: C, 89.65; H, 5.21; N, 5.55.

EXAMPLE N-1

Synthesis of Compound Represented by CF N-4

As an example of a compound for an organic photoelectric device according to an embodiment, the compound represented by CF N-4 was synthesized as in Reaction Scheme 4.

[Reaction Scheme 4]

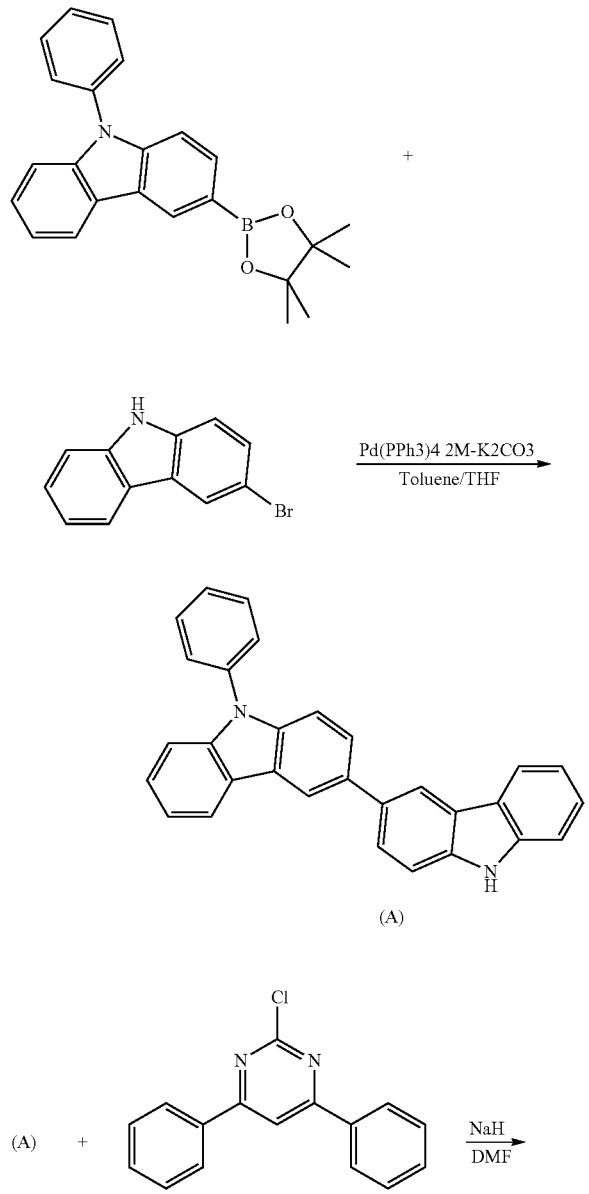

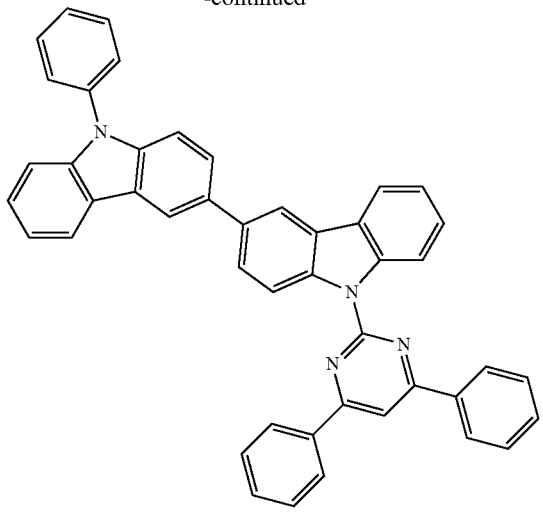

Step 1: Synthesis of compound (A)

5 g (20 mmol) of 3-bromocarbazole, 9 g (24 mmol) of N-phenyl-carbazole boronic acid pinacol ester, and 100 mL of tetrahydrofuran were mixed with palladium-tetrakis(triphenylphosphine) and a 2M aqueous potassium carbonate solution in a 250 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound A of 7.8 g (yield: 60%)

Step 2: Synthesis of CF N-4

3.5 g (8.55 mmol) of the intermediate product represented by the compound A, 2.74 g (10.26 mmol) of 2-chloro-4,6-diphenyl pyrimidine, sodium hydride, and dimethylformamide were put in a 100 mL round flask and heated at room temperature under a nitrogen flow.

Next, an organic solvent was removed from the reactant under reduced pressure distillation, and 3.823 g of a compound N-4 (yield: 70%) was obtained through column chromatography.

The compound represented by CF N-4 was element-analyzed. The result is provided as follows.

calcd. C46H30N4: C, 86.49; H, 4.73; N, 8.77. found: C, 86.24; H, 4.89; N, 8.55.

EXAMPLE N-2

Synthesis of Compound Represented by CF N-5

As an example of a compound for an organic photoelectric device according to an embodiment, the compound represented by CF N-5 was synthesized as in Reaction Scheme 5.

[Reaction Scheme 5]

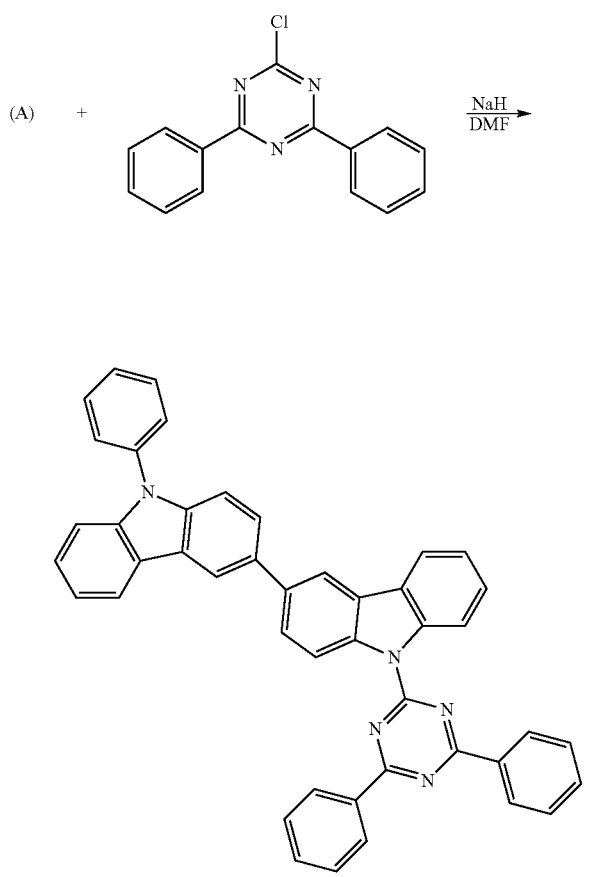

Synthesis of CF N-5

3.5 g (8.55 mmol) of the intermediate product represented by the compound A, 2.74 g (10.26 mmol) of 2-chloro-4,6-diphenyl triazine, sodium hydride, and dimethylformamide were put in a 100 mL round flask and heated at room temperature under a nitrogen flow.

Next, an organic solvent was removed from the reactant under reduced pressure distillation, and 4.1 g of a compound N-5 (yield: 75%) was obtained through column chromatography.

The compound represented by CF N-5 was element-analyzed. The result is provided as follows.

calcd. C45H29N5: C, 84.48; H, 4.57; N, 10.95. found: C, 84.24; H, 4.65; N, 10.55.

EXAMPLE N-3

Synthesis of Compound Represented by CF N-14

As an example of a compound for an organic photoelectric device according to an embodiment, the compound represented by CF N-14 was synthesized as in Reaction Scheme 6.

[Reaction Scheme 6]

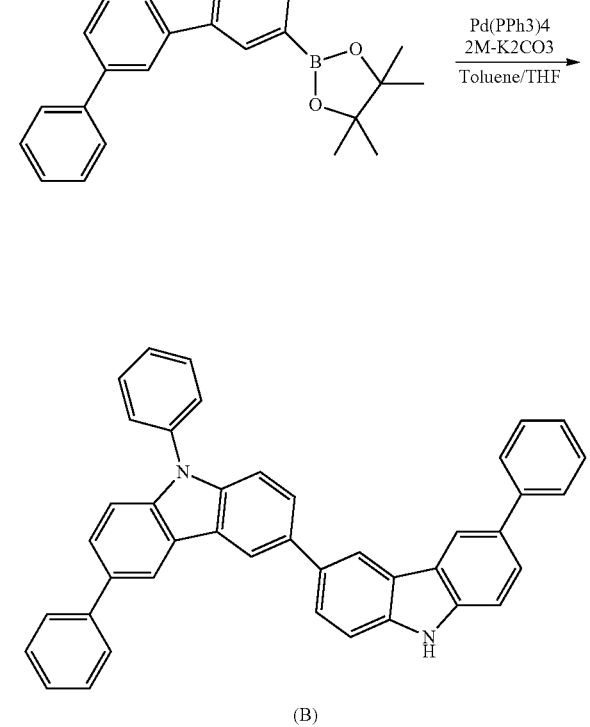

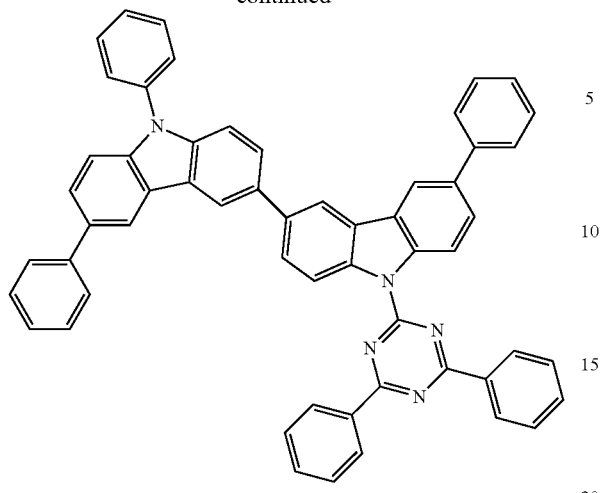

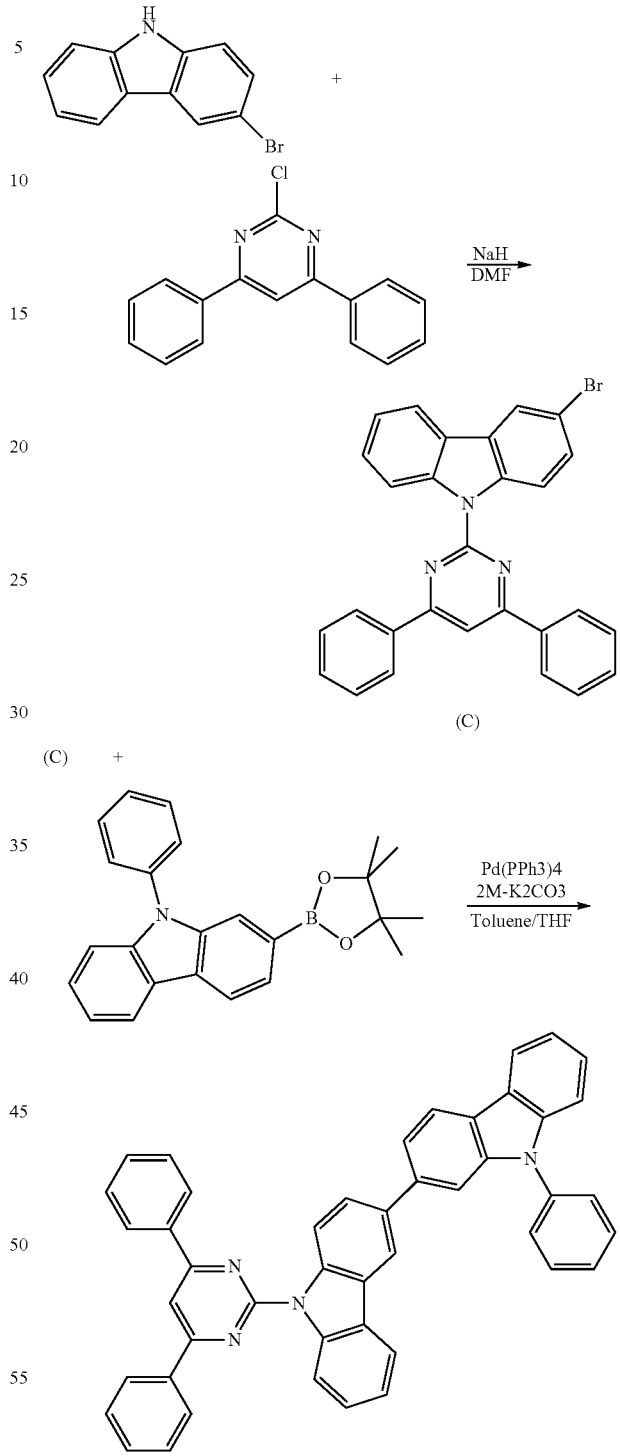

[Reaction Scheme 7]

Step 1: Synthesis of Compound (B)

5 g (12.6 mmol) of 3-bromo-N-phenyl-6-phenyl carbazole, 5.56 g (15 mmol) of 3-phenyl-carbazole boronic acid pinacol ester, and 100 mL of tetrahydrofuran were mixed with palladium-tetrakis(triphenylphosphine) and a 2M aqueous potassium carbonate solution in a 250 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound B of 6.5 g (yield: 65%)

Step 2: Synthesis of CF N-14

6 g (10.5 mmol) of the intermediate product represented by the compound B, 3.44 g (12.84 mmol) of 2-chloro-4,6-diphenyl triazine, sodium hydride, and dimethylformamide were put in a 250 mL round flask and heated at room temperature under a nitrogen flow.

Next, an organic solvent was removed from the reactant under reduced pressure distillation, and 3.825 g of a compound N-14 (yield: 70%) was obtained through column chromatography.

The compound represented by CF N-14 was element-analyzed. The result is provided as follows.

calcd. C57H37N5: C, 86.45; H, 4.71; N, 8.84. found: C, 86.15; H, 4.57; N, 8.57.

EXAMPLE N-4

Synthesis of Compound Represented by CF A-2

As an example of a compound for an organic photoelectric device according to an embodiment, the compound represented by CF A-2 was synthesized as in Reaction Scheme 7.

Step 1: Synthesis of compound (A)

28.4 g (115.46 mmol) of 3-bromocarbazole, 36.95 g (138.55 mmol) of 2-chloro-4,6-diphenyl pyrimidine, 6.93 g of sodium hydride, and dimethylformamide were put in a 1000 mL round flask with an agitator under a nitrogen atmosphere. The mixture was refluxed for 12 hours under a nitrogen flow at room temperature.

The resulting solution was crystallized using distilled water, and then the resulting solution was filtered and recrystallized using dichloromethane and hexane, obtaining a compound C of 53 g (yield: 96%)

Step 2: Synthesis of CF A-2

22.26 g (46.7 mmol) of the intermediate product represented by the compound C, 20.71 g (56.1 mmol) of N-phenyl-carbazole boronic acid pinacol ester, 200 mL of tetrahydrofuran, and 200 mL of toluene were mixed with palladium-tetrakis(triphenylphosphine) and 200 mL of 2M aqueous potassium carbonate solution in a 250 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichlorobenzene and methanol, obtaining a compound A-2 of 20 g (yield: 70%)

calcd. C46H30N4: C, 86.49; H, 4.73; N, 8.77. found: C, 86.44; H, 4.74; N, 8.75.

EXAMPLE N-5

Synthesis of Compound Represented by CF A-10

As an example of a compound for an organic photoelectric device according to an embodiment, the compound represented by CF A-10 was synthesized as in Reaction Scheme 8.

[Reaction Scheme 8]

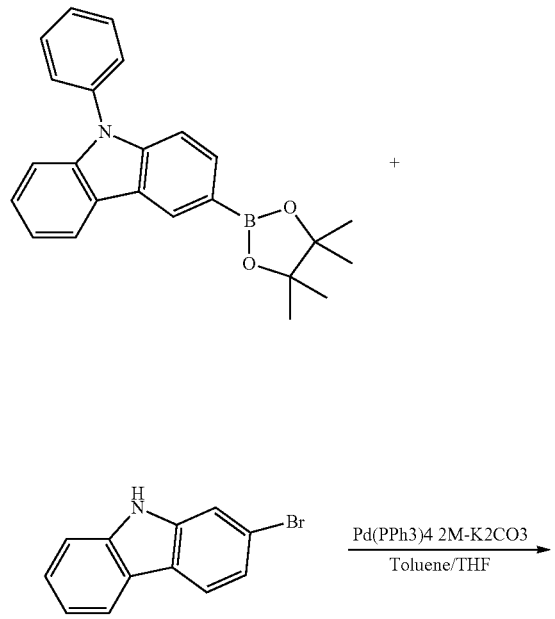

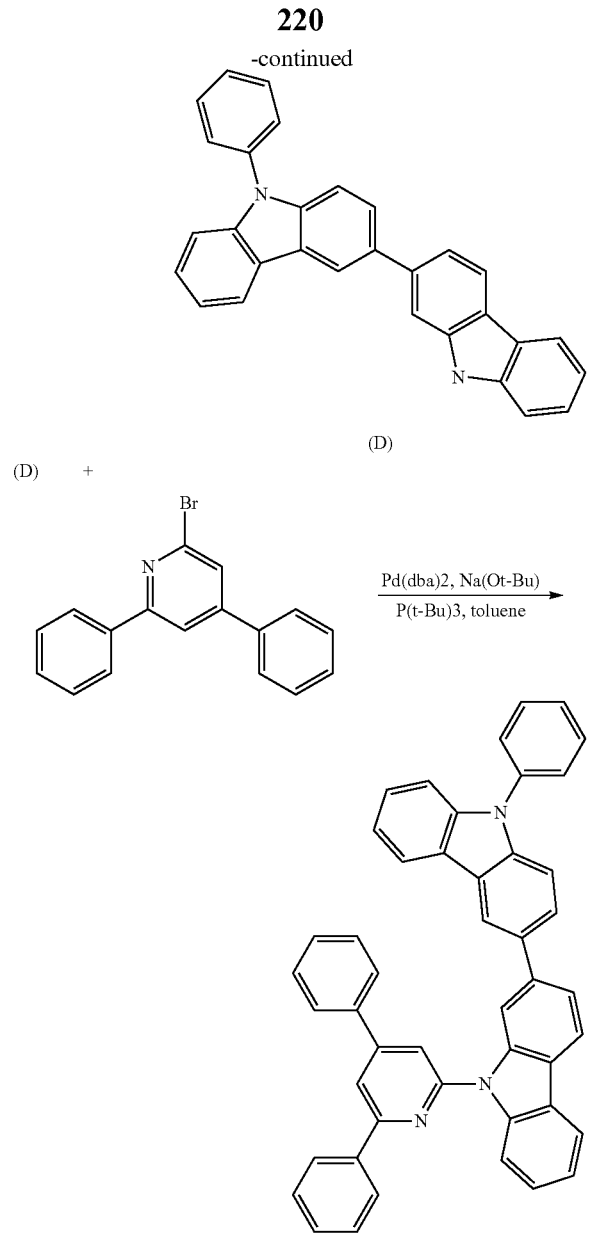

Step 1: Synthesis of Compound (D)

17.66 g (71.7 mmol) of 2-bromocarbazole, 22.08 g (59.8 mmol) of N-phenyl-carbazole boronic acid pinacol ester, and 100 mL of tetrahydrofuran were mixed with palladium-tetrakis(triphenylphosphine) and a 2M aqueous potassium carbonate solution in a 500 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound D of 19 g (yield: 65%)

Step 2: Synthesis of CF A-10

8.3 g (20.53 mmol) of the intermediate product represented by the compound D, 7.64 g (24.64 mmol) of 2-bromo-4,6- diphenyl pyridine, and 3.35 g (34.9 mmol) of sodium tert-butoxide were dissolved with 200 ml of toluene in a 500 mL round flask. Then, 0.47 g (0.51 mmol) of palladium dibenzyliden amine and 0.77 ml of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound A-10 of 11 g (yield: 84%)

calcd. C47H31N3: C, 88.51; H, 4.90; N, 6.59. found: C, 88.49; H, 4.91; N, 6.61.

EXAMPLE N-6

Synthesis of Compound Represented by CF A-12

As an example of a compound for an organic photoelectric device according to an embodiment, the compound represented by CF A-12 was synthesized as in Reaction Scheme 9.

[Reaction Scheme 9]

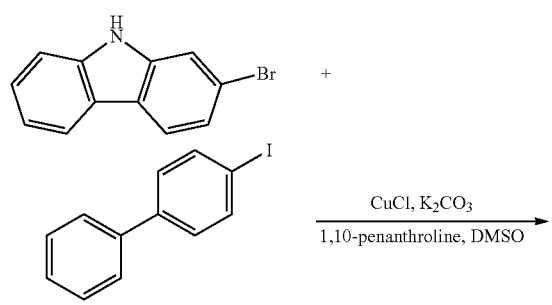

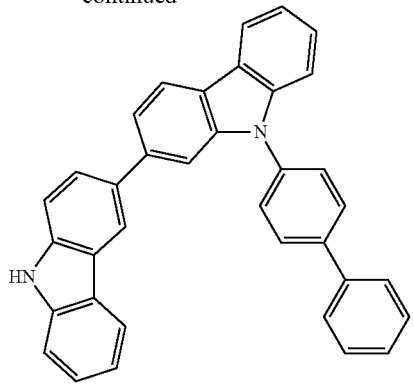

(F)

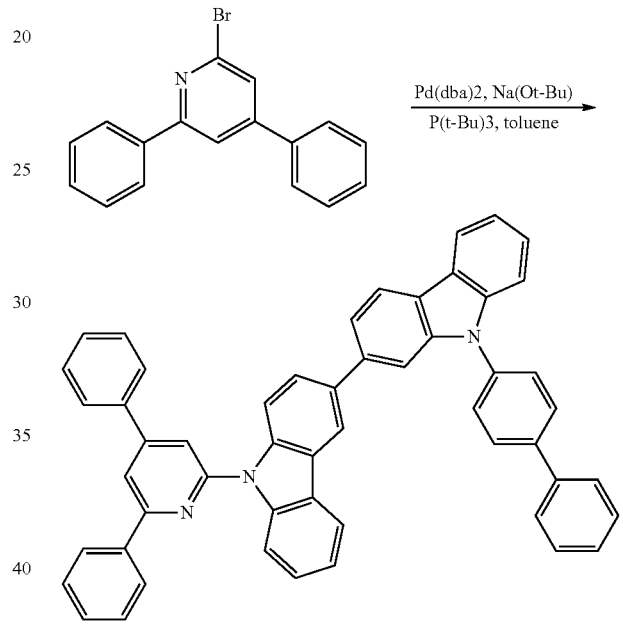

Step 1: Synthesis of Compound (E)

22.22 g (90.3 mmol) of 2-bromocarbazole, 37.94 g (135.5 mmol) of 4-iodo-biphenyl, and 18.72 g (135.5 mmol) of potassium carbonate were dissolved with dimethylsulfoxide in a 1000 mL round flask with an agitator under a nitrogen atmosphere, and then 3.26 g (135.47 mmol) of 1,10-phenanthroline and 1.79 g (18.06 mmol) of copper chloride (I) were added into the round flask.

The mixture was agitated for 12 hours under a nitrogen flow at 150° C.

After the reaction was complete, distilled water was poured into the reactant. Then, a solid produced therefrom was filtered and dissolved in chlorobenzene, and then an activated carbon and anhydrous magnesium sulfate were added thereto. Then, the mixture was agitated.

The resulting solution was filtered and recrystallized using dichlorobenzene and methanol, obtaining a compound E of 25 g (yield: 70%)

Step 2: Synthesis of Compound (F)

18.2 g (46.7 mmol) of the intermediate product represented by the compound E, 16.4 g (56.1 mmol) of 3-carbazole boronic acid pinacol ester, 200 mL of tetrahydrofuran, 200 mL of toluene were mixed with palladium-tetrakis(triphenylphosphine) and a 2M aqueous potassium carbonate solution in a 1000 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in chlorobenzene, and activated carbon and anhydrous magnesium sulfate were added thereto. Then, the mixture was agitated.

The resulting solution was filtered and recrystallized using dichlorobenzene and methanol, obtaining a compound F of 19 g (yield: 64%)

Step 3: Synthesis of CF A-12

9.73 g (20.1 mmol) of the intermediate product represented by the compound F, 7.47 g (24.10 mmol) of 2-bromo-4,6-diphenyl pyridine, and 3.28 g (34.1 mmol) of sodium tert-butoxide were dissolved with 180 ml of toluene in a 500 mL round flask. Then, 0.46 g (0.5 mmol) of palladium dibenzyliden amine and 0.75 mL (1.51 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound A-12 of 9.9 g (yield: 70%)

calcd. C53H35N3: C, 89.17; H, 4.94; N, 5.89. found: C, 89.29; H, 4.96; N, 5.82.

EXAMPLE N-7

Synthesis of Compound Represented by CF B-5

As an example of a compound for an organic photoelectric device according to an embodiment, the compound represented by CF B-5 was synthesized as in Reaction Scheme 10.

[Reaction Scheme 10]

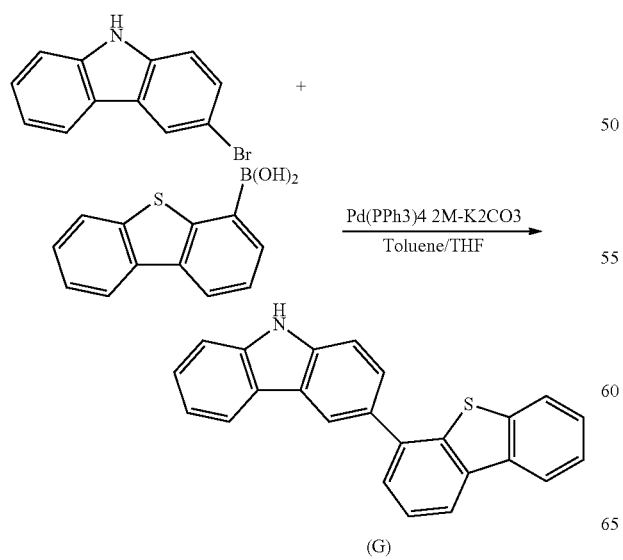

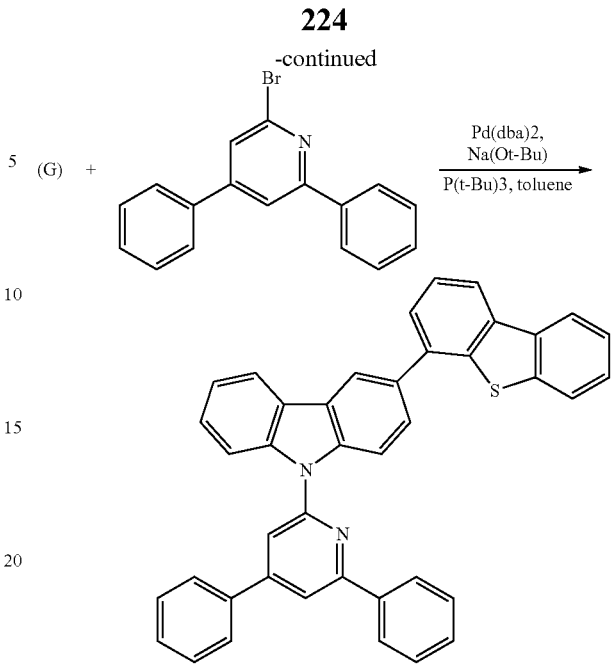

Step 1: Synthesis of Compound (G)

18.53 g (75.3 mmol) of 3-bromocarbazole, 22.3 g (97.9 mmol) of 4-dibenzothiophene boronic acid, and 100 mL of tetrahydrofuran were mixed with palladium-tetrakis(triphenylphosphine) and 100 mL of a 2M aqueous potassium carbonate solution in a 500 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound D of 15 g (yield: 60%)

Step 2: Synthesis of CF B-5

10 g (28.80 mmol) of the intermediate product represented by the compound G, 11.6 g (37.4 mmol) of 2-bromo-4,6-diphenyl pyridine, and 5.53 g (57.6 mmol) of sodium tert-butoxide were dissolved with 160 ml of toluene in a 500 mL round flask. Then, 1.32 g (1.44 mmol) of palladium dibenzyliden amine and 0.87 mL (4.32 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound B-5 of 14 g (yield: 85%)

calcd. C41H26N2S: C, 85.09; H, 4.53; N, 4.84; S, 5.54. found: C, 85.11; H, 4.50; N, 4.80; S, 5.50.

EXAMPLE N-8

Synthesis of Compound Represented by CF B-8

As an example of a compound for an organic photoelectric device according to an embodiment, the compound represented by CF B-8 was synthesized as in Reaction Scheme 11.

[Reaction Scheme 11]

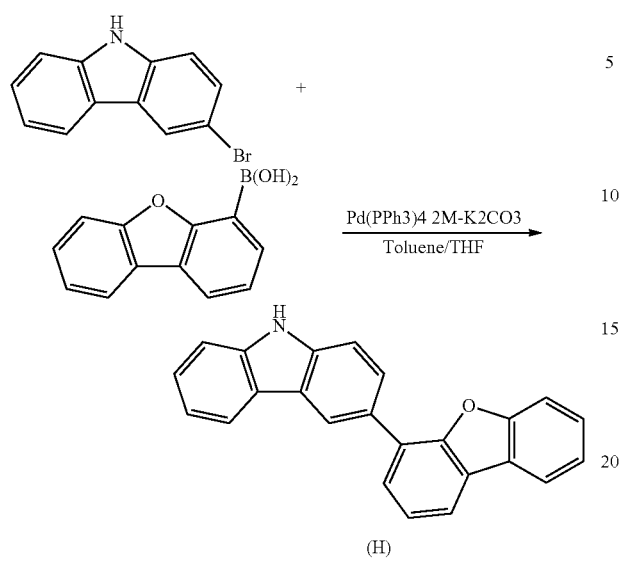

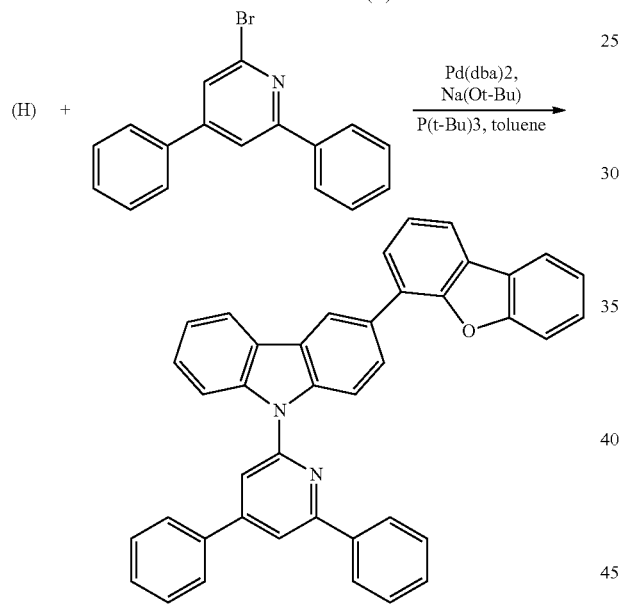

Step 1: Synthesis of Compound (H)

9.84 g (39.99 mmol) of 3-bromocarbazole, 10.17 g (47.99 mmol) of 4-dibenzofuran boronic acid, and 100 mL of tetrahydrofuran were mixed with palladium-tetrakis(triphenylphosphine) and 100 mL of a 2M aqueous potassium carbonate solution in a 500 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound H of 11 g (yield: 83%)

Step 2: Synthesis of CF B-8

10.8 g (32.58 mmol) of the intermediate product represented by the compound H, 11.6 g (37.4 mmol) of 2-bromo-4,6-diphenyl pyridine, and 5.53 g (57.6 mmol) of sodium tert-butoxide were dissolved with 160 ml of toluene in a 500 mL round flask. Then, 1.32 g (1.44 mmol) of palladium dibenzyliden amine and 0.87 mL (4.32 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound B-8 of 14 g (yield: 85%)

calcd. C41H26N2O: C, 87.52; H, 4.66; N, 4.98; O, 2.84. found: C, 87.50; H, 4.68; N, 4.96; O, 2.82

EXAMPLE N-9

Synthesis of Compound Represented by CF B-21

As an example of a compound for an organic photoelectric device according to an embodiment, the compound represented by CF B-21 was synthesized as in Reaction Scheme 12.

[Reaction Scheme 12]

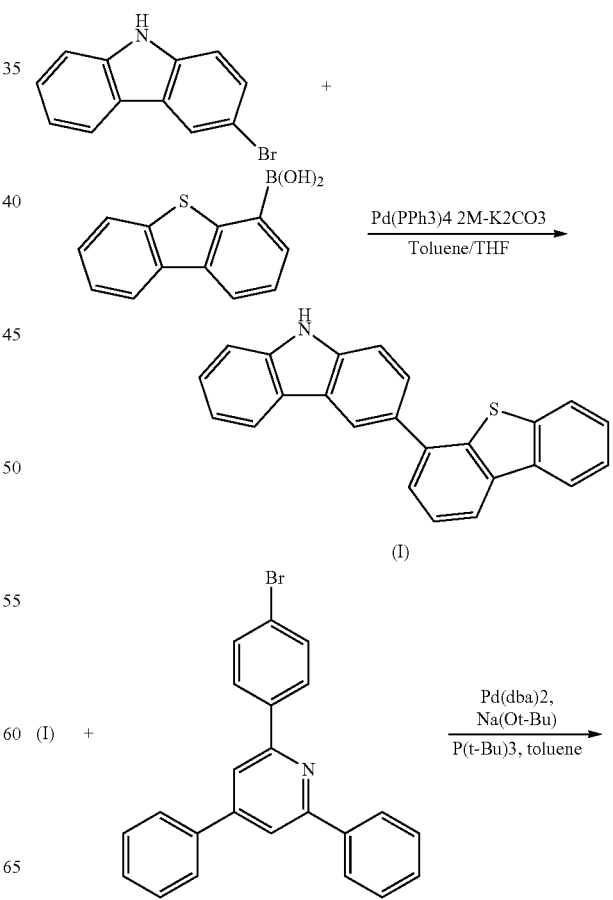

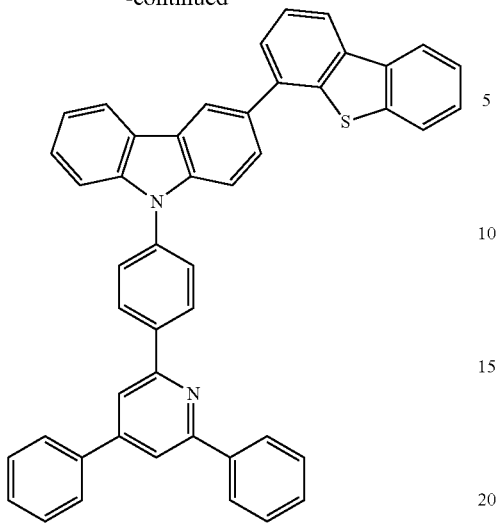

Step 1: Synthesis of Compound (I)

18.53 g (75.3 mmol) of 3-bromocarbazole, 22.3 g (97.9 mmol) of 4-dibenzothiophene boronic acid, and 100 mL of tetrahydrofuran were mixed with palladium-tetrakis(triphenylphosphine) and 100 mL of a 2M aqueous potassium carbonate solution in a 500 mL round-bottomed flask with an agitator under a nitrogen atmosphere. The mixture was heated and refluxed for 12 hours under a nitrogen flow.

After the reaction was complete, hexane was poured into the reactant. Then, a solid produced therefrom was filtered and dissolved in a mixed solution prepared by mixing toluene and tetrahydrofuran in a volume ratio of 50:50, and activated carbon and anhydrous magnesium sulfate were added thereto. Then, the mixture was agitated.

The resulting solution was filtered and recrystallized using dichloromethane and hexane, obtaining a compound I of 15 g (yield: 60%)

Step 2: Synthesis of CF B-21

10 g (28.80 mmol) of the intermediate product represented by the compound I, 14.43 g (37.4 mmol) of 2-(4-bromophenyl)-4,6-diphenyl pyridine, and 5.53 g (57.6 mmol) of sodium tert-butoxide were dissolved with 160 ml of toluene in a 500 mL round flask. Then, 1.32 g (1.44 mmol) of palladium dibenzyliden amine and 0.87 mL (4.32 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound B-21 of 10 g (yield: 60%)

calcd. C47H30N2S: C, 86.21; H, 4.62; N, 4.28; S, 4.90. found: C, 86.20; H, 4.60; N, 4.26; S, 4.88.

EXAMPLE N-10

Synthesis of Compound Represented by CF N-3

As an example of a compound for an organic photoelectric device according to an embodiment, the compound represented by CF N-3 was synthesized as in Reaction Scheme 13.

[Reaction Scheme 13]

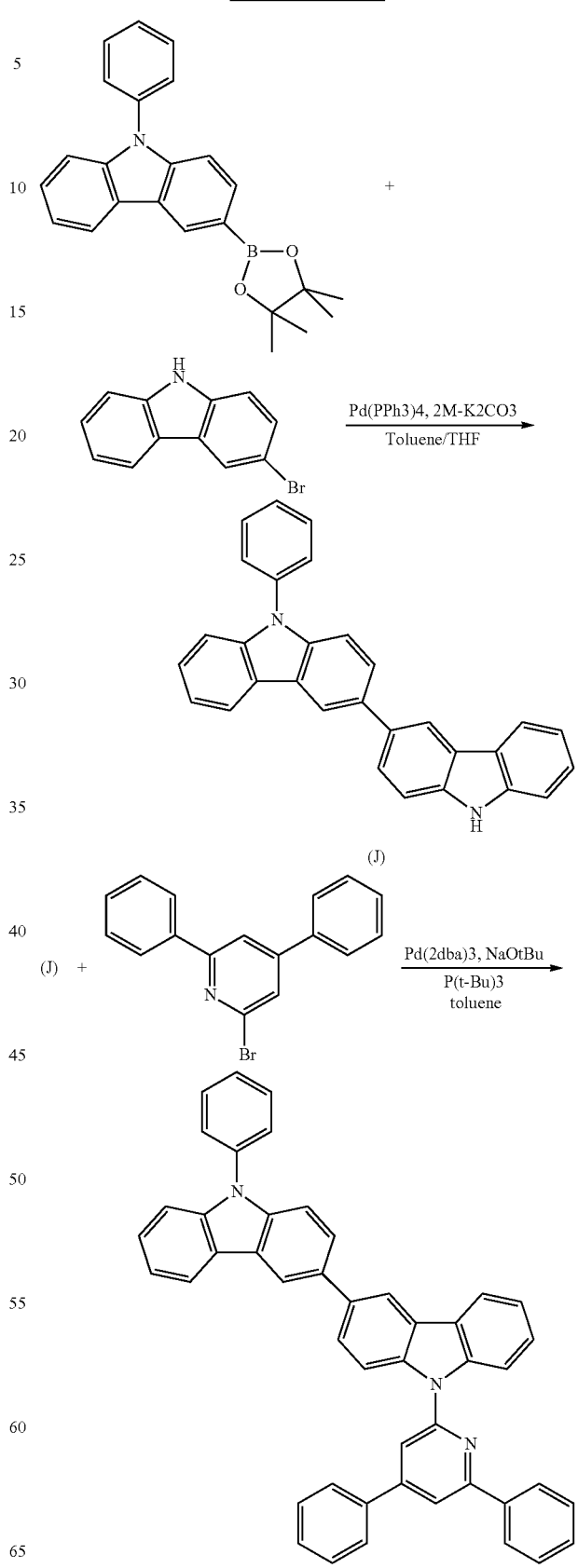

Step 1: Synthesis of Compound (J)

26.96 g (81.4 mmol) of N-phenyl-carbazole 3-boronic acid pinacol ester, 23.96 g (97.36 mmol) of carbazole-3-boronic acid, and 230 mL of tetrahydrofuran were mixed with palladium-tetrakis(triphenylphosphine) and 100 mL of a 2M aqueous potassium carbonate solution in a 500 mL round-bottomed flask with an agitator under a nitrogen atmosphere. The mixture was heated and refluxed for 12 hours under a nitrogen flow.

After the reaction was complete, methanol was poured into the reactant. Then, a solid produced therefrom was filtered and dissolved in chlorobenzene, and activated carbon and anhydrous magnesium sulfate were added thereto. Then, the mixture was agitated.

The resulting solution was filtered and recrystallized using dichlorobenzene and methanol, obtaining a compound J of 22.6 g (yield: 68%)

Step 2: Synthesis of CF N-3

22.42 g (54.88 mmol) of the intermediate product represented by the compound J, 20.43 g (65.85 mmol) of 2-bromo-4,6-diphenyl pyridine, and 7.92 g (82.32 mmol) of sodium tert-butoxide were dissolved with 400 ml of toluene in a 500 mL round flask. Then, 1.65 g (1.65 mmol) of palladium dibenzyliden amine and 1.78 g (4.36 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound N-3 of 10 g (yield: 80%)

calcd. C47H31N3: C, 88.51; H, 4.90; N, 6.59. found: C, 88.62; H, 4.80; N, 6.47.

EXAMPLE N-11

Synthesis of Compound Represented by CF N-54

As an example of a compound for an organic photoelectric device according to an embodiment, the compound represented by CF N-54 was synthesized as in Reaction Scheme 14.

[Reaction Scheme 14]

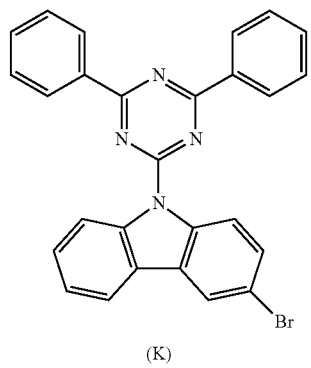

(K)

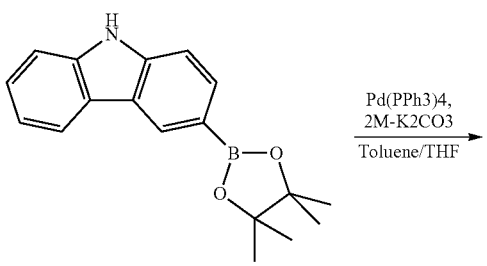

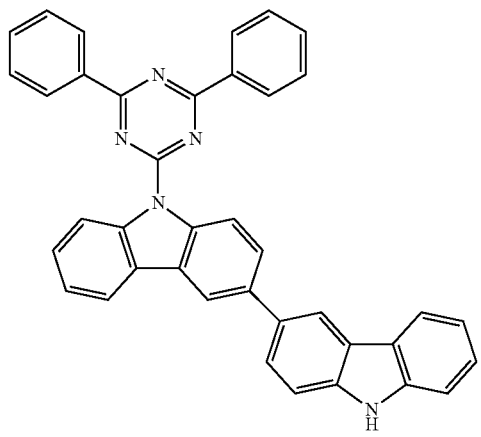

(L)

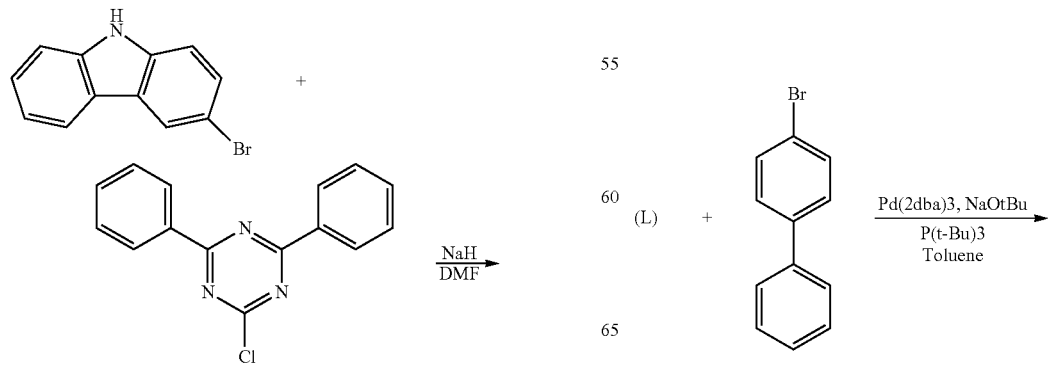

-continued

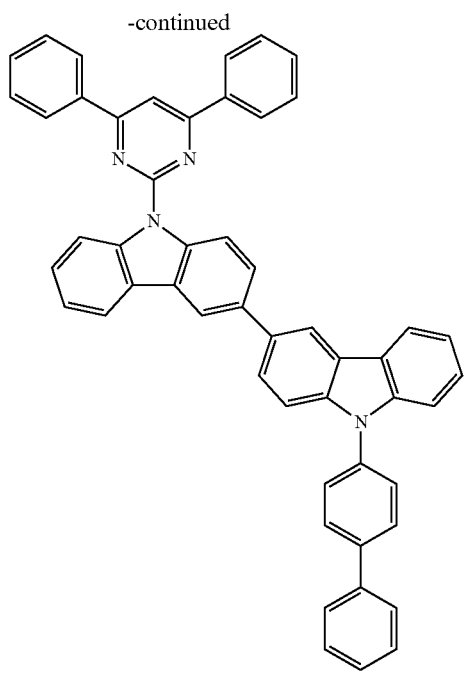

Step 1: Synthesis of Compound (K)

42.97 g (174.57 mmol) of 3-bromocarbazole, 56.1 g (209.5 mmol) of 2-chloro-4,6-diphenyl triazine, 10.48 g (261.86 mmol) of sodium hydride, and dimethylformamide were put in a 1000 mL round flask with an agitator under a nitrogen atmosphere. The mixture was refluxed for 12 hours under a nitrogen flow at room temperature.

The resulting solution was crystallized using distilled water, and then the resulting solution was filtered and recrystallized using chlorobenzene and hexane, obtaining a compound K of 82 g (yield: 98%)

Step 2: Synthesis of Compound (L)

70.57 g (147.85 mmol) of the intermediate product represented by the compound K, 52.01 g (177.42 mmol) of carbazole 3-boronic acid pinacol ester, 400 mL of tetrahydrofuran, and 400 mL of toluene were mixed with palladium-tetrakis (triphenylphosphine) and 400 mL of 2M aqueous potassium carbonate solution in a 2 L round-bottomed flask with an agitator under a nitrogen atmosphere. The mixture was heated and refluxed for 12 hours under a nitrogen flow.

After the reaction was complete, methanol was poured into the reactant. Then, a solid produced therefrom was filtered and dissolved in chlorobenzene, and activated carbon and anhydrous magnesium sulfate were added thereto. Then, the mixture was agitated.

The resulting solution was filtered and recrystallized using dichlorobenzene and methanol, obtaining a compound L of 66 g (yield: 79%)

Step 3: Synthesis of CF N-54

10.1 g (17.88 mmol) of the intermediate product represented by the compound L, 5 g (21.46 mmol) of 2-bromobiphenyl, and 3.44 g (35.76 mmol) of sodium tert-butoxide were dissolved with 400 ml of toluene in a 1 L round flask. Then, 1.03 g (1.79 mmol) of palladium dibenzyliden amine and 2.17 g (5.36 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound N-54 of 9.40 g (yield: 73%)

calcd. C52H34N4: C, 87.37; H, 4.79; N, 7.84. found: C, 87.47; H, 4.80; N, 7.78.

EXAMPLE N-12

Synthesis of Compound Represented by CF C-13

As an example of a compound for an organic photoelectric device according to an embodiment, the compound represented by CF C-13 was synthesized as in Reaction Scheme 15.

[Reaction Scheme 15]

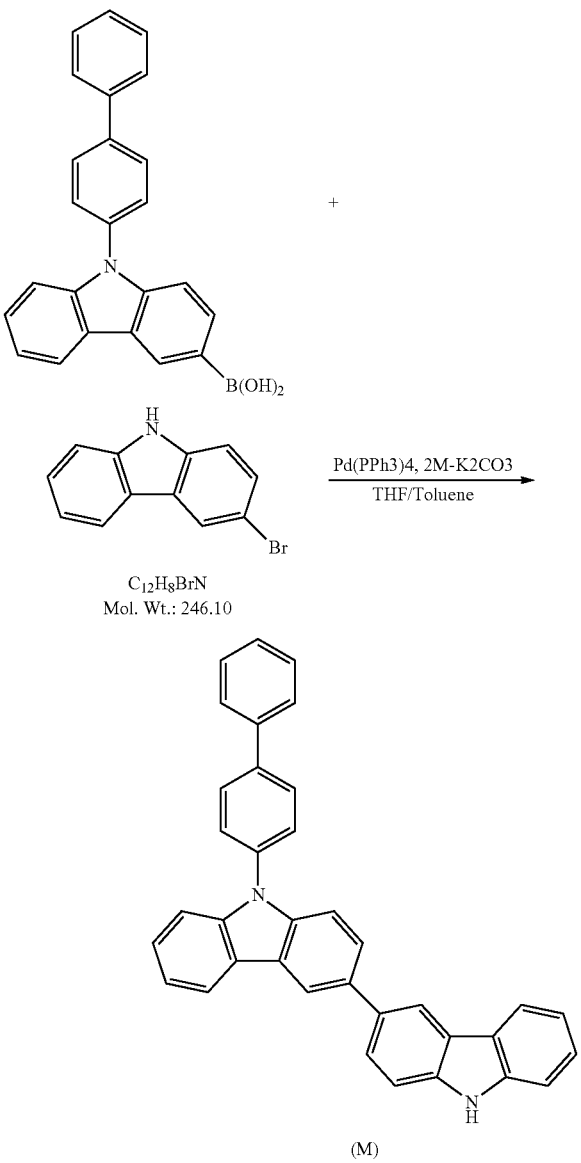

-continued

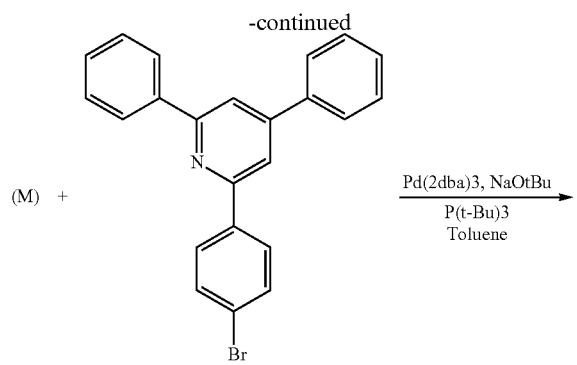

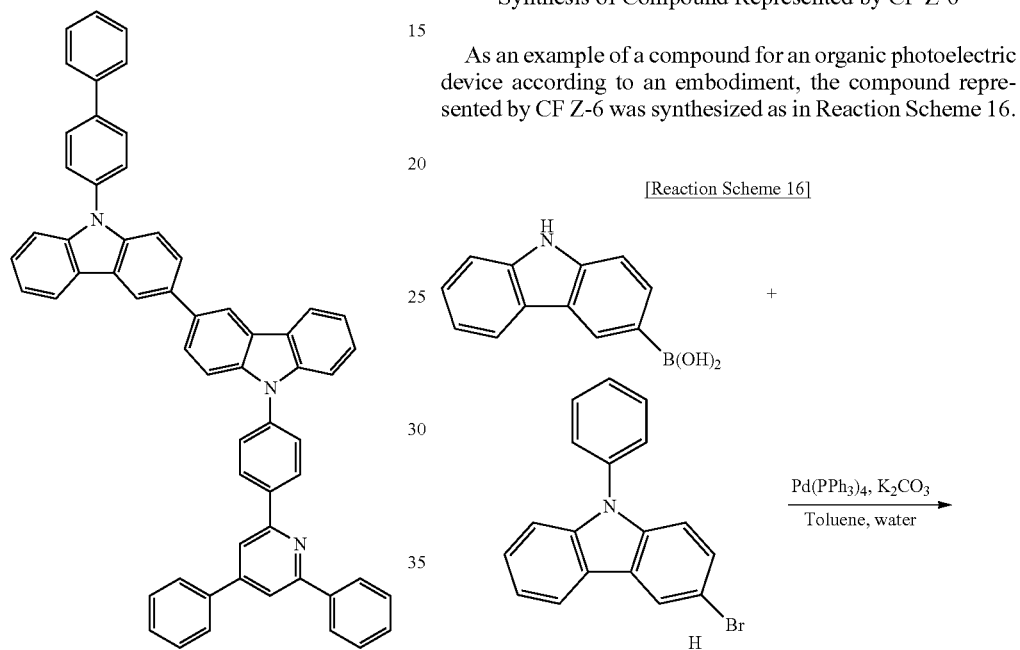

Step 1: Synthesis of Compound (M)

19.3 g (53.06 mmol) of N-phenyl-3-carbazole boronic acid, 10.9 g (44.22 mmol) of 3-bromocarbazole, 70 mL of tetrahydrofuran, and 70 mL of toluene were mixed with palladium-tetrakis(triphenylphosphine) and 80 mL of a 2M aqueous potassium carbonate solution in a 500 mL round-bottomed flask with an agitator under a nitrogen atmosphere. The mixture was heated and refluxed for 12 hours under a nitrogen flow.

After the reaction was complete, methanol was poured into the reactant. Then, a solid produced therefrom was filtered and dissolved in chlorobenzene, and activated carbon and anhydrous magnesium sulfate were added thereto. Then, the mixture was agitated.

The resulting solution was filtered and recrystallized using dichlorobenzene and methanol, obtaining a compound M of 13.7 g (yield: 64%)

Step 2: Synthesis of CF C-13

9.6 g (19.82 mmol) of the intermediate product represented by the compound M, 9.2 g (23.8 mmol) of 2-(4-bromophenyl)-4,6-diphenyl pyridine, and 3.2 g (33.7 mmol) of sodium tert-butoxide were dissolved with 160 ml of toluene in a 500 mL round flask. Then, 0.454 g (0.5 mmol) of palladium dibenzyliden amine and 0.6 g (1.49 mmol) of tert-butyl phosphorus were added into the round flask.

The mixture was heated at 110° C. and agitated for 12 hours under a nitrogen flow.

After the reaction was complete, methanol was poured into the reactant. Then, a solid produced therefrom was dissolved in chlorobenzene and agitated with activated carbon and anhydrous magnesium sulfate.

The resulting solution was filtered and recrystallized using chlorobenzene and methanol, obtaining a compound C-13 of 14 g (yield: 89%)

calcd. C59H39N3: C, 89.70; H, 4.98; N, 5.32. found: C, 89.57; H, 4.83; N, 5.65.

EXAMPLE Z-1

Synthesis of Compound Represented by CF Z-6

As an example of a compound for an organic photoelectric device according to an embodiment, the compound represented by CF Z-6 was synthesized as in Reaction Scheme 16.

[Reaction Scheme 16]

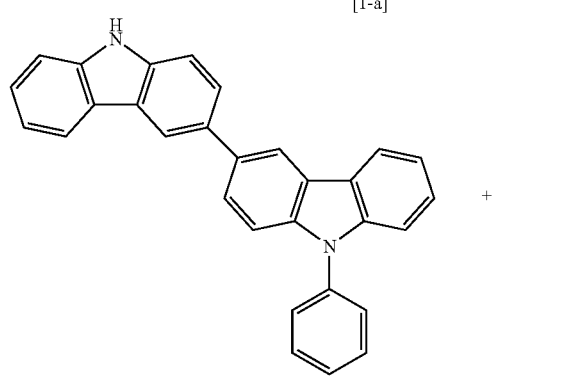

235
-continued

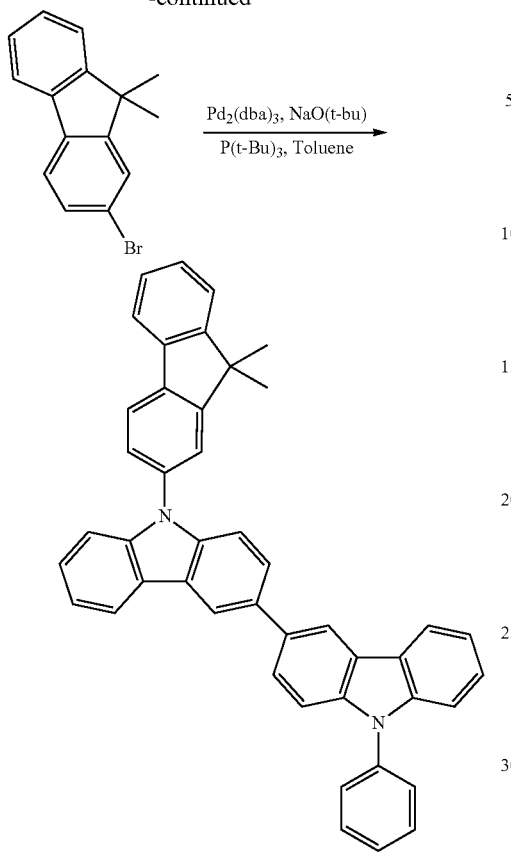

Step 1: Synthesis of Compound 1-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 1-a of 18 g (yield: 93%).

Step 2: Synthesis of Compound Represented by CF Z-6

10 g (24.48 mmol) of the intermediate product represented by the compound 1-a, 7.02 g (25.70 mmol) of 2-bromo dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-6 of 14.4 g (yield: 98%).

236

EXAMPLE Z-2

Synthesis of Compound Represented by CF Z-7

As an example of a compound for an organic photoelectric device according to an embodiment, the compound represented by CF Z-7 was synthesized as in Reaction Scheme 17.

[Reaction Scheme 17]

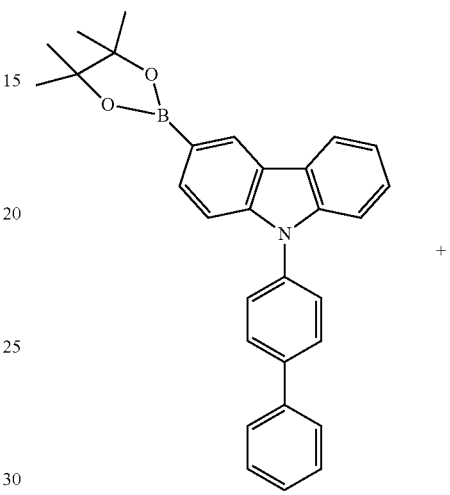

+

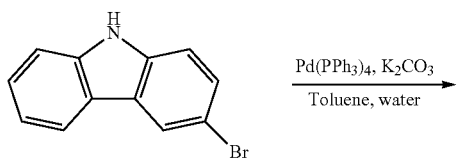

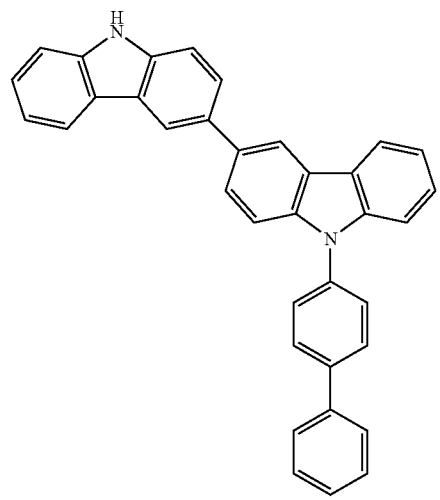

[2-a]

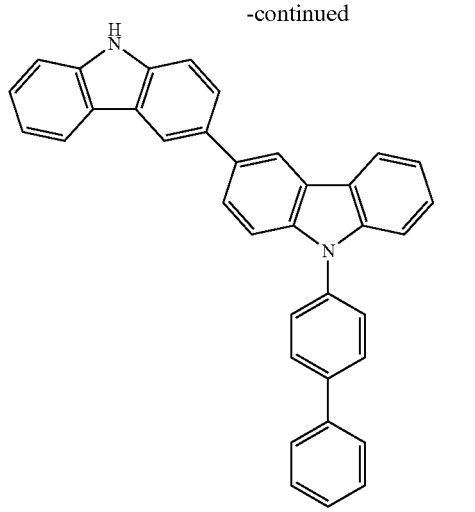

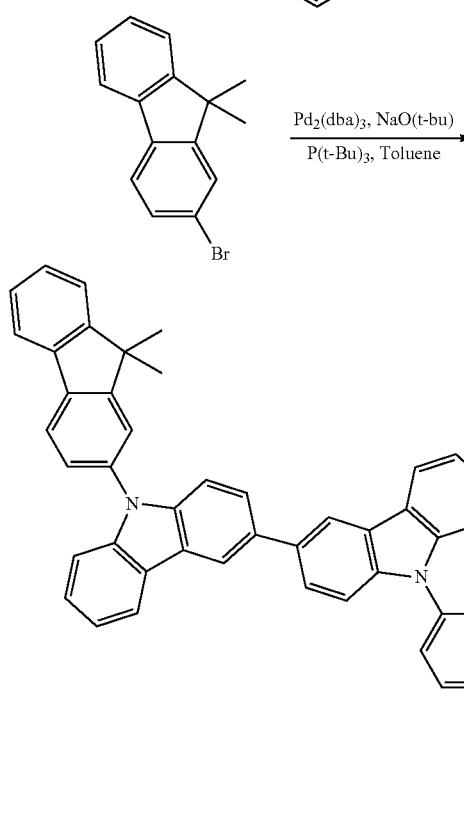

Step 1: Synthesis of Compound 2-a 20.0 g (44.91 mmol) of 9-biphenylcarbazole-3-boronic ester, 11.6 g (47.39 mmol) of 3-bromo carbazole, 0.519 g (0.45 mmol) of $Pd(PP_3)_4$, and 12.41 g (89.81 mmol) of $K_2CO_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 2-a of 13.8 g (yield: 60%).

Step 2: Synthesis of Compound Represented by CF Z-7

10 g (20.64 mmol) of the intermediate product represented by the compound 2-a, 5.92 g (21.67 mmol) of 2-bromo dimethylfluorene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-7 of 13.5 g (yield: 97%).

EXAMPLE Z-3

Synthesis of Compound Represented by CF Z-8

As an example of a compound for an organic photoelectric device according to an embodiment, the compound represented by CF Z-8 was synthesized as in Reaction Scheme 18.

[Reaction Scheme 18]

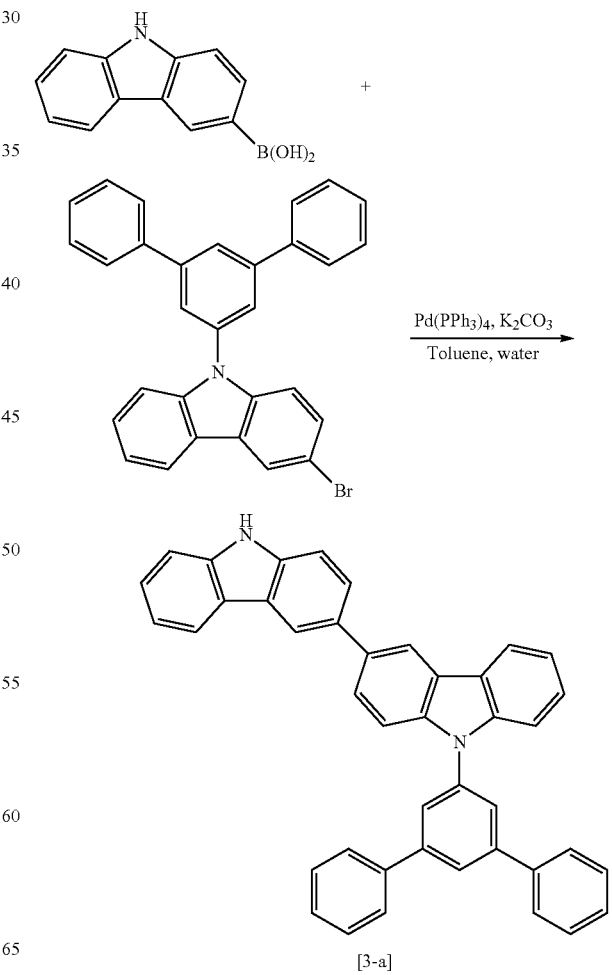

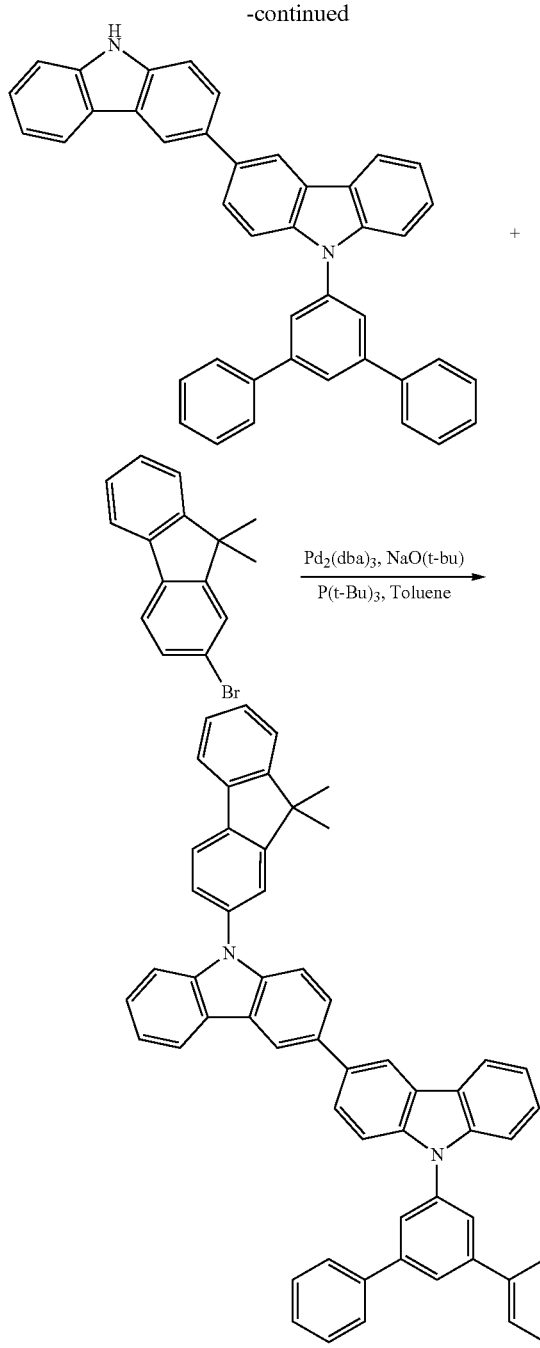

Step 1: Synthesis of Compound 3-a 10 g (47.39 mmol) of carbazole-3-boronic acid, 24.73 g (52.13 mmol) of 9-tert-phenyl-3-bromo carbazole, 0.548 g (0.47 mmol) of Pd(PP₃)₄, and 13.10 g (94.78 mmol) of K₂CO₃ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 3-a of 22 g (yield: 83%).

Step 2: Synthesis of Compound Represented by CF Z-8

10 g (17.84 mmol) of the intermediate product represented by the compound 3-a, 5.12 g (18.73 mmol) of 2-bromo dimethylfluorene, and 1.89 g (19.62 mmol) of sodium tert-butoxide were dissolved with 100 ml of toluene. Then, 0.163 g (0.18 mmol) of palladium dibenzyliden amine and 0.11 mL (0.54 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-8 of 13.0 g (yield: 97%).

EXAMPLE Z-4

Synthesis of Compound Represented by CF Z-9

As an example of a compound for an organic photoelectric device according to an embodiment, the compound represented by CF Z-9 was synthesized as in Reaction Scheme 19.

[Reaction Scheme 19]

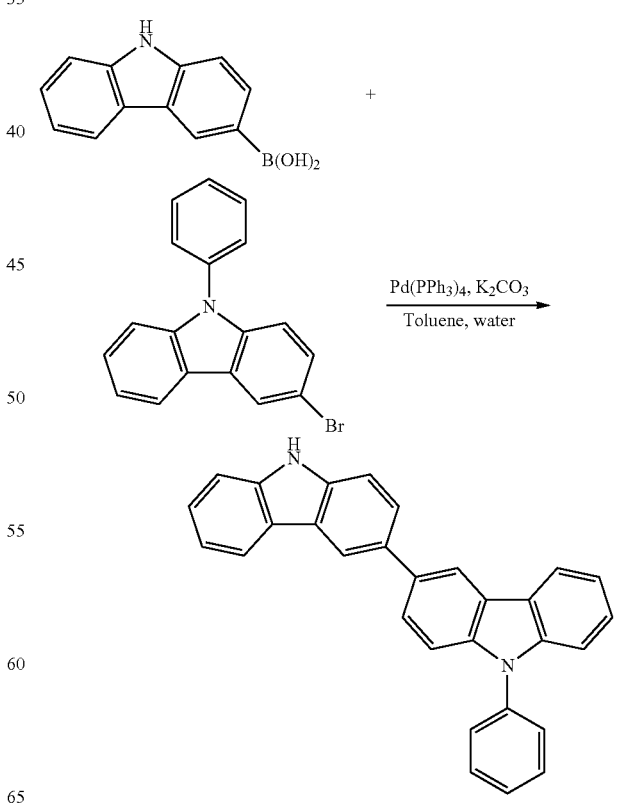

[4-a]

241

-continued

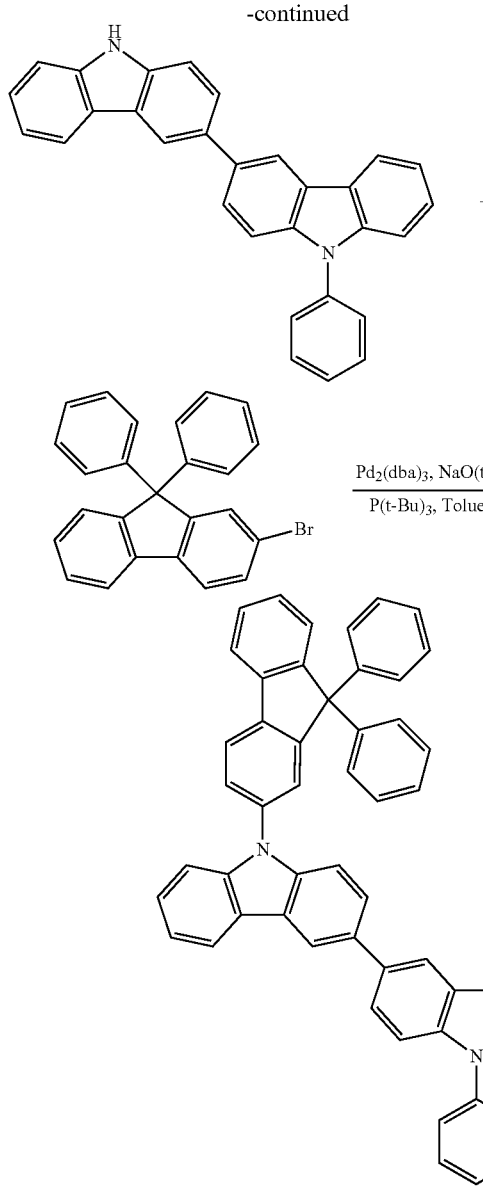

Step 1: Synthesis of Compound 4-a 10 g (47.39 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 4-a of 18 g (yield: 93%).

Step 2: Synthesis of Compound Represented by CF Z-9

10 g (24.48 mmol) of the intermediate product represented by the compound 4-a, 10.21 g (25.70 mmol) of 2-bromo diphenylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-9 of 17.2 g (yield: 97%).

EXAMPLE Z-5

Synthesis of Compound Represented by CF Z-10

As an example of a compound for an organic photoelectric device according to an embodiment, the compound represented by CF Z-10 was synthesized as in Reaction Scheme 20.

[Reaction Scheme 20]

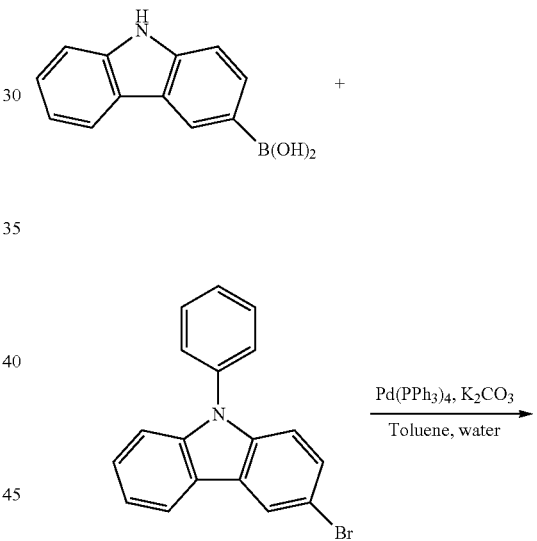

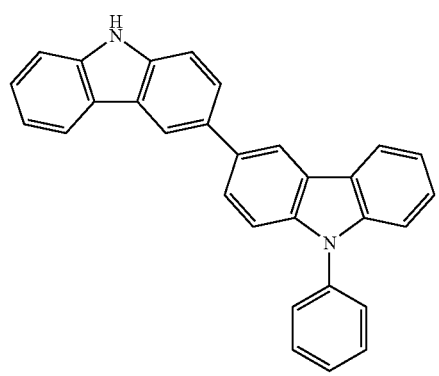

[5-a]

-continued

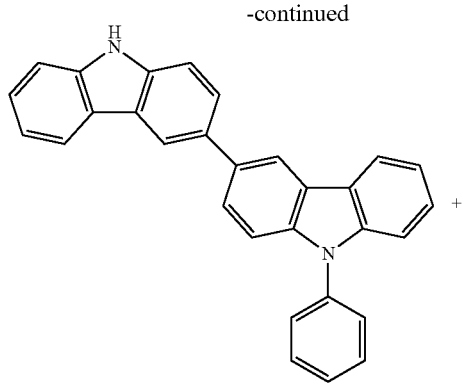

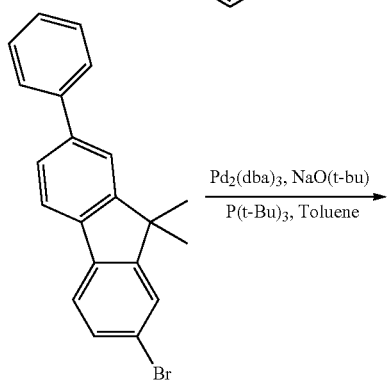

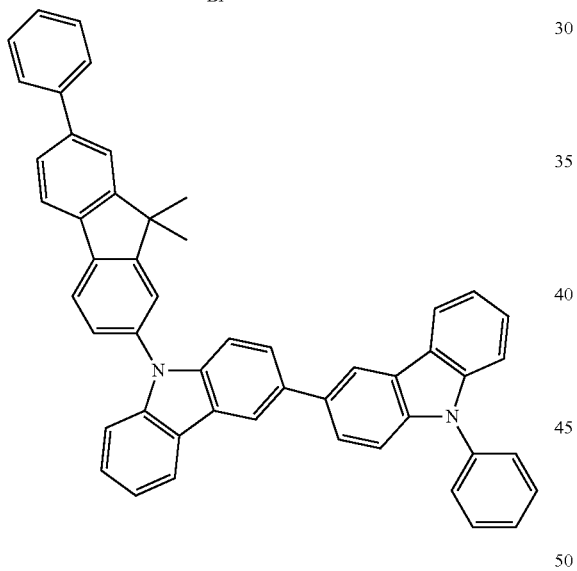

Step 1: Synthesis of Compound 5-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 5-a of 18 g (yield: 93%).

Step 2: Synthesis of Compound Represented by CF Z-10

10 g (24.48 mmol) of the intermediate product represented by the compound 5-a, 8.98 g (25.70 mmol) of 2-bromo-7-phenyl-dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-10 of 15.8 g (yield: 95%).

EXAMPLE Z-6

Synthesis of Compound Represented by CF Z-11

As an example of a compound for an organic photoelectric device according to an embodiment, the compound represented by CF Z-11 was synthesized as in Reaction Scheme 21.

[Reaction Scheme 21]

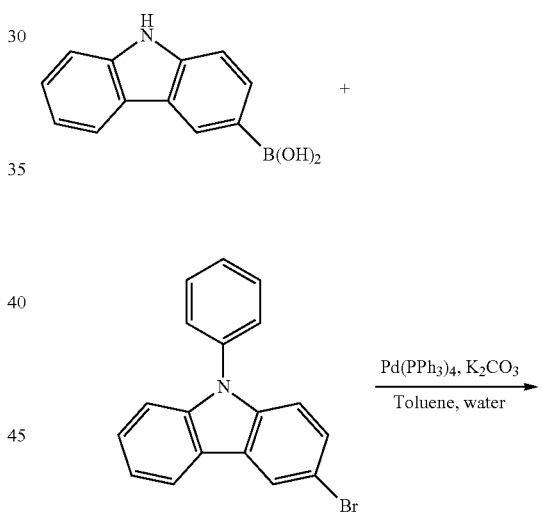

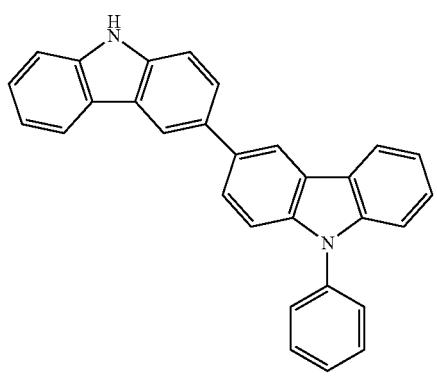

[6-a]

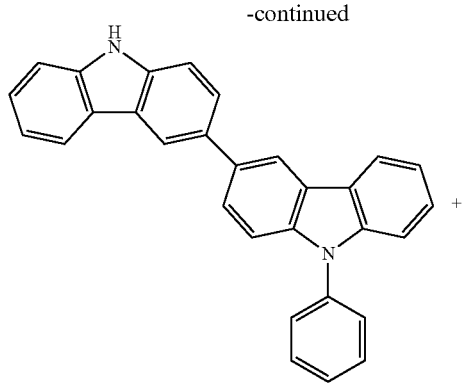

+

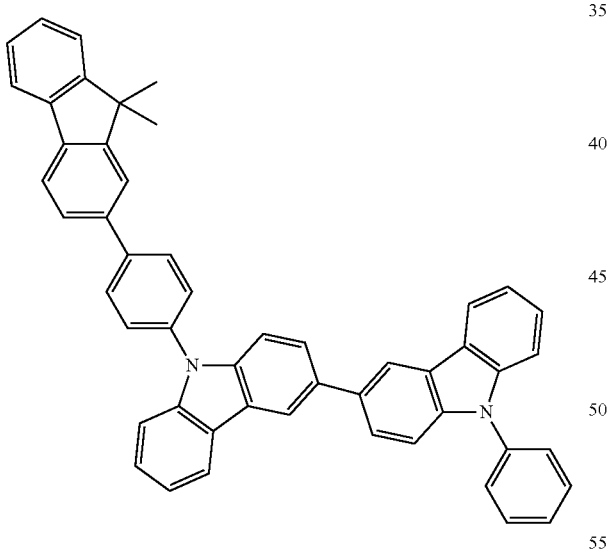

Pd₂(dba)₃, NaO(t-bu)
———————————————→
P(t-Bu)₃, Toluene

Step 1: Synthesis of Compound 6-a 10 g (47.36 mmol) of carbazole-3-boronic acid, 16.80 g (52.13 mmol) of 9-phenyl-3-bromo carbazole, 0.548 g (0.47 mmol) of Pd(PP₃)₄, and 13.10 g (94.78 mmol) of K₂CO₃ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystal-lized using dichloromethane and ethyl acetate, obtaining an intermediate product represented by the compound 6-a of 18 g (yield: 93%).

Step 2: Synthesis of Compound Represented by CF Z-11

10 g (24.48 mmol) of the intermediate product represented by the compound 6-a, 8.98 g (25.70 mmol) of 2-bromo-phenyl-dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystal-lized using dichloromethane and ethyl acetate, obtaining a product represented by the compound CF Z-11 of 16 g (yield: 97%).

EXAMPLE Z-7

Synthesis of Compound Represented by CF Z-12

As an example of a compound for an organic photoelectric device according to an embodiment, the compound represented by CF Z-12 was synthesized as in Reaction Scheme 22.

[Reaction Scheme 22]

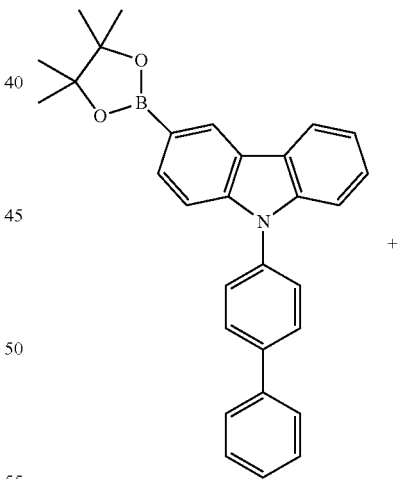

+

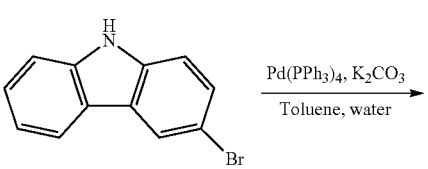

Pd(PPh₃)₄, K₂CO₃
———————————→
Toluene, water

[7-a]

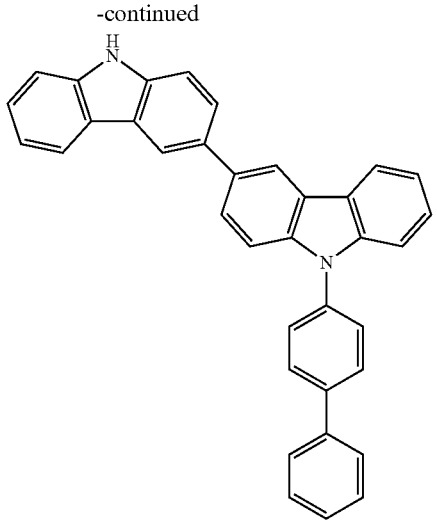

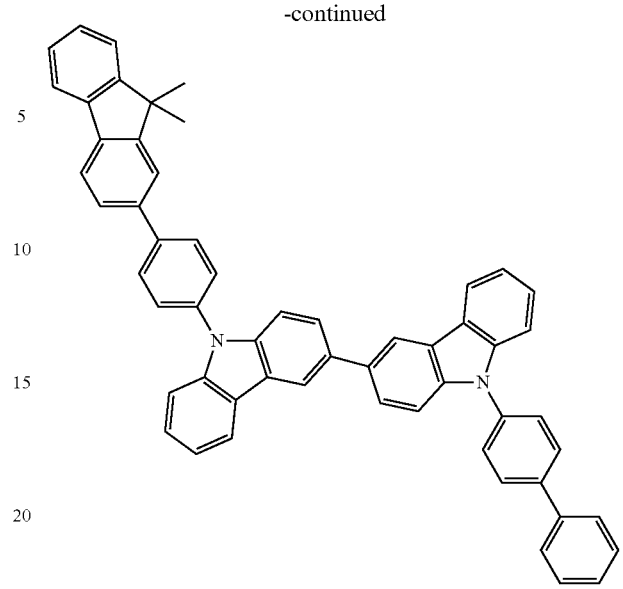

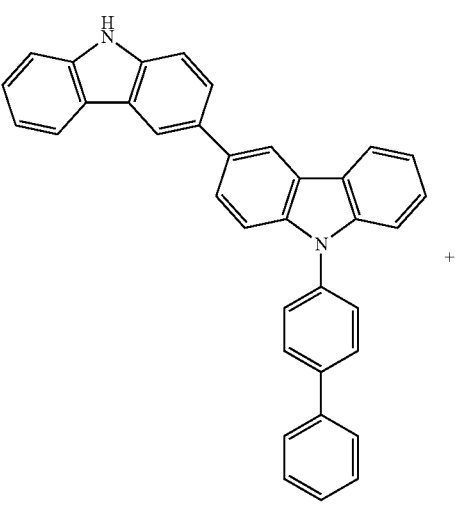 +

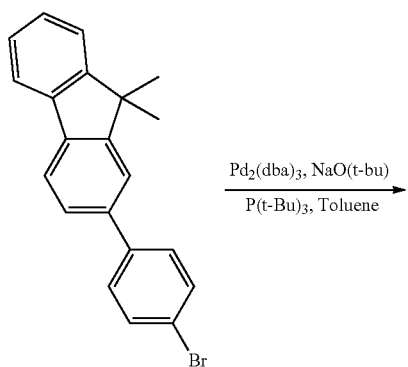

Pd₂(dba)₃, NaO(t-bu)
———————————→
P(t-Bu)₃, Toluene

Step 1: Synthesis of Compound 7-a 20 g (44.91 mmol) of 9-biphenylcarbazole-3-boronic acid, 11.6 g (47.39 mmol) of 3-bromo carbazole, 0.519 g (0.45 mmol) of Pd(PP₃)₄, and 12.41 g (89.81 mmol) of K₂CO₃ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 7-a of 13.8 g (yield: 60%).

Step 2: Synthesis of Compound Represented by CF Z-12

10 g (20.64 mmol) of the intermediate product represented by the compound 7-a, 7.57 g (21.67 mmol) of 2-bromo-phenyl-dimethylfluorene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-12 of 15.1 g (yield: 97%).

EXAMPLE Z-8

Synthesis of Compound Represented by CF Z-13

As an example of a compound for an organic photoelectric device according to an embodiment, the compound represented by CF Z-13 was synthesized as in Reaction Scheme 23.

[Reaction Scheme 23]

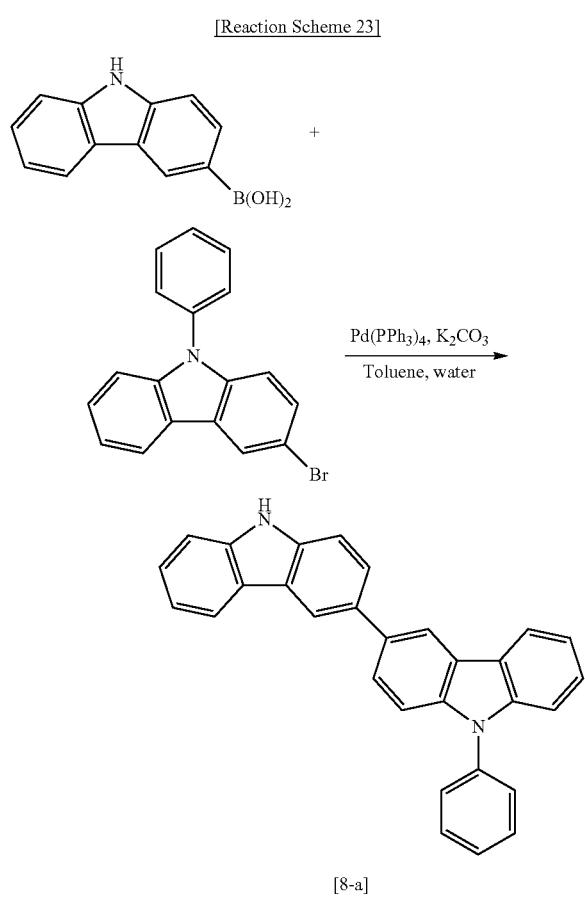

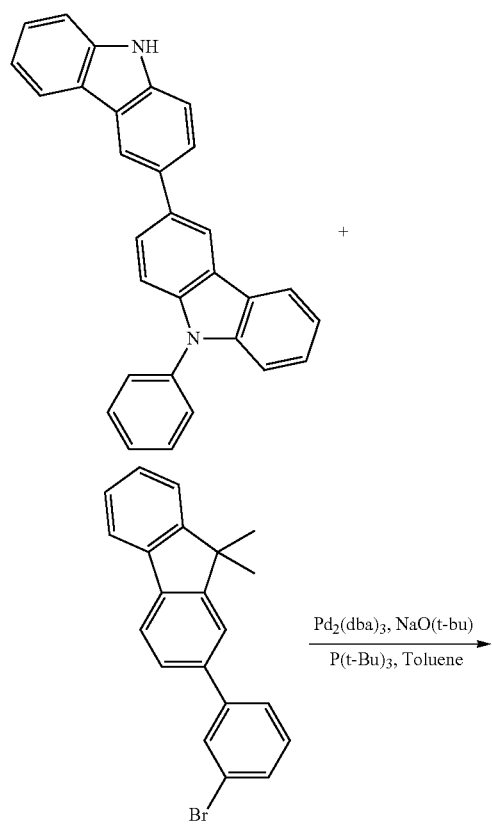

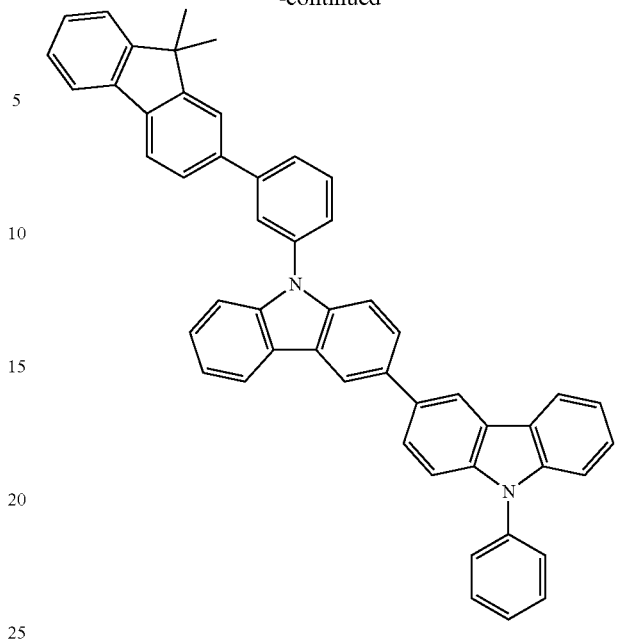

Step 1: Synthesis of Compound 8-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 8-a of 18 g (yield: 93%).

Step 2: Synthesis of Compound Represented by CF Z-13

10 g (24.48 mmol) of the intermediate product represented by the compound 8-a, 8.98 g (21.67 mmol) of 2-(2-bromophenyl)-dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-13 of 15.8 g (yield: 95%).

EXAMPLE Z-9

Synthesis of Compound Represented by CF Z-14

As an example of a compound for an organic photoelectric device according to an embodiment, the compound represented by CF Z-14 was synthesized as in Reaction Scheme 24.

[Reaction Scheme 24]

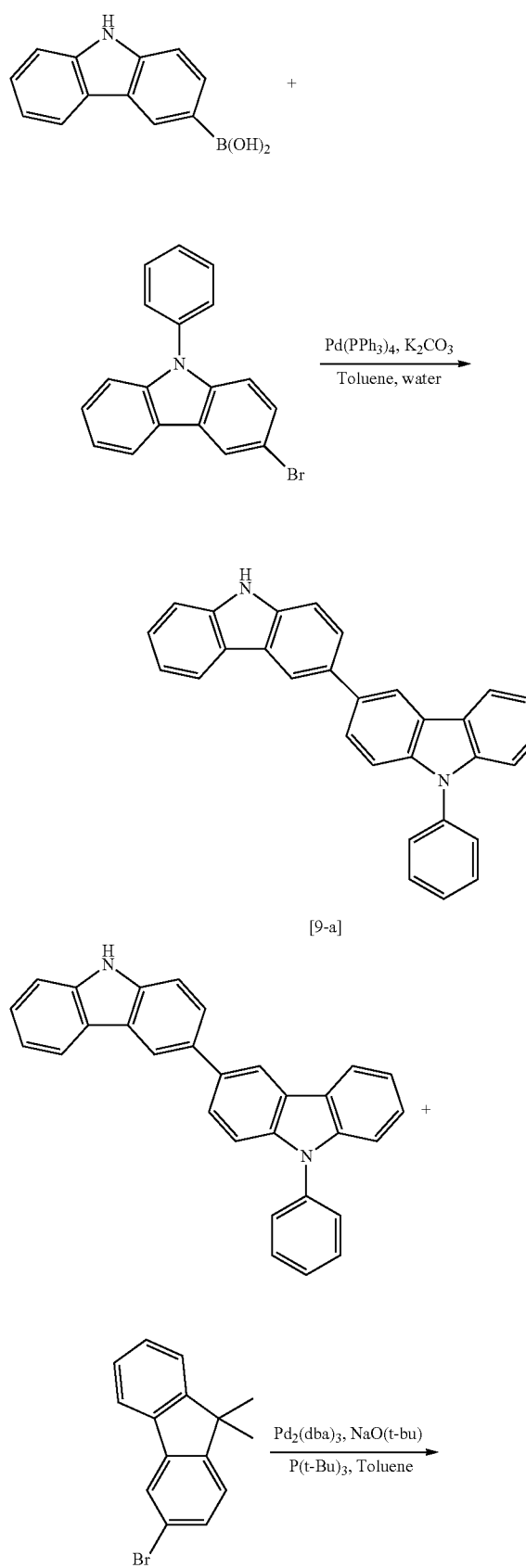

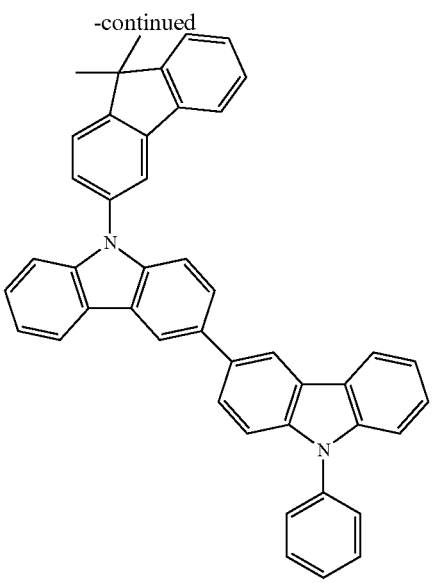

Step 1: Synthesis of Compound 9-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 1-a of 18 g (yield: 93%).

Step 2: Synthesis of Compound Represented by CF Z-14

10 g (24.48 mmol) of the intermediate product represented by the compound 9-a, 7.02 g (25.70 mmol) of 3-bromo dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-14 of 12.2 g (yield: 83%).

EXAMPLE Z-10

Synthesis of Compound Represented by CF Z-15

As an example of a compound for an organic photoelectric device according to an embodiment, the compound represented by CF Z-15 was synthesized as in Reaction Scheme 25.

[Reaction Scheme 25]

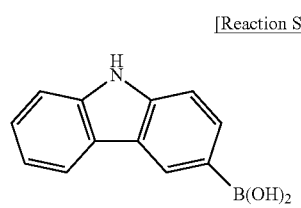

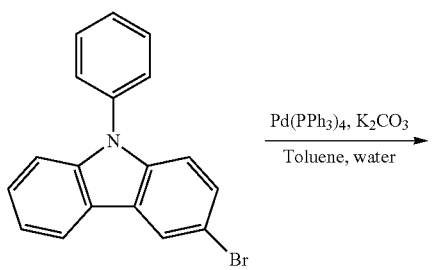

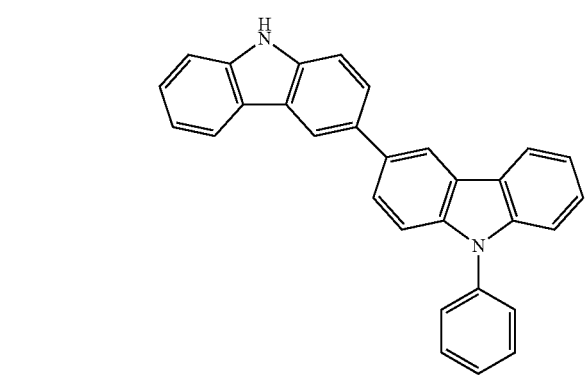

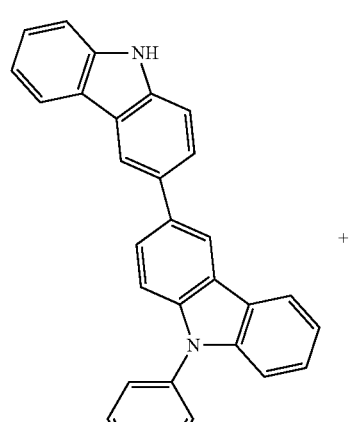

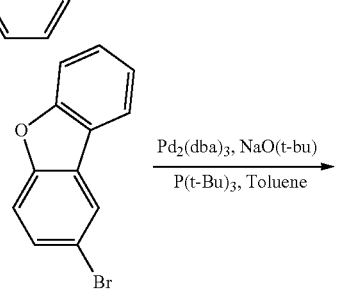

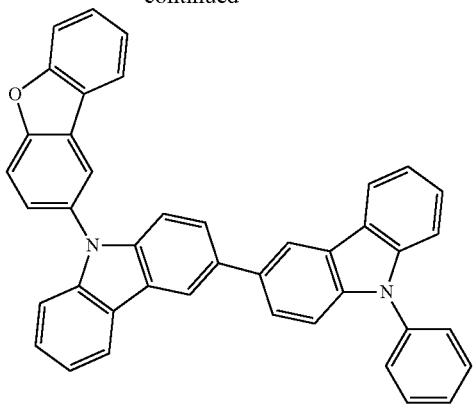

Step 1: Synthesis of compound 10-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 10-a of 18 g (yield: 93%).

Step 2: Synthesis of Compound Represented by CF Z-15

10 g (24.48 mmol) of the intermediate product represented by the compound 10-a, 6.35 g (21.67 mmol) of 2-bromo dibenzofuran, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-15 of 12.7 g (yield: 90%).

EXAMPLE Z-11

Synthesis of Compound Represented by CF Z-16

As an example of a compound for an organic photoelectric device according to an embodiment, the compound represented by CF Z-16 was synthesized as in Reaction Scheme 26.

[Reaction Scheme 26]

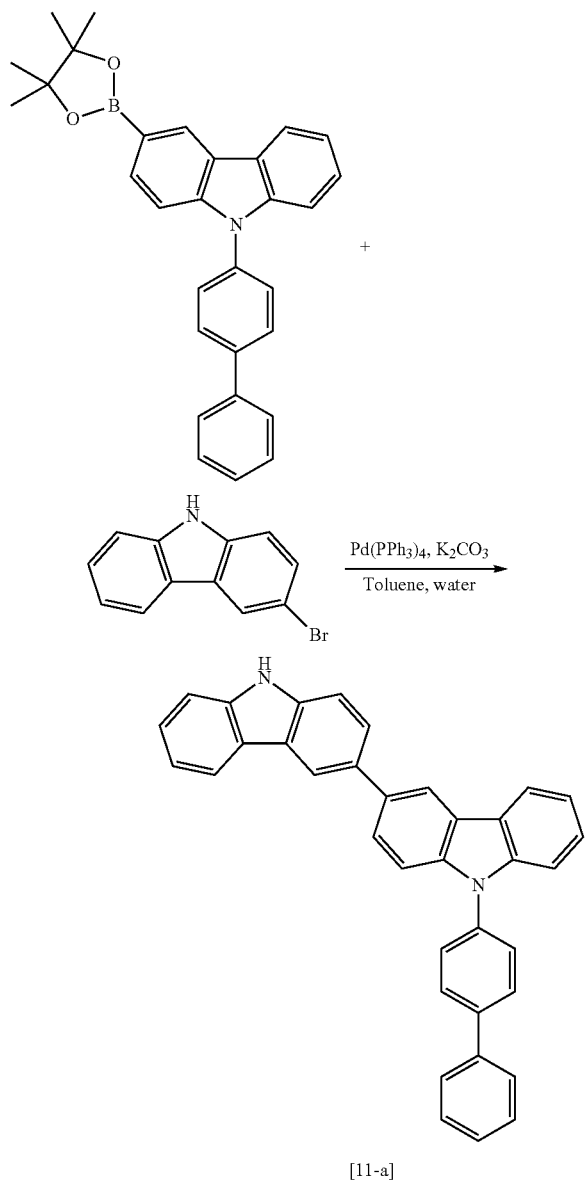

[11-a]

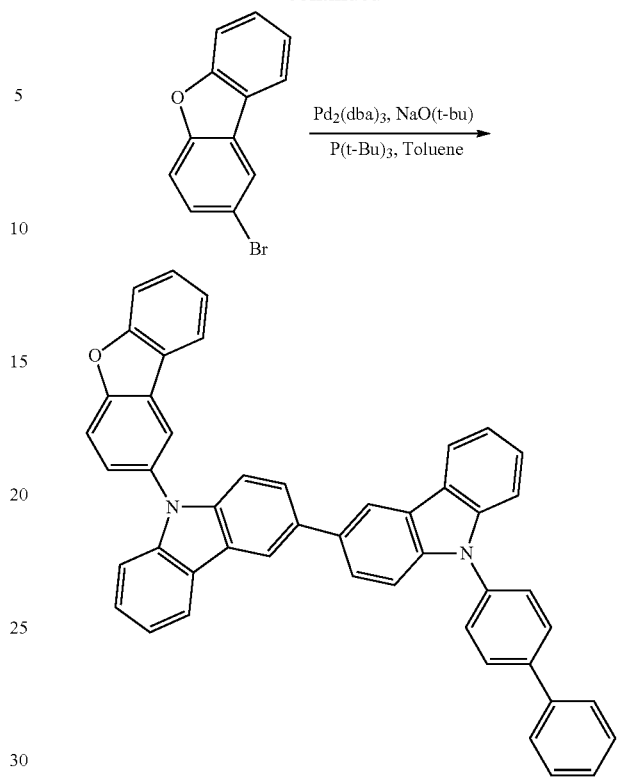

Step 1: Synthesis of Compound 11-a 20.0 g (44.91 mmol) of 9-biphenylcarbazole-3-boronic ester, 11.6 g (47.39 mmol) of 3-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 11-a of 13.8 g (yield: 60%).

Step 2: Synthesis of Compound Represented by CF Z-7

10 g (20.64 mmol) of the intermediate product represented by the compound 11-a, 5.35 g (21.67 mmol) of 2-bromo dibenzofuran, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-16 of 11.4 g (yield: 96%).

EXAMPLE Z-12

Synthesis of Compound Represented by CF Z-17

As an example of a compound for an organic photoelectric device according to an embodiment, the compound represented by CF Z-17 was synthesized as in Reaction Scheme 27.

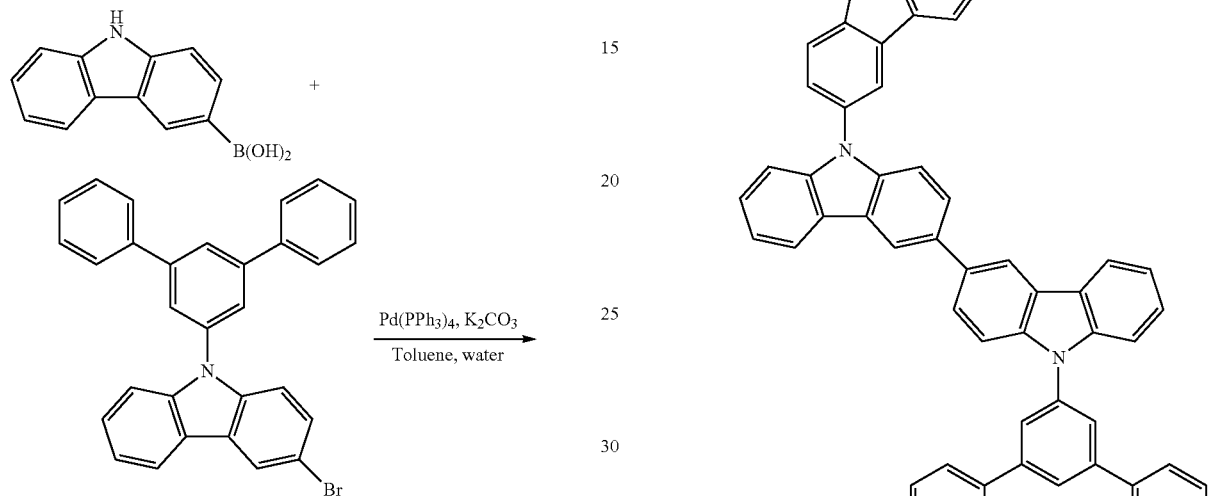

Step 1: Synthesis of compound 12-a 10 g (47.39 mmol) of carbazole-3-boronic acid, 24.73 g (52.13 mmol) of 9-tert-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 12-a of 22 g (yield: 83%).

Step 2: Synthesis of Compound Represented by CF Z-17

10 g (17.84 mmol) of the intermediate product represented by the compound 12-a, 4.63 g (18.73 mmol) of 2-bromo dibenzofuran, and 1.89 g (19.62 mmol) of sodium tert-butoxide were dissolved with 100 ml of toluene. Then, 0.163 g (0.18 mmol) of palladium dibenzyliden amine and 0.11 mL (0.54 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-17 of 11.9 g (yield: 92%).

EXAMPLE Z-13

Synthesis of Compound Represented by CF Z-18

As an example of a compound for an organic photoelectric device according to an embodiment, the compound represented by CF Z-18 was synthesized as in Reaction Scheme 28.

[Reaction Scheme 28]

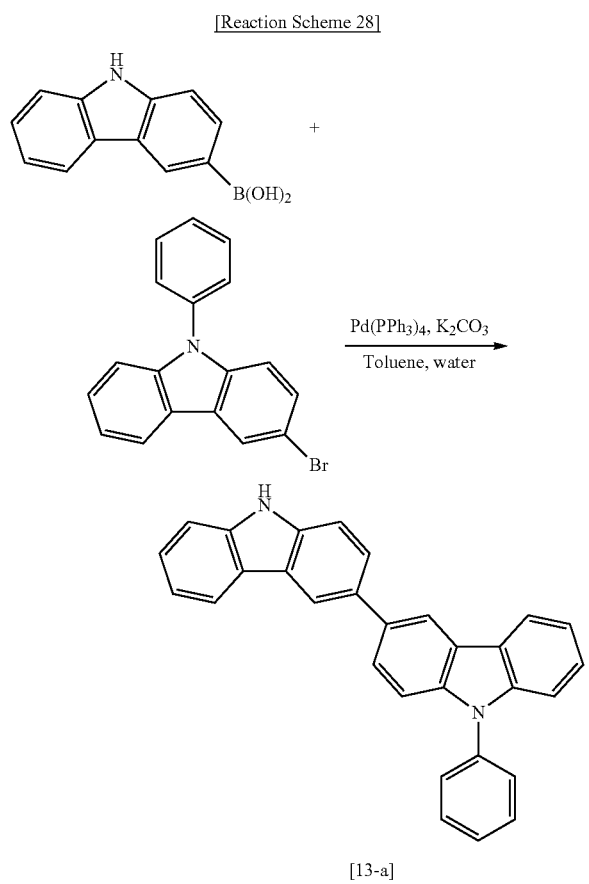

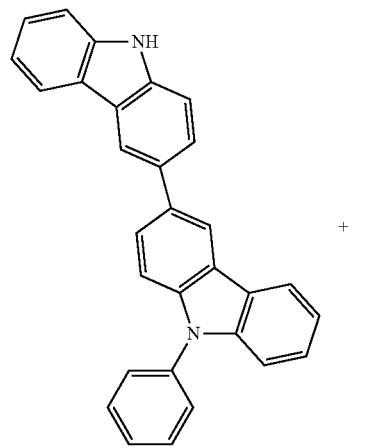

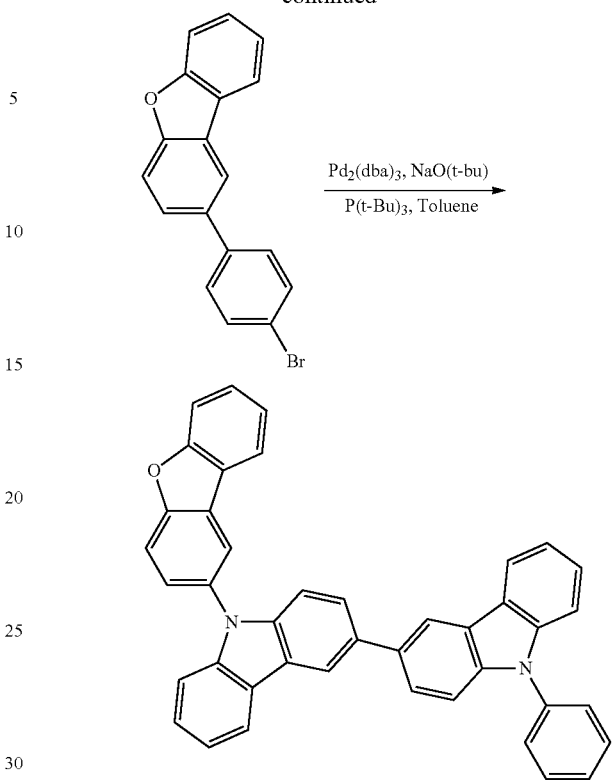

Step 1: Synthesis of Compound 13-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 13-a of 18 g (yield: 93%).

Step 2: Synthesis of Compound Represented by CF Z-18

10 g (24.48 mmol) of the intermediate product represented by the compound 13-a, 8.31 g (25.70 mmol) of 2-(4-bromophenyl) dibenzofuran, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-18 of 13.5 g (yield: 85%).

EXAMPLE Z-14

Synthesis of Compound Represented by CF Z-19

As an example of a compound for an organic photoelectric device according to an embodiment, the compound represented by CF Z-19 was synthesized as in Reaction Scheme 29.

[Reaction Scheme 29]

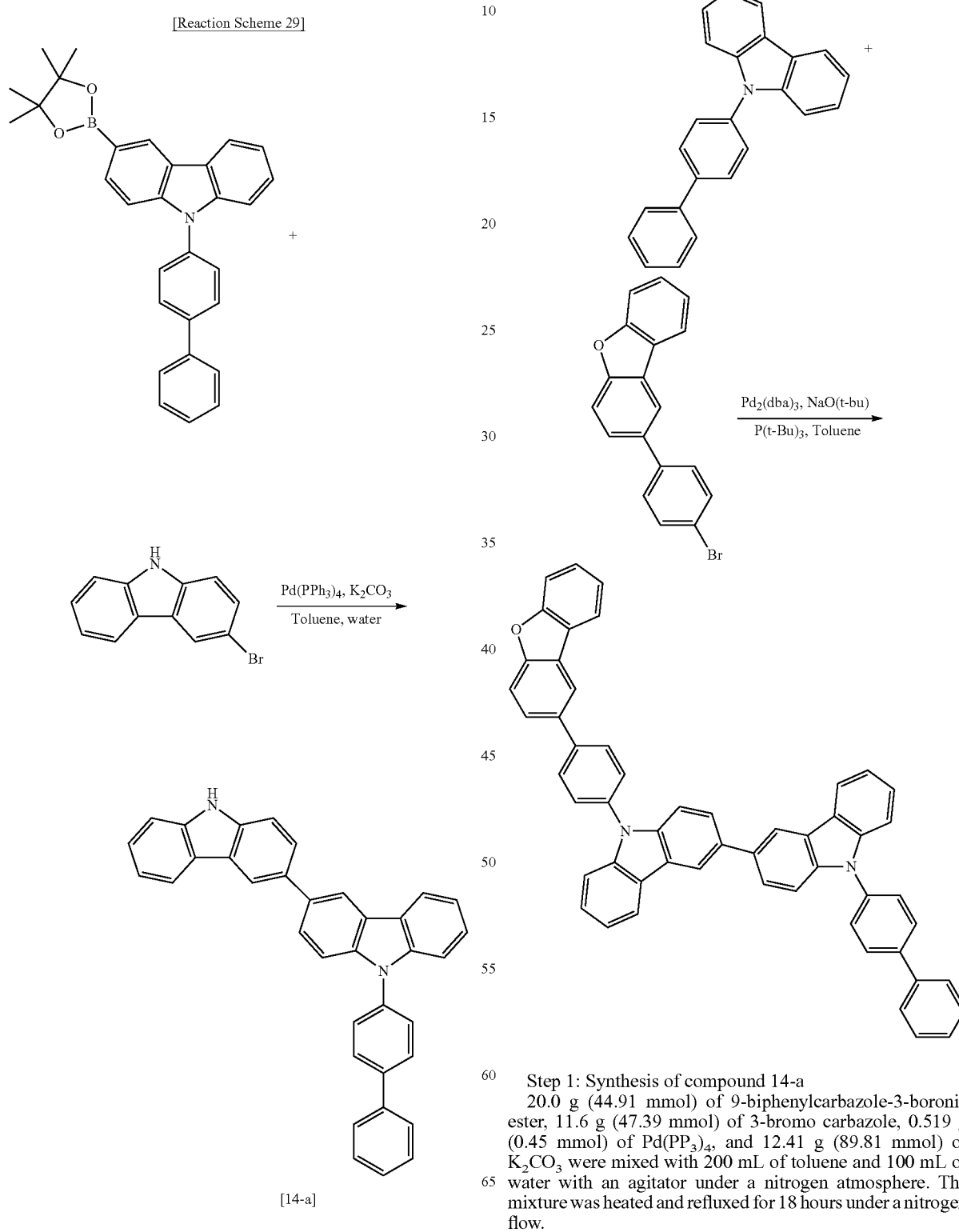

[14-a]

Step 1: Synthesis of compound 14-a 20.0 g (44.91 mmol) of 9-biphenylcarbazole-3-boronic ester, 11.6 g (47.39 mmol) of 3-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 14-a of 13.8 g (yield: 60%).

Step 2: Synthesis of Compound Represented by CF Z-19

10 g (20.64 mmol) of the intermediate product represented by the compound 14-a, 7.00 g (21.67 mmol) of 2-(4-bromodibenzofuran), and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-19 of 12.7 g (yield: 85%).

EXAMPLE Z-15

Synthesis of Compound Represented by CF Z-20

As an example of a compound for an organic photoelectric device according to an embodiment, the compound represented by CF Z-20 was synthesized as in Reaction Scheme 30.

[Reaction Scheme 30]

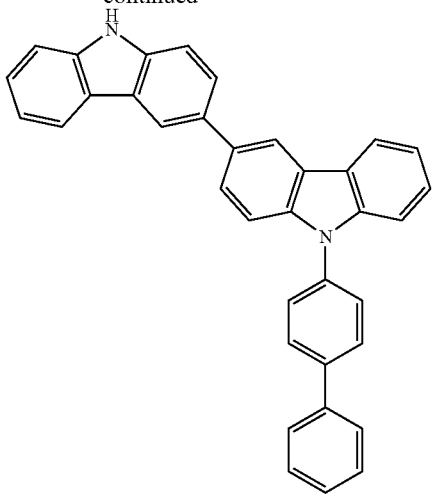

[15-a]

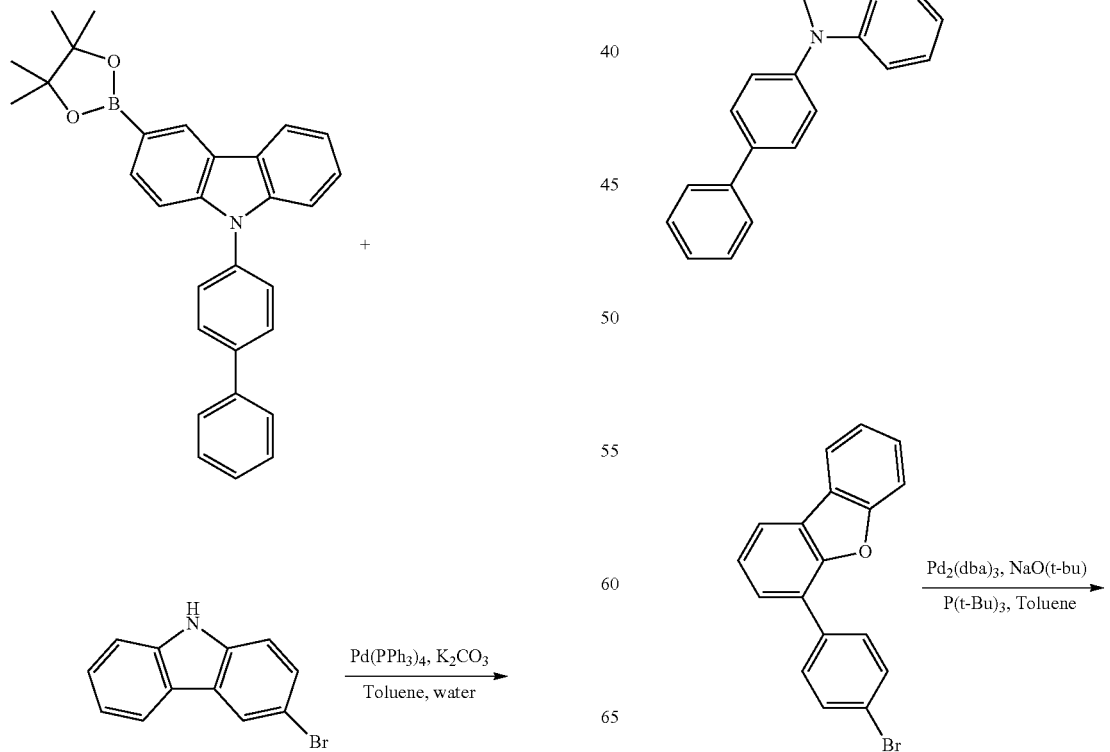

-continued

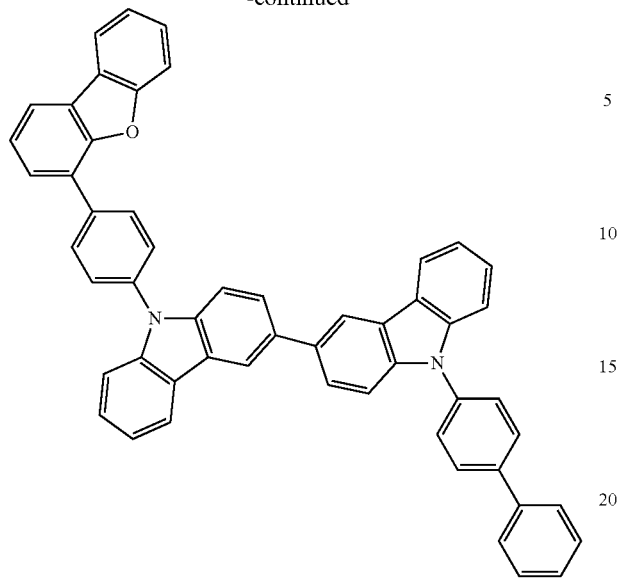

Step 1: Synthesis of Compound 15-a 20.0 g (44.91 mmol) of 9-biphenylcarbazole-3-boronic ester, 11.6 g (47.39 mmol) of 3-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 15-a of 13.8 g (yield: 60%).

Step 2: Synthesis of Compound Represented by CF Z-20

10 g (20.64 mmol) of the intermediate product represented by the compound 15-a, 7.00 g (21.67 mmol) of 4-(4-bromo-dibenzofuran), and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-20 of 12.0 g (yield: 80%).

EXAMPLE Z-16

Synthesis of Compound Represented by CF Z-21

As an example of a compound for an organic photoelectric device according to an embodiment, the compound represented by CF Z-21 was synthesized as in Reaction Scheme 31.

[Reaction Scheme 31]

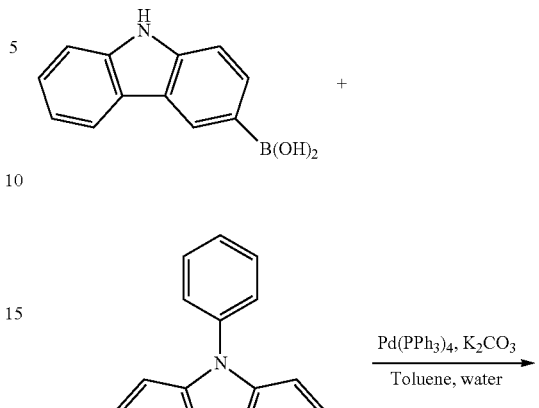

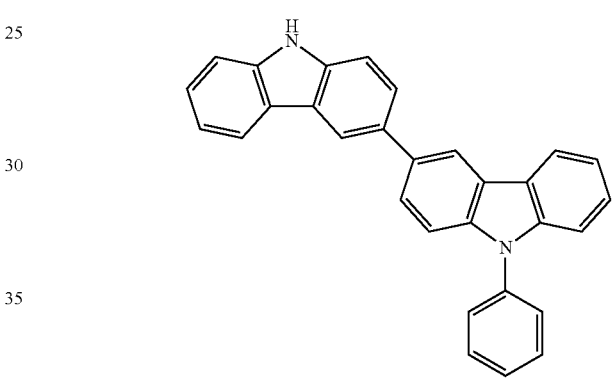

[16-a]

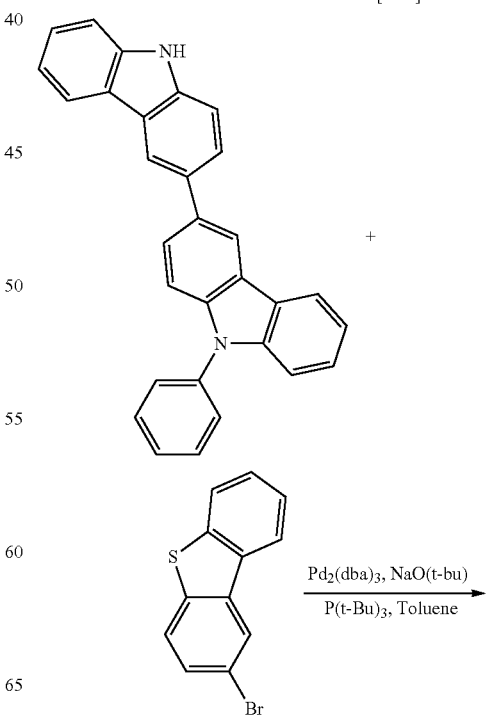

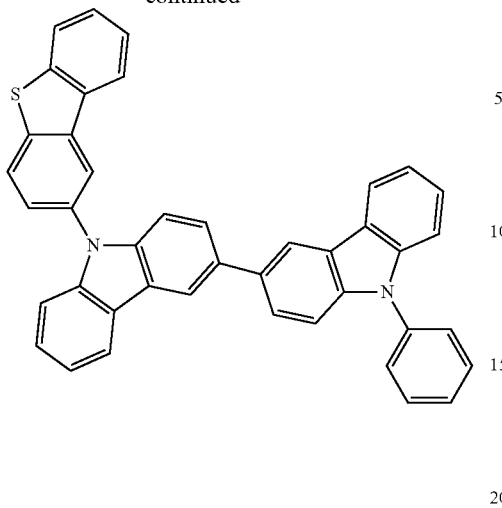

Step 1: Synthesis of compound 16-a 10 g (47.36 mmol) of carbazole-3-boronic acid, 16.80 g (52.13 mmol) of 9-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 16-a of 18 g (yield: 93%).

Step 2: Synthesis of Compound Represented by CF Z-21

10 g (24.48 mmol) of the intermediate product represented by the compound 16-a, 6.76 g (25.7 mmol) of 2-bromo-dibenzothiophene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-21 of 14.0 g (yield: 97%).

EXAMPLE Z-17

Synthesis of Compound Represented by CF Z-22

As an example of a compound for an organic photoelectric device according to an embodiment, the compound represented by CF Z-22 was synthesized as in Reaction Scheme 32.

[Reaction Scheme 32]

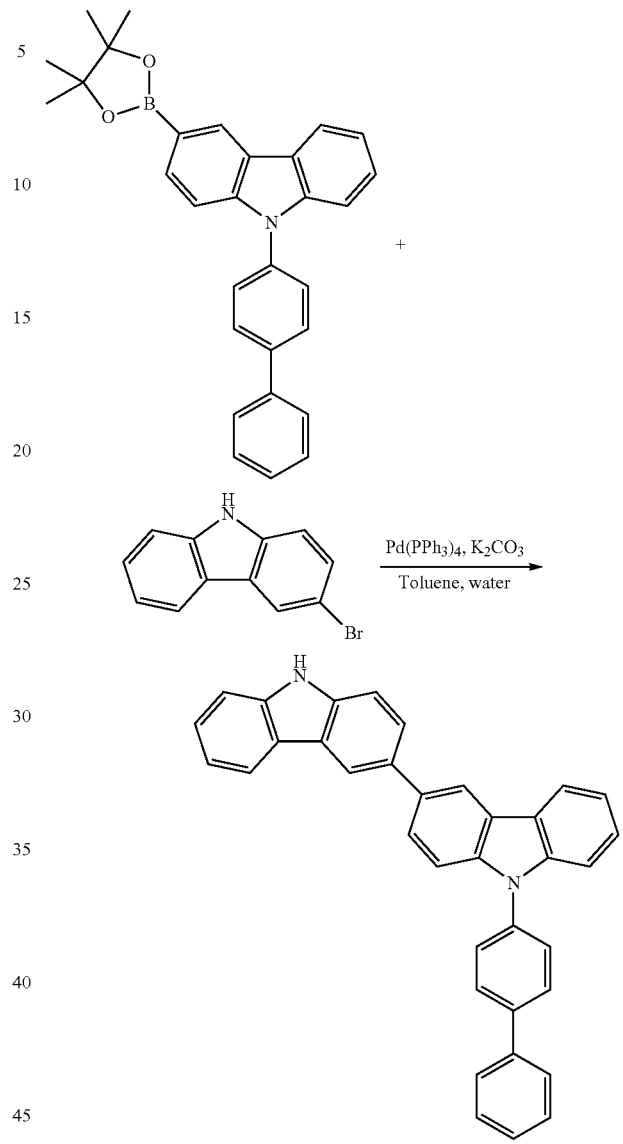

-continued

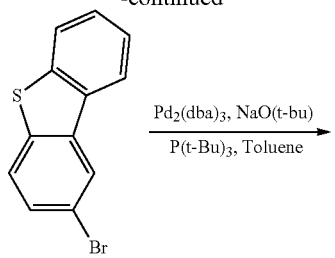

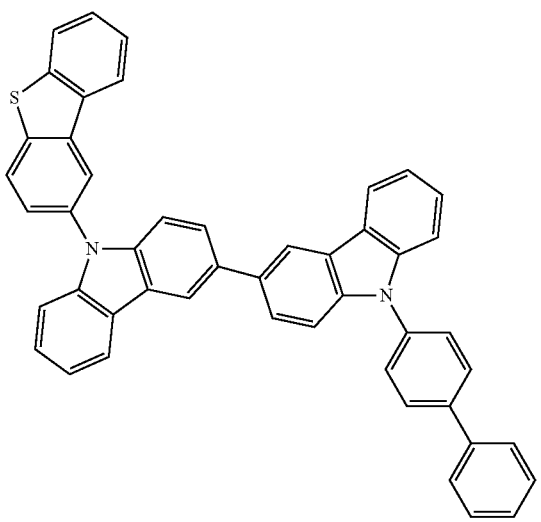

Step 1: Synthesis of Compound 17-a 20.0 g (44.91 mmol) of 9-biphenylcarbazole-3-boronic ester, 11.6 g (47.39 mmol) of 3-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 17-a of 13.8 g (yield: 60%).

Step 2: Synthesis of Compound Represented by CF Z-22

10 g (20.64 mmol) of the intermediate product represented by the compound 17-a, 5.35 g (21.67 mmol) of 2-bromo-dibenzothiophene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-22 of 12.7 g (yield: 92%).

EXAMPLE Z-18

Synthesis of Compound Represented by CF Z-23

As an example of a compound for an organic photoelectric device according to an embodiment, the compound represented by CF Z-23 was synthesized as in Reaction Scheme 33.

[Reaction Scheme 33]

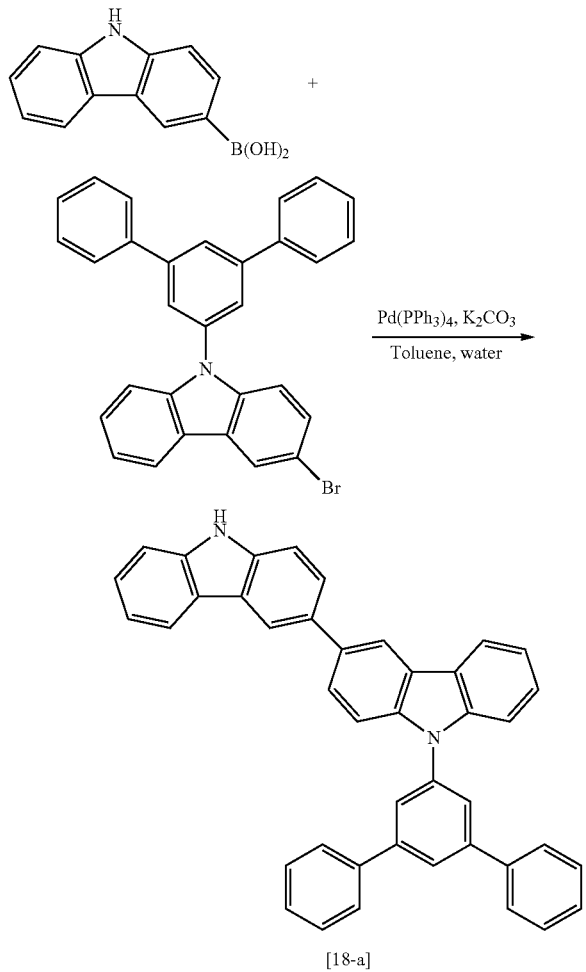

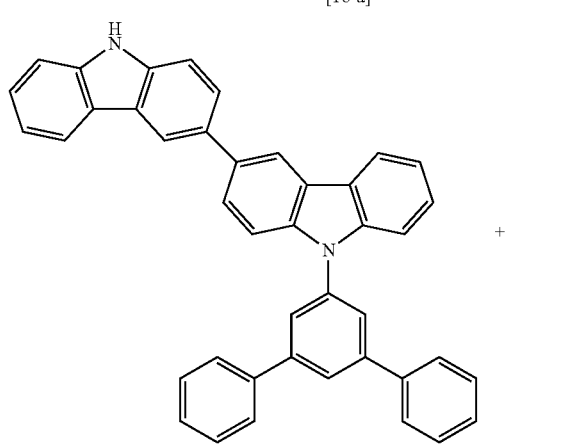

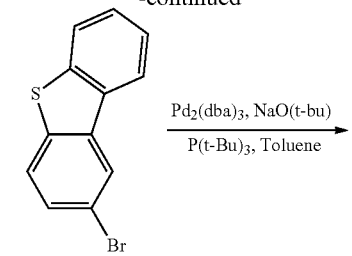

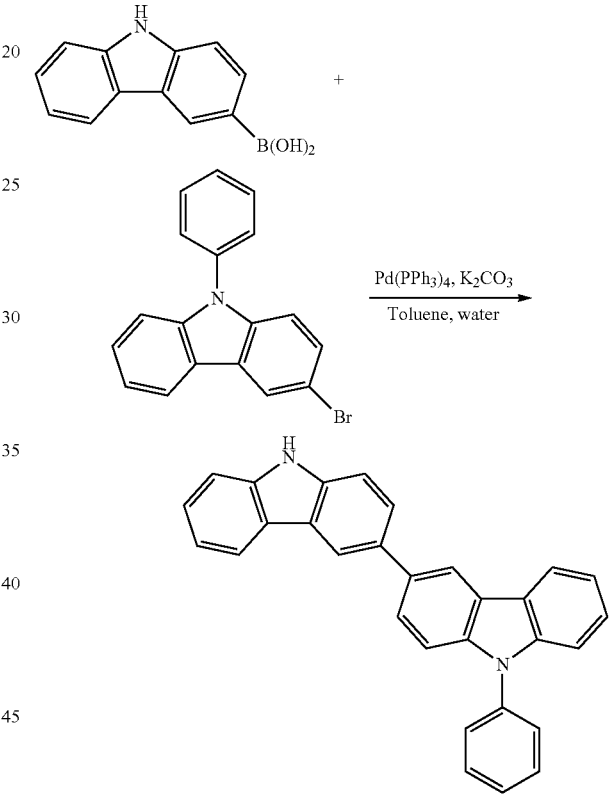

Step 1: Synthesis of Compound 18-a 10 g (47.39 mmol) of carbazole-3-boronic acid, 24.73 g (52.13 mmol) of 9-tert-phenyl-3-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 18-a of 22 g (yield: 83%).

Step 2: Synthesis of Compound Represented by CF Z-23

10 g (17.84 mmol) of the intermediate product represented by the compound 18-a, 4.93 g (18.73 mmol) of 2-bromo-dibenzothiophene, and 1.89 g (19.62 mmol) of sodium tert-butoxide were dissolved with 75 ml of toluene. Then, 0.163 g (0.18 mmol) of palladium dibenzyliden amine and 0.11 mL (0.54 mmol) of tert-butyl phosphine were added.

The mixture was agitated for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-23 of 11.9 g (yield: 90%).

EXAMPLE Z-19

Synthesis of Compound Represented by CF Z-24

As an example of a compound for an organic photoelectric device according to an embodiment, the compound represented by CF Z-24 was synthesized as in Reaction Scheme 34.

[Reaction Scheme 34]

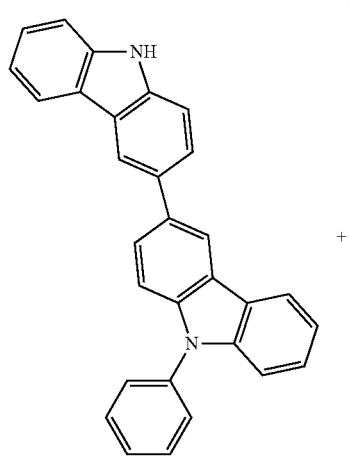

EXAMPLE Z-20

Synthesis of Compound Represented by CF Z-25

As an example of a compound for an organic photoelectric device according to an embodiment, the compound represented by CF Z-25 was synthesized as in Reaction Scheme 35.

[Reaction Scheme 35]

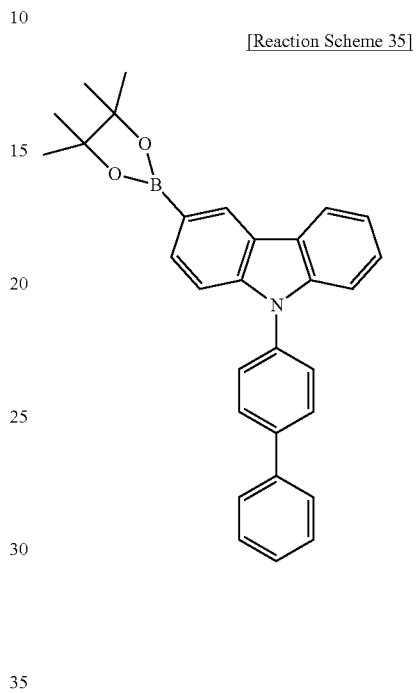

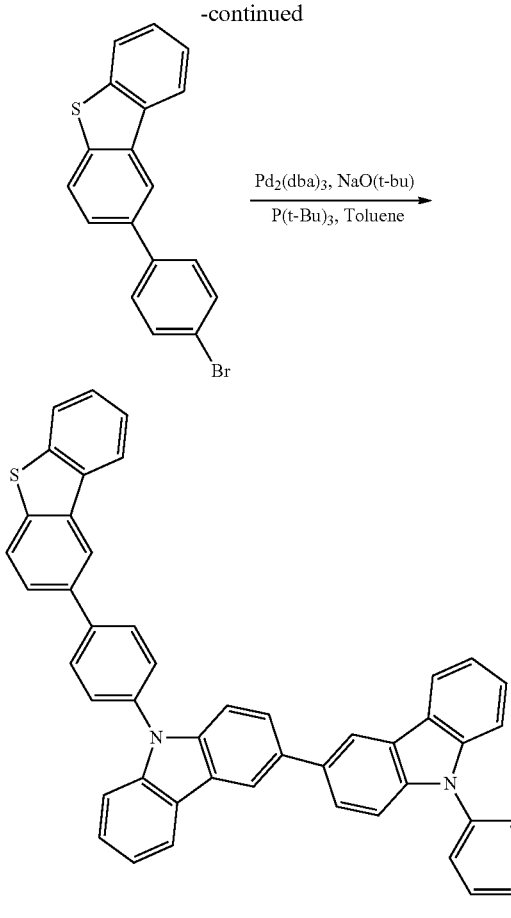

+

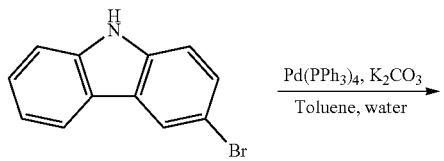

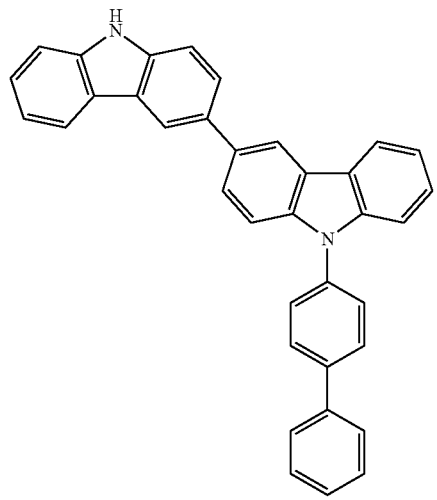

[20-a]

Step 1: Synthesis of Compound 19-a 10 g (47.36 mmol) of carbazole-3-boronic acid, 16.80 g (52.13 mmol) of 9-phenyl-3-bromo carbazole, 0.548 g (0.47 mmol) of $Pd(PP_3)_4$, and 13.10 g (94.78 mmol) of $K_2CO_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 19-a of 18 g (yield: 93%).

Step 2: Synthesis of Compound Represented by CF Z-24

10 g (24.48 mmol) of the intermediate product represented by the compound 19-a, 8.72 g (25.70 mmol) of 2-(4-bromophenyl) dibenzothiophene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-24 of 13.1 g (yield: 80%).

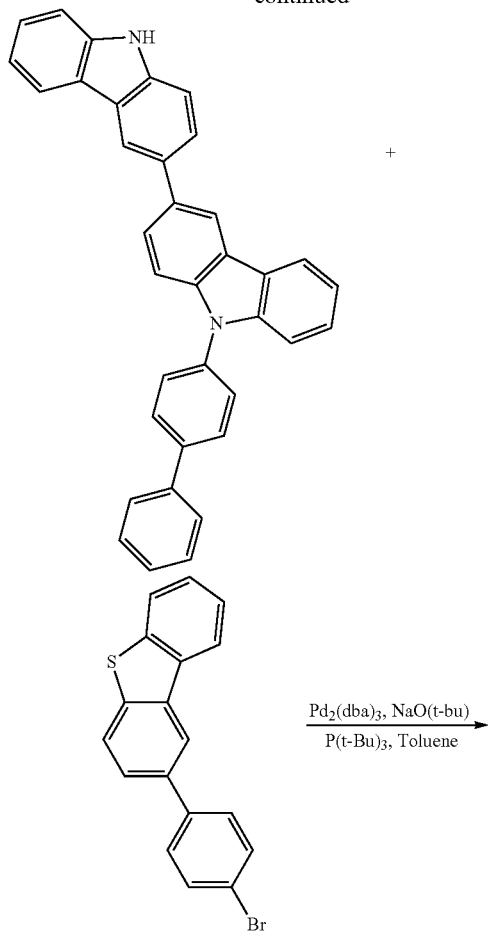

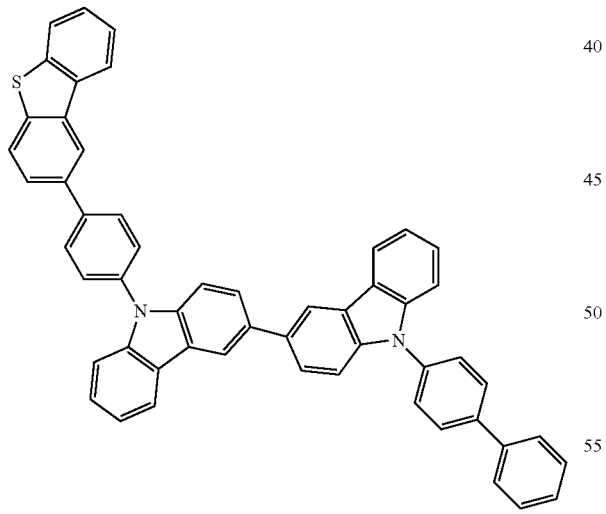

Step 1: Synthesis of Compound 20-a 20.0 g (44.91 mmol) of 9-biphenylcarbazole-3-boronic ester, 11.6 g (47.39 mmol) of 3-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 20-a of 13.8 g (yield: 60%).

Step 2: Synthesis of Compound Represented by CF Z-25

10 g (20.64 mmol) of the intermediate product represented by the compound 20-a, 7.35 g (21.67 mmol) of 2-(4-bromo phenyl) dibenzothiophene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and acetone, obtaining a product represented by the compound CF Z-25 of 13.0 g (yield: 85%).

EXAMPLE Z-21

Synthesis of Compound Represented by CF Z-26

As an example of a compound for an organic photoelectric device according to an embodiment, the compound represented by CF Z-26 was synthesized as in Reaction Scheme 36.

[Reaction Scheme 36]

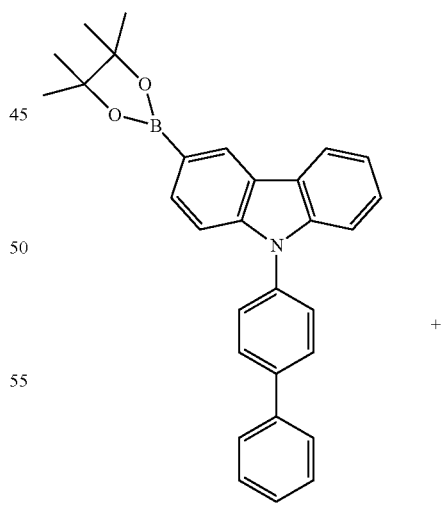

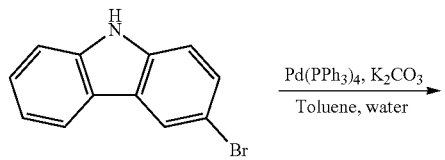

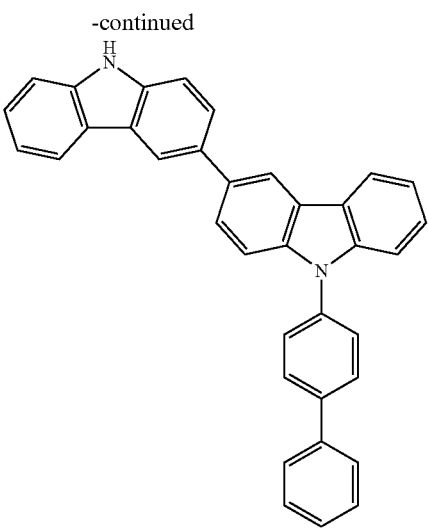

[21-a]

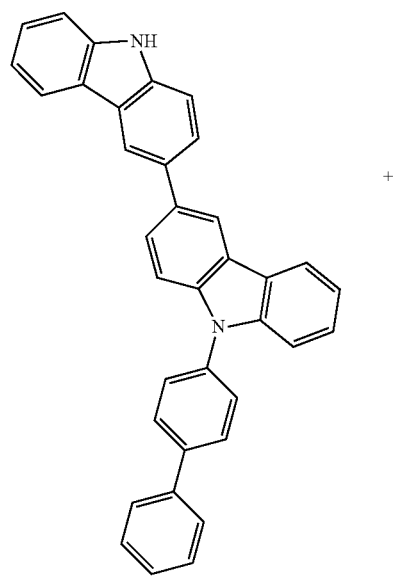

+

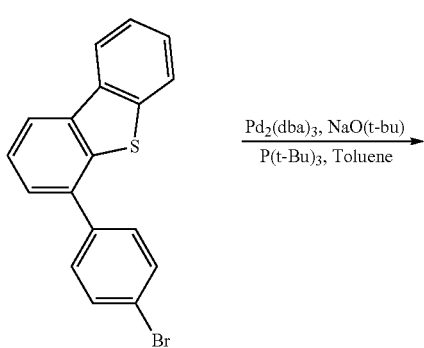

Pd₂(dba)₃, NaO(t-bu)
—————————→
P(t-Bu)₃, Toluene

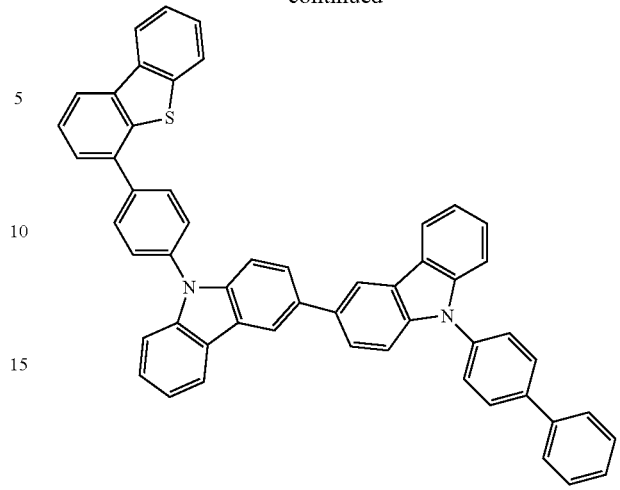

Step 1: Synthesis of Compound 21-a 20.0 g (44.91 mmol) of 9-biphenylcarbazole-3-boronic ester, 11.6 g (47.39 mmol) of 3-bromo carbazole, 0.519 g (0.45 mmol) of Pd(PP₃)₄, and 12.41 g (89.81 mmol) of K₂CO₃ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 21-a of 13.8 g (yield: 60%).

Step 2: Synthesis of Compound Represented by CF Z-26

10 g (20.64 mmol) of the intermediate product represented by the compound 21-a, 7.00 g (21.67 mmol) of 4-(4-bromo phenyl) dibenzothiophene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-26 of 12.7 g (yield: 83%).

EXAMPLE Z-22

Synthesis of Compound Represented by CF Z-27

As an example of a compound for an organic photoelectric device according to an embodiment, the compound represented by CF Z-27 was synthesized as in Reaction Scheme 37.

[Reaction Scheme 37]

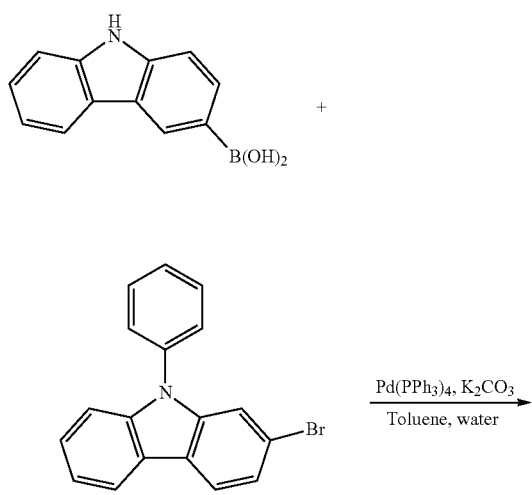

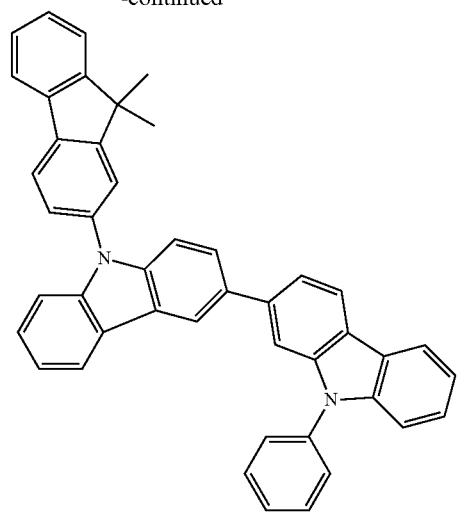

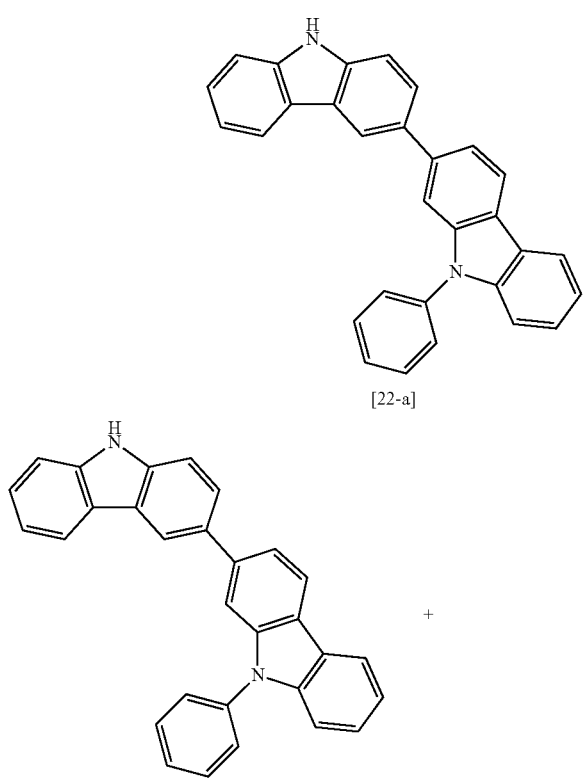

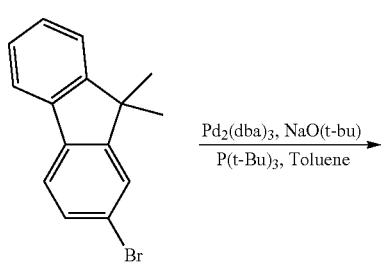

Step 1: Synthesis of Compound 22-a 10 g (47.36 mmol) of carbazole-3-boronic acid, 16.80 g (52.13 mmol) of 9-phenyl-2-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 22-a of 16 g (yield: 83%).

Step 2: Synthesis of Compound Represented by CF Z-27

10 g (24.48 mmol) of the intermediate product represented by the compound 22-a, 7.02 g (25.70 mmol) of 2-bromo-dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-27 of 12.6 g (yield: 86%).

EXAMPLE Z-23

Synthesis of Compound Represented by CF Z-28

As an example of a compound for an organic photoelectric device according to an embodiment, the compound represented by CF Z-28 was synthesized as in Reaction Scheme 38.

[Reaction Scheme 38]

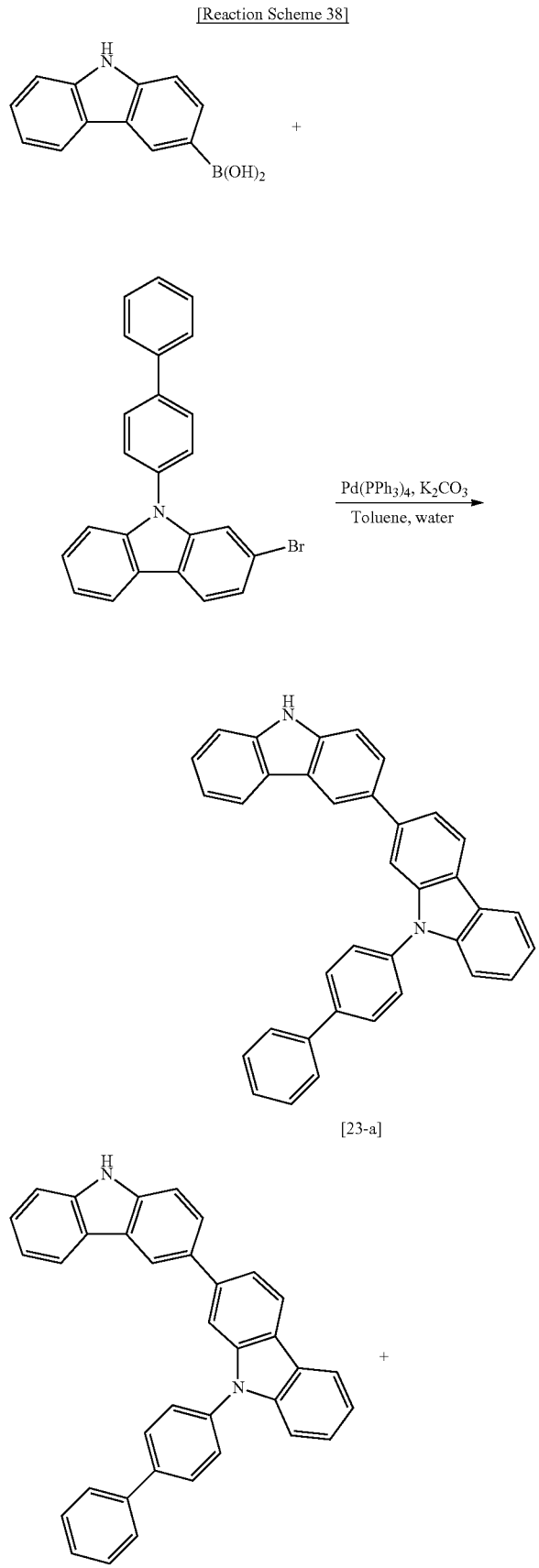

[23-a]

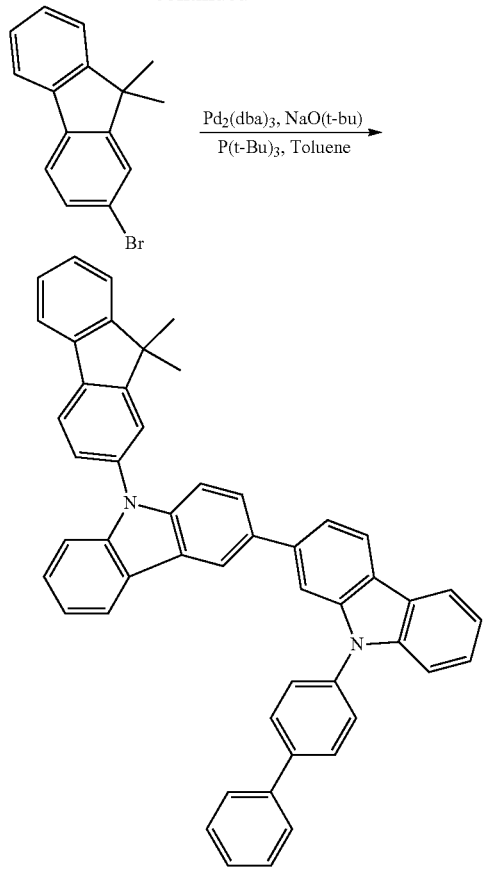

Step 1: Synthesis of Compound 23-a 10 g (47.36 mmol) of carbazole-3-boronic acid, 20.76 g (52.13 mmol) of 9-biphenyl-2-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 23-a of 16.1 g (yield: 70%).

Step 2: Synthesis of Compound Represented by CF Z-28

10 g (20.64 mmol) of the intermediate product represented by the compound 23-a, 5.92 g (21.67 mmol) of 2-bromo-dimethylfluorene, and 2.59 g (26.93 mmol) of sodium tert-butoxide were dissolved with 85 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethylacetate, obtaining a product represented by the compound CF Z-28 of 11.8 g (yield: 84%).

EXAMPLE Z-24

Synthesis of Compound Represented by CF Z-29

As an example of a compound for an organic photoelectric device according to an embodiment, the compound represented by CF Z-29 was synthesized as in Reaction Scheme 39.

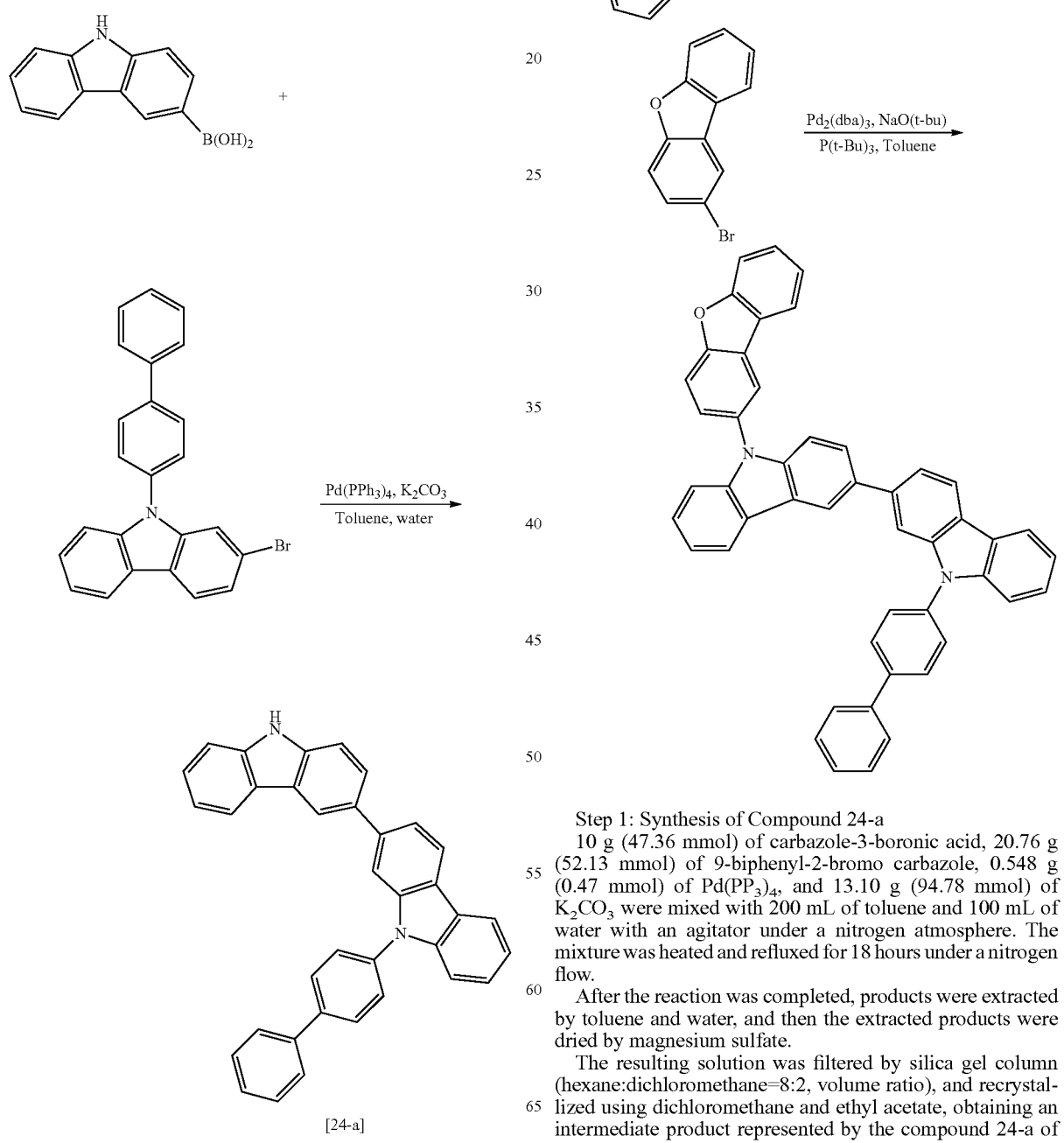

Step 1: Synthesis of Compound 24-a 10 g (47.36 mmol) of carbazole-3-boronic acid, 20.76 g (52.13 mmol) of 9-biphenyl-2-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 24-a of 16.1 g (yield: 70%).

Step 2: Synthesis of Compound Represented by CF Z-29

10 g (20.64 mmol) of the intermediate product represented by the compound 24-a, 5.35 g (21.67 mmol) of 2-bromo-dibenzofuran, and 2.59 g (26.93 mmol) of sodium tert-butoxide were dissolved with 85 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethylacetate, obtaining a product represented by the compound CF Z-29 of 11.5 g (yield: 86%).

EXAMPLE Z-25

Synthesis of Compound Represented by CF Z-30

As an example of a compound for an organic photoelectric device according to an embodiment, the compound represented by CF Z-30 was synthesized as in Reaction Scheme 40.

[Reaction Scheme 40]

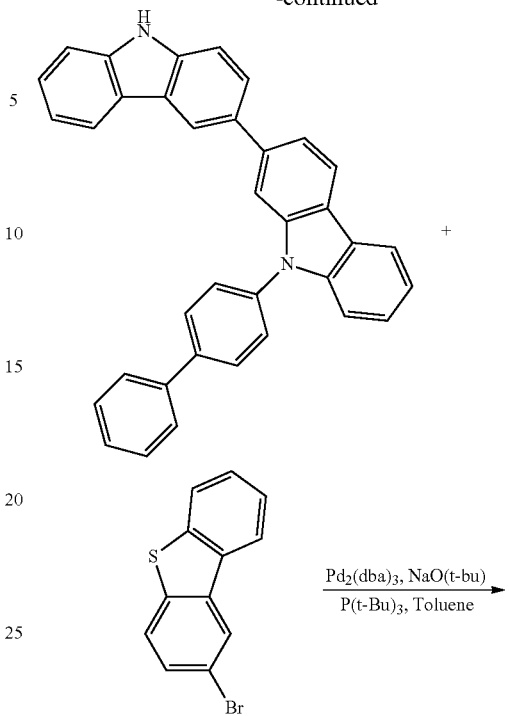

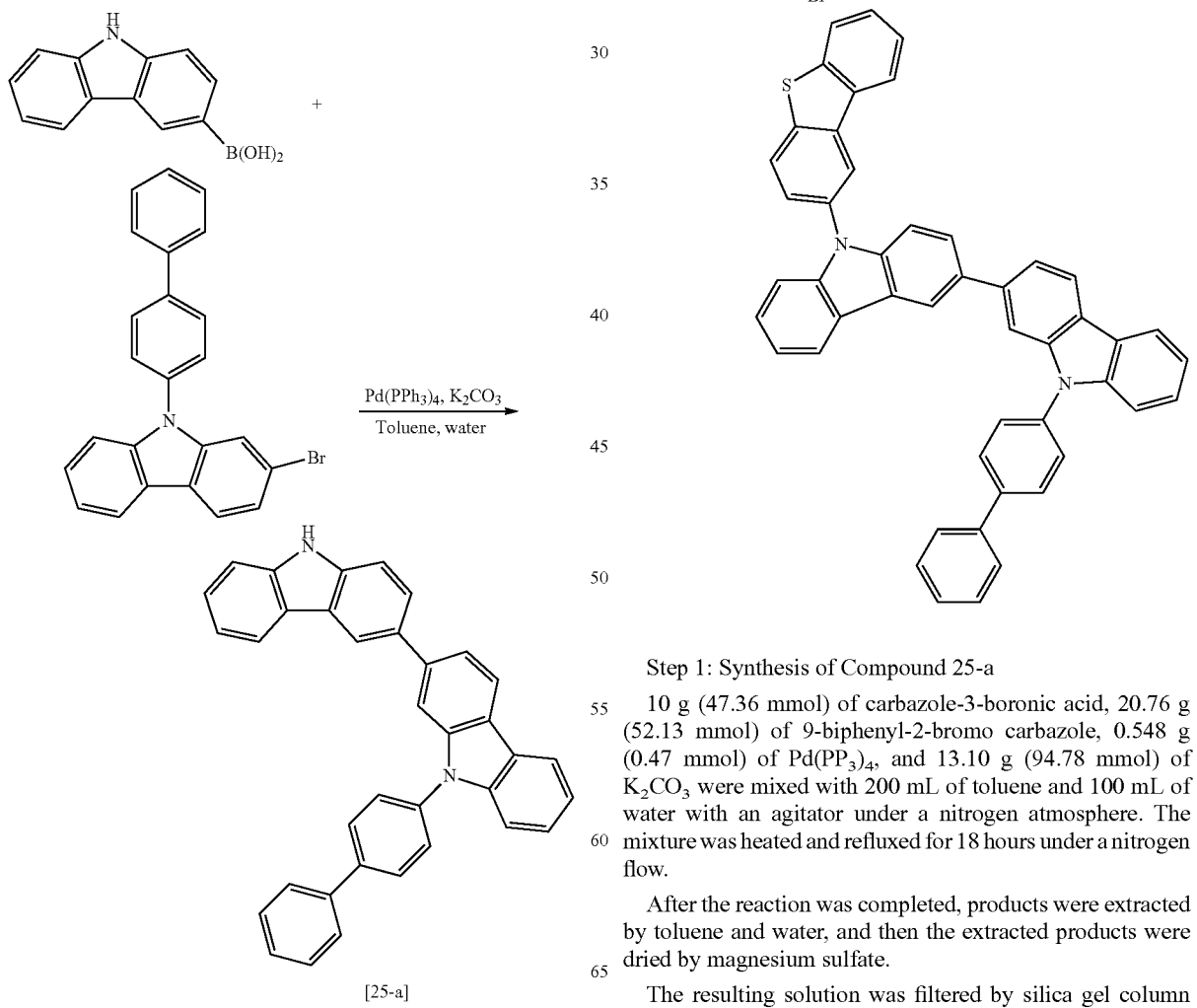

Step 1: Synthesis of Compound 25-a 10 g (47.36 mmol) of carbazole-3-boronic acid, 20.76 g (52.13 mmol) of 9-biphenyl-2-bromo carbazole, 0.548 g (0.47 mmol) of Pd(PP$_3$)$_4$, and 13.10 g (94.78 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 25-a of 16.1 g (yield: 70%).

Step 2: Synthesis of compound represented by CF Z-30

10 g (20.64 mmol) of the intermediate product represented by the compound 25-a, 5.70 g (21.67 mmol) of 2-bromodibenzothiophene, and 2.59 g (26.93 mmol) of sodium tert-butoxide were dissolved with 85 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethylacetate, obtaining a product represented by the compound CF Z-30 of 11.7 g (yield: 85%).

EXAMPLE Z-26

Synthesis of Compound Represented by CF Z-31

As an example of a compound for an organic photoelectric device according to an embodiment, the compound represented by CF Z-31 was synthesized as in Reaction Scheme 41.

[Reaction Scheme 41]

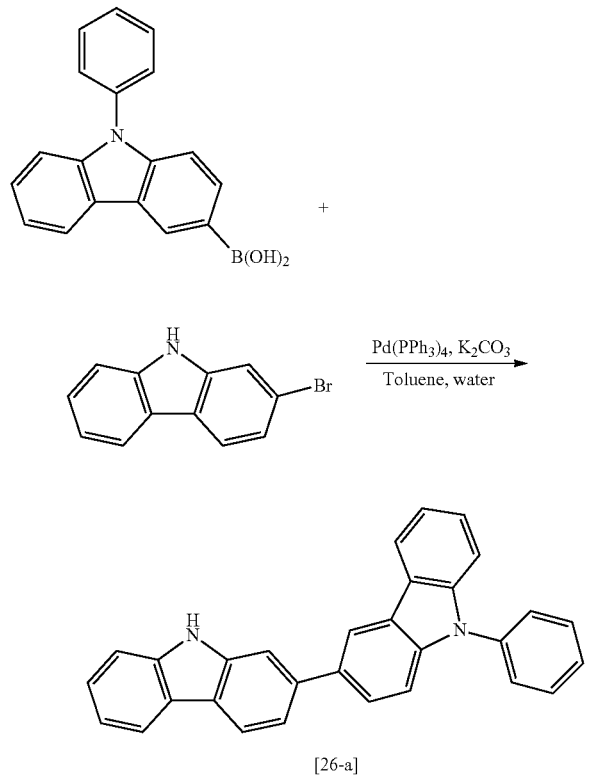

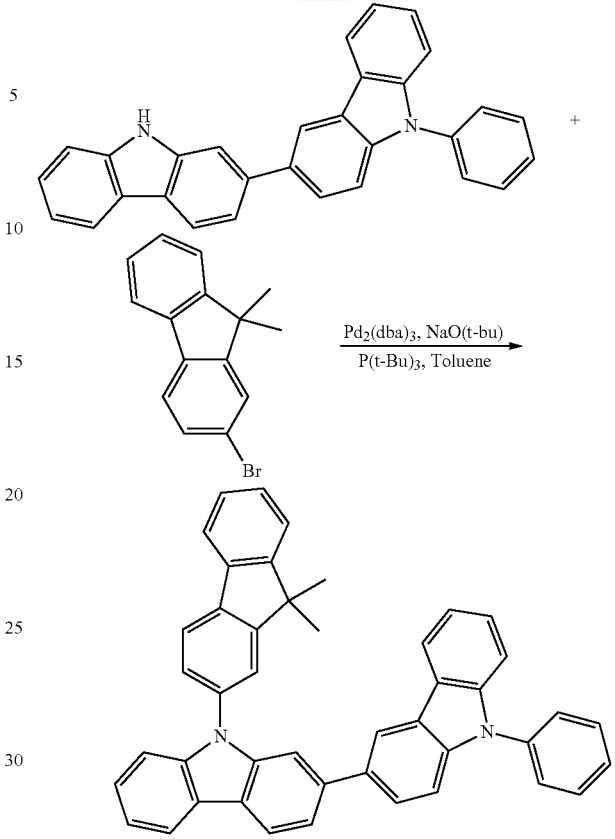

Step 1: Synthesis of Compound 26-a 10 g (34.83 mmol) of 9-phenyl carbazole-3-boronic acid, 9.43 g (38.31 mmol) of 2-bromo carbazole, 0.402 g (0.35 mmol) of Pd(PP$_3$)$_4$, and 9.63 g (69.66 mmol) of K$_2$CO$_3$ were mixed with 150 mL of toluene, and 75 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 26-a of 11.0 g (yield: 77%).

Step 2: Synthesis of Compound Represented by CF Z-31

10 g (24.48 mmol) of the intermediate product represented by the compound 26-a, 7.02 g (25.70 mmol) of 2-bromo-dimethylfluorene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-31 of 11.6 g (yield: 79%).

EXAMPLE Z-27

Synthesis of Compound Represented by CF Z-32

As an example of a compound for an organic photoelectric device according to an embodiment, the compound represented by CF Z-32 was synthesized as in Reaction Scheme 42.

[Reaction Scheme 42]

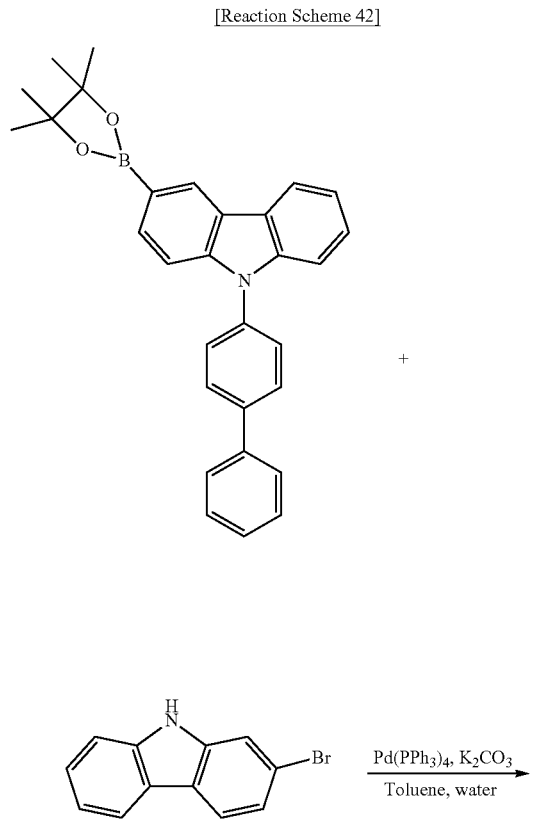

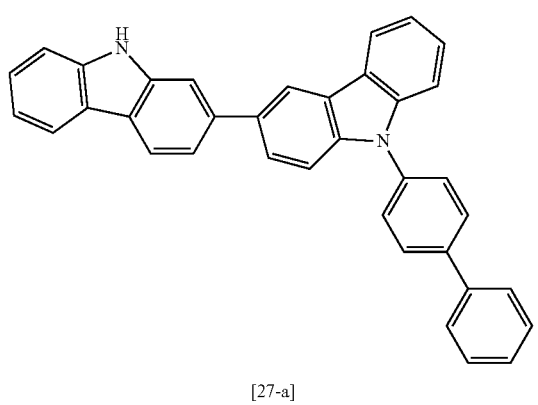

[27-a]

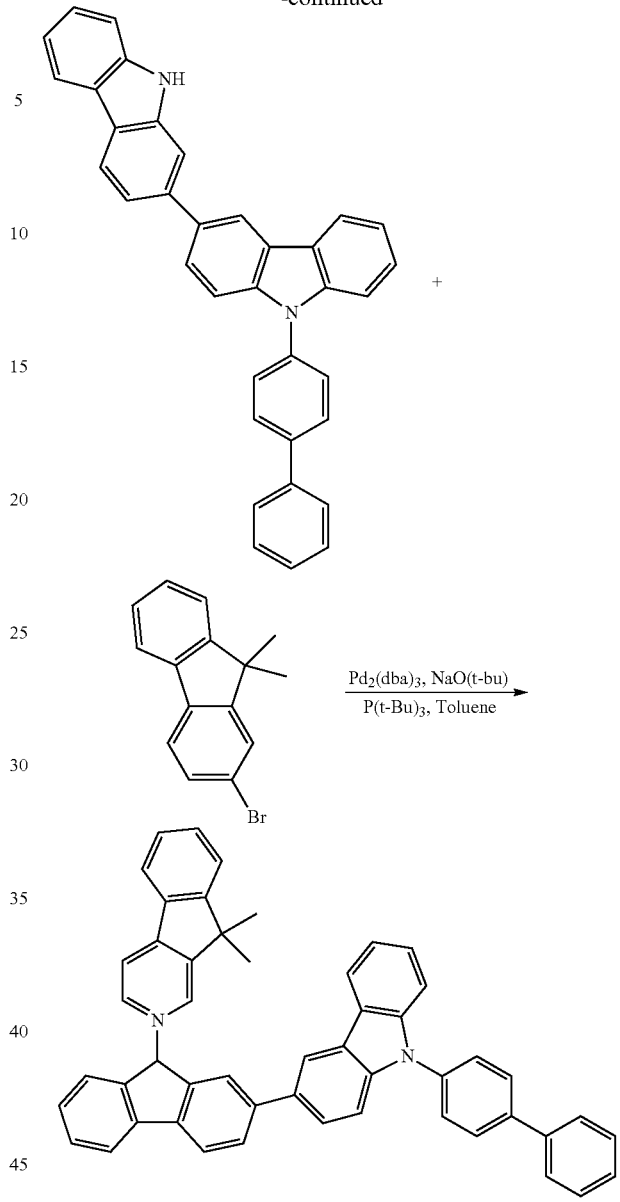

Step 1: Synthesis of Compound 27-a 20.0 g (44.91 mmol) of 9-biphenylcarbazole-3-boronic ester, 12.166 g (49.4 mmol) of 2-bromo carbazole, 0.519 g (0.45 mmol) of $Pd(PP_3)_4$, and 12.41 g (89.81 mmol) of $K_2CO_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 27-a of 13.3 g (yield: 61%).

Step 2: Synthesis of Compound Represented by CF Z-32

10 g (20.64 mmol) of the intermediate product represented by the compound 27-a, 5.92 g (21.67 mmol) of 2-bromo diphenylfluorene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-32 of 11.2 g (yield: 80%).

EXAMPLE Z-28

Synthesis of Compound Represented by CF Z-33

As an example of a compound for an organic photoelectric device according to an embodiment, the compound represented by CF Z-33 was synthesized as in Reaction Scheme 43.

[Reaction Scheme 43]

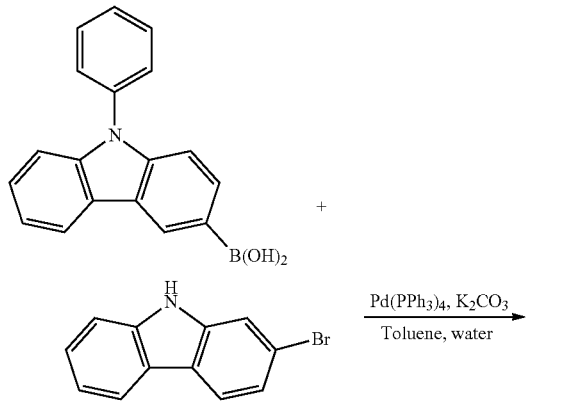
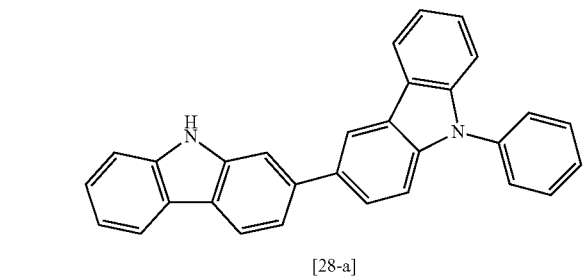
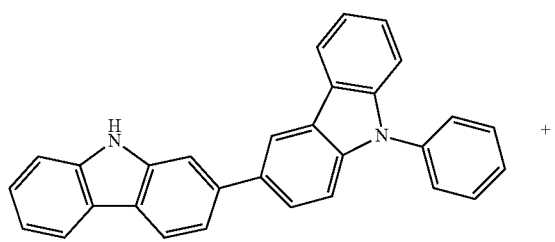
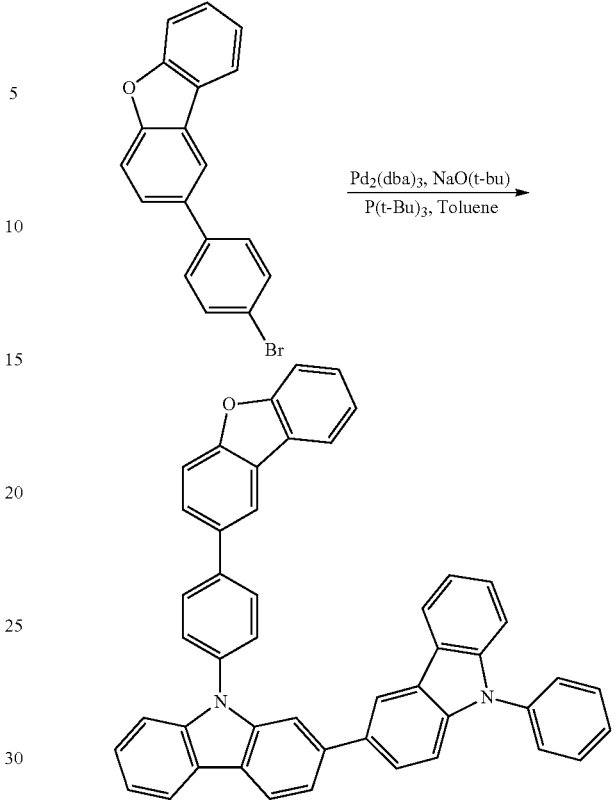

Step 1: Synthesis of Compound 28-a 10 g (34.83 mmol) of 9-phenyl carbazole-3-boronic acid, 9.43 g (38.31 mmol) of 2-bromo carbazole, 0.402 g (0.35 mmol) of $Pd(PP_3)_4$, and 9.63 g (69.66 mmol) of $K_2CO_3$ were mixed with 150 mL of toluene, and 75 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 28-a of 11.0 g (yield: 77%).

Step 2: Synthesis of Compound Represented by CF Z-33

10 g (24.48 mmol) of the intermediate product represented by the compound 28-a, 8.31 g (25.70 mmol) of 2-(4-bromo phenyl)-dibenzofuran, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-33 of 12.0 g (yield: 75%).

EXAMPLE Z-29

Synthesis of Compound Represented by CF Z-34

As an example of a compound for an organic photoelectric device according to an embodiment, the compound represented by CF Z-34 was synthesized as in Reaction Scheme 44.

[Reaction Scheme 44]

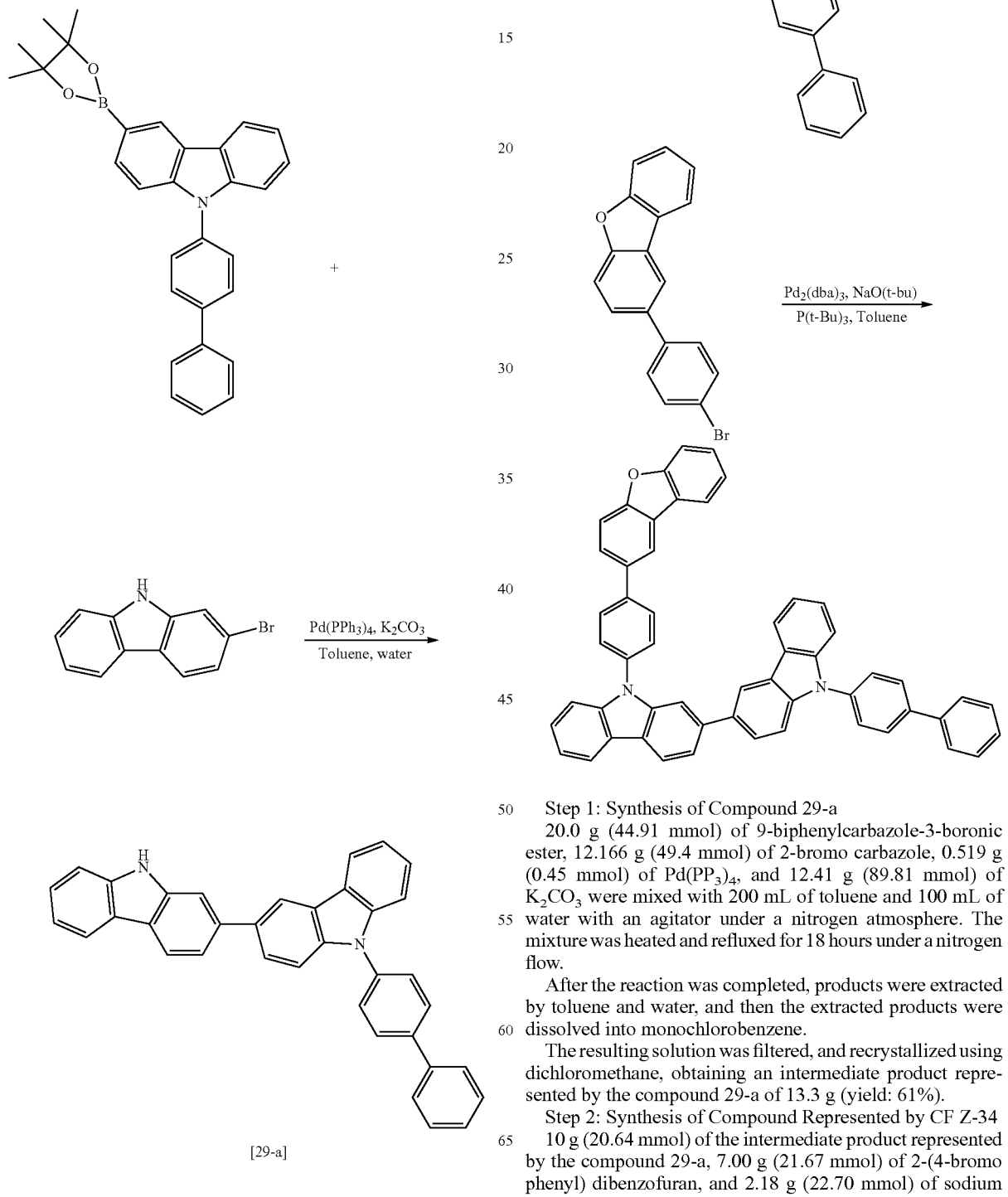

Step 1: Synthesis of Compound 29-a 20.0 g (44.91 mmol) of 9-biphenylcarbazole-3-boronic ester, 12.166 g (49.4 mmol) of 2-bromo carbazole, 0.519 g (0.45 mmol) of Pd(PP₃)₄, and 12.41 g (89.81 mmol) of $K_2CO_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 29-a of 13.3 g (yield: 61%).

Step 2: Synthesis of Compound Represented by CF Z-34

10 g (20.64 mmol) of the intermediate product represented by the compound 29-a, 7.00 g (21.67 mmol) of 2-(4-bromo phenyl) dibenzofuran, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-34 of 12.7 g (yield: 85%).

EXAMPLE Z-30

Synthesis of Compound Represented by CF Z-35

As an example of a compound for an organic photoelectric device according to an embodiment, the compound represented by CF Z-35 was synthesized as in Reaction Scheme 45.

[Reaction Scheme 45]

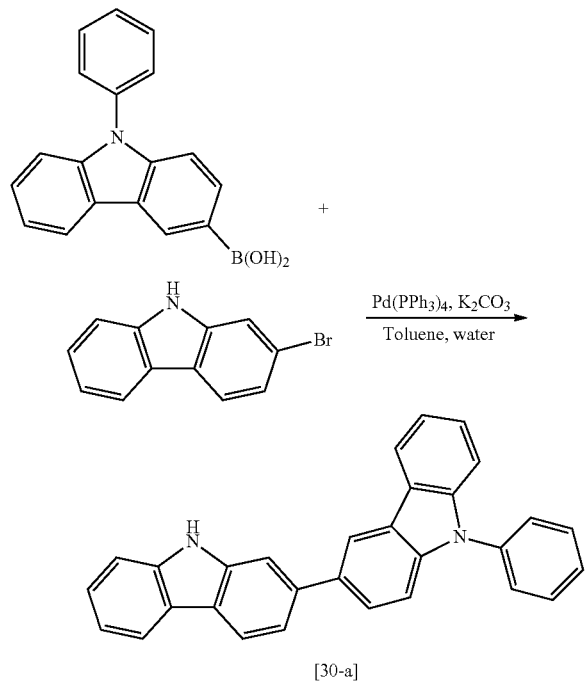

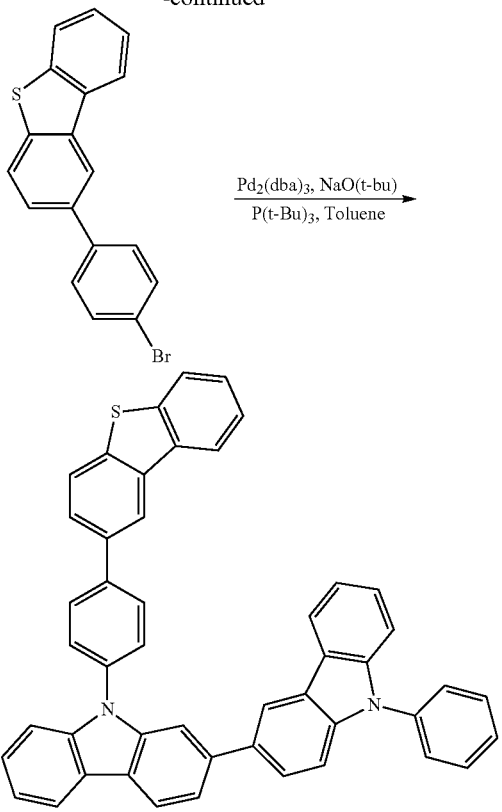

Step 1: Synthesis of Compound 30-a 10 g (34.83 mmol) of 9-phenyl carbazole-3-boronic acid, 9.43 g (38.31 mmol) of 2-bromo carbazole, 0.402 g (0.35 mmol) of Pd(PP$_3$)$_4$, and 9.63 g (69.66 mmol) of K$_2$CO$_3$ were mixed with 150 mL of toluene, and 75 mL of water with an agitator under a nitrogen atmosphere. The mixture was heated and refluxed for 18 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining an intermediate product represented by the compound 30-a of 11.0 g (yield: 77%).

Step 2: Synthesis of Compound Represented by CF Z-35

10 g (24.48 mmol) of the intermediate product represented by the compound 30-a, 8.72 g (25.70 mmol) of 2-(4-bromo phenyl)-dibenzothiophene, and 2.59 g (26.93 mmol) of sodium tert-butoxide were dissolved with 100 ml of toluene. Then, 0.224 g (0.24 mmol) of palladium dibenzyliden amine and 0.15 mL (0.73 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-35 of 13.1 g (yield: 80%).

EXAMPLE Z-31

Synthesis of Compound Represented by CF Z-36

As an example of a compound for an organic photoelectric device according to an embodiment, the compound represented by CF Z-36 was synthesized as in Reaction Scheme 46.

[Reaction Scheme 46]

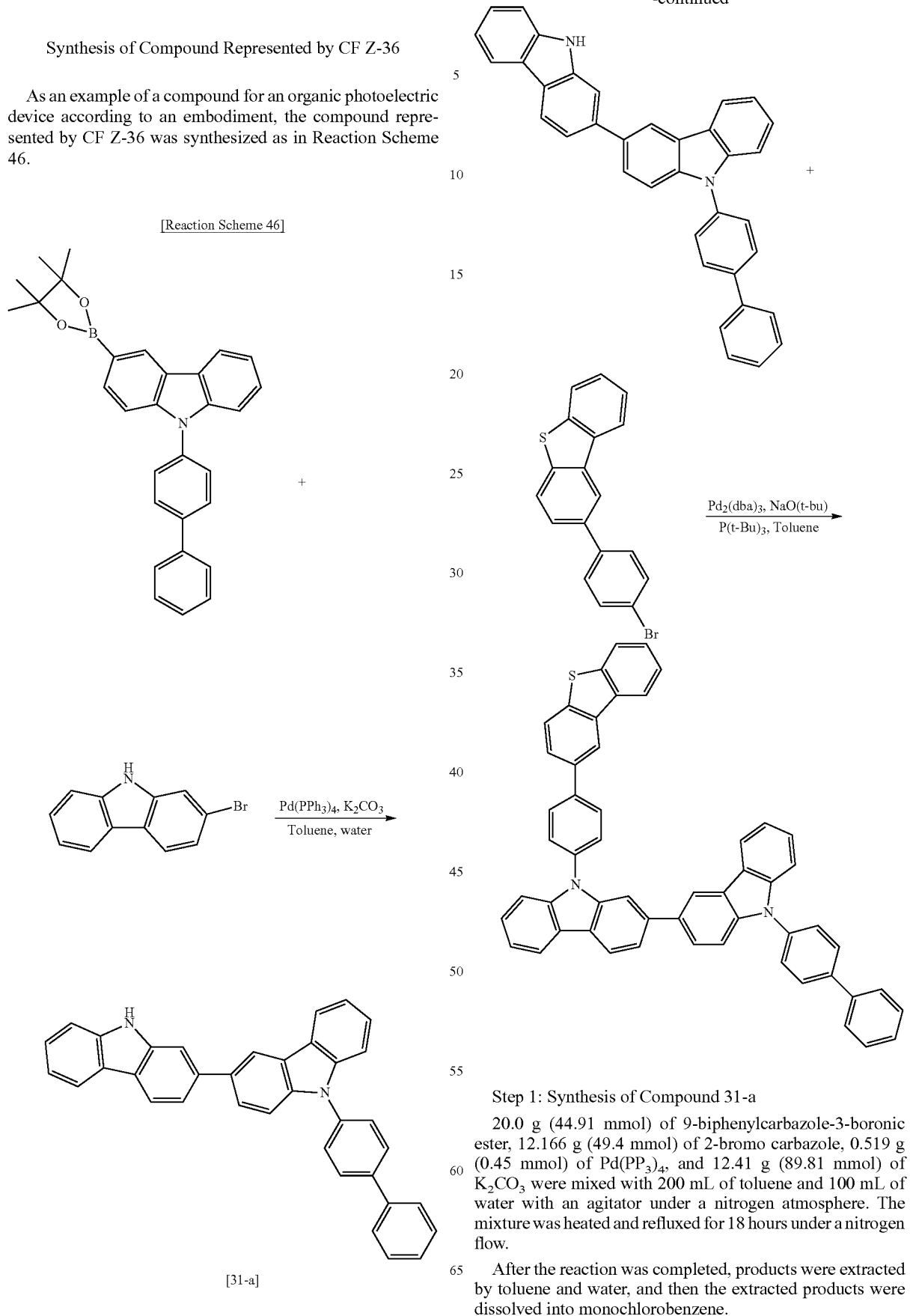

Step 1: Synthesis of Compound 31-a 20.0 g (44.91 mmol) of 9-biphenylcarbazole-3-boronic ester, 12.166 g (49.4 mmol) of 2-bromo carbazole, 0.519 g (0.45 mmol) of $Pd(PP_3)_4$, and 12.41 g (89.81 mmol) of $K_2CO_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 31-a of 13.3 g (yield: 61%).

Step 2: Synthesis of Compound Represented by CF Z-36

10 g (20.64 mmol) of the intermediate product represented by the compound 31-a, 7.35 g (21.67 mmol) of 2-(4-bromo phenyl) dibenzothiophene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-36 of 12.2 g (yield: 80%).

EXAMPLE Z-32

Synthesis of Compound Represented by CF Z-37

As an example of a compound for an organic photoelectric device according to an embodiment, the compound represented by CF Z-37 was synthesized as in Reaction Scheme 47.

[Reaction Scheme 47]

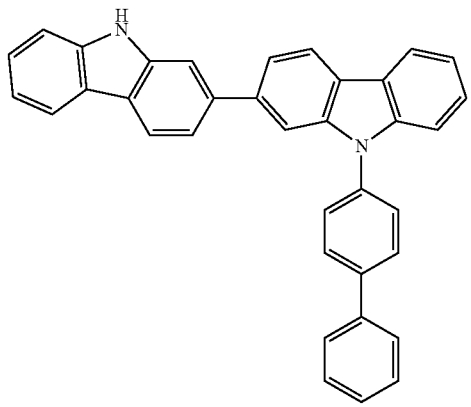

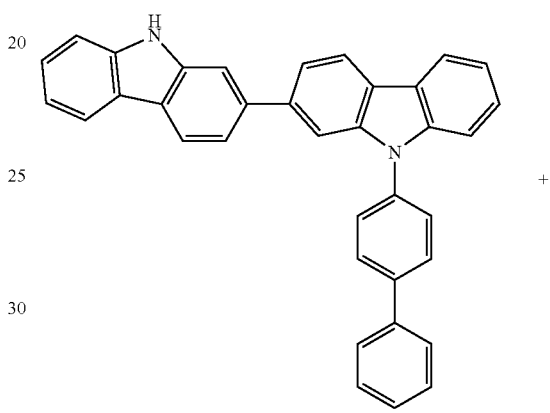

[32-a]

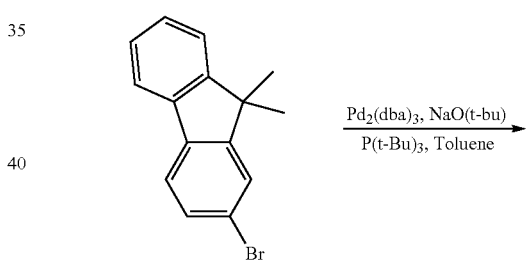

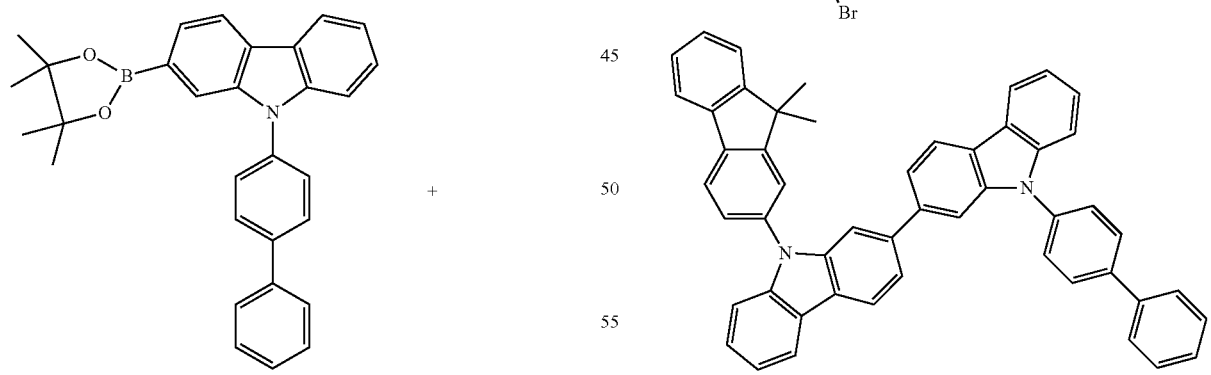

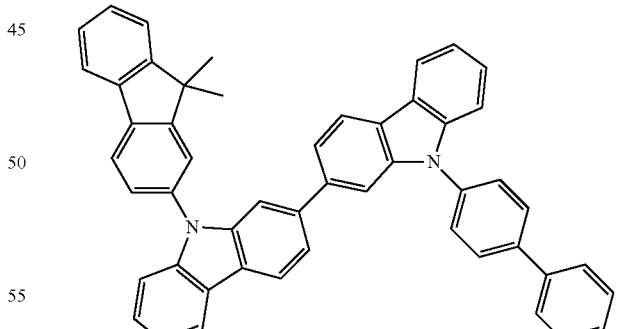

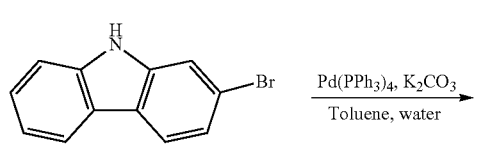

Step 1: Synthesis of Compound 32-a 20.0 g (44.91 mmol) of 9-biphenylcarbazole-2-boronic ester, 12.166 g (49.4 mmol) of 2-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 32-a of 15.0 g (yield: 69%).

Step 2: Synthesis of Compound Represented by CF Z-37

10 g (20.64 mmol) of the intermediate product represented by the compound 32-a, 5.92 g (21.67 mmol) of 2-bromo dimethylfluorene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-37 of 12.0 g (yield: 86%).

EXAMPLE Z-33

Synthesis of Compound Represented by CF Z-38

As an example of a compound for an organic photoelectric device according to an embodiment, the compound represented by CF Z-38 was synthesized as in Reaction Scheme 48.

[Reaction Scheme 48]

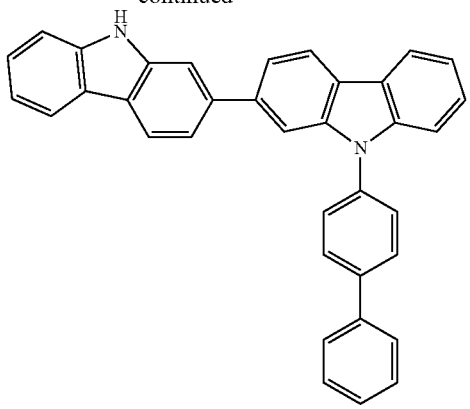

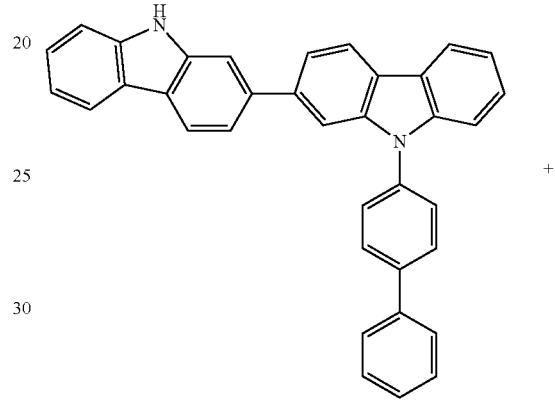

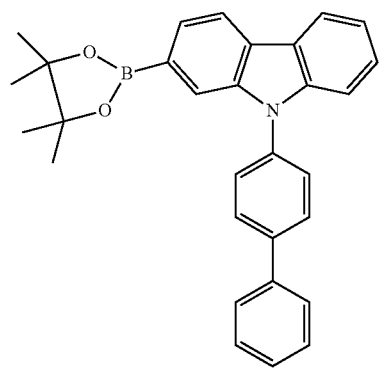

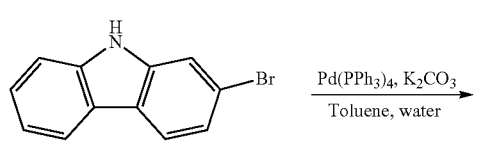

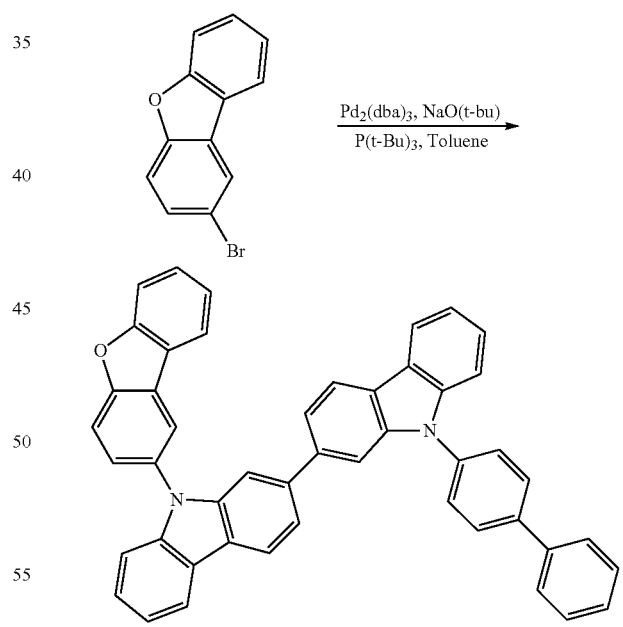

Step 1: Synthesis of Compound 33-a 20.0 g (44.91 mmol) of 9-biphenylcarbazole-2-boronic ester, 12.166 g (49.4 mmol) of 2-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 33-a of 15.0 g (yield: 69%).

Step 2: Synthesis of compound represented by CF Z-38

10 g (20.64 mmol) of the intermediate product represented by the compound 33-a, 5.35 g (21.67 mmol) of 2-bromo dibenzofuran, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-38 of 11.4 g (yield: 85%).

EXAMPLE Z-34

Synthesis of Compound Represented by CF Z-39

As an example of a compound for an organic photoelectric device according to an embodiment, the compound represented by CF Z-39 was synthesized as in Reaction Scheme 49.

[Reaction Scheme 49]

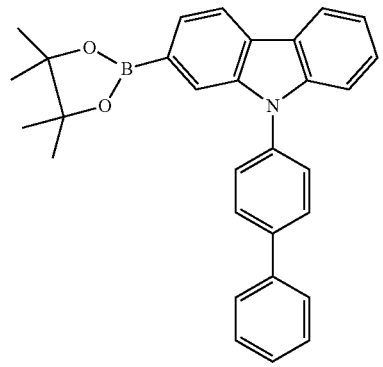

+

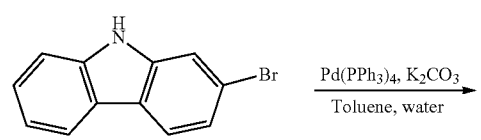

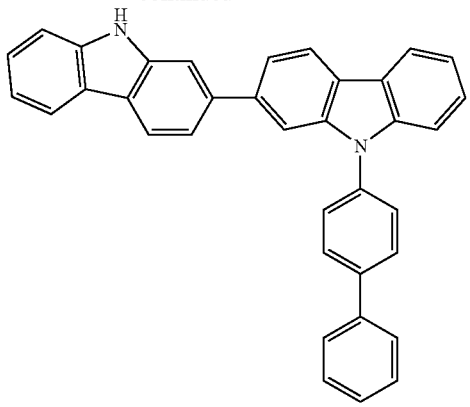

[34-a]

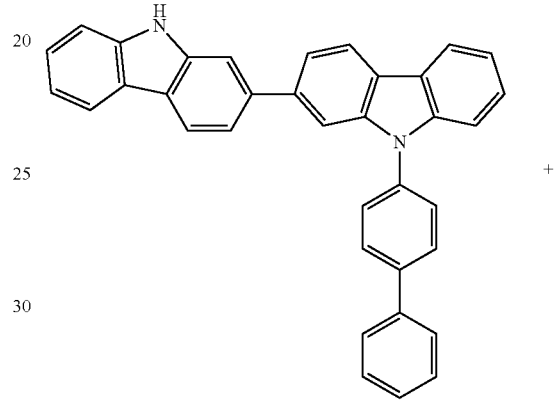

+

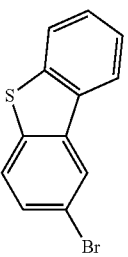

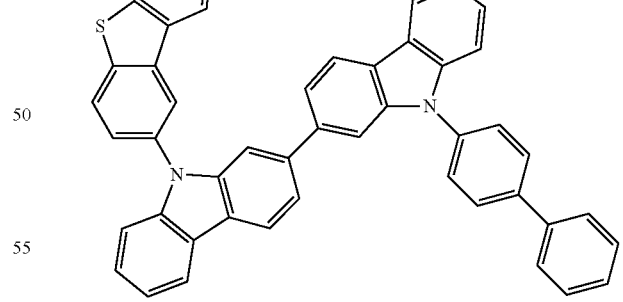

Step 1: Synthesis of Compound 34-a 20.0 g (44.91 mmol) of 9-biphenylcarbazole-2-boronic ester, 12.166 g (49.4 mmol) of 2-bromo carbazole, 0.519 g (0.45 mmol) of Pd(PP$_3$)$_4$, and 12.41 g (89.81 mmol) of K$_2$CO$_3$ were mixed with 200 mL of toluene and 100 mL of water with an agitator under a nitrogen atmosphere. The mixture was heated and refluxed for 18 hours under a nitrogen flow.

After the reaction was completed, products were extracted by toluene and water, and then the extracted products were dissolved into monochlorobenzene.

The resulting solution was filtered, and recrystallized using dichloromethane, obtaining an intermediate product represented by the compound 34-a of 15.0 g (yield: 69%).

Step 2: Synthesis of Compound Represented by CF Z-39

10 g (20.64 mmol) of the intermediate product represented by the compound 34-a, 5.70 g (21.67 mmol) of 2-bromo dibenzothiophene, and 2.18 g (22.70 mmol) of sodium tert-butoxide were dissolved with 85 ml of toluene. Then, 0.189 g (0.21 mmol) of palladium dibenzyliden amine and 0.125 mL (0.62 mmol) of tert-butyl phosphine were added.

The mixture was agitated for 12 hours under a nitrogen flow.

After the reaction was completed, products were extracted by toluene and water, and then the extracted products were dried by magnesium sulfate.

The resulting solution was filtered by silica gel column (hexane:dichloromethane=8:2, volume ratio), and recrystallized using dichloromethane and ethyl acetate, obtaining a product represented by the compound CF Z-39 of 12.2 g (yield: 89%).

(Fabrication of Organic Photoelectric Device)

EXAMPLE 4

An organic photoelectric device was fabricated by using a host of the compound represented by CF 11 obtained from Example 1, and a dopant of Ir(PPy)$_3$. The anode was ITO having a thickness of 1000 Å, and the cathode was aluminum (Al) having a thickness of 1000 Å.

The organic photoelectric device was fabricated by cutting an ITO glass substrate having a sheet resistance of 15 Ω/cm$^2$ to a size of 50 mm×50 mm×0.7 mm, ultrasonic wave cleaning the same in acetone, isopropyl alcohol, and pure water for 15 minutes for each, and UV ozone cleaning the same for 30 minutes to provide an anode.

N,N'-di(1-naphthyl)-N,N'-diphenylbenzidine (NPB) (70 nm) and 4,4',4''-tri(N-carbazolyl)triphenylamine (TCTA) (10 nm) were deposited on the upper surface of the substrate under the conditions of a vacuum degree of 650×10$^{-7}$ Pa and a deposition speed of 0.1 to 0.3 nm/s to provide a hole transport layer (HTL) having a thickness of 900 Å.

Subsequently, a 300 Å-thick emission layer was prepared by using the compound synthesized in Example 1 under the same vacuum deposition conditions, and a phosphorescence dopant of Ir(PPy)$_3$ was simultaneously deposited. Herein, a deposition rate of phosphorescent dopant was adjusted so that the phosphorescent dopant was present in an amount of 7 wt% based on 100 wt% of emission layer.

Bis(8-hydroxy-2-methylquinolato)-aluminumbiphenoxide (BAlq) was deposited on the emission layer under the same vacuum deposition conditions to form a hole blocking layer having a thickness of 50 Å.

Then Alga was deposited under the same vacuum deposition conditions to provide an electron transport layer (ETL) having a thickness of 200 Å.

LiF and Al were sequentially deposited on the upper surface of the electron transport layer (ETL) to fabricate an organic photoelectric device.

The organic photoelectric device had a structure of ITO/NPB (70 nm)/TCTA (10 nm)/EML (compound of Example 1 (93 wt%)+Ir(PPy)$_3$ (7 wt%), 30 nm)/BAlq (5 nm)/Alq$_3$ (20 nm)/LiF (1 nm)/Al (100 nm).

EXAMPLE 5

An organic photoelectric device was fabricated in accordance with the same procedure as in Example 4, except that the compound synthesized in Example 2 was used as a host of the emission layer.

EXAMPLE 6

An organic photoelectric device was fabricated in accordance with the same procedure as in Example 4, except that the compound synthesized in Example 3 was used as a host of the emission layer.

EXAMPLE 7

An organic photoelectric device was fabricated in accordance with the same procedure as in Example 4, except that the compound synthesized in Example N-1 was used as a host of the emission layer.

EXAMPLE 8

An organic photoelectric device was fabricated in accordance with the same procedure as in Example 4, except that the compound synthesized in Example N-2 was used as a host of the emission layer.

EXAMPLE 9

An organic photoelectric device was fabricated in accordance with the same procedure as in Example 4, except that the compound synthesized in Example N-4 was used as a host of the emission layer.

EXAMPLE 10

An organic photoelectric device was fabricated in accordance with the same procedure as in Example 4, except that the compound synthesized in Example N-6 was used as a host of the emission layer.

EXAMPLE 11

An organic photoelectric device was fabricated in accordance with the same procedure as in Example 4, except that the compound synthesized in Example N-7 was used as a host of the emission layer.

EXAMPLE 12

An organic photoelectric device was fabricated in accordance with the same procedure as in Example 4, except that the compound synthesized in Example N-10 was used as a host of the emission layer.

EXAMPLE 13

An organic photoelectric device was fabricated in accordance with the same procedure as in Example 4, except that the compound synthesized in Example N-11 was used as a host of the emission layer.

EXAMPLE 14

An organic photoelectric device was fabricated in accordance with the same procedure as in Example 4, except that the compound synthesized in Example N-12 was used as a host of the emission layer.

COMPARATIVE EXAMPLE 1

An organic photoelectric device was fabricated in accordance with the same procedure as in Example 4, except that 4,4-N,N-dicarbazolebiphenyl (CBP) was used as a host of the emission layer instead of the compound synthesized in Example 1.

COMPARATIVE EXAMPLE 2

A performance data of bis[9-(4-methoxyphenyl)carbazol-3-yl] (Jib796-04k) according to KR 10-2005-0100673 was used as reference.

Measurement of Performance of Organic Photoelectric Device

EXPERIMENTAL EXAMPLE

Each of the obtained organic photoelectric devices according to Examples 4 to 6 and Comparative Example 1 was measured for luminance change, current density change depending upon voltage, and luminous efficiency. The specific measurement methods were as follows and the results are shown in the following Table 1.

(1) Measurement of Current Density Change Depending on Voltage Change

The obtained organic photoelectric device was measured for current value flowing in the unit device while increasing the voltage from 0 V to 10 V using a current-voltage meter (Keithley 2400), and the measured current value was divided by area to provide the result.

(2) Measurement of Luminance Change Depending on Voltage Change

The obtained organic photoelectric device was measured for luminance using a luminance meter (Minolta Cs-1000A) while increasing the voltage from 0 V to 10 V.

(3) Measurement of Efficiency

The current efficiency (cd/A) and electric power efficiency (lm/W) at the same luminance (1000 $cd/m^2$) were calculated by using luminance and current density from (1) and (2), and voltage The results are shown in the following Tables 1 and 2.

(4) The Color Coordinate was Measured using a Luminance Meter (Minolta Cs-100A).

TABLE 1

| | Host material in an emission layer | 1000 $cd/m^2$ | | |
|---|---|---|---|---|
| | | Driving voltage | Luminous efficiency | Electric power efficiency |
| Example 4 | Compound of Example 1 | 6.86 | 46.43 | 22.56 |
| Example 5 | Compound of Example 2 | 7.67 | 48.33 | 23.47 |
| Example 6 | Compound of Example 3 | 6.20 | 50.76 | 26.45 |
| Comparative Example 1 | CBP | 7.70 | 42.70 | 19.20 |

Referring to Table 1, Examples 4 to 6 showed better driving voltage and efficiency compared to the reference material, CBP. These results showed that the compounds prepared in Examples 1 to 3 were applied as a material for an organic photoelectric device.

TABLE 2

| | Host material | 9000 $cd/m^2$ | | |
|---|---|---|---|---|
| | | Driving voltage (V) | Luminous efficiency (cd/A) | Life span (h, T97%) |
| Ex. 7 | Example N-1 | 4.1 | 87.9 | 50 |
| Ex. 8 | Example N-2 | 4.3 | 88.7 | 50 |
| Ex. 9 | Example N-4 | 4.1 | 83.8 | 45 |
| Ex. 10 | Example N-6 | 4.7 | 73.7 | 20 |
| Ex. 11 | Example N-7 | 5.1 | 73.6 | 10 |
| Ex. 12 | Example N-10 | 4.8 | 78.7 | 60 |
| Ex. 13 | Example N-11 | 4.0 | 68.2 | 10 |
| Ex. 14 | Example N-12 | 5.3 | 69.5 | 5 |
| Comp. Ex. 2 | bis[9-(4-methoxyphenyl) carbazol-3-yl] | — | 30 to 35 | — |

Referring to Table 2, Examples 7 to 14 showed better luminous efficiency compared to the Comparative Example 2.

These results showed that the compounds prepared in Examples may be suitably applied as a material for an organic photoelectric device.

By way of summation and review, when one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be used as a light emitting material in order to improve color purity and increase luminous efficiency and stability through energy transfer.

In order to implement high performance of an organic photoelectric device, a material constituting an organic material layer, for example a hole injection material, a hole transport material, a light emitting material, an electron transport material, an electron injection material, and a light emitting material such as a host and/or a dopant, should be stable and have good efficiency. Such a material may also be useful other organic photoelectric devices.

As described above, a compound according to an embodiment may have excellent electrochemical and thermal stability, and may provide an organic photoelectric device having an excellent life span and high luminous efficiency at a low driving voltage. A compound according to an embodiment may act as an electron injection and/or transport material, and may also act as a light emitting host along with an appropriate dopant.

A compound for an organic photoelectric device according to an embodiment may have a structure in which two carbazole groups are bound to a core and a substituent is selectively bound to the core. In addition, the compound for an organic photoelectric device may be a compound having various energy bandgaps by including the core and by introducing various substituents to the core, and thus may provide a compound satisfying conditions required for the emission layer as well as the electron injection layer (EIL) and transport layer.

According to an embodiment, an organic photoelectric device includes a compound having the appropriate energy level depending upon the substituents, and electron transporting properties may be controlled to provide excellent efficiency and driving voltage. Further, electrochemical and thermal stability may be improved to enhance the life-span characteristic while driving the organic photoelectric device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic photoelectric device, comprising:
an anode, a cathode, and at least one organic thin layer, the at least one organic thin layer being disposed between the anode and cathode, and including a compound for an organic photoelectric device the compound being resented b the following Chemical Formula "CF" Z-1 :

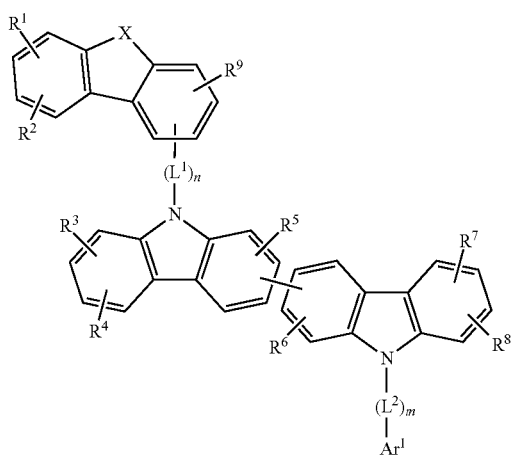

[CF Z-1]

wherein, in CF Z-1,
X is selected from the group of —O—, —S—, —SO—, —S(O)$_7$—, and —CR'R"—,
R$^1$ to R$^9$, R', and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group,
L$^1$ and L$^2$ are each independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group,
Ar$^1$ is a substituted or unsubstituted C6 to C30 aryl group,
n is an integer of 0 to 3, and
m is an integer of 0 to 3, wherein the compound is included in a hole transport layer (HTL) or a hole injection layer (HIL).

2. The organic photoelectric device as claimed in claim 1, wherein the compound represented by CF Z-1 is represented by one or more of the following CF Z-6 to CF Z-26:

[CF Z-6]

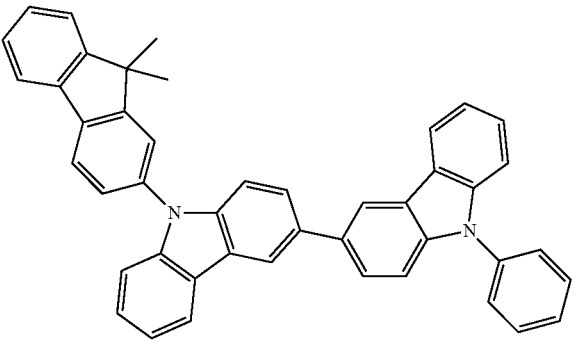

[CF Z-7]

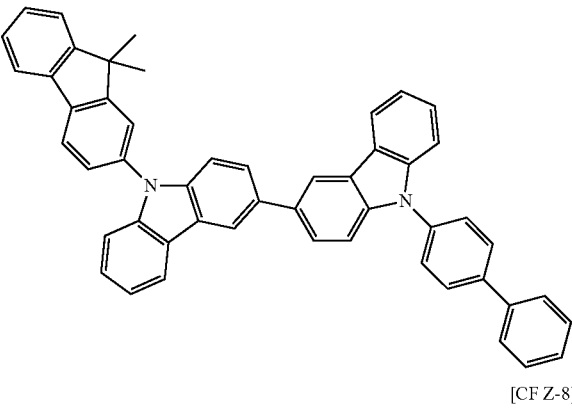

[CF Z-8]

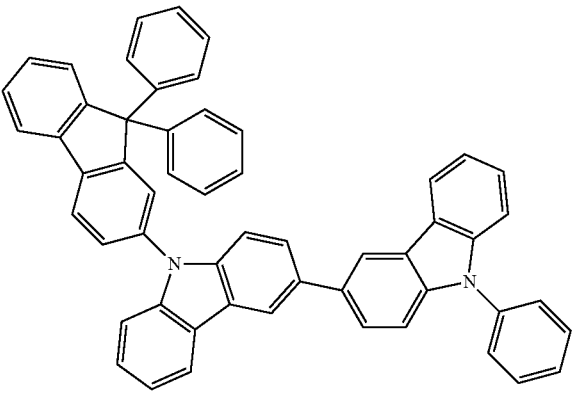

[CF Z-9]

[CF Z-10]
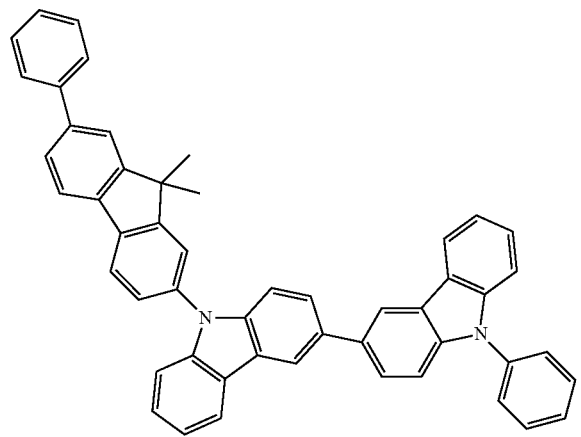
[CF Z-11]
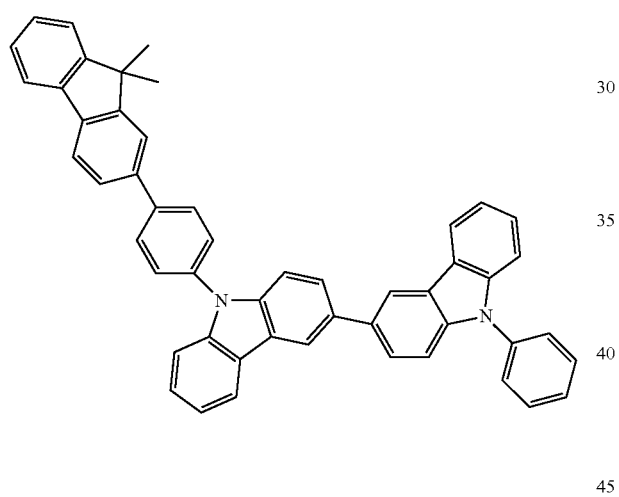
[CF Z-12]
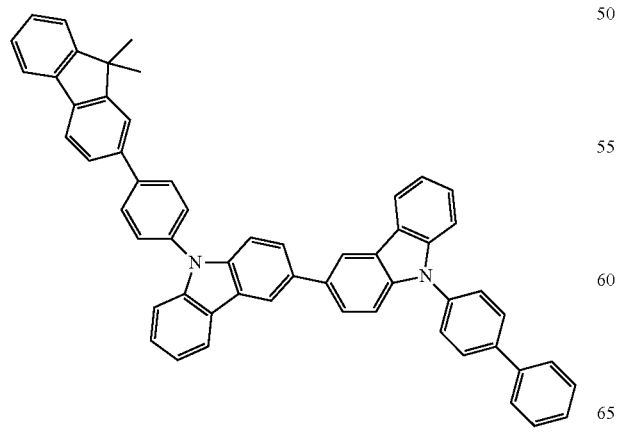
[CF Z-13]
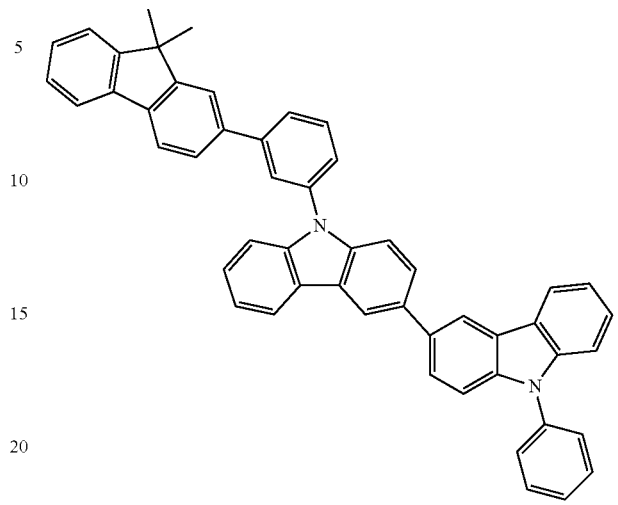
[CF Z-14]
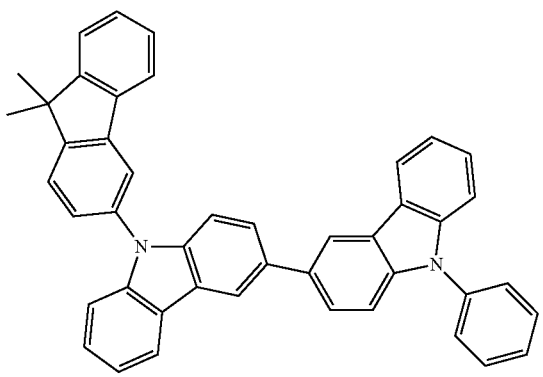
[CF Z-15]
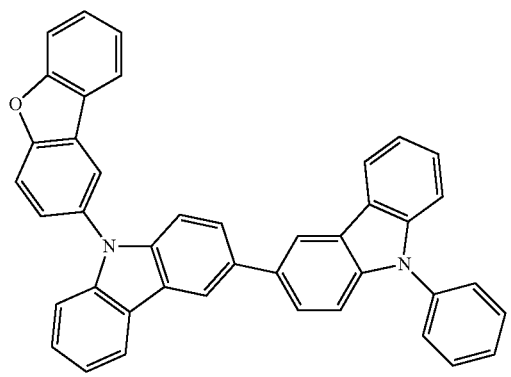

[CF Z-16]
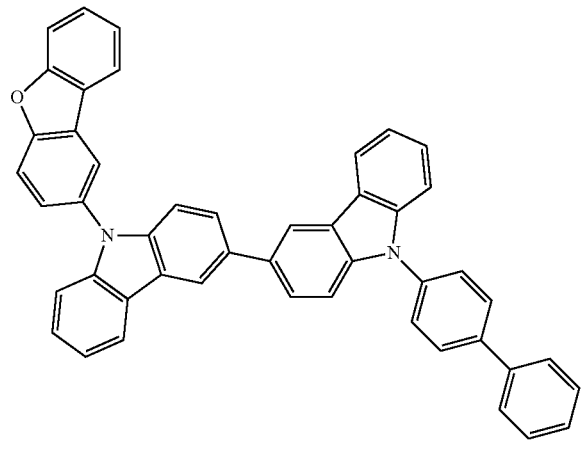
[CF Z-17]
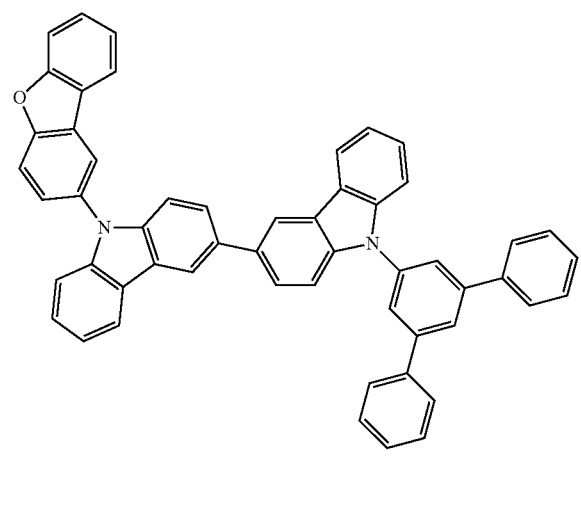
[CF Z-18]
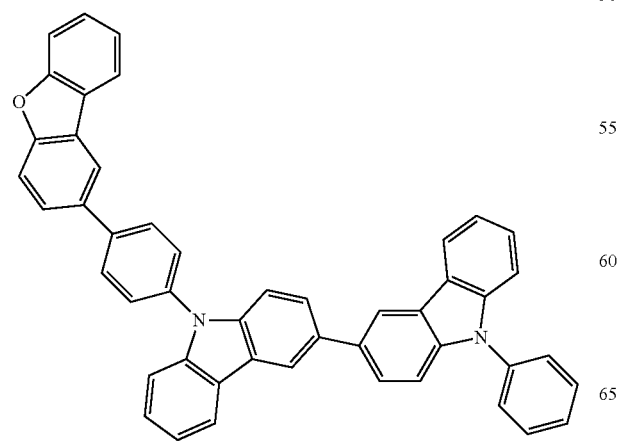
[CF Z-19]
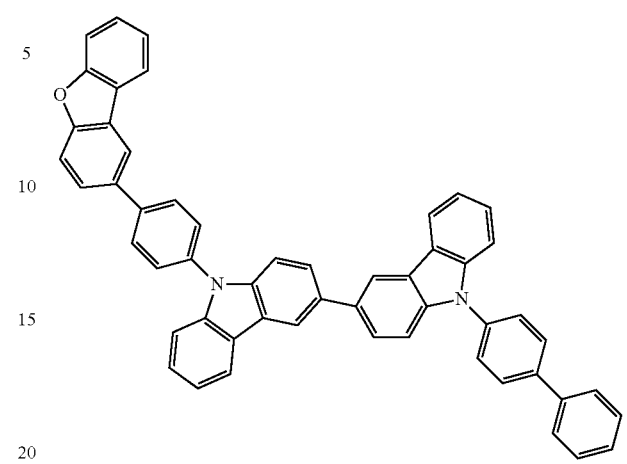
[CF Z-20]
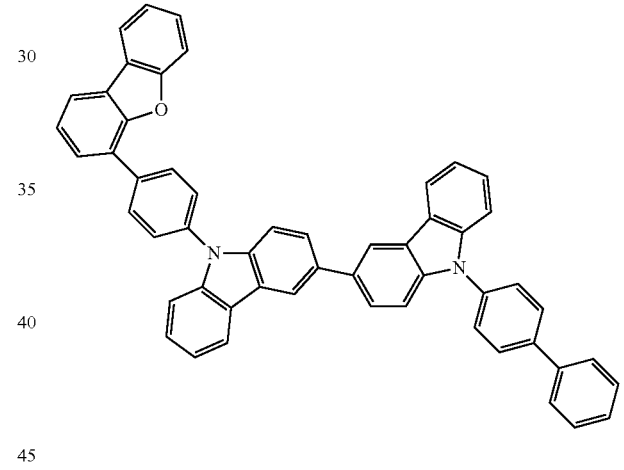
[CF Z-21]
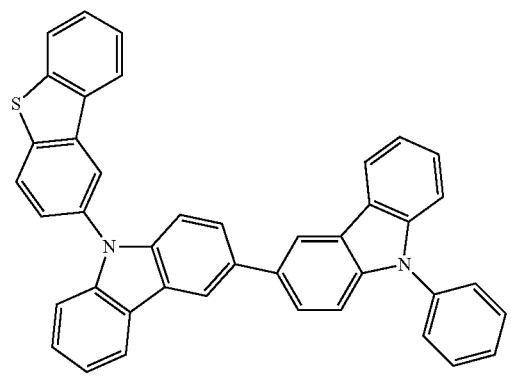

[CF Z-22]
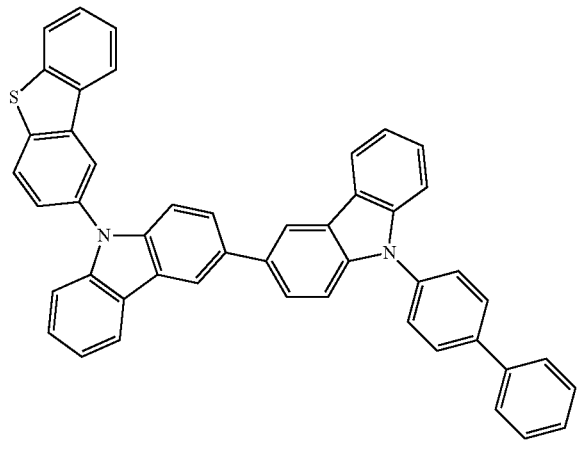
[CF Z-23]
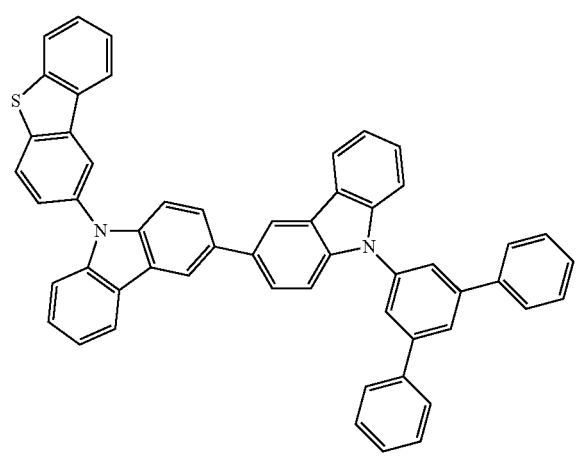
[CF Z-24]
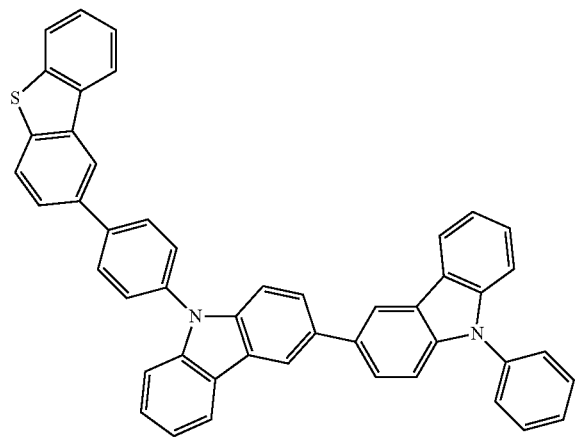
[CF Z-25]
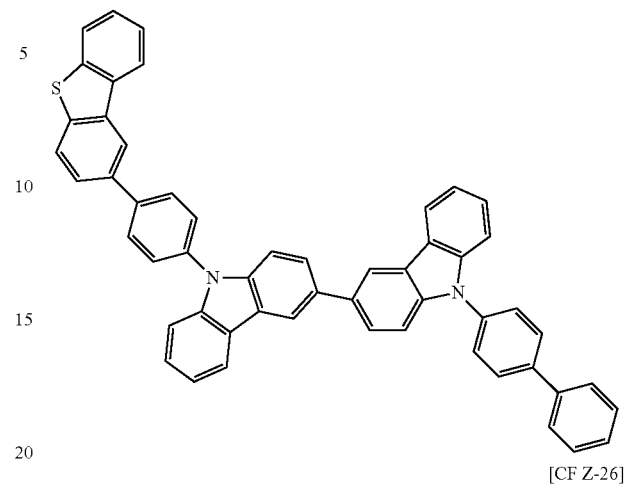
[CF Z-26]
3. The organic photoelectric device as claimed in claim 1, wherein the compound represented by CF Z-1 is represented by one or more of the following CF Z-27 to CF Z-36:
[CF Z-37]
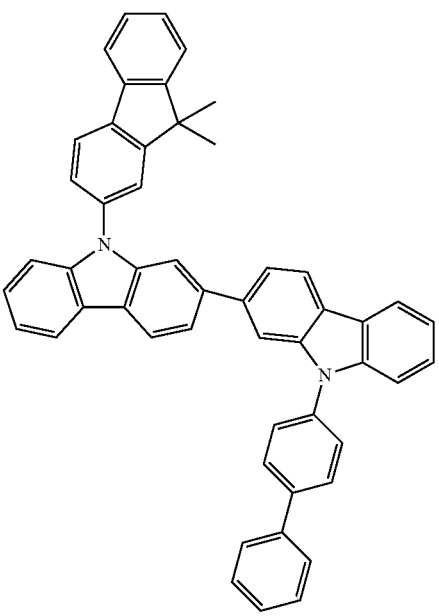

[CF Z-38]
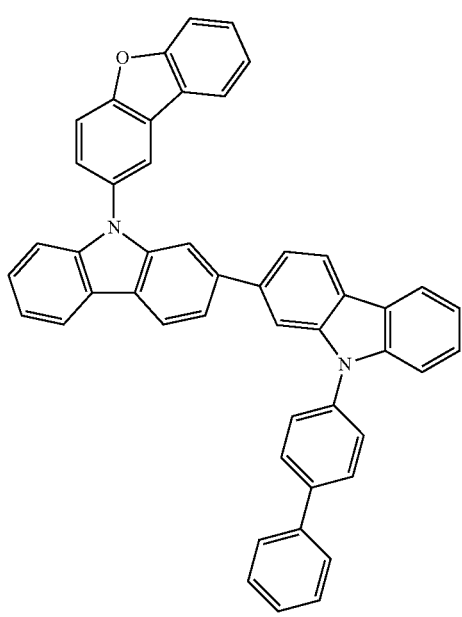
[CF Z-39]
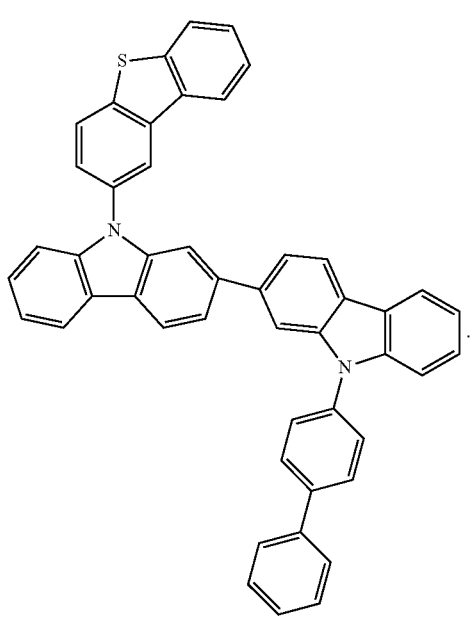
[CF Z-37]
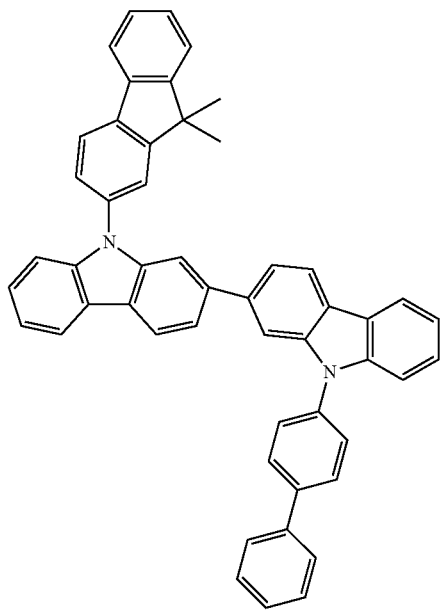
[CF Z-38]
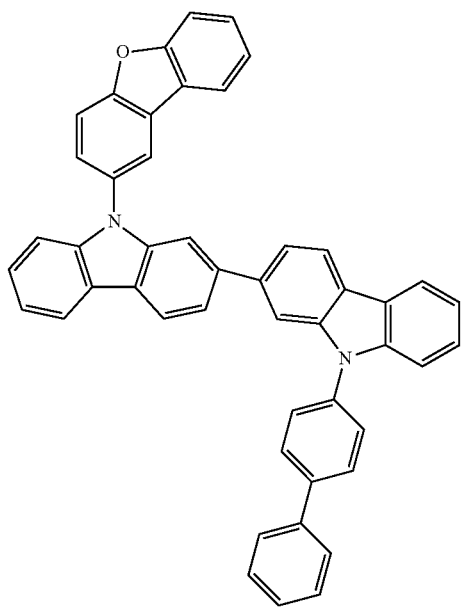
4. The organic photoelectric device as claimed in claim 1, wherein the compound represented by CF Z-1 is represented by one or more of the following CF Z-37 to CF Z-39:

-continued

[CF Z-39]

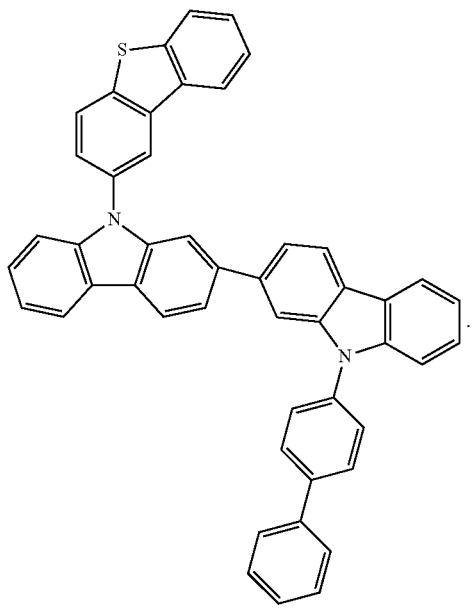

5. The organic photoelectric device as claimed in claim 1, wherein the X is —O—.

6. The organic photoelectric device as claimed in claim 1, wherein the X is —S—.

7. The organic photoelectric device as claimed in claim 1, wherein the X is —CR'R"—, and R' and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group.

8. The organic photoelectric device as claimed in claim 1, wherein the compound represented by CF Z-1 is represented by the following CF Z-2:

[CF Z-2]

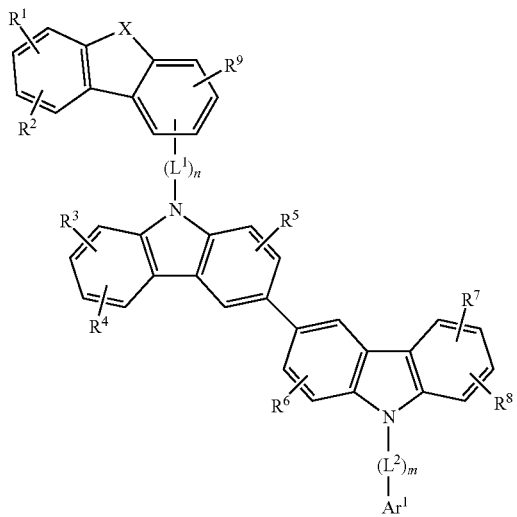

wherein, in CF Z-2,

X is selected from the group of —O—, —S—, —SO—, —S(O)$_2$—, and —CR'R"—,

R$^1$ to R$^9$, R', and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ are each independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, Ar$^1$ is a substituted or unsubstituted C6 to C30 aryl group, n is an integer of 0 to 3, and m is an integer of 0 to 3.

9. The organic photoelectric device as claimed in claim 1, wherein the compound represented by CF Z-1 is represented by the following CF Z-3:

[CF Z-3]

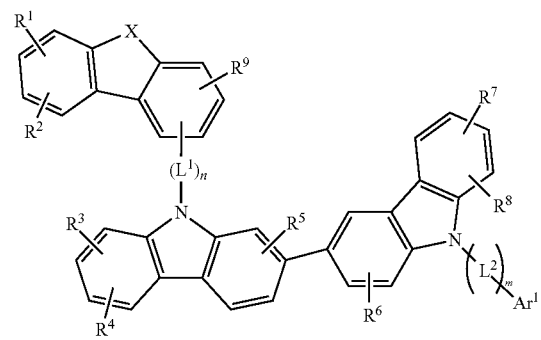

wherein, in CF Z-3,

X is selected from the group of —O—, —S—, —SO—, —S(O)$_2$—, and —CR'R"—,

R$^1$ to R$^9$, R', and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group, L$^1$ and L$^2$ are each independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group, Ar$^1$ is a substituted or unsubstituted C6 to C30 aryl group, n is an integer of 0 to 3, and m is an integer of 0 to 3.

10. The organic photoelectric device as claimed in claim 1, wherein the compound represented by CF Z-1 is represented by the following CF Z-4:

[CF Z-4]

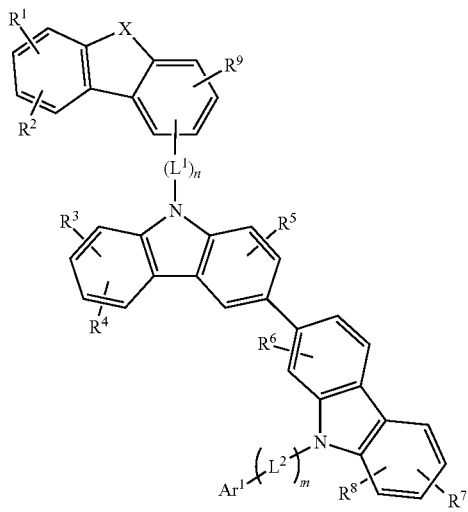

wherein, in CF Z-4,
X is selected from the group of —O—, —S—, —SO—, —S(O)$_2$—, and —CR'R"—,
R$^1$ to R$^9$, R', and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group,
L$^1$ and L$^2$ are each independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group,
Ar$^1$ is a substituted or unsubstituted C6 to C30 aryl group,
n is an integer of 0 to 3, and
m is an integer of 0 to 3.

11. The organic photoelectric device as claimed in claim 1, wherein the compound represented by CF Z-1 is represented by the following CF Z-5:

[CF Z-5]

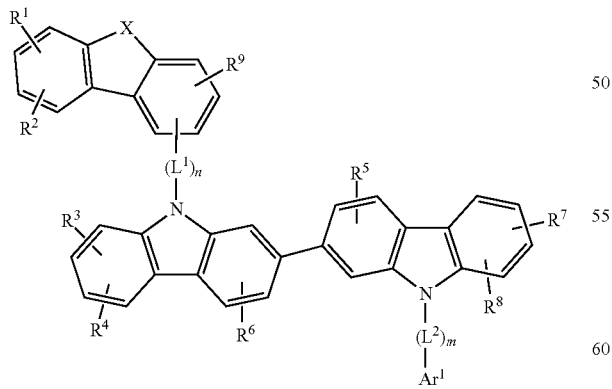

wherein, in CF Z-5,
X is selected from the group of —O—, —S—, —SO—, —S(O)$_2$—, and —CR'R"—,
R' to R$^9$, R', and R" are each independently selected from the group of hydrogen, a substituted or unsubstituted C1 to C30 alkyl group, a substituted or unsubstituted C6 to C30 aryl group, and a substituted or unsubstituted C2 to C30 heteroaryl group,
L$^1$ and L$^2$ are each independently selected from the group of a substituted or unsubstituted C2 to C30 alkenylene group, a substituted or unsubstituted C2 to C30 alkynylene group, a substituted or unsubstituted C6 to C30 arylene group, and a substituted or unsubstituted C2 to C30 heteroarlyene group,
Ar$^1$ is a substituted or unsubstituted C6 to C30 aryl group,
n is an integer of 0 to 3, and
m is an integer of 0 to 3.

12. The organic photoelectric device as claimed in claim 1, wherein the compound represented by CF Z-1 is represented by the following CF Z-6:

[CF Z-6]

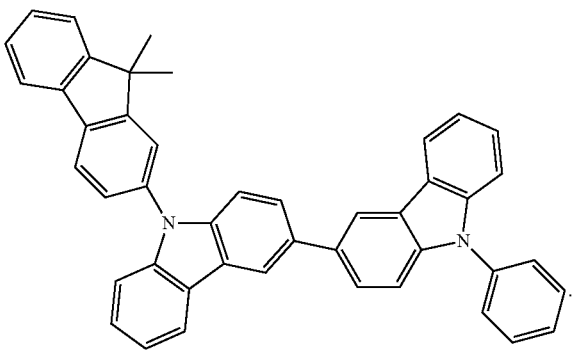

13. A compound represented by the following CF Z-6:

[CF Z-6]

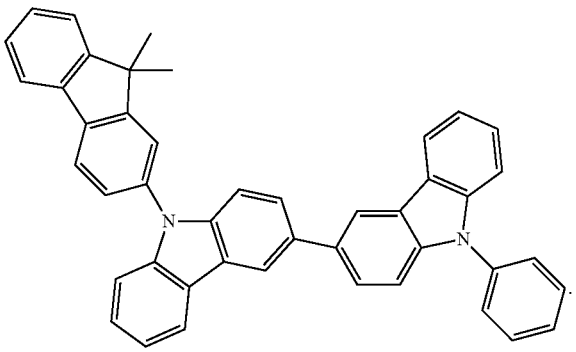

14. A display device comprising an organic photoelectric device according to claim 1.

* * * * *